US006933450B2

(12) United States Patent
Okumichi et al.

(10) Patent No.: US 6,933,450 B2
(45) Date of Patent: Aug. 23, 2005

(54) HIGH-FREQUENCY SIGNAL TRANSMITTING DEVICE

(75) Inventors: Takehiro Okumichi, Kamo-cho (JP); Hiroyuki Tanaka, Uji (JP); Yuji Kishida, Seika-cho (JP)

(73) Assignee: Kyocera Corporation, Kyoto (JP)

( * ) Notice: Subject to any disclaimer, the term of this patent is extended or adjusted under 35 U.S.C. 154(b) by 198 days.

(21) Appl. No.: 10/603,256

(22) Filed: Jun. 25, 2003

(65) Prior Publication Data

US 2005/0098348 A1 May 12, 2005

(30) Foreign Application Priority Data

| | | |
|---|---|---|
| Jun. 27, 2002 | (JP) | 2002-188466 |
| Jun. 27, 2002 | (JP) | 2002-188467 |
| Aug. 29, 2002 | (JP) | 2002-251966 |
| Aug. 29, 2002 | (JP) | 2002-251967 |
| Sep. 30, 2002 | (JP) | 2002-284635 |
| Sep. 30, 2002 | (JP) | 2002-284636 |
| Nov. 28, 2002 | (JP) | 2002-346579 |

(51) Int. Cl.[7] .......................... H05K 1/11; H01R 12/04
(52) U.S. Cl. ...................... 174/264; 174/255; 174/262; 361/795
(58) Field of Search ................................ 174/262, 255, 174/260, 261, 263, 264, 266; 361/792, 793, 361/794, 795

(56) References Cited

U.S. PATENT DOCUMENTS

| | | | | |
|---|---|---|---|---|
| 3,739,469 | A * | 6/1973 | Dougherty, Jr. | 29/852 |
| 5,381,306 | A * | 1/1995 | Schumacher et al. | 361/792 |
| 5,726,863 | A * | 3/1998 | Nakayama et al. | 361/794 |
| 6,617,526 | B2 * | 9/2003 | Miller | 174/261 |

* cited by examiner

*Primary Examiner*—Kamand Cuneo
*Assistant Examiner*—Ishwar (I. B.) Patel
(74) *Attorney, Agent, or Firm*—Hogan & Hartson LLP

(57) ABSTRACT

Signal wiring conductors are provided at opposing positions on the upper surface of the uppermost dielectric layer and on the lower surface of the bottommost dielectric layer, and grounding conductors surrounding grounding-conductor non-forming areas are provided on the upper surfaces of intermediate dielectric layers and the bottommost dielectric layer. These grounding conductors form an electromagnetically shielded space by being connected by grounding-conductor via conductors vertically penetrating the respective dielectric layers around the grounding-conductor non-forming areas, and signal via conductors are so provided in the respective dielectric layers as to penetrate this electromagnetically shielded space. A signal via conductor of the uppermost dielectric layer is connected with the signal wiring conductor on the upper surface thereof via a signal-wiring connecting conductor, and a signal via conductor of the bottommost dielectric layer is connected with the signal wiring conductor on the lower surface thereof via a signal-wiring connecting conductor.

18 Claims, 62 Drawing Sheets

HIGH-FREQUENCY SIGNAL TRANSMITTING DEVICE

BACKGROUND OF THE INVENTION

The present invention relates to a high-frequency signal transmitting device which is used in a high-frequency band such as a microwave band and an extremely high frequency band and is able to accommodate a semiconductor device and particularly to a high-frequency signal transmitting device having a good transmission characteristic in a high-frequency band.

A high-frequency signal transmitting device or layered structure for high-frequency signal transmission having a construction shown in FIGS. 76A and 76B is known. FIG. 76A is a plan view of the high-frequency signal transmitting device, and FIG. 76B is a vertical sectional view taken along the line 76B—76B of FIG. 76A. The high-frequency signal transmitting device shown in FIGS. 76A and 76B is formed by using a layered substrate 510 in which a plurality of dielectric layers (dielectric substrates) 500 rectangular in plan view are placed one over another along vertical direction of FIGS. 76A and 76B. On the upper surface of the uppermost dielectric layer 500 of this layered substrate 510 and on the lower surface of the bottommost dielectric layer 500, signal wiring conductors 520, 530 are provided at such positions facing each other. A grounding conductor 550 having such a shape as to surround a circular grounding-conductor non-forming area 540 defined in the center of each dielectric layer 500 is provided on each of the upper surfaces of the intermediate dielectric layers 500 located between the uppermost and bottommost dielectric layer 500 and the upper surface of the bottommost dielectric layer 500.

Signal via conductors 560 are so provided at positions of the respective dielectric layers 500 corresponding to the centers of the grounding-conductor non-forming areas 540 as to vertically penetrate the dielectric layers 500. The signal via conductor 560 of the uppermost dielectric layer 500 is connected with the signal wiring conductor 520 via a signal-wiring connecting conductor 570 provided on the upper surface of the uppermost dielectric layer 500, and the signal via conductor 560 of the bottommost dielectric layer 500 is connected with the signal wiring conductor 530 via a signal-wiring connecting conductor 580 provided on the lower surface of the bottommost dielectric layer 500.

By providing the grounding conductors 550 on the upper surfaces of the intermediate dielectric layers 500 and the bottommost dielectric layer 500 and providing the respective dielectric layers 500 with the signal via conductors 560 in this way, the layered substrate 510 is allowed to have a coaxial line construction, thereby forming a high-frequency signal transmitting device.

However, when a sample as described below was prepared and a high-frequency characteristic thereof was studied, it was found out that the high-frequency signal transmitting device having the conventional construction did not have a good high-frequency transmission characteristic.

Specifically, the high-frequency signal transmitting device having the construction of FIGS. 76A and 76B was constructed as follows. The layered substrate 510 was formed by placing nine dielectric layers 500 having a relative dielectric constant of 9.2 and a thickness of 0.2 mm one over another, the signal wiring conductors 520, 530 and the signal-wiring connecting conductors 570, 580 of the uppermost and bottommost dielectric layers 500 were formed to have a width of 0.16 mm, whereas the signal via conductors 560 of the respective dielectric layers 500 were formed to have a circular cross section of a diameter of 0.1 mm, and the grounding conductors 550 of the intermediate and bottommost dielectric layers 500 were formed such that the grounding-conductor non-forming areas 540 had a circular shape of a diameter of 0.84 mm. Further, a distance between an end of the signal wiring conductor 520 at a side opposite from the signal-wiring connecting conductor 570 and an end of the signal wiring conductor 530 at a side opposite from the signal-wiring connecting conductor 580 was set to be 2.0 mm in plan view.

The high-frequency characteristic between the ends of the signal wiring conductors 520 and 530 was obtained for the sample thus constructed by an electromagnetic field simulation, a characteristic curve having a frequency characteristic as shown in a graph of FIG. 77 was obtained. FIG. 77 shows a frequency characteristic of a reflection coefficient (unit: dB) which is a rate of reflected and returned signals to incident high-frequency signals, wherein horizontal axis represents frequency (unit: GHz) and vertical axis represent reflection frequency (unit: dB) as an evaluation index of a reflected quantity of the signal. As is clear from FIG. 77, the conventional high-frequency signal transmitting device having the construction of FIGS. 76A and 76B can be understood not to have a good high-frequency transmission characteristic.

SUMMARY OF THE INVENTION

It is an object of the present invention to provide a high-frequency signal transmitting device which is free from the problems residing in the prior art.

It is another object of the present invention to provide a high-frequency signal transmitting device which has a good high-frequency transmission characteristic.

According to an aspect of the invention, a high-frequency signal transmitting device is provided with a layered substrate having an uppermost dielectric layer, a bottommost dielectric layer, and a plurality of intermediate dielectric layers located between the uppermost and bottommost dielectric layers. Signal wiring conductors are provided between one end and an inner side on the upper surface of the uppermost dielectric layer and between the other end opposite from the one end and the inner side on the lower surface of the bottommost dielectric layer. Grounding conductors are provided on the upper surfaces of the respective intermediate dielectric layers and the bottommost dielectric layer and surrounding grounding-conductor non-forming areas of a specified shape provided on the respective dielectric layers. A signal via conductor vertically penetrates the uppermost dielectric layer, and is provided within an area facing the grounding-conductor non-forming area on the upper surface of the uppermost intermediate dielectric layer. A signal via conductor vertically penetrates the bottommost dielectric layer, and is provided within an area facing the grounding-conductor non-forming area on the upper surface of the bottommost dielectric layer. Signal via conductors vertically penetrate the respective intermediate dielectric layers, and are provided within the grounding-conductor non-forming areas of the respective dielectric layers. Signal-wiring connecting conductors are provided on the upper surface of the uppermost dielectric layer and on the lower surface of the bottommost dielectric layer to connect the signal wiring conductors of the uppermost and bottommost dielectric layers with the signal via conductors. Via conductor connecting conductors are provided on the upper surfaces of the respective intermediate dielectric layers and the bottommost dielectric layer to connect the signal via conductors of the respective dielectric layers with those of the dielectric layers right thereabove. Grounding-conductor via conductors vertically penetrate the respective intermediate dielectric layers to connect the respective grounding conductors at a plurality of positions around the grounding-conductor non-forming areas of the respective dielectric layers.

These and other objects, features, aspects, and advantages of the present invention will become more apparent from the following detailed description of the preferred embodiments/examples with reference to the accompanying drawings.

BRIEF DESCRIPTION OF THE DRAWINGS

FIG. 54B is a vertical sectional view taken along the line 54B—54B of FIG. 54A;

FIG. 55A is a plan view diagrammatically showing a high-frequency signal transmitting device;

FIG. 55B is a vertical sectional view taken along the line 55B—55B of FIG. 55A;

FIG. 56 is a graph showing a relationship of the width and length of signal-wiring connecting conductors, the relative dielectric constant of dielectric layers, and the inductances of the signal-wiring connecting conductors;

FIG. 57 is a graph showing high-frequency characteristics of the high-frequency signal transmitting device shown in FIGS. 52A and 52B;

FIG. 58 is a graph showing high-frequency characteristics of the high-frequency signal transmitting device shown in FIGS. 53A and 53B;

FIG. 59 is a graph showing high-frequency characteristics of the high-frequency signal transmitting device shown in FIGS. 54A and 54B;

FIG. 60 is a section diagrammatically showing an essential portion of a high-frequency semiconductor package according to a thirty-third embodiment of the invention;

FIG. 61 is a section diagrammatically showing an essential portion of a high-frequency semiconductor package according to a thirty-fourth embodiment of the invention;

FIG. 62 is a section diagrammatically showing an essential portion of a high-frequency semiconductor package according to a thirty-fifth embodiment of the invention;

FIG. 63 is a section diagrammatically showing an essential portion of a high-frequency semiconductor package as a comparative example of the respective thirty-third to thirty-fifth embodiments of the invention;

FIG. 64 is a graph showing high-frequency characteristics of the high-frequency semiconductor package shown in FIG. 60 and a high-frequency semiconductor package;

Figure 61:
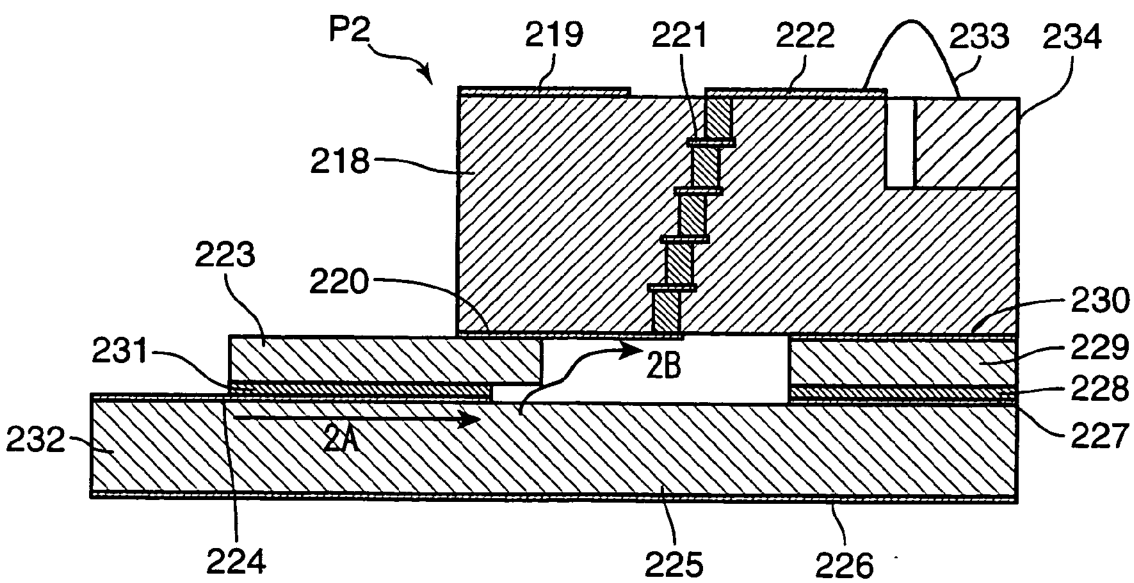
Figure 62:
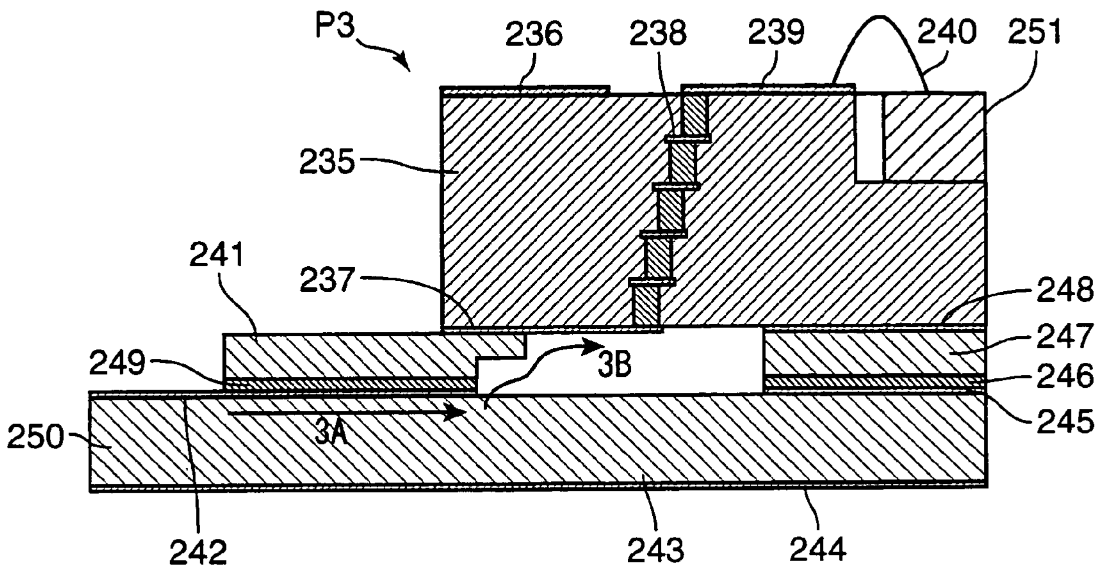
Figure 65:
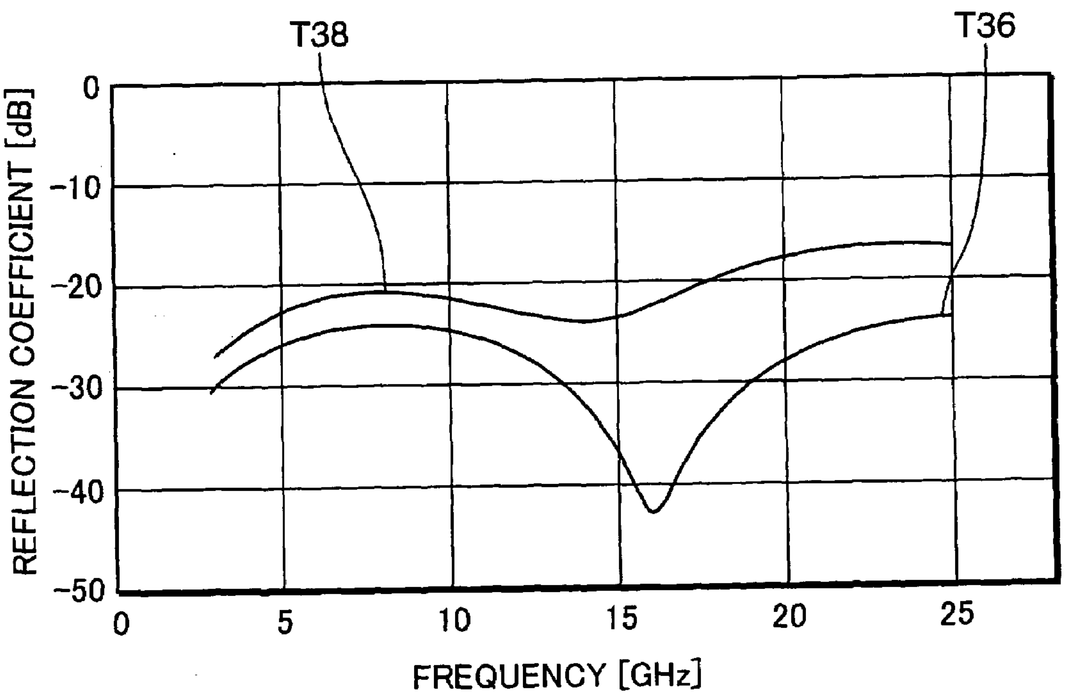
Figure 66:
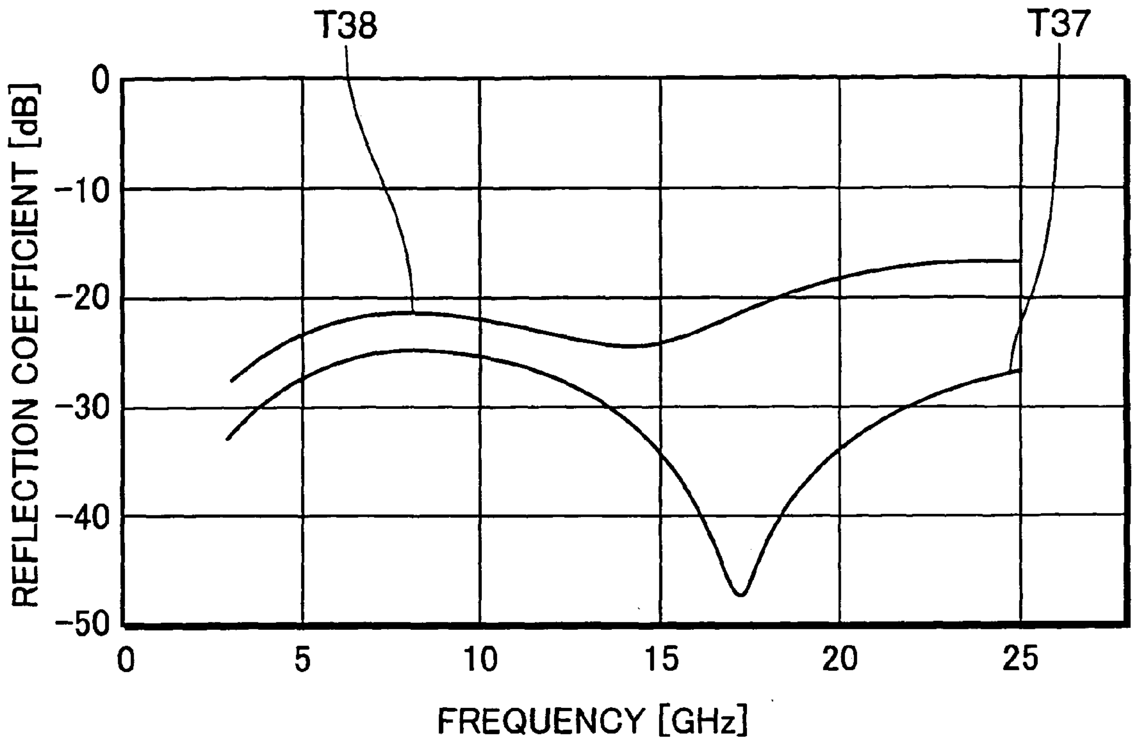
Figure 67A:
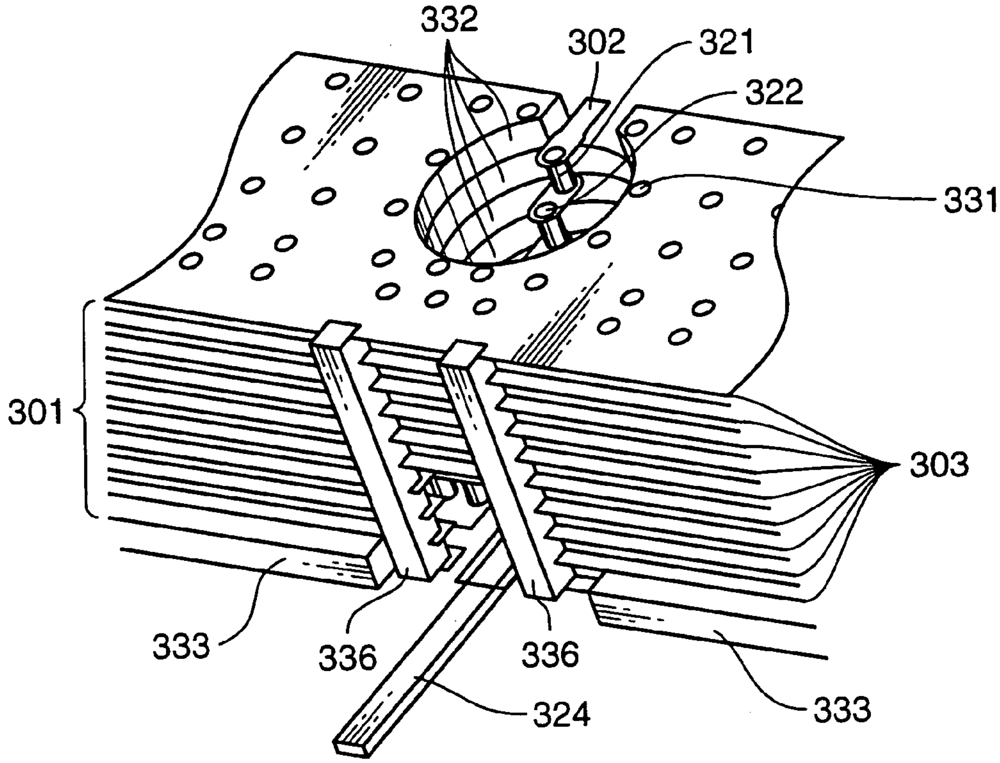
Figure 67B:
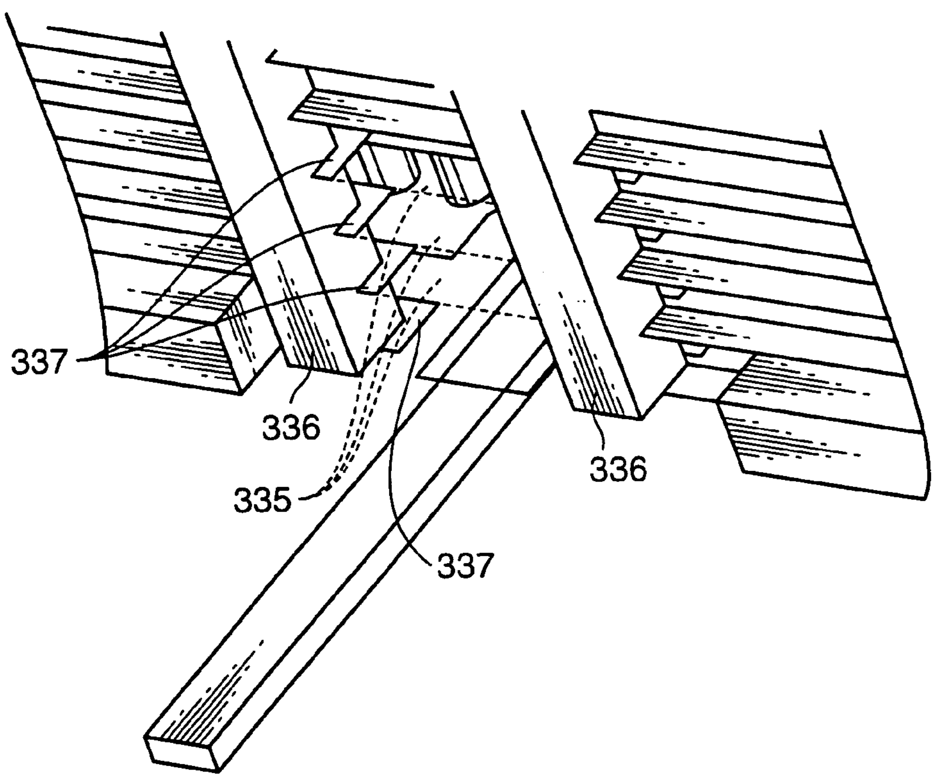
Figure 68A:
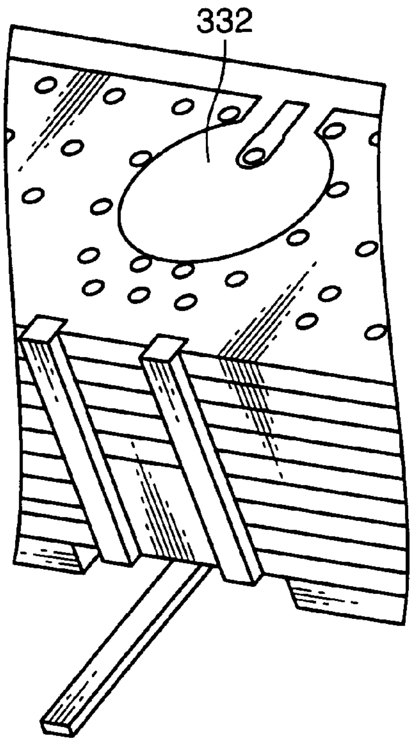
Figure 68B:
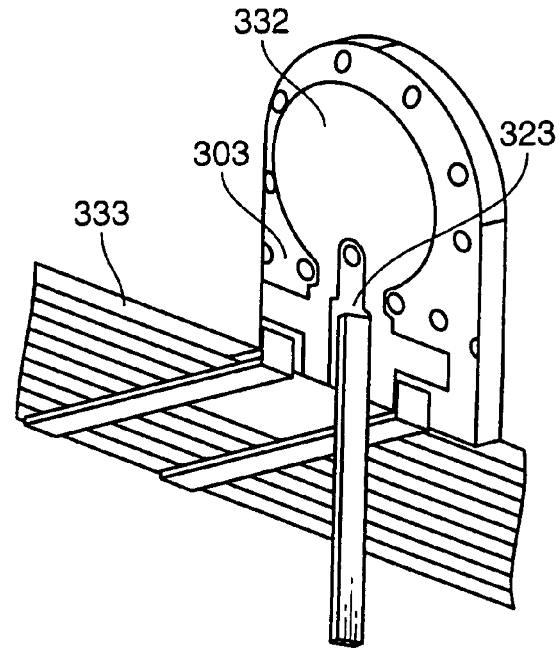
Figure 68C:
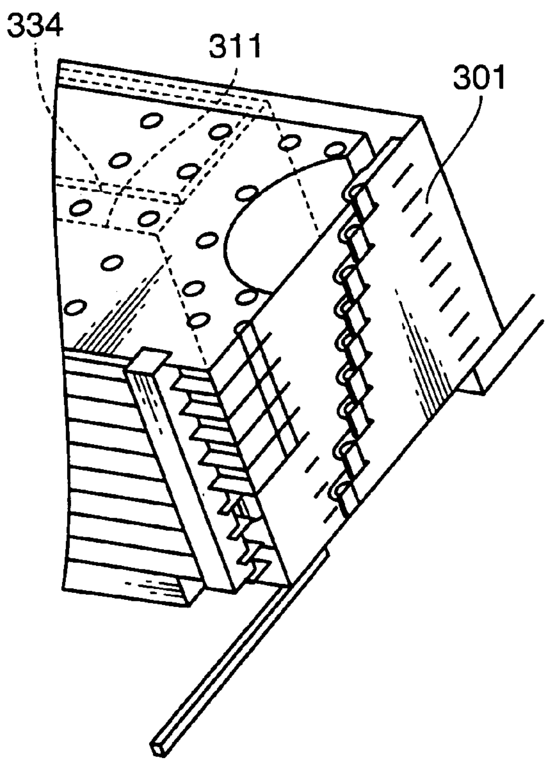
Figure 68D:
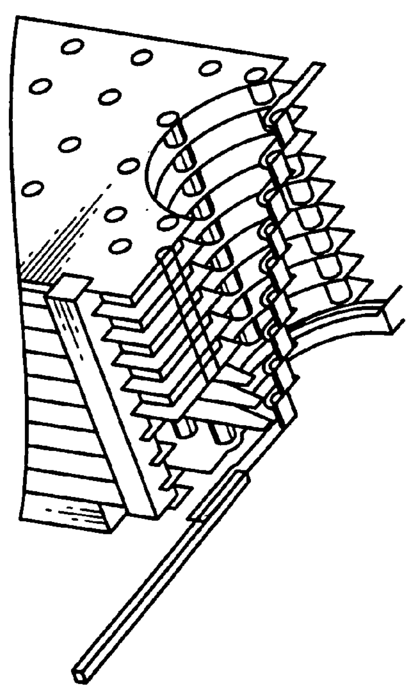
Figure 69:
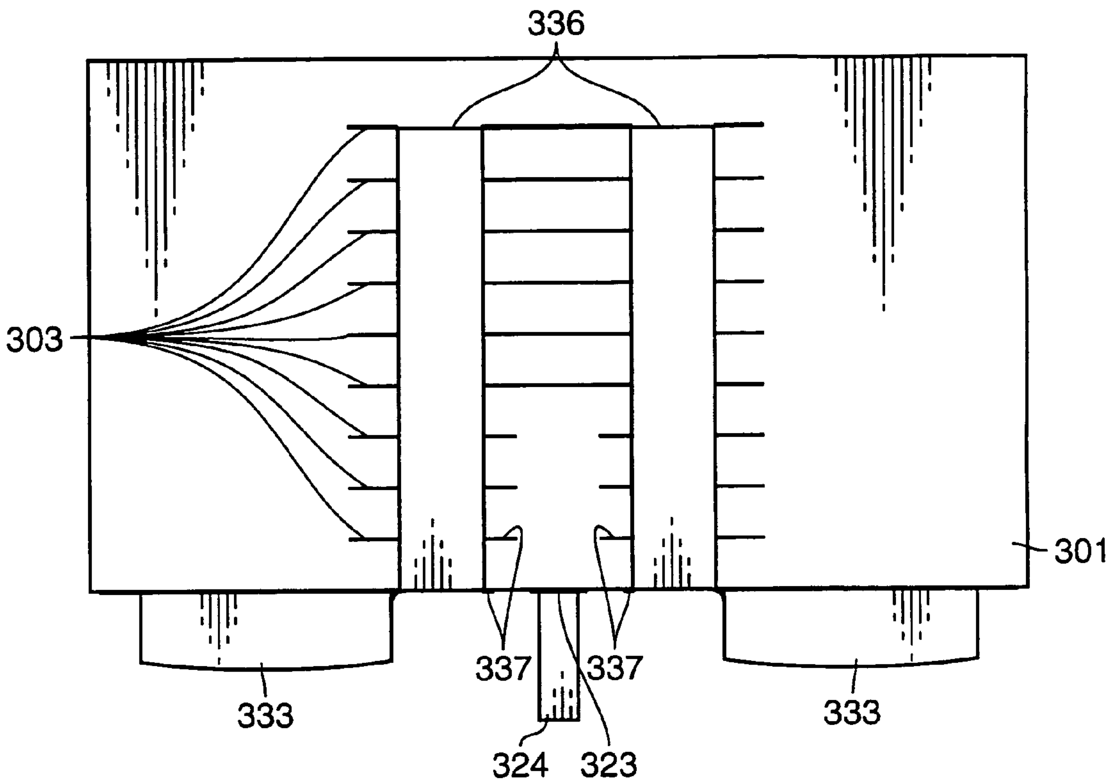
Figure 70A:
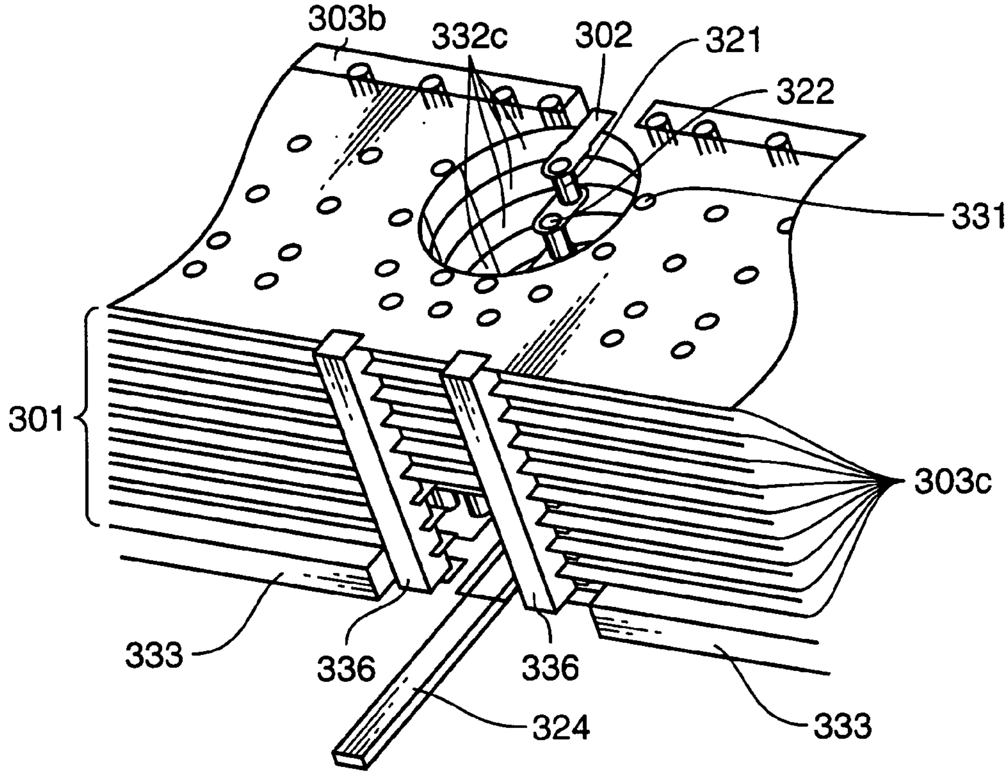
Figure 70B:
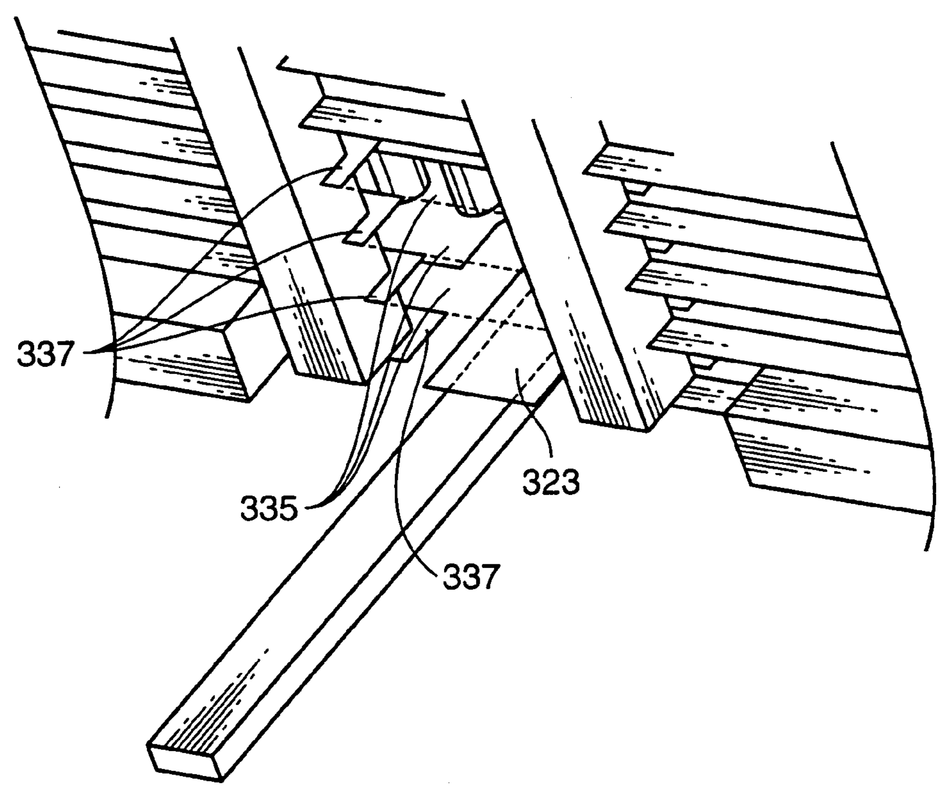
Figure 71A:
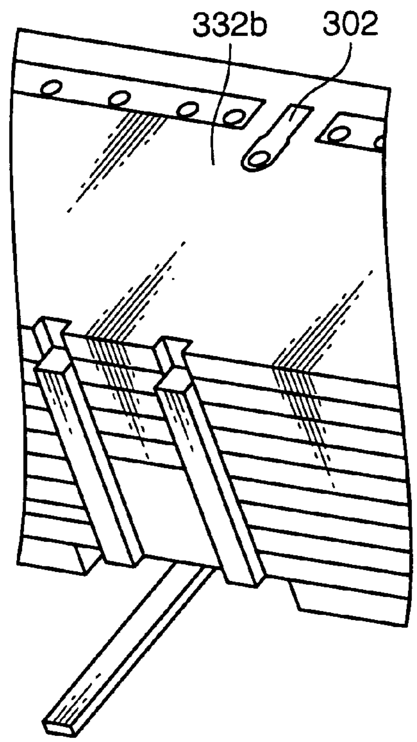
Figure 71B:
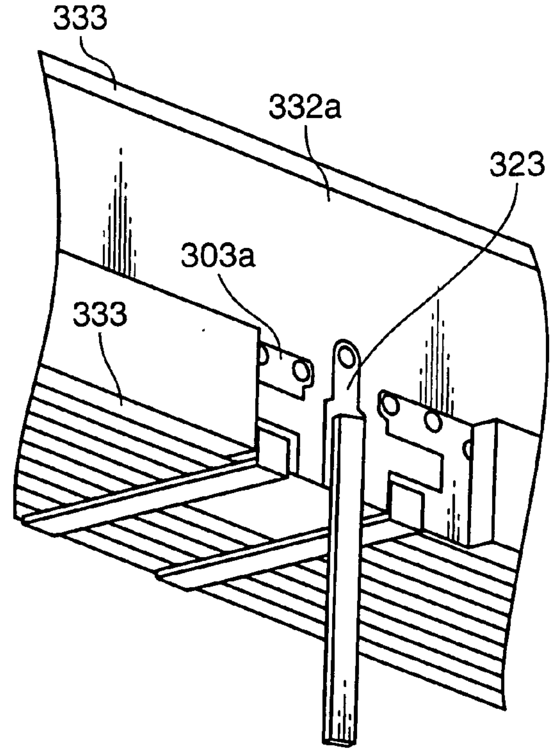
Figure 71C:
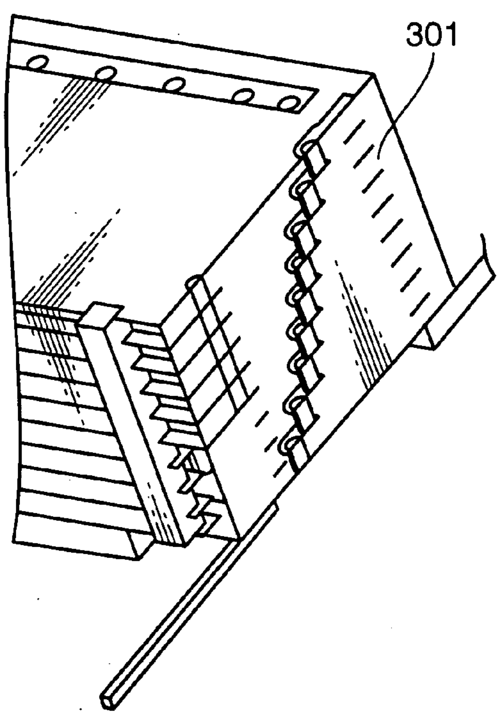
Figure 71D:
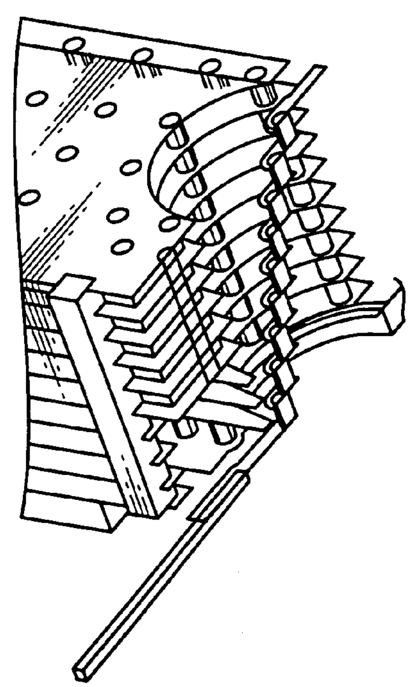
Figure 72:
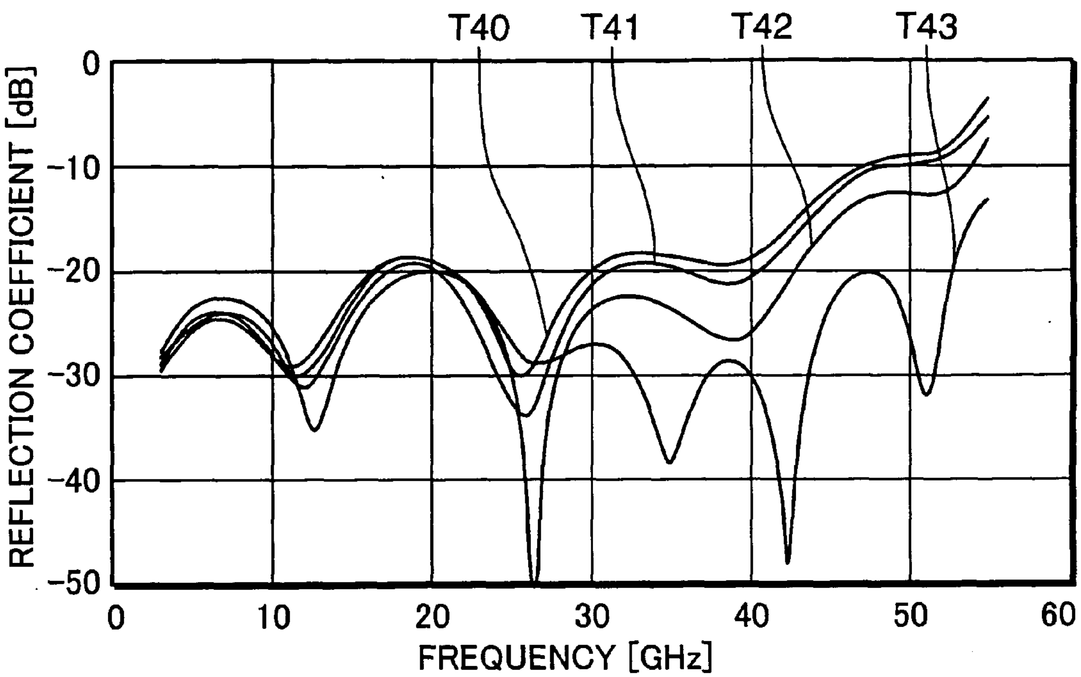
Figure 73:
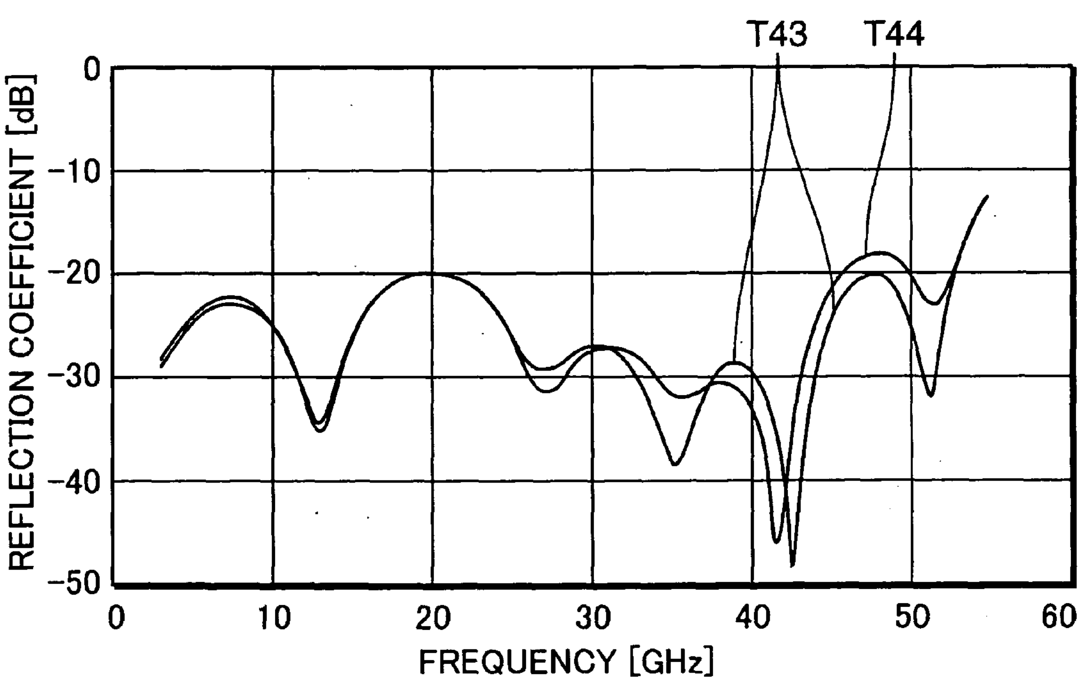
Figure 74:
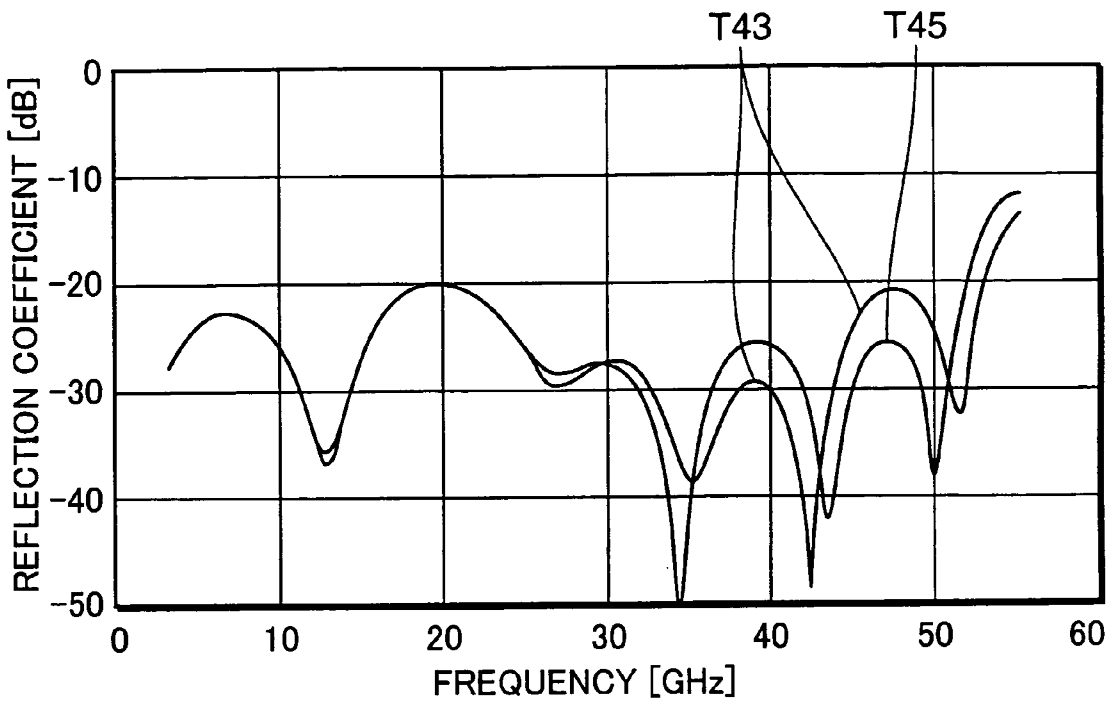
Figure 75:
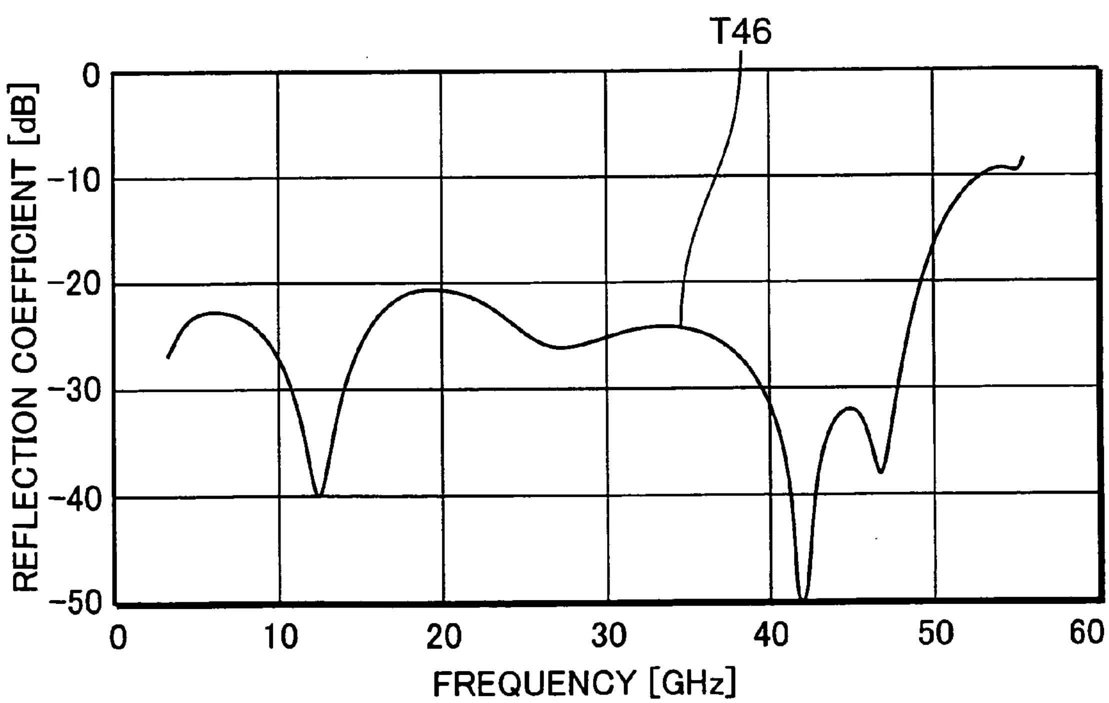
Figure 76A:
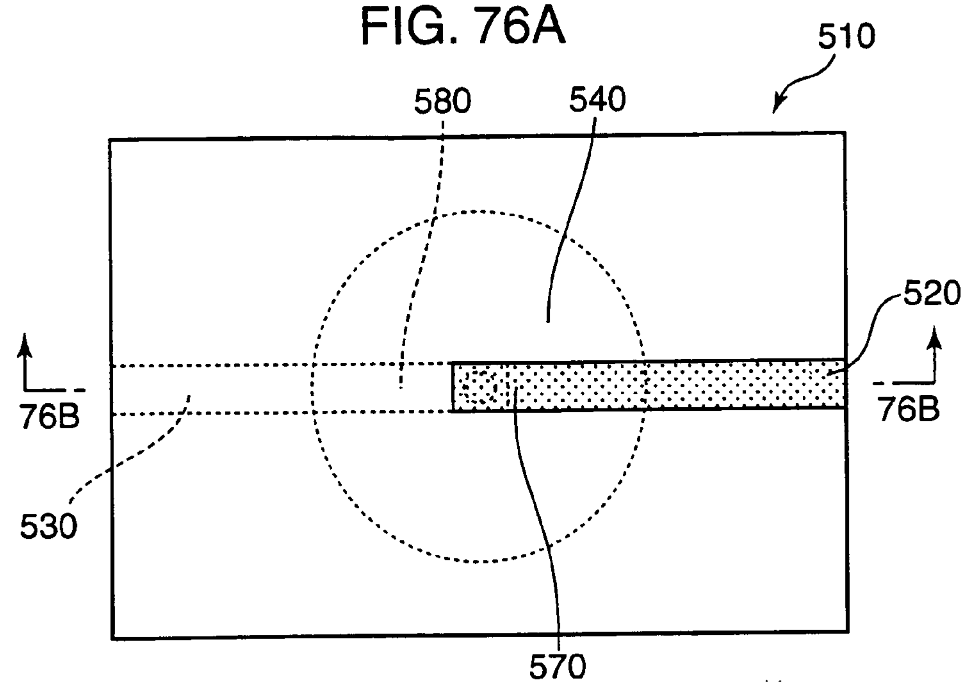
Figure 76B:
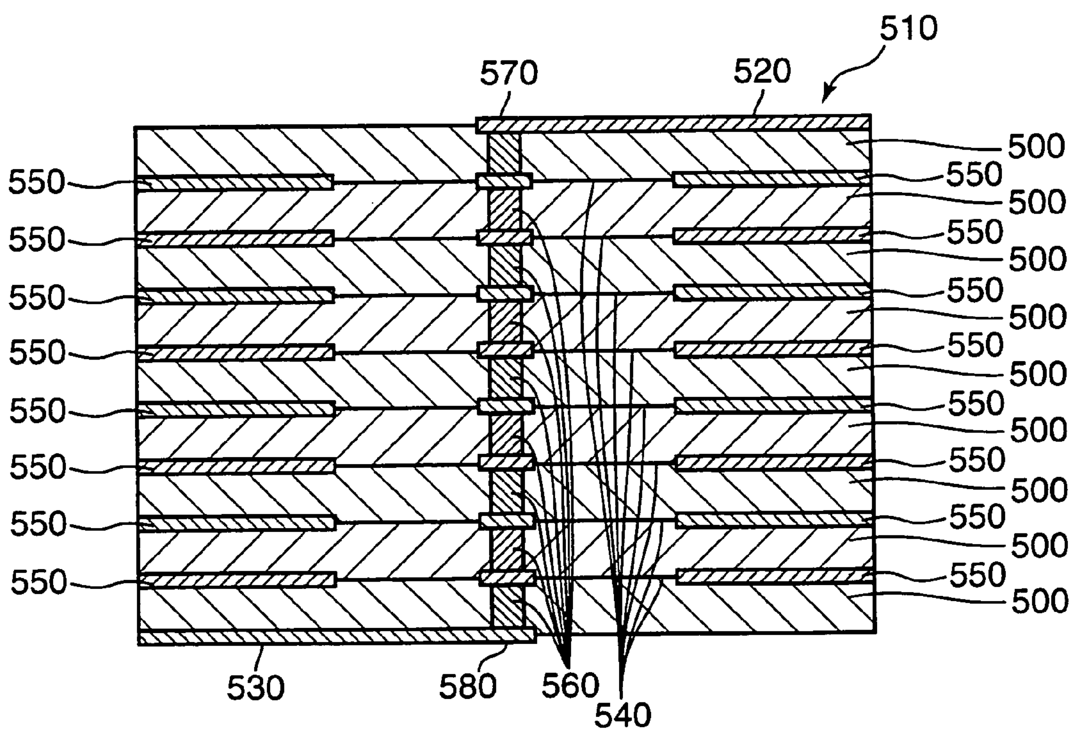
Figure 77:
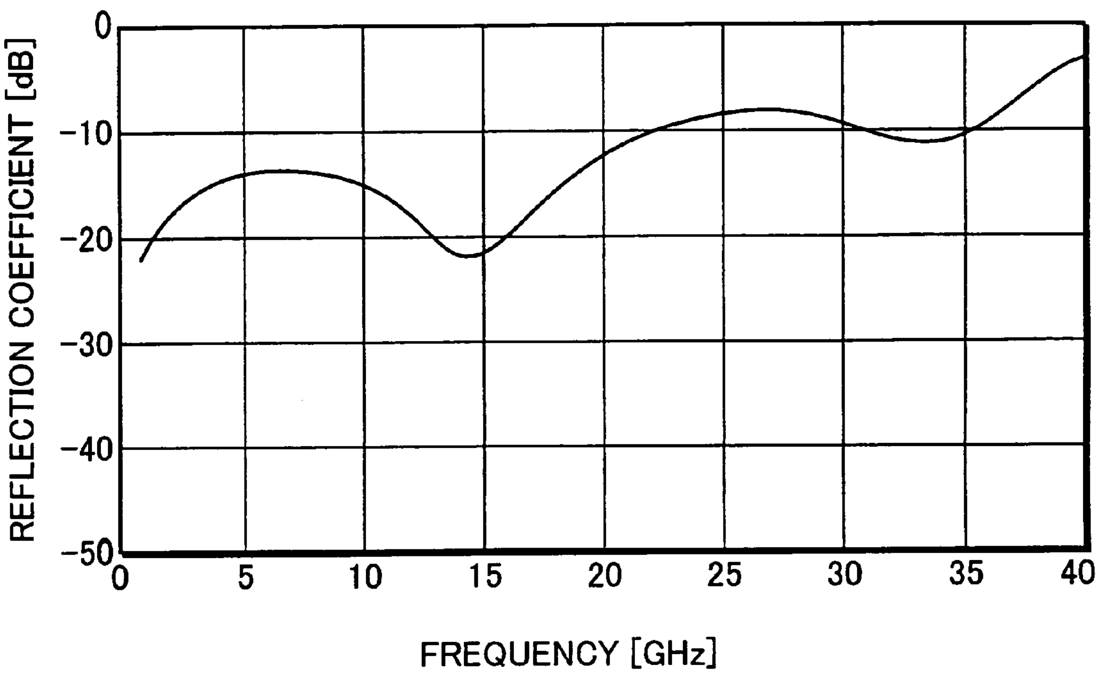

FIG. 65 is a graph showing high-frequency characteristics of the high-frequency semiconductor package shown in FIG. 61 and the high-frequency semiconductor package;

FIG. 66 is a graph showing high-frequency characteristics of the high-frequency semiconductor package shown in FIG. 62 and the high-frequency semiconductor package;

FIG. 67A is a perspective view diagrammatically showing an essential portion of a high-frequency signal transmitting device according to a third-sixth embodiment of the invention, wherein only conductors are shown without showing dielectric layers;

FIG. 67B is an enlarged perspective view showing an essential portion of the high-frequency signal transmitting device shown in FIG. 67A;

FIG. 68A is a perspective view showing an essential portion of the high-frequency signal transmitting device corresponding to FIG. 67A, wherein the dielectric layers are diagrammatically shown;

FIG. 68B is a perspective view showing a state of a metal lead mounting portion and around it in the high-frequency signal transmitting device shown in FIG. 68A;

FIG. 68C is a perspective view showing an essential portion of the high-frequency signal transmitting device shown in FIG. 68A;

FIG. 68D is a perspective view showing an essential portion of the high-frequency signal transmitting device shown in FIG. 68C, wherein only conductors are shown without showing the dielectric layers;

FIG. 69 is a front view of the high-frequency signal transmitting device shown in FIG. 67A when viewed from the side of the metal lead;

FIG. 70A is a perspective view diagrammatically showing an essential portion of a high-frequency signal transmitting device according to a modification of the thirty-sixth embodiment of the invention, wherein only conductors are shown without showing dielectric layers;

FIG. 70B is an enlarged perspective view showing the essential portion of the high-frequency signal transmitting device shown in FIG. 70A;

FIG. 71A a perspective view diagrammatically showing an essential portion of a high-frequency signal transmitting device according to another modification of the thirty-sixth embodiment of the invention;

FIG. 71B is a perspective view showing a state of a metal lead mounting portion and around it in the high-frequency signal transmitting device shown in FIG. 71A;

FIG. 71C is a perspective view showing an essential portion of the high-frequency signal transmitting device shown in FIG. 71A;

FIG. 71D is a perspective view showing the essential portion of the high-frequency signal transmitting device shown in FIG. 71C, wherein only conductors are shown without showing the dielectric layers;

FIG. 72 is a graph showing high-frequency characteristics of the high-frequency signal transmitting device shown in FIGS. 67A and 67B. FIGS. 68A, 68B, 68C and 68D;

FIG. 73 is a graph showing a high-frequency characteristic of a modification of the high-frequency signal transmitting device shown in FIGS. 67A and 67B, FIGS. 68A, 68B, 68C and 68D;

FIG. 74 is a graph showing a high-frequency characteristic of another modification of the high-frequency signal transmitting device shown in FIGS. 67A and 67B, FIGS. 68A, 68B, 68C and 68D;

FIG. 75 is a graph showing a high-frequency characteristic of the high-frequency signal transmitting device shown in FIGS. 70A and 70B, FIGS. 71A, 71B, 71C and 71D;

FIG. 76A is a plan view diagrammatically showing a prior art high-frequency signal transmitting device;

FIG. 76B is a vertical sectional view taken along the line 76B—76B of FIG. 76A; and FIG. 77 is a graph showing a high-frequency characteristic of the prior art high-frequency signal transmitting device shown in FIGS. 76A and 76B.

DETAILED DESCRIPTION OF THE PREFERRED EMBODIMENTS OF THE INVENTION

Referring to FIGS. 1A to 1D showing a high-frequency signal transmitting device (layered structure for high-frequency signal transmission) according to a first embodiment of the present invention, a high-frequency signal transmitting device S1 is constructed using a layered substrate 2 in which a plurality of (nine in this embodiment) dielectric layers (dielectric substrates) 1 rectangular in plan view are placed one over another along vertical direction of FIGS. 1A to 1D.

The number of the dielectric layers 1 forming the dielectric substrate 2 is not limited to nine as in this embodiment. However, the dielectric substrate 2 is preferably comprised of at least four dielectric layers 1 (i.e., uppermost dielectric layer 1, bottommost dielectric layer 1, and at least two intermediate dielectric layers 1 located between the uppermost and bottommost dielectric layers 1) in order to accomplish a desired object in all the embodiments described below. Further, the intermediate dielectric layers 1 between the uppermost and bottommost dielectric layers 1 preferably have a thickness smaller than half the tube wavelength of a highest frequency used.

On one surface of the layered substrate 2, i.e., the upper surface of the uppermost dielectric layer 1, there are provided a thin signal wiring conductor (outer-layer signal wiring conductor) 11 extending from one edge of this upper surface toward the center (inner portion) thereof, a grounding conductor (outer-layer grounding conductor) 12 having such a shape as to surround the signal wiring conductor 11 with specified gaps G1, G2 defined to the opposite sides of the signal wiring conductor 11 and a grounding-conductor non-forming area (outer-layer grounding-conductor non-forming area) 16 which has a specified shape (elliptical shape in this embodiment) and is located in a central part and where no grounding conductor is formed, and a signal-wiring connecting conductor (outer-layer signal-wiring connecting conductor) 13 having one end connected with the signal wiring conductor 11 and the other end extended to the center of the grounding-conductor non-forming area 16.

On the other surface of the layered substrate 2, i.e., the lower surface of the bottommost dielectric layer 1, there are provided a thin signal wiring conductor (outer-layer signal wiring conductor) 21 provided at a side opposite from the signal wiring conductor 11 and extending from an edge of this upper surface at this side toward the center (inner portion) thereof, a grounding conductor (outer-layer grounding conductor) 22 having such a shape as to surround the signal wiring conductor 21 with specified gaps G3, G4 defined to the opposite sides of the signal wiring conductor 21 and a grounding-conductor non-forming area (outer-layer grounding-conductor non-forming area) 26 which has a specified shape (elliptical shape in this embodiment) and is of the same size and located at the same position as the grounding-conductor non-forming area 16 of the uppermost dielectric layer 1 and where no grounding conductor is formed, and a signal-wiring connecting conductor (wiring connecting conductor for outer-layer signal) 23 having one end connected with the signal wiring conductor 21 and the other end extended to the center of the grounding-conductor non-forming area 26.

On each of the upper surfaces of the respective intermediate dielectric layers 1 between the uppermost and bottommost dielectric layers 1 of the layered substrate 2 and the upper surface of the bottommost dielectric layer 1, there are provided a grounding conductor (inner-layer grounding conductor) 32 having such a shape as to surround a grounding-conductor non-forming area (inner-layer grounding-conductor non-forming area) 36 which has a specified shape (elliptical shape in this embodiment) and is of the same size and located at the same position as the grounding-conductor non-forming area 16 of the uppermost dielectric layer 1 and where no grounding conductor is formed, and a connecting conductor for signal (connecting conductor for inner-layer signal) 33 formed in the center of the grounding-conductor non-forming area 36.

Further, the uppermost dielectric layer 1 is provided with a signal via conductor (via conductor for outer-layer signal) 14 formed to vertically penetrate this dielectric layer 1 in the center of the grounding-conductor non-forming area 16 and connected with the other end of the connecting conductor 13 present on the upper surface and with the connecting conductor 33 (connecting conductor for signal 33 provided on the upper surface of the uppermost intermediate dielectric layer 1) present on the lower surface, and a plurality of grounding-conductor via conductors (via conductors for outer-layer grounding) 15 which are formed to vertically penetrate this dielectric layer 1 at positions of the grounding conductor 12 proximate to the opposite sides of the signal wiring conductor 11 and at a plurality of positions proximate to the grounding-conductor non-forming area 16 and along the outer periphery of the grounding-conductor non-forming area 16 and connected with the grounding conductor 12 present on the upper surface and with the grounding conductor 32 (grounding conductor 32 provided on the upper surface of the uppermost intermediate dielectric layer 1) present on the lower surface.

Further, the bottommost dielectric layer 1 is provided with a signal via conductor (via conductor for outer-layer signal) 24 formed to vertically penetrate this dielectric layer 1 in the center of the grounding-conductor non-forming area 16 and connected with the other end of the connecting conductor 23 present on the lower surface and with the connecting conductor for signal 33 present on the upper surface, and a plurality of grounding-conductor via conductors (via conductors for outer-layer grounding) 25 which are formed to vertically penetrate this dielectric layer 1 at positions of the grounding conductor 22 proximate to the opposite sides of the signal wiring conductor 21 and at a plurality of positions proximate to the grounding-conductor non-forming area 26 and along the outer periphery of the grounding-conductor non-forming area 26 and connected with the grounding conductor 22 present on the lower surface and with the grounding conductor 32 present on the upper surface.

Further, each intermediate dielectric layer 1 is provided with a signal via conductor (via conductor for inner-layer signal) 34 formed to vertically penetrate this dielectric layer 1 in the center of the grounding-conductor non-forming area 36 and connected with the connecting conductor for signal 33 present on the upper surface and with the connecting conductor 33 (connecting conductor 33 provided on the upper surface of the intermediate dielectric layer 1 located right below for the intermediate dielectric layers 1 excluding the bottommost intermediate dielectric layer 1, and connecting conductor 33 provided on the upper surface of the bottommost dielectric layer 1 for the bottommost intermediate dielectric layer 1) present on the lower surface, and a plurality of grounding-conductor via conductors (via conductors for inner-layer grounding) 35 which are formed to vertically penetrate this dielectric layer 1 at a plurality of positions of the grounding conductor 32 proximate to the grounding-conductor non-forming area 36 and along the outer periphery of the grounding-conductor non-forming area 36 and connected with the grounding conductor 32 present on the upper surface and with the grounding conductor 32 (grounding conductor 33 provided on the upper surface of the intermediate dielectric layer 1 located right below for the intermediate dielectric layers 1 excluding the bottommost intermediate dielectric layer 1, and grounding conductor 22 provided on the lower surface of the bottommost dielectric layer 1 for the bottommost intermediate dielectric layer 1) present on the lower surface.

Here, the signal wiring conductor 11 in the present invention means a portion of the uppermost dielectric layer 1 opposed to the grounding conductor 32 provided on the upper surface of the dielectric layer 1 (uppermost intermediate dielectric layer 1) right below the uppermost dielectric layer 1 in the thickness direction of the dielectric layer 1, and the signal-wiring connecting conductor 13 means a portion of the uppermost dielectric layer 1 which is not opposed to the above grounding conductor 32 in the thickness direction. Further, the signal wiring conductor 21 means a portion of the bottommost dielectric layer 1 opposed to the grounding conductor 32 provided on the upper surface of the bottommost dielectric layer 1 in the thickness direction, and the signal-wiring connecting conductor 23 means a portion of the bottommost dielectric layer 1 which is not opposed to the above grounding conductor 32 in the thickness direction. Furthermore, the grounding-conductor via conductors 15, 25, 35 are preferably provided at an interval shorter than half the tube wavelength of a highest frequency used at the outer peripheries of the grounding-conductor non-forming areas 16, 26, 36. These apply to all the embodiments described below.

As described above, in the first embodiment of the present invention, the grounding conductors 12, 22, 32 are so provided as to define the grounding-conductor non-forming areas 16, 26, 36 of the same size at the same positions of the respective dielectric layers 1, the signal via conductors 14, 24, 34 are so provided as to coaxially penetrate straight along the centers of the grounding-conductor non-forming areas 16, 26, 36, and the respective grounding conductors 12, 22, 32 are connected by the grounding-conductor via conductors 15, 25, 35, whereby the layered substrate 2 is allowed to have a coaxial line construction and to form a high-frequency signal transmitting device.

Specifically, an electromagnetically shielded space can be provided inside the layered substrate 2 by connecting the respective grounding conductors 12, 22, 32 by the grounding-conductor via conductors 15, 25, 35, with the result that a leak of a high-frequency signal upon passing the signal via conductors 14, 24, 34 can be suppressed to improve a high-frequency transmission characteristic. Thus, a high-frequency signal transmitting device having a good transmission characteristic in a high-frequency band can be obtained. It should be noted that specific transmission characteristics as well as those of succeeding embodiments to be described later are described in detail in Examples.

Referring to FIGS. 2A to 2E showing a high-frequency signal transmitting device S2 according to a second embodiment of the present invention, a high-frequency signal transmitting device S2 has, in its basic construction, the same elements as the high-frequency signal transmitting device S1 according to the first embodiment shown in FIGS. 1A to 1D. Thus, no detailed description is given on the elements having the same functions by identifying them by the same reference numerals, and the following description is centered on differences to the high-frequency signal transmitting device S1 of the first embodiment.

In the high-frequency signal transmitting device S1 of the first embodiment, as described above, the electromagnetically shielded space is so formed as to vertically extend between the upper and lower surfaces of the layered substrate 2 by providing the grounding-conductor non-forming areas 16, 26, 36 substantially at the same positions of the respective dielectric layers 1 and the signal via conductors 14, 24, 34 of the respective dielectric layers 1 coaxially penetrate straight along the center of this electromagnetically shielded space.

The high-frequency signal transmitting device S2 of the second embodiment differs from the high-frequency signal transmitting device S1 of the first embodiment in that the signal via conductors 14, 24, 34 of the respective dielectric layers 1 penetrate the electromagnetically shielded space formed to vertically extend between the upper and lower surfaces of the layered substrate 2 while being inclined in a step-like manner (zigzag manner) at the same angle of inclination (i.e., along a straight line of a specified inclination). The other construction is same as in the high-frequency signal transmitting device S1 of the first embodiment.

Specifically, the signal via conductor 14 of the uppermost dielectric layer 1 is provided at a position in the grounding-conductor non-forming area 16 near the signal wiring conductor 11; the signal via conductor 34 of the bottommost dielectric layer 1 is provided at a position in the grounding-conductor non-forming area 26 near the signal wiring conductor 21; and the signal via conductors 24 of the respective intermediate dielectric layers 1 are so provided as to be successively displaced by a substantially equal distance in a plane direction from the side of the signal via conductor 14 of the uppermost dielectric layer 1 toward the side of the signal via conductor 24 of the bottommost dielectric layer 1 from top to bottom.

Here, a displacement in the plane direction between the signal via conductor 14 of the uppermost dielectric layer 1 and the signal via conductor 34 of the uppermost intermediate dielectric layer 1, a displacement in the plane direction between the signal via conductor 34 of each intermediate dielectric layer 1 and that of the intermediate dielectric layer 1 located right below, and a displacement in the plane direction between the signal via conductor 34 of the bottommost intermediate dielectric layer 1 and the signal via conductor 24 of the bottommost dielectric layer 1 are so set as to take substantially the same value. Since the positions of the respective signal via conductors 14, 24, 34 are displaced in the plane direction, the connecting conductors for signal 33 are longer in a direction of displacement than those of the first embodiment.

In this way, the signal via conductor 14 of the uppermost dielectric layer 1 is provided at the position near the signal wiring conductor 11, and the signal via conductor 24 of the bottommost dielectric layer 1 is provided at the position near the signal wiring conductor 21. Thus, the signal-wiring connecting conductors 13, 23 of the uppermost and bottommost dielectric layers 1 are shorter than those of high-frequency signal transmitting device S1 of the first embodiment and inductances created at the respective signal-wiring connecting conductors 13, 23 can be reduced. As a result, a high-frequency signal transmitting device having a good transmission characteristic in a high-frequency band can be obtained.

Figure 1C:
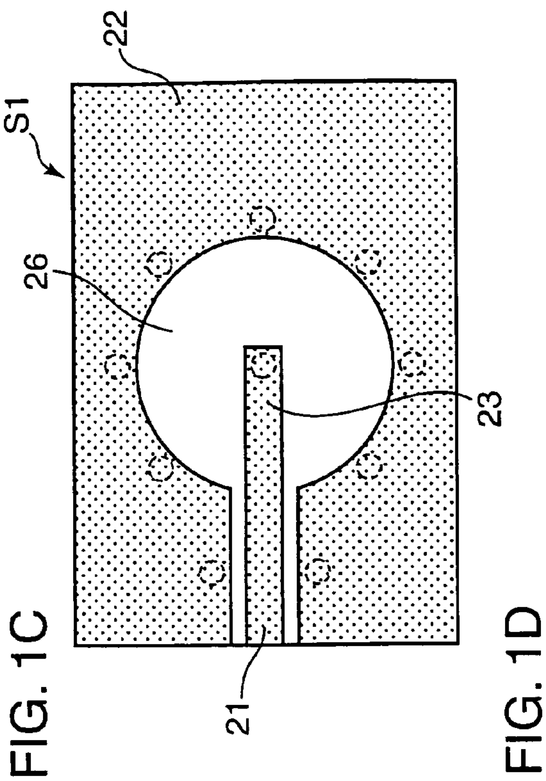
FIG. 1C is a bottom view of the high-frequency signal transmitting device of FIG. 1A.
Figure 1D:
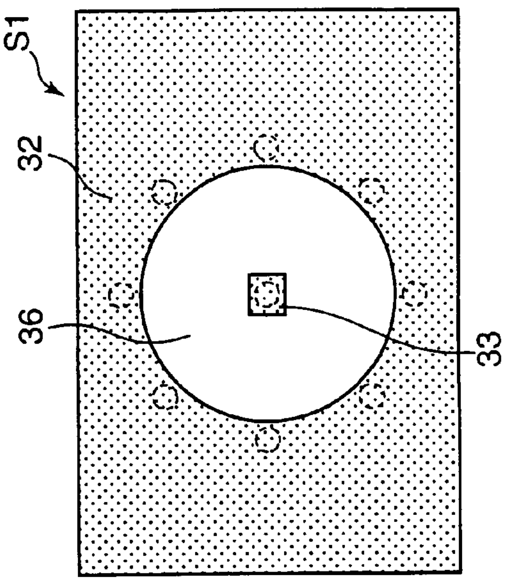
FIG. 1D is a plan view of a second dielectric layer from top in the high-frequency signal transmitting device of FIG. 1A.
Figure 1A:
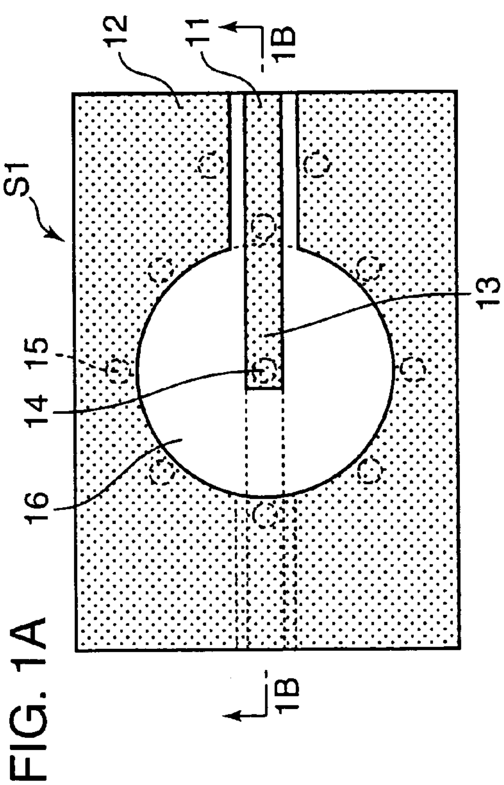
FIG. 1A is a plan view diagrammatically showing a high-frequency signal transmitting device according to a first embodiment of the invention.
Figure 1B:
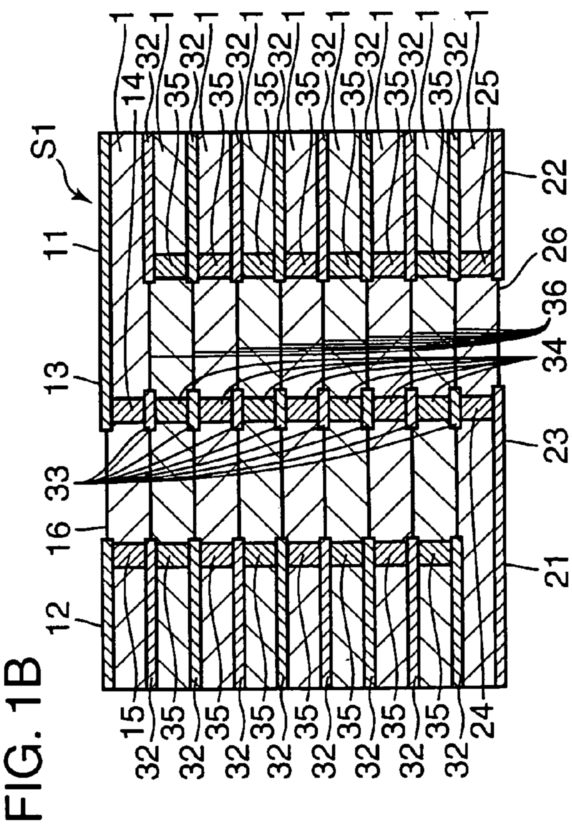
FIG. 1B is a vertical sectional view taken along the line 1B—1B of FIG. 1A.
Figure 2C:
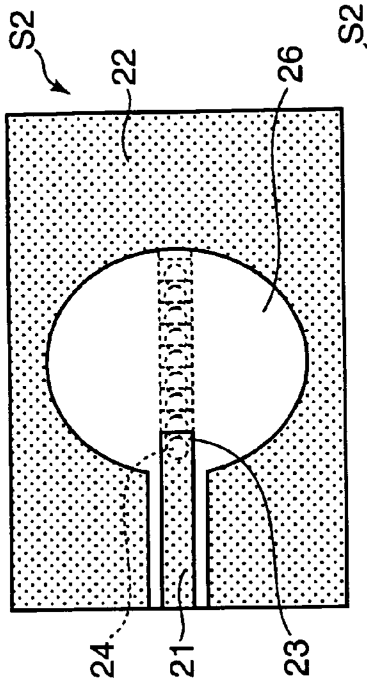
FIG. 2C is a bottom view of the high-frequency signal transmitting device of FIG. 2A.
Figure 2D:
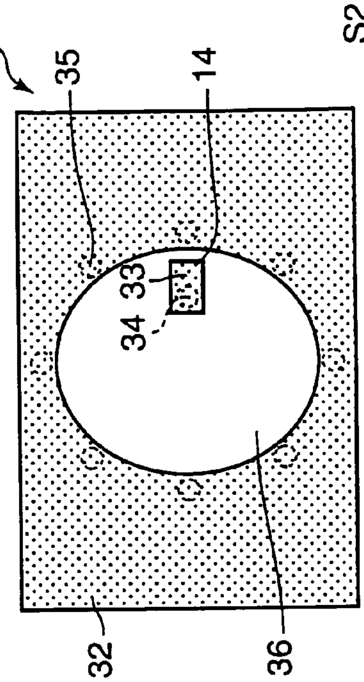
FIG. 2D is a plan view of a second dielectric layer from top in the high-frequency signal transmitting device of FIG. 2A.
Figure 2E:
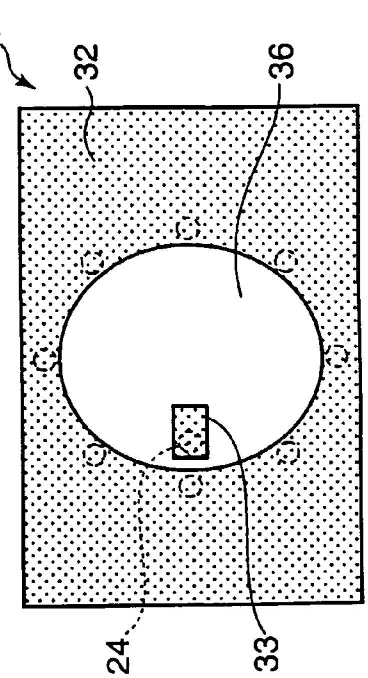
FIG. 2E is a plan view of a bottommost dielectric layer in the high-frequency signal transmitting device of FIG. 2A.
Figure 2A:
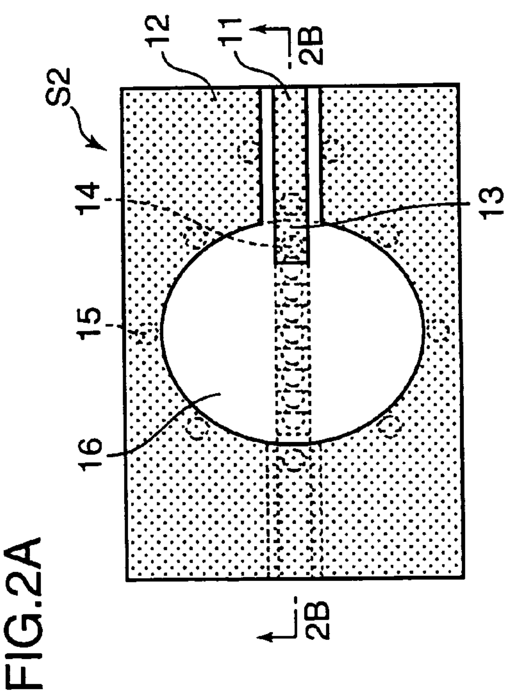
FIG. 2A is a plan view diagrammatically showing a high-frequency signal transmitting device according to a second embodiment of the invention.
Figure 2B:
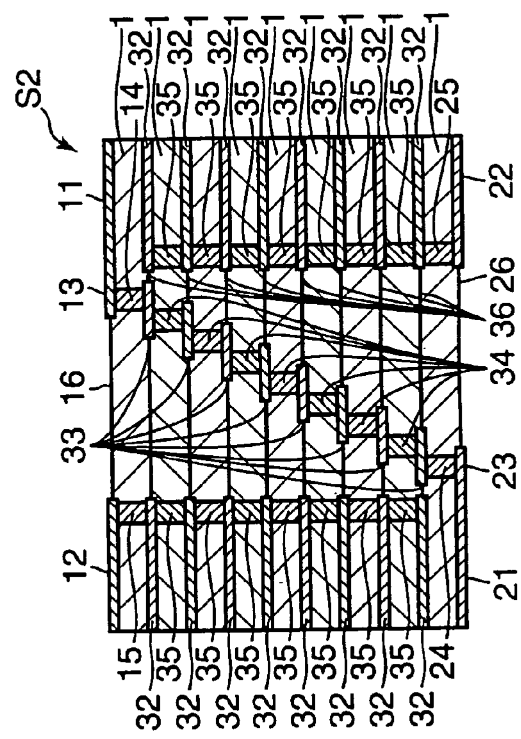
FIG. 2B is a vertical sectional view taken along the line 2B—2B of FIG. 2A.
Figure 3A:
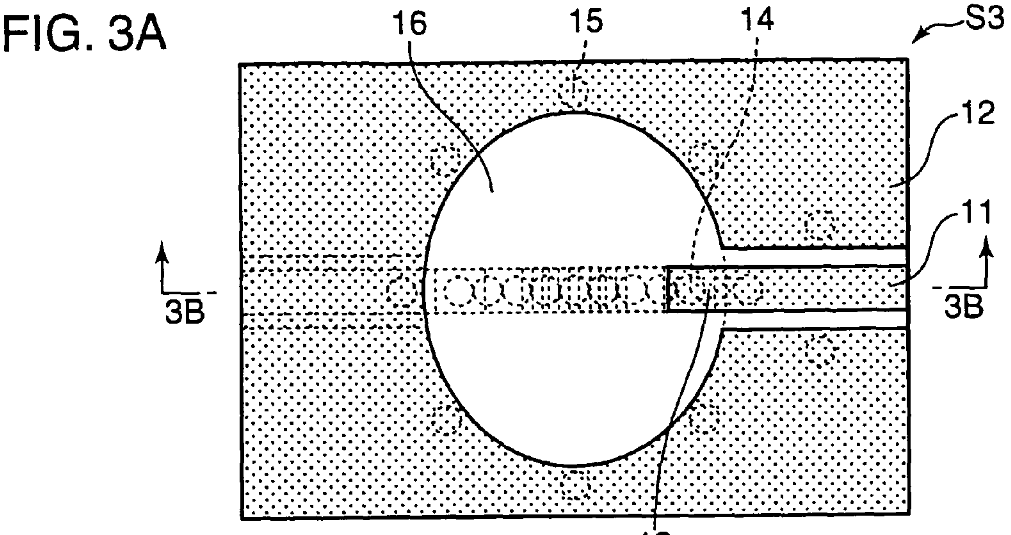
FIG. 3A is a plan view diagrammatically showing a high-frequency signal transmitting device according to a third embodiment of the invention.
Figure 3B:
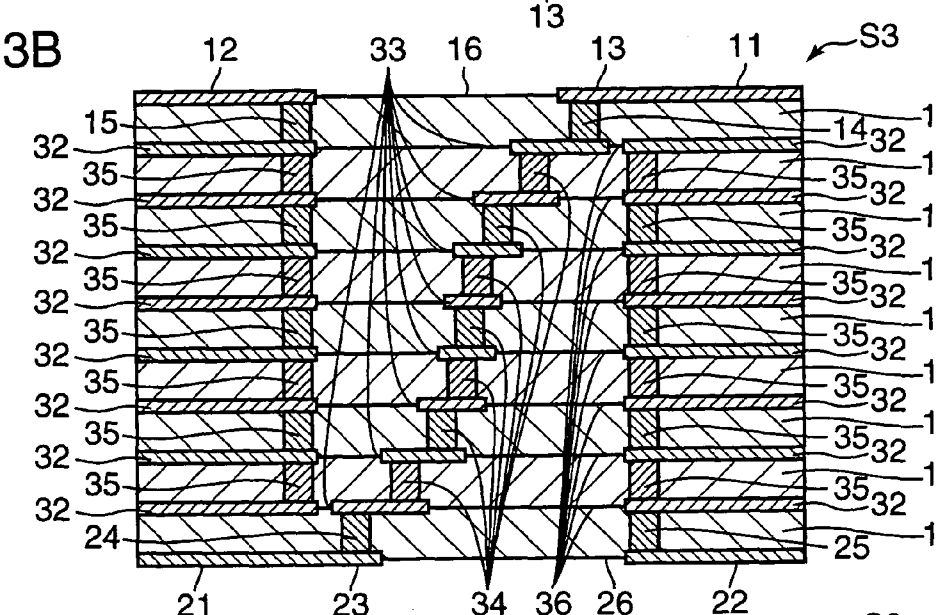
FIG. 3B is a vertical sectional view taken along the line 3B—3B of FIG. 3A.
Figure 3C:
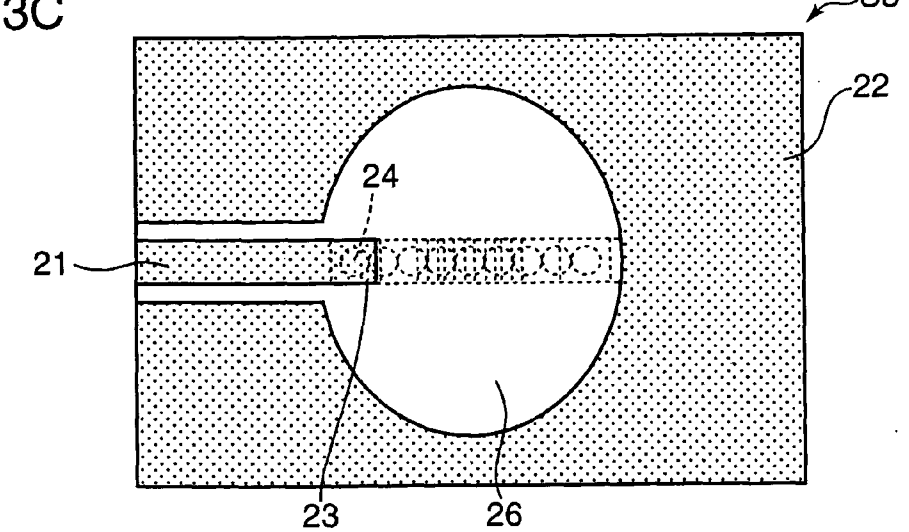
FIG. 3C is a bottom view of the high-frequency signal transmitting device of FIG. 3A.

Referring to FIGS. 3A to 3C showing a high-frequency signal transmitting device S3 according to a third embodiment of the present invention, a high-frequency signal transmitting device S3 has, in its basic construction, the same elements as the high-frequency signal transmitting device S2 according to the second embodiment shown in FIGS. 2A to 2E. Thus, no detailed description is given on the elements having the same functions by identifying them by the same reference numerals, and the following description is centered on differences to the high-frequency signal transmitting device S2 of the second embodiment.

In the high-frequency signal transmitting device S2 of the second embodiment, as described above, the signal via conductors 14, 24, 34 of the respective dielectric layers 1 penetrate the electromagnetically shielded space formed to vertically extend between the upper and lower surfaces of the layered substrate 2 while being inclined in a step-like manner (zigzag manner) at the same angle of inclination between the side of the signal wiring conductor 11 and the side of the signal wiring conductor 21.

The high-frequency signal transmitting device S3 of the third embodiment differs from the high-frequency signal transmitting device S1 of the second embodiment in that the signal via conductors 14, 24, 34 of the respective dielectric layers 1 penetrate the electromagnetically shielded space formed to vertically extend between the upper and lower surfaces of the layered substrate 2 while being inclined in such a step-like manner (zigzag manner) as to be at a larger angle of inclination at outer sides, i.e., at the sides of the uppermost and bottommost dielectric layers 1 and at a smaller angle of inclination at an inner or middle side. The other construction is same as in the high-frequency signal transmitting device S2 of the second embodiment.

Specifically, the respective signal via conductors 14, 24, 34 are so provided as to satisfy a relationship L1>L2>L3>L4 when L1 denotes a displacement in the plane direction between the signal via conductor 14 of the uppermost dielectric layer 1 and the signal via conductor 34 of the uppermost intermediate dielectric layer 1 and a displacement in the plane direction between the signal via conductor 34 of the bottommost intermediate dielectric layer 1 and the signal via conductor 24 of the bottommost dielectric layer 1; L2 denotes a displacement in the plane direction between the signal via conductor 34 of the uppermost intermediate dielectric layer 1 and that of the second intermediate dielectric layer 1 from top and a displacement in the plane direction between the signal via conductor 34 of the bottommost intermediate dielectric layer 1 and that of the second intermediate dielectric layer 1 from bottom; L3 denotes a displacement in the plane direction between the signal via conductor 34 of the second intermediate dielectric layer 1 from top and that of the third intermediate dielectric layer 1 from top and a displacement in the plane direction between the signal via conductor 34 of the second intermediate dielectric layer 1 from bottom and that of the third intermediate dielectric layer 1 from bottom, and L4 denotes a displacement in the plane direction between the signal via conductor 34 of the third intermediate dielectric layer 1 from top and that of the fourth intermediate dielectric layer 1 from top and a displacement in the plane direction between the signal via conductor 34 of the third intermediate dielectric layer 1 from bottom and that of the fourth intermediate dielectric layer 1 from bottom.

In this way, similar to the high-frequency signal transmitting device S2 of the second embodiment, the signal via conductors 14, 24 are provided at the positions near the signal wiring conductors 11, 21 also in the high-frequency signal transmitting device S3 of the third embodiment. Thus, the signal-wiring connecting conductors 13, 23 are shorter than those of high-frequency signal transmitting device S1 of the first embodiment and inductances created at the respective signal-wiring connecting conductors 13, 23 can be reduced. Further, the signal via conductors 14, 24, 34 of the respective dielectric layers 1 penetrate the electromagnetically shielded space while being inclined in such a step-like manner as to be at a larger angle of inclination at the sides of the uppermost and bottommost dielectric layers 1 and at a smaller angle of inclination at the middle side. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Figure 4A:
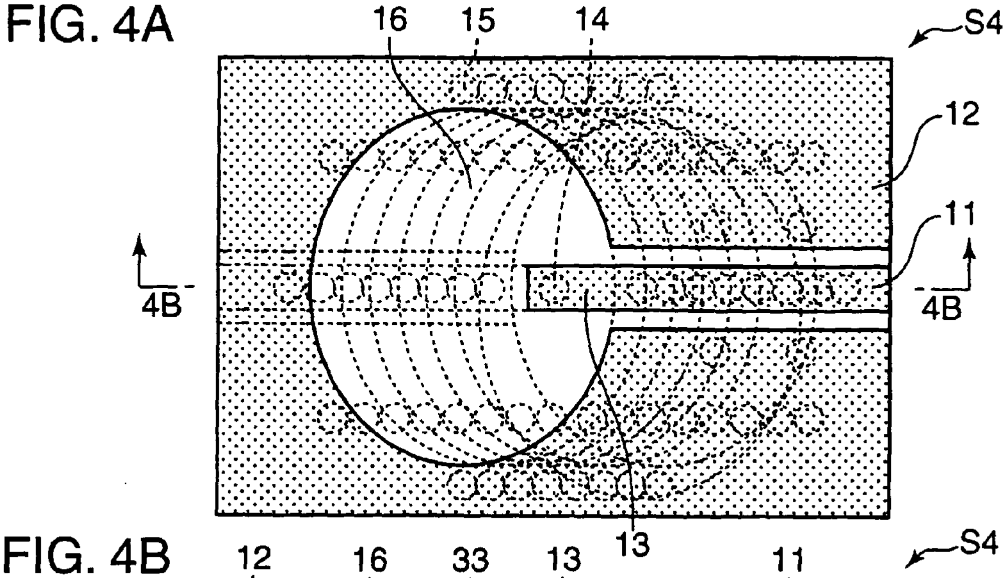
FIG. 4A is a plan view diagrammatically showing a high-frequency signal transmitting device according to a fourth embodiment of the invention.
Figure 4B:
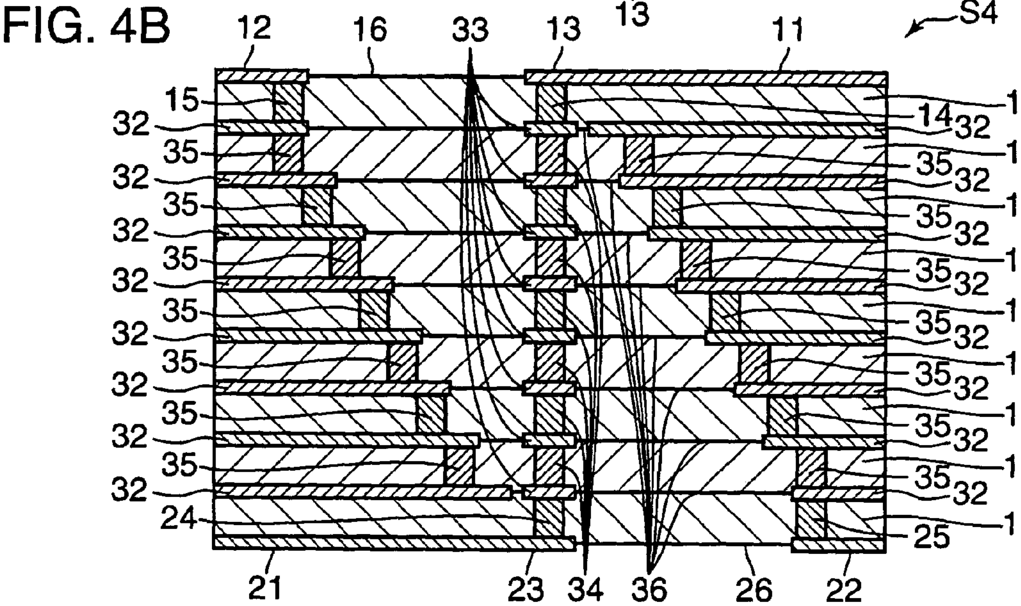
FIG. 4B is a vertical sectional view taken along the line 4B—4B of FIG. 4A.
Figure 4C:
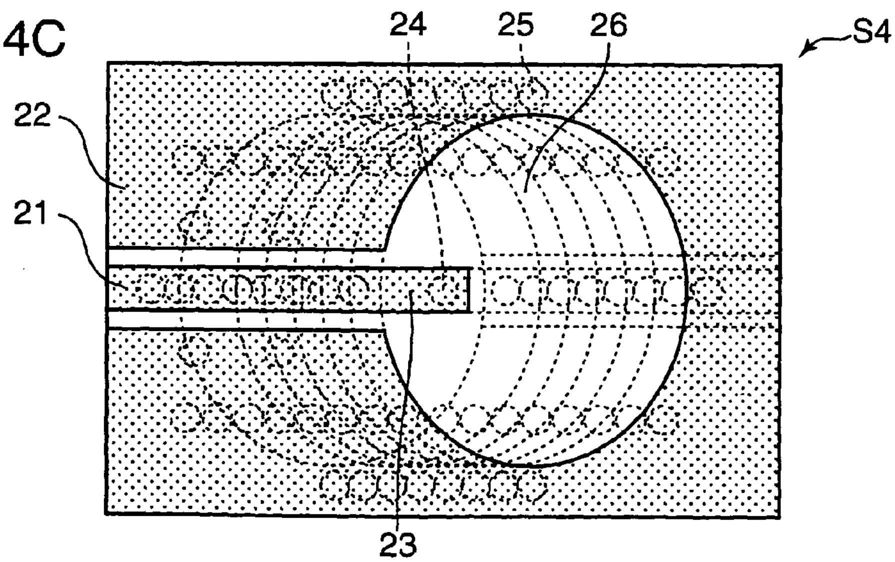
FIG. 4C is a bottom view of the high-frequency signal transmitting device of FIG. 4A.

Referring to FIGS. 4A to 4C showing a high-frequency signal transmitting device S4 according to a fourth embodiment of the present invention, a high-frequency signal transmitting device S4 has, in its basic construction, the same elements as the high-frequency signal transmitting device S1 according to the first embodiment shown in FIGS. 1A to 1D. Thus, no detailed description is given on the elements having the same functions by identifying them by the same reference numerals, and the following description is centered on differences to the high-frequency signal transmitting device S1 of the first embodiment.

As described above, the high-frequency signal transmitting device S1 of the first embodiment is constructed such that the electromagnetically shielded space is so formed as to vertically extend between the upper and lower surfaces of the layered substrate 2 by providing the grounding-conductor non-forming areas 16, 26, 36 substantially at the same positions of the respective dielectric layers 1, and the signal via conductors 14, 24, 34 of the respective dielectric layers 1 coaxially penetrate straight along the center of this electromagnetically shielded space.

The high-frequency signal transmitting device S4 of the fourth embodiment differs from the high-frequency signal transmitting device S1 of the first embodiment as follows. In the high-frequency signal transmitting device S4, the grounding-conductor non-forming area 16 on the upper surface of the uppermost dielectric layer 1 and the grounding-conductor non-forming area 36 on the upper surface of the uppermost intermediate dielectric layer 1 are provided at the same position near the other side, i.e., left side in the shown example away from the signal wiring conductor 11; the grounding-conductor non-forming areas 26 and 36 on the lower and upper surfaces of the bottommost dielectric layer 1 are provided at the same position near one side, i.e., right side in the shown example away from the signal wiring conductor 21; the grounding-conductor non-forming areas 36 on the upper surfaces of the remaining intermediate dielectric layers 1 are successively shifted to right in the shown example by the same amount of displacement from top to bottom, whereby the electromagnetically shielded space is formed to obliquely extend between the upper and lower surfaces of the layered substrate 2; and the signal via conductors 14, 24, 34 vertically penetrate this electromagnetically shielded space along the same axis. The other conduction is similar to that of the high-frequency signal transmitting device S1 of the first embodiment.

In this way, the high-frequency signal transmitting device S4 of the fourth embodiment is constructed such that the electromagnetically shielded space obliquely extends between the upper and lower surfaces of the layered substrate 2 by successively displacing the grounding-conductor non-forming areas 36 on the upper surfaces of the respective intermediate dielectric layers 1 and on the upper surface of the bottommost dielectric layer 1 from left to right in the shown example by the same amount from top to bottom, and the signal via conductors 14, 24, 34 vertically penetrate this electromagnetically shielded space along the same axis.

Thus, the signal via conductor 14 of the uppermost dielectric layer 1 is present at the position near the signal wiring conductor 11 and the via conductor 24 for signal of the bottommost dielectric layer 1 is present at the position near the signal wiring conductor 21, with the result that the lengths of the signal wiring conductors 13, 23 of the uppermost and bottommost dielectric layers 1 are shorter as compared to the first embodiment. Therefore, inductances created at the respective signal-wiring connecting conductors 13, 23 can be reduced, and a high-frequency signal transmitting device having a good transmission characteristic in a high-frequency band can be obtained.

Figure 5A:
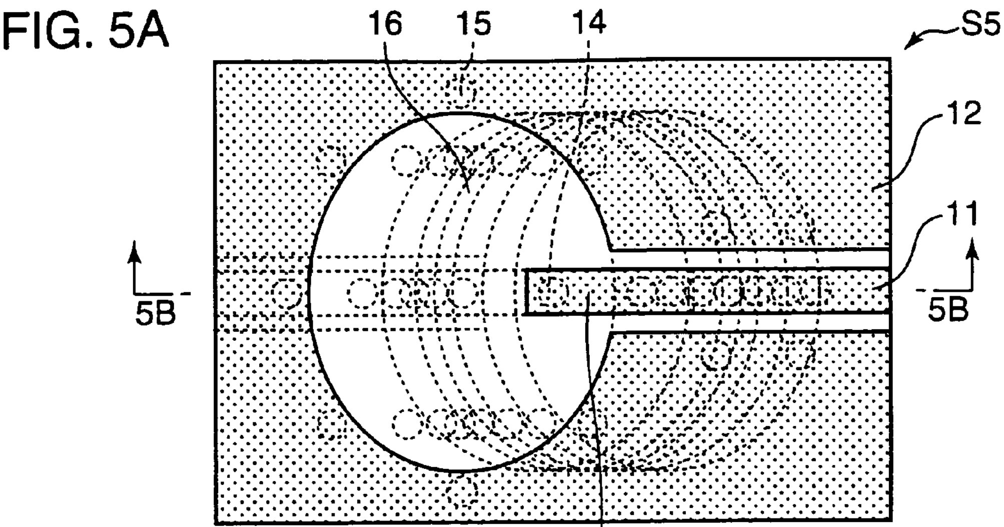
FIG. 5A is a plan view diagrammatically showing a high-frequency signal transmitting device according to a fifth embodiment of the invention.
Figure 5B:
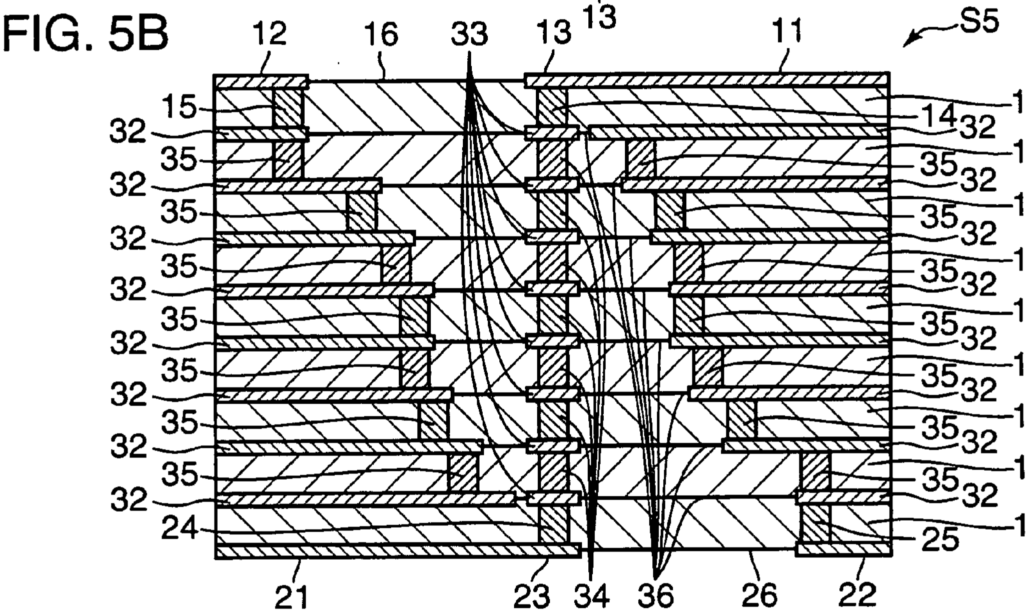
FIG. 5B is a vertical sectional view taken along the line 5B—5B of FIG. 5A.
Figure 5C:
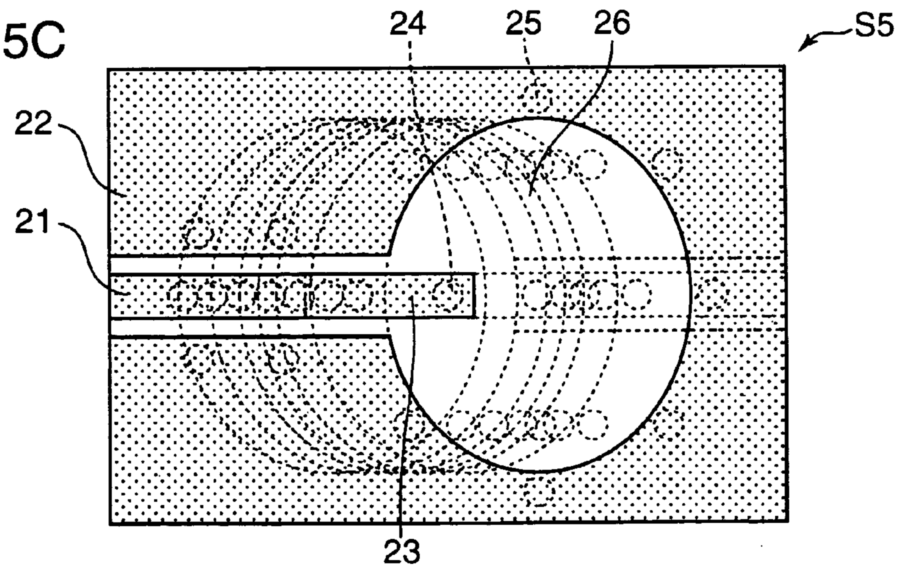
FIG. 5C is a bottom view of the high-frequency signal transmitting device of FIG. 5A.

Referring to FIGS. 5A to 5C showing a high-frequency signal transmitting device S5 according to a fifth embodiment of the present invention, a high-frequency signal transmitting device S5 has, in its basic construction, the same elements as the high-frequency signal transmitting device S4 according to the fourth embodiment shown in FIGS. 4A to 4C. Thus, no detailed description is given on the elements having the same functions by identifying them by the same reference numerals, and the following description is centered on differences to the high-frequency signal transmitting device S4 of the fourth embodiment.

As described above, the high-frequency signal transmitting device S4 of the fourth embodiment is constructed such that the electromagnetically shielded space obliquely extends between the upper and lower surfaces of the layered substrate 2 by successively displacing the positions of the grounding-conductor non-forming areas 16, 26, 36 from left to right in the shown example by the same amount from top to bottom, and the signal via conductors 14, 24, 34 vertically penetrate this electromagnetically shielded space along the same axis.

The high-frequency signal transmitting device S5 of the fifth embodiment differs from the high-frequency signal transmitting device S4 of the fourth embodiment as follows. In the high-frequency signal transmitting device S5, the electromagnetically shielded space is formed to extend in a bent manner in an oblique direction between the upper and lower surfaces of the layered substrate 2 by successively displacing the grounding-conductor non-forming areas 16, 26, 36 of the respective dielectric layers 1 from left to right in the shown example such that the displacement is larger at the sides of the uppermost and bottommost dielectric layers 1 while being smaller at the inner side. The other conduction is similar to that of the high-frequency signal transmitting device S4 of the fourth embodiment.

Thus, the respective grounding-conductor non-forming areas 16, 26, 36 are so provided as to satisfy a relationship D1>D2>D3>D4 when D1 denotes a displacement between the grounding-conductor non-forming area 36 on the upper surface of the uppermost intermediate dielectric layer 1 located at the same position as the grounding-conductor non-forming area 16 on the upper surface of the uppermost dielectric layer 1 and that on the upper surface of the second intermediate dielectric layer 1 from top and a displacement between the grounding-conductor non-forming area 36 on the upper surface of the bottommost dielectric layer 1 located at the same position as the grounding-conductor non-forming area 26 on the lower surface of the bottommost dielectric layer 1 and that on the upper surface of the bottommost intermediate dielectric layer 1; D2 denotes a displacement between the grounding-conductor non-forming area 36 on the upper surface of the second intermediate dielectric layer 1 from top and that on the upper surface of the third intermediate dielectric layer 1 from top and a displacement between the grounding-conductor non-forming area 36 on the upper surface of the second intermediate dielectric layer 1 from bottom and that on the upper surface of the third intermediate dielectric layer 1 from bottom; D3 denotes a displacement between the grounding-conductor non-forming area 36 on the upper surface of the third intermediate dielectric layer 1 from top and that on the upper surface of the fourth intermediate dielectric layer 1 from top and a displacement between the grounding-conductor non-forming area 36 on the upper surface of the third intermediate dielectric layer 1 from bottom and that on the upper surface of the fourth intermediate dielectric layer 1 from bottom; and D4 denotes a displacement between the grounding-conductor non-forming area 36 on the upper surface of the fourth intermediate dielectric layer 1 from top and that on the upper surface of the fifth intermediate dielectric layer 1 from top.

Similar to the high-frequency signal transmitting device S4 of the fourth embodiment, the lengths of the signal wiring conductors 13, 23 of the uppermost and bottommost dielectric layers 1 are also shorter in the high-frequency signal transmitting device S5 of the fifth embodiment as compared to the first embodiment. Thus, inductances created at the respective signal-wiring connecting conductors 13, 23 can be reduced. Further, since the electromagnetically shielded space is formed while being bent in the oblique direction, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Figure 6A:
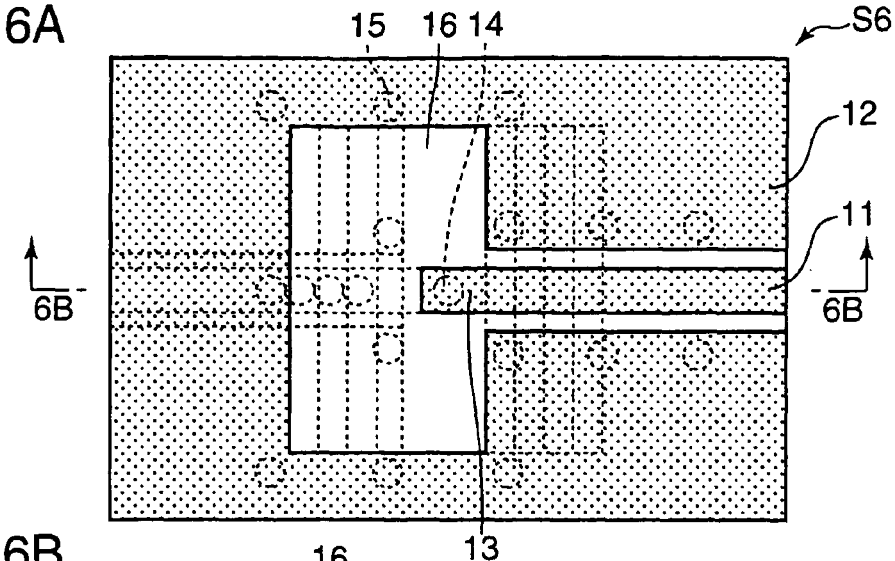
FIG. 6A is a plan view diagrammatically showing a high-frequency signal transmitting device according to a sixth embodiment of the invention.
Figure 6B:
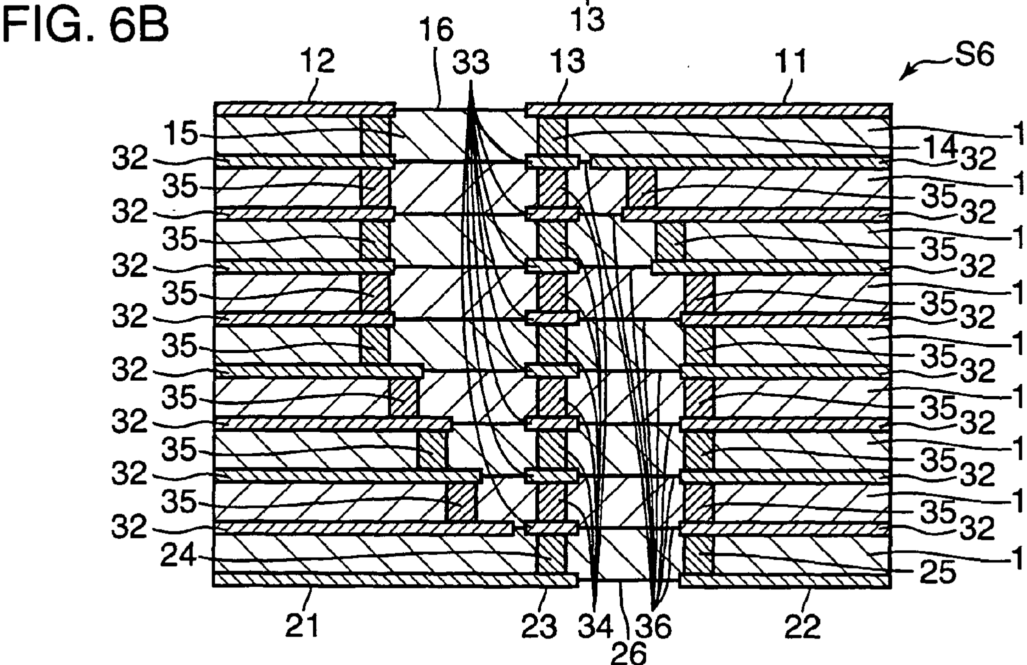
FIG. 6B is a vertical sectional view taken along the line 6B—6B of FIG. 6A.
Figure 6C:
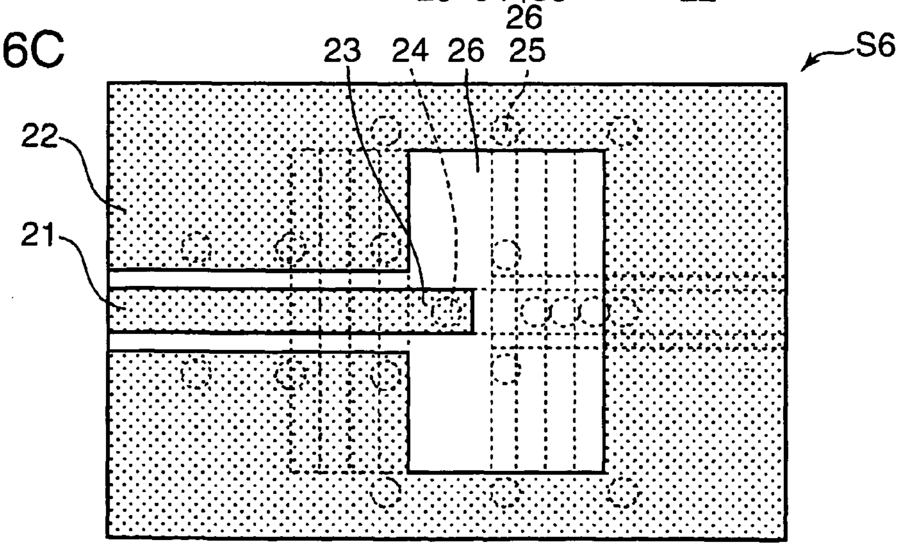
FIG. 6C is a bottom view of the high-frequency signal transmitting device of FIG. 6A.

Referring to FIGS. 6A to 6C showing a high-frequency signal transmitting device S6 according to a sixth embodiment of the present invention, a high-frequency signal transmitting device S6 has, in its basic construction, the same elements as the high-frequency signal transmitting device S4 according to the fourth embodiment. Thus, no detailed description is given on the elements having the same functions by identifying them by the same reference numerals, and the following description is centered on differences to the high-frequency signal transmitting device S4 of the fourth embodiment.

As described above, the high-frequency signal transmitting device S4 of the fourth embodiment is constructed such that the electromagnetically shielded space obliquely extends between the upper and lower surfaces of the layered substrate 2 by successively displacing the positions of the grounding-conductor non-forming areas 16, 26, 36 in the same direction from top to bottom, and the signal via conductors 14, 24, 34 vertically penetrate this electromagnetically shielded space along the same axis.

The high-frequency signal transmitting device S6 of the sixth embodiment differs from the high-frequency signal transmitting device S4 of the fourth embodiment as follows. In the high-frequency signal transmitting device S6, the grounding-conductor non-forming area 16 on the upper surface of the uppermost dielectric layer 1 and the grounding-conductor non-forming area 36 on the upper surface of the uppermost intermediate dielectric layer 1 are provided at the same position near the other end, i.e., left side of the dielectric layers 1 in the shown example; the grounding-conductor non-forming area 26 and the grounding-conductor non-forming area 36 on the lower and upper surfaces of the bottommost dielectric layer 1 are provided at the same position near one end, i.e., right side of the dielectric layers 1 in the shown example; and the electromagnetically shielded space is formed to extend obliquely between the upper and lower surfaces of the layered substrate 2 by increasing the lengths of the grounding-conductor non-forming areas 36 on the upper surfaces of the respective intermediate dielectric layers 1 between the one and the other sides (lengths along a direction between the signal wiring conductors 11 and 21 in plan views) from the uppermost layer toward the middle layer and from the bottommost layer toward the middle layer and lower side, i.e., outer sides toward the inner side to increase the areas of the grounding-conductor non-forming areas 36, and the signal via conductors 14, 24, 34 vertically penetrate the electromagnetically shielded space along the same axis The other conduction is similar to that of the high-frequency signal transmitting device S4 of the fourth embodiment.

Specifically, the grounding-conductor non-forming area 16 on the upper surface of the uppermost dielectric layer 1 and the grounding-conductor non-forming area 36 on the upper surface of the uppermost intermediate dielectric layer 1 are of the same size and provided at the same position near the left side, i.e., the other end of the dielectric layers 1 in the shown example, and the grounding-conductor non-forming areas 26, 36 on the lower and upper surfaces of the bottommost dielectric layer 1 are of the same size and provided at the same position near the right side, i.e., the one end of the dielectric layers 1 in the shown example.

Further, the grounding-conductor non-forming areas 36 on the upper surfaces of the second and third intermediate dielectric layers 1 from top have their right end positions, i.e., end positions at one side successively moved to right from the upper to the lower layers while having their left end positions, i.e., end positions at the other side fixed, thereby successively increasing the areas of the grounding-conductor non-forming areas 36.

Similarly, the grounding-conductor non-forming areas 36 on the upper surfaces of the second and third intermediate dielectric layers 1 from bottom have their left end positions, i.e., end positions at the other side successively moved to left by the same length from the lower to the upper layers while having their right end positions, i.e., end positions at the one side fixed, thereby successively increasing the areas of the grounding-conductor non-forming areas 36.

It should be noted that the other end of the grounding-conductor non-forming area 36 on the upper surface of the middle intermediate dielectric layer 1 (fourth intermediate dielectric layer 1 both from top and from bottom) is located at the same position as the corresponding ends of the grounding-conductor non-forming areas 36 on the upper surfaces of the second and third intermediate dielectric layers 1 from top while the one end thereof is located at the same position as the corresponding ends of the grounding-conductor non-forming areas 36 on the upper surface of the second and third intermediate dielectric layers 1 from bottom.

In this way, in the high-frequency signal transmitting device S6, the grounding-conductor non-forming area 16 on the upper surface of the uppermost dielectric layer 1 and the grounding-conductor non-forming area 36 on the upper surface of the uppermost intermediate dielectric layer 1 are provided at the same position near the other end, i.e., left side of the dielectric layers 1 in the shown example; the grounding-conductor non-forming area 26 and the grounding-conductor non-forming area 36 on the lower and upper surfaces of the bottommost dielectric layer 1 are provided at the same position near the one end, i.e., right side of the dielectric layers 1 in the shown example; the electromagnetically shielded space is formed to extend obliquely between the upper and lower surfaces of the layered substrate 2 by increasing the dimensions of the grounding-conductor non-forming areas 36 of the respective intermediate dielectric layers 1 between the one and the other ends by the same length from the upper layers toward the middle layers and from the lower layers toward the middle layers to increase the areas of the grounding-conductor non-forming areas 36; and the signal via conductors 14, 24, 34 vertically penetrate this electromagnetically shielded space along the same axis.

Thus, the signal via conductor 14 of the uppermost dielectric layer 1 is present at the position near the signal wiring conductor 11 and the via conductor 24 for signal of the bottommost dielectric layer 1 is present at the position near the signal wiring conductor 21, with the result that the lengths of the signal wiring conductors 13, 23 of the uppermost and bottommost dielectric layers 1 are shorter as compared to the first embodiment. Therefore, inductances created at the respective signal-wiring connecting conductors 13, 23 can be reduced, and a high-frequency signal transmitting device having a good transmission characteristic in a high-frequency band can be obtained.

The grounding-conductor non-forming areas 16, 26, 36 in the high-frequency signal transmitting device S4 of the fourth embodiment take an elliptical shape, whereas those 16, 26, 36 of the high-frequency signal transmitting device S6 of the sixth embodiment take a rectangular shape in order to make their areas changeable on the planes of the dielectric layers 1. However, this shape difference has no substantial influence on the high-frequency transmission characteristic. In other words, the grounding-conductor non-forming areas 16, 26, 36 preferably take such shapes substantially symmetrical with respect to two mutually orthogonal axial directions such as circular shapes, elliptical shapes and rectangular shapes in all the embodiments described in this specification.

Figure 7A:
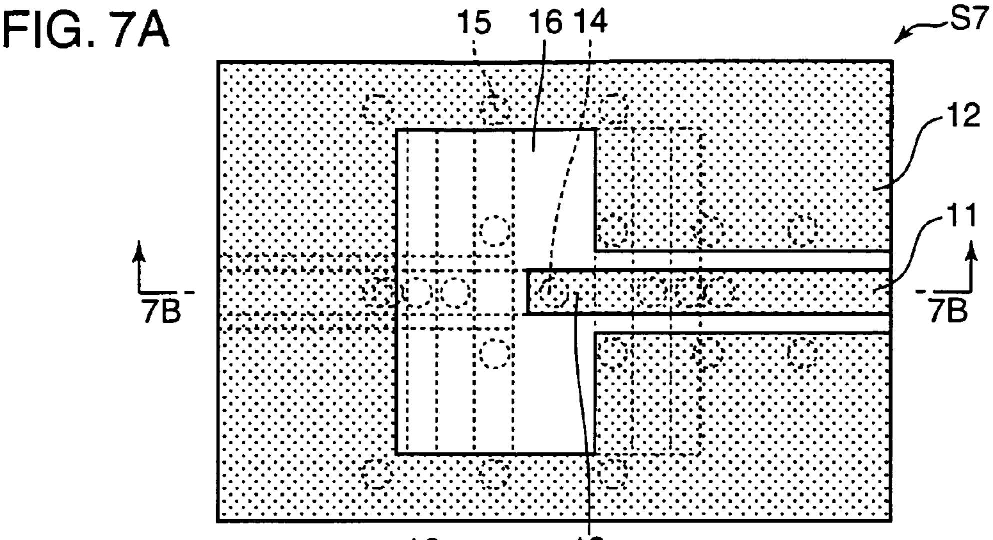
FIG. 7A is a plan view diagrammatically showing a high-frequency signal transmitting device according to a seventh embodiment of the invention.
Figure 7B:
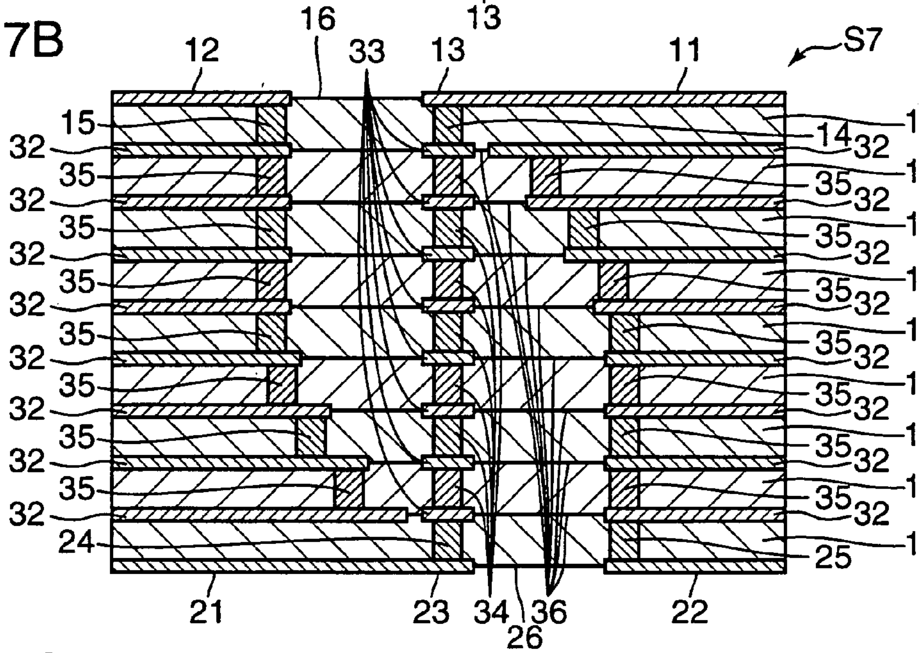
FIG. 7B is a vertical sectional view taken along the line 7B—7B of FIG. 7A.
Figure 7C:
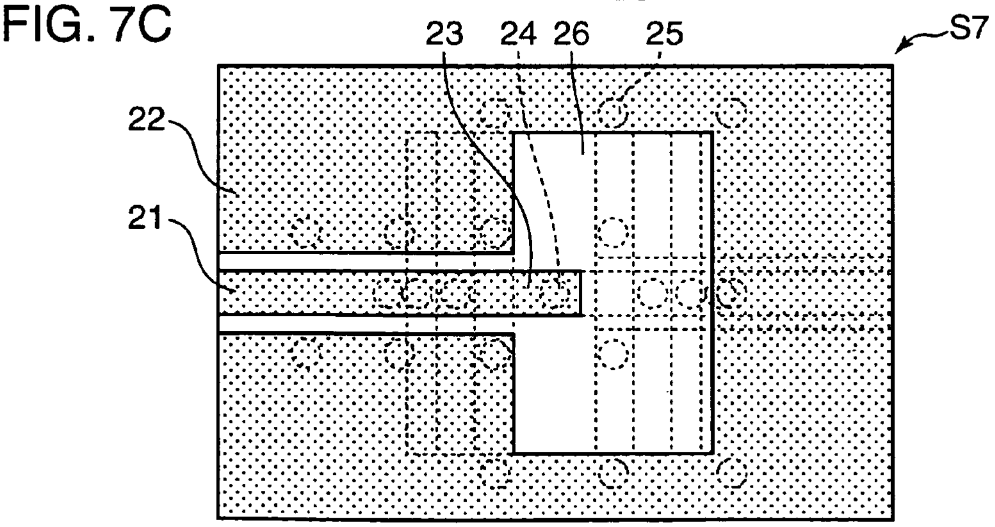
FIG. 7C is a bottom view of the high-frequency signal transmitting device of FIG. 7A.

Referring to FIGS. 7A to 7C showing a high-frequency signal transmitting device S7 according to a seventh embodiment of the present invention, a high-frequency signal transmitting device S7 has, in its basic construction, the same elements as the high-frequency signal transmitting device S6 according to the sixth embodiment shown in FIGS. 6A to 6C. Thus, no detailed description is given on the elements having the same functions by identifying them by the same reference numerals, and the following description is centered on differences to the high-frequency signal transmitting device S6 of the sixth embodiment.

As described above, the high-frequency signal transmitting device S6 of the sixth embodiment is constructed such that the electromagnetically shielded space obliquely extends between the upper and lower surfaces of the layered substrate 2 by increasing the dimensions of the grounding-conductor non-forming areas 36 of the intermediate dielectric layers 1 between the one and the other ends by the same length from the upper layers toward the middle layers and from the lower layers toward the middle layers of the layered substrate 2, and the signal via conductors 14, 24, 34 vertically penetrate this electromagnetically shielded space along the same axis.

Similar to the high-frequency signal transmitting device S6 of the sixth embodiment, the high-frequency signal transmitting device S7 of the seventh embodiment is constructed such that the electromagnetically shielded space obliquely extends between the upper and lower surfaces of the layered substrate 2 by increasing the dimensions of the grounding-conductor non-forming areas 36 of the intermediate dielectric layers 1 between the one and the other ends from the upper layers toward the middle layers and from the lower layers toward the middle layers of the layered substrate 2 to increase the areas thereof, and the signal via conductors 14, 24, 34 vertically penetrate this electromagnetically shielded space along the same axis. The high-frequency signal transmitting device S7 differs from the high-frequency signal transmitting device S6 in that changing values of the dimensions of the grounding-conductor non-forming areas 36 between the one and the other sides from the upper layers toward the middle layers and from the lower layers toward the middle layers of the layered substrate 2 is made smaller from the outer sides toward the inner side. The other conduction is similar to that of the high-frequency signal transmitting device S6 of the sixth embodiment.

Specifically, the grounding-conductor non-forming areas 36 on the upper surfaces of the second to fourth intermediate dielectric layers 1 from top have their dimensions between the one and the other sides more elongated than those of the high-frequency signal transmitting device S6 of the sixth embodiment to have larger areas, and the grounding-conductor non-forming areas 36 on the upper surfaces of the first to third intermediate dielectric layers 1 from bottom have their dimensions between the one and the other sides more elongated than those of the high-frequency signal transmitting device S6 of the sixth embodiment to have larger areas.

In this way, in the high-frequency signal transmitting device S7 of the second embodiment, the changing values of the dimensions between the one and the other sides of the grounding-conductor non-forming areas 36 of the intermediate dielectric layers 1 are made smaller from the upper layers toward the middle layers and from the lower layers toward the middle layers of the layered substrate 2 as compared to the high-frequency signal transmitting device S6 of the sixth embodiment. Thus, discontinuity of impedance in the propagation of a high-frequency signal between the outer side and the inner side can be improved, with the result that a high-frequency signal transmitting device having a good transmission characteristic in a high-frequency band can be obtained.

Figure 8A:
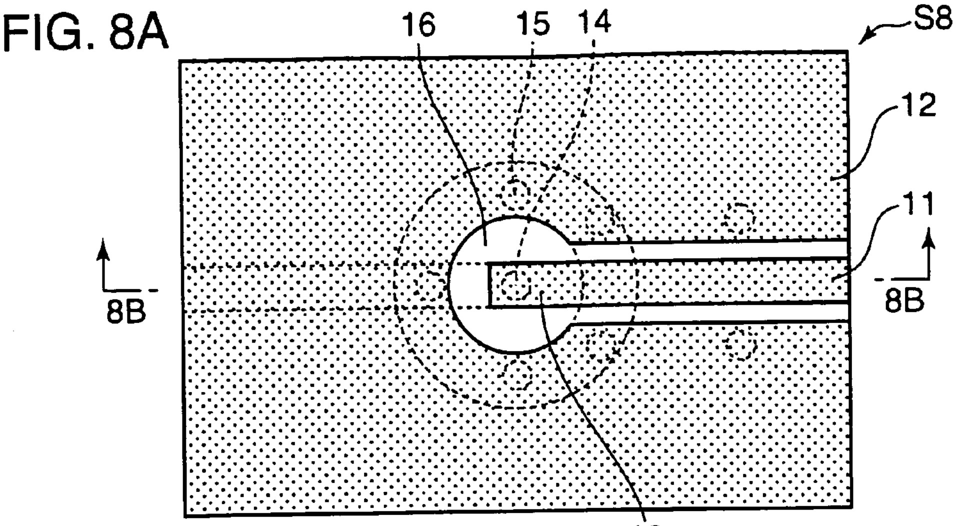
FIG. 8A is a plan view diagrammatically showing a high-frequency signal transmitting device according to an eighth embodiment of the invention.
Figure 8B:
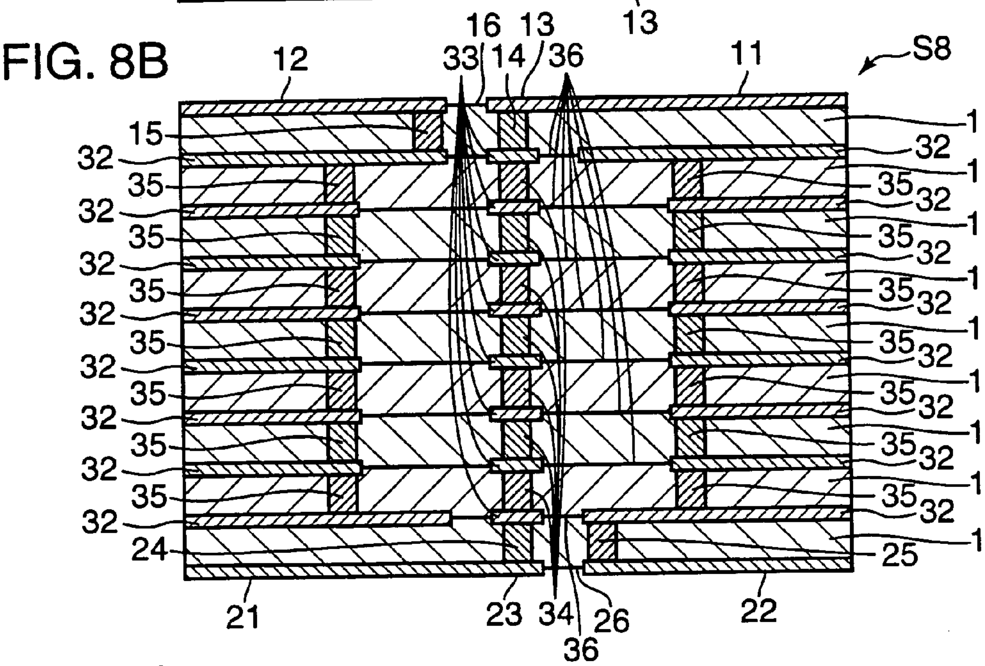
FIG. 8B is a vertical sectional view taken along the line 8B—8B of FIG. 8A.
Figure 8C:
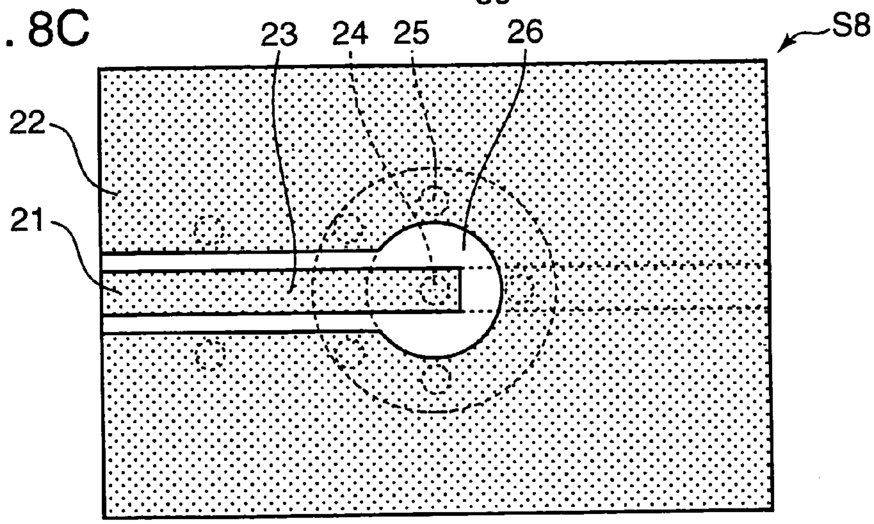
FIG. 8C is a bottom view of the high-frequency signal transmitting device of FIG. 8A.

Referring to FIGS. 8A to 8C showing a high-frequency signal transmitting device S8 according to an eighth embodiment of the present invention, a high-frequency signal transmitting device S8 has, in its basic construction, the same elements as the high-frequency signal transmitting device S1 according to the first embodiment. Thus, no detailed description is given on the elements having the same functions by identifying them by the same reference numerals, and the following description is centered on differences to the high-frequency signal transmitting device S1 of the first embodiment.

As described above, the high-frequency signal transmitting device S1 of the first embodiment is constructed such that the electromagnetically shielded space vertically extend between the upper and lower surfaces of the layered substrate 2 by providing the grounding-conductor non-forming areas 16, 26, 36 of the substantially same size at the same position of the respective dielectric layers 1 and the signal via conductors 14, 24, 34 of the respective dielectric layers 1 penetrate straight along the same axis in the center of this electromagnetically shielded space.

The high-frequency signal transmitting device S8 of the eighth embodiment differs from the high-frequency signal transmitting device S1 of the first embodiment as follows. In the high-frequency signal transmitting device S8, the grounding-conductor non-forming area 16 on the upper surface of the uppermost dielectric layer 1, the grounding-conductor non-forming area 36 on the upper surface of the uppermost intermediate dielectric layer 1, the grounding-conductor non-forming areas 26, 36 on the lower and upper surfaces of the bottommost dielectric layer 1 are formed to be of the same size and to be concentric with, but have a smaller diameter than the grounding-conductor non-forming areas 36 of the other intermediate dielectric layers 1, thereby having a smaller area. Thus, the grounding-conductor via conductors 15, 25 of the uppermost and bottommost dielectric layers 1 are provided at positions closer to the centers of the dielectric layers 1 than the grounding-conductor via conductors 35 of the respective intermediate dielectric layers 1. The other conduction is similar to that of the high-frequency signal transmitting device S1 of the first embodiment.

In this way, since the grounding-conductor non-forming area 16, 36 on the upper surfaces of the uppermost dielectric layer 1 and the uppermost intermediate dielectric layer 1 and the grounding-conductor non-forming area 26, 36 on the lower and upper surfaces of the bottommost dielectric layer 1 are formed to be concentric with and smaller than the grounding-conductor non-forming areas 36 of the other dielectric layers 1, the length of the signal-wiring connecting conductor 13 on the upper surface of the uppermost dielectric layer 1 which is the conductive portion not opposed to the grounding conductor 32 of the dielectric layer 1 located immediately therebelow in the thickness direction and the length of the signal-wiring connecting conductor 23 on the lower surface of the bottommost dielectric layer 1 which is the conductive portion not opposed to the grounding conductor 32 on the upper surface of the bottommost dielectric layer 1 in the thickness direction are shorter as compared to those of the high-frequency signal transmitting device S1 of the first embodiment. Thus, inductances created at the respective signal-wiring connecting conductors 13, 23 can be reduced, with the result that a high-frequency signal transmitting device having a good transmission characteristic in a high-frequency band can be obtained.

Figure 9A:
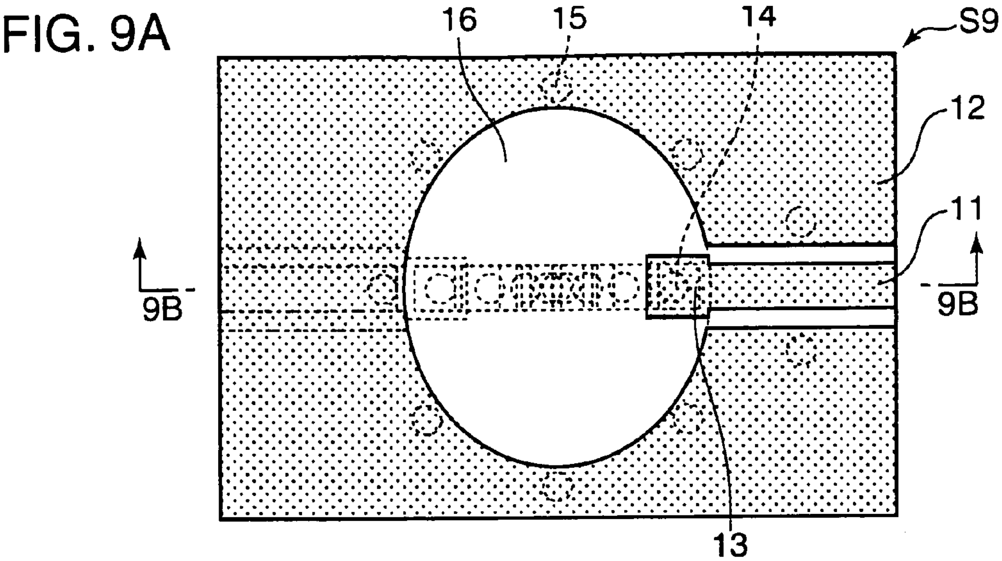
FIG. 9A is a plan view diagrammatically showing a high-frequency signal transmitting device according to a ninth embodiment of the invention.
Figure 9B:
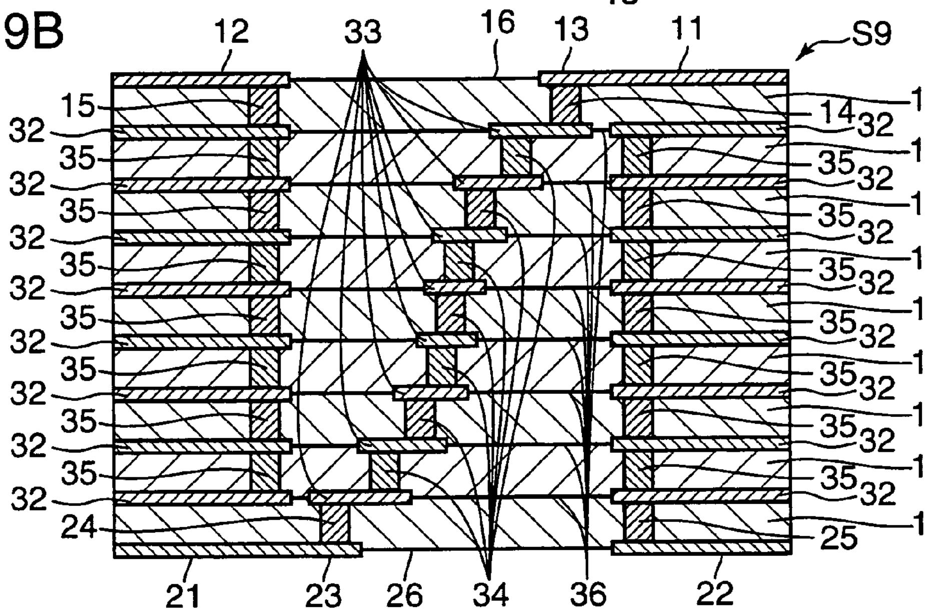
FIG. 9B is a vertical sectional view taken along the line 9B—9B of FIG. 9A.
Figure 9C:
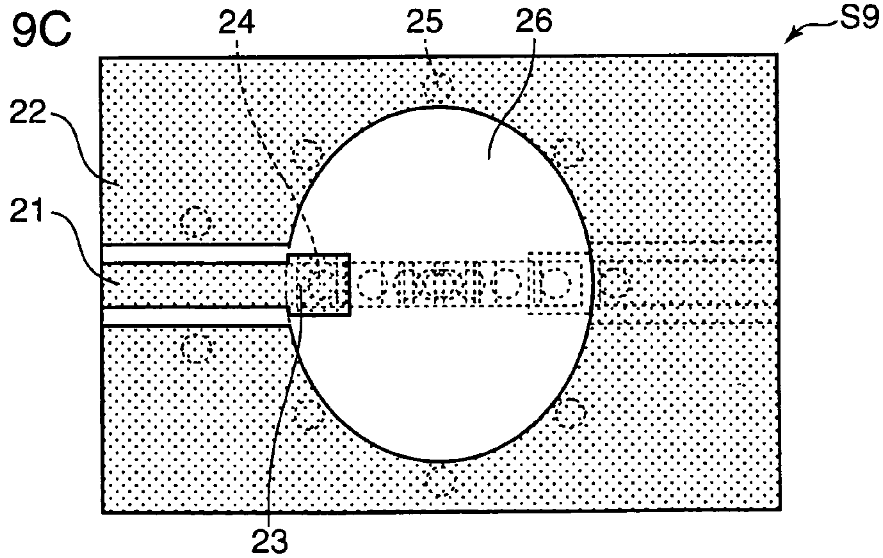
FIG. 9C is a bottom view of the high-frequency signal transmitting device of FIG. 9A.

Referring to FIGS. 9A to 9C showing a high-frequency signal transmitting device S9 according to a ninth embodiment of the present invention, a high-frequency signal transmitting device S9 has, in its basic construction, the same elements as the high-frequency signal transmitting device S3 according to the third embodiment shown in FIGS. 3A to 3C. Thus, no detailed description is given on the elements having the same functions by identifying them by the same reference numerals, and the following description is centered on differences to the high-frequency signal transmitting device S3 of the third embodiment.

As described above, the high-frequency signal transmitting device S3 of the third embodiment is constructed such the signal via conductors 14, 24, 34 of the respective dielectric layers 1 are shifted by different amounts of displacement in the plane direction so as to penetrate the electromagnetically shielded space formed to vertically extend between the upper and lower surfaces of the layered substrate 2 while being inclined in such a step-like manner as to be at a larger angle of inclination at the sides of the uppermost and bottommost dielectric layers 1 and at a smaller angle of inclination at the middle side.

Similar to the high-frequency signal transmitting device S3 of the third embodiment, the signal via conductors 14, 24, 34 of the respective dielectric layers 1 are shifted by different amounts of displacement in the plane direction so as to penetrate the electromagnetically shielded space formed to vertically extend between the upper and lower surfaces of the layered substrate 2 while being inclined in such a step-like manner as to be at a larger angle of inclination at the sides of the uppermost and bottommost dielectric layers 1 and at a smaller angle of inclination at the middle side in the high-frequency signal transmitting device S9 of the ninth embodiment. However, the high-frequency signal transmitting device S9 differs from the high-frequency signal transmitting device S3 of the third embodiment in that the signal-wiring connecting conductor 13 on the upper surface of the uppermost dielectric layer 1 and the one 23 on the lower surface of the bottommost dielectric layer 1 are formed wider than the signal wiring conductors 11, 21. The other conduction is similar to that of the high-frequency signal transmitting device S3 of the third embodiment.

In this way, since the signal-wiring connecting conductor 13 on the upper surface of the uppermost dielectric layer 1 and the one 23 on the lower surface of the bottommost dielectric layer 1 are formed wider than the signal wiring conductors 11, 21, inductances created at the respective signal-wiring connecting conductors 13, 23 can be reduced. As a result, a high-frequency signal transmitting device having a good transmission characteristic in a high-frequency band can be obtained.

The construction of forming the signal-wiring connecting conductors 13, 23 wider is also applicable to all the other embodiments including those in which the displacements of the signal via conductors 14, 24, 34 of the respective dielectric layers 1 in the plane direction take substantially the same value, and enables inductances created at the signal-wiring connecting conductors 13, 23 to be reduced and the transmission characteristic in the high-frequency band to be better.

Figure 10A:
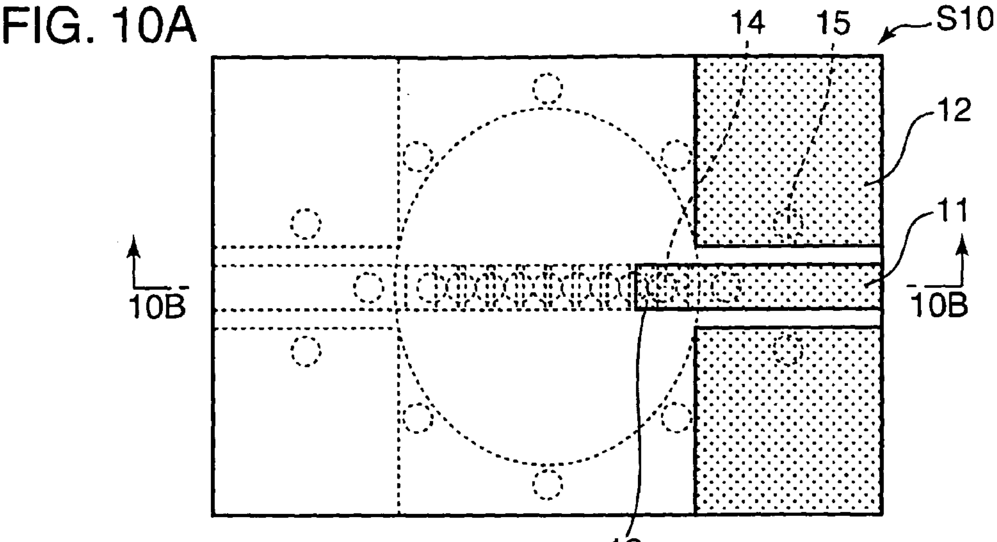
FIG. 10A is a plan view diagrammatically showing a high-frequency signal transmitting device according to a tenth embodiment of the invention.
Figure 10B:
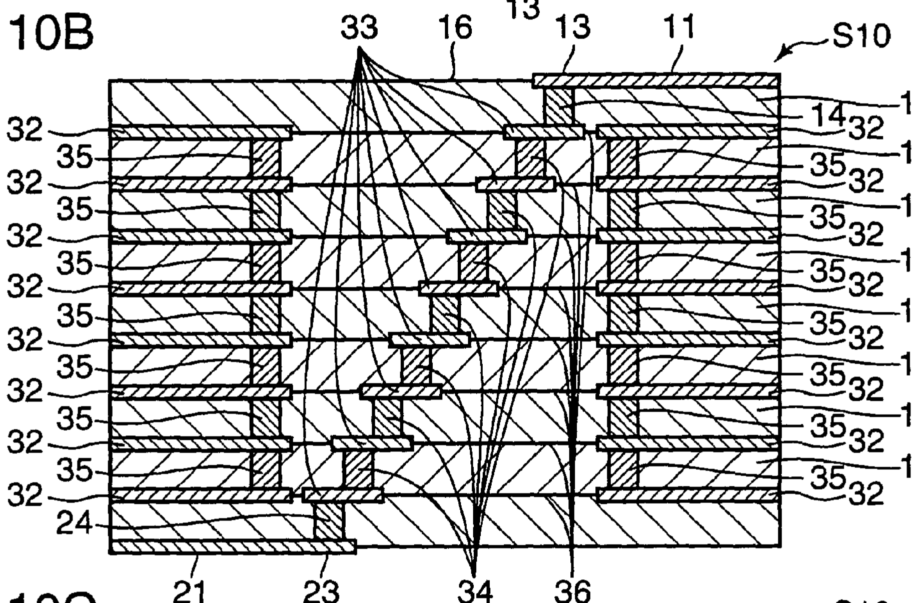
FIG. 10B is a vertical sectional view taken along the line 10B—10B of FIG. 10A.
Figure 10C:
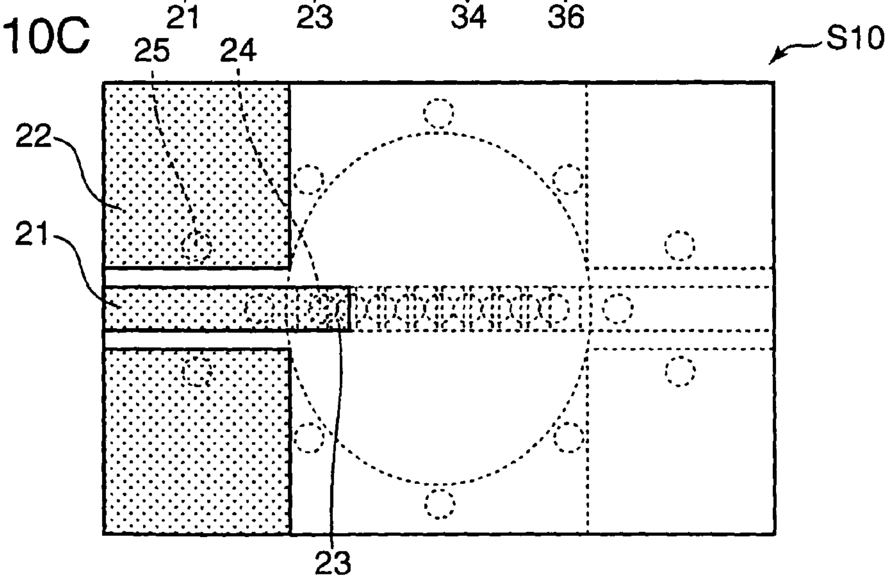
FIG. 10C is a bottom view of the high-frequency signal transmitting device of FIG. 10A.

Referring to FIGS. 10A to 10C showing a high-frequency signal transmitting device S10 according to a tenth embodiment of the present invention, a high-frequency signal transmitting device S10 has, in its basic construction, the same elements as the high-frequency signal transmitting device S2 according to the second embodiment shown in FIGS. 2A to 2E. Thus, no detailed description is given on the elements having the same functions by identifying them by the same reference numerals, and the following description is centered on differences to the high-frequency signal transmitting device S2 of the second embodiment.

As described above, the high-frequency signal transmitting device S2 of the second embodiment is constructed such that the grounding conductor 12 having such a shape as to surround the signal wiring conductor 11 and the grounding-conductor non-forming area 16 is provided on the upper surface of the uppermost dielectric layer 1, the grounding conductor 22 having such a shape as to surround the signal wiring conductor 21 and the grounding-conductor non-forming area 26 is provided on the lower surface of the bottommost dielectric layer 1, and the signal via conductors 14, 24, 34 of the respective dielectric layers 1 penetrate the electromagnetically shielded space formed to vertically extend between the upper and lower surfaces of the layered substrate 2 while being inclined in a step-like manner along the straight oblique line of the specified inclination between the signal wiring conductors 11 and 21.

Similar to the high-frequency signal transmitting device S2 of the second embodiment, the signal via conductors 14, 24, 34 of the respective dielectric layers 1 penetrate the electromagnetically shielded space formed to vertically extend between the upper and lower surfaces of the layered substrate 2 while being inclined in a step-like manner along the straight oblique line of the specified inclination between the signal wiring conductors 11 and 21 in the high-frequency signal transmitting device S10 of the tenth embodiment. However, the high-frequency signal transmitting device S10 of the tenth embodiment differs from the high-frequency signal transmitting device S2 of the second embodiment in that the grounding conductor 12 on the upper surface of the uppermost dielectric layer 1 is provided only in an area at the opposite sides of the signal wiring conductor 11 and the grounding conductor 22 on the lower surface of the bottommost dielectric layer 1 is provided only in an area at the opposite sides of the signal wiring conductor 21.

Since the grounding conductors 12, 22 are provided only in the areas at the opposite sides of the signal wiring conductors 11, 21 in this embodiment, the grounding-conductor via conductors 15, 25 provided in the uppermost and bottommost dielectric layers 1 are also provided only at the opposite sides of the signal wiring conductors 11, 21. The other conduction is similar to that of the high-frequency signal transmitting device S2 of the second embodiment.

In this way, similar to the high-frequency signal transmitting device S2 of the second embodiment, inductances created at the respective signal-wiring connecting conductors 13, 23 are reduced to improve the transmission characteristic in the high-frequency band in the high-frequency signal transmitting device S10 of the tenth embodiment. In addition, since the signal via conductors 14, 24, 34 of the respective dielectric layers 1 penetrate the electromagnetically shielded space formed to vertically extend between the upper and lower surfaces of the layered substrate 2 while being inclined in a step-like manner along the oblique straight line of the specified inclination between the signal wiring conductors 11, 21, a direction of propagation can be changed while maintaining a propagation mode stable against a straight-propagating property of electromagnetic waves from the outer side to the inner side or from the inner side to the outer side. This makes reflection difficult to occur, with the result that a high-frequency signal transmitting device having a good compatibility can be obtained.

Although the displacements of the signal via conductors 14, 24, 34 between the respective dielectric layers take the same value in the tenth embodiment, they may differ as in the aforementioned third embodiment or the signal via conductors 14, 24, 34 may be vertically arranged along the same axis as in the aforementioned first embodiment. Even in such cases, inductances created at the respective signal-wiring connecting conductors 13, 23 are reduced to improve the transmission characteristic in the high-frequency band.

In any of the high-frequency signal transmitting devices S1 to S10 of the first and tenth embodiments, it is preferable to set the length of the signal-wiring connecting conductor 13 between the signal wiring conductor 11 and the signal via conductor 14 on the upper surface of the uppermost dielectric layer 1 at a value equal to or smaller than the thickness of the uppermost dielectric layer 1 in the grounding-conductor non-forming area 16 and to set the length of the signal-wiring connecting conductor 23 between the signal wiring conductor 21 and the signal via conductor 24 on the lower surface of the bottommost dielectric layer 1 at a value equal to or smaller than the thickness of the bottommost dielectric layer 1 in the grounding-conductor non-forming area 26. Such setting makes the lengths of the signal-wiring connecting conductors 13, 23 very short and only a very small amount of inductance is created there, with the result that the transmission characteristic in the high-frequency band can be better.

Figure 11A:
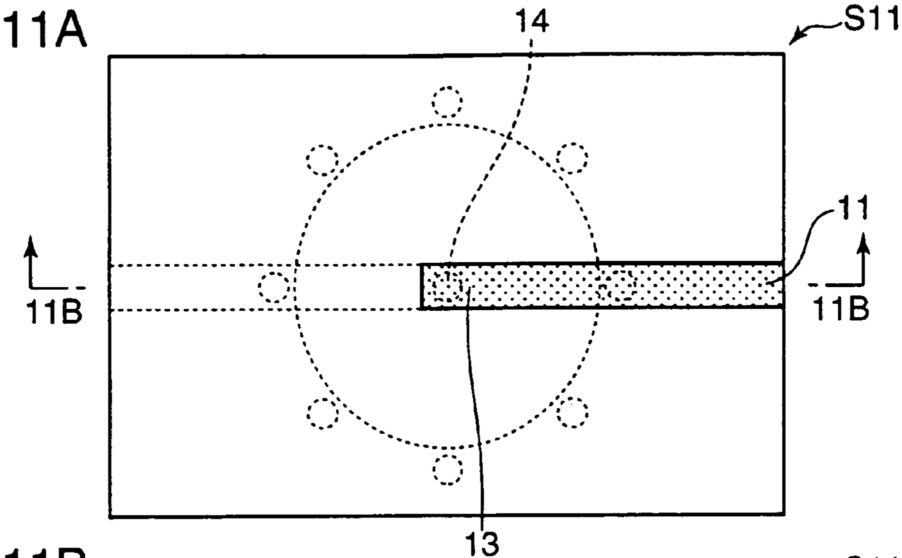
FIG. 11A is a plan view diagrammatically showing a high-frequency signal transmitting device according to an eleventh embodiment of the invention.
Figure 11B:
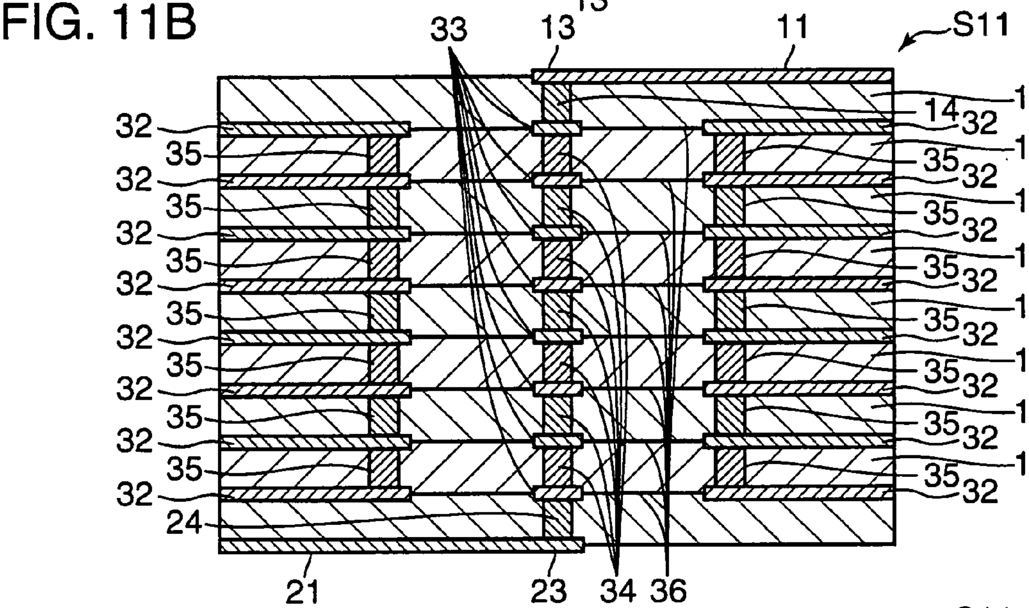
FIG. 11B is a vertical sectional view taken along the line 11B—11B of FIG. 11A.
Figure 11C:
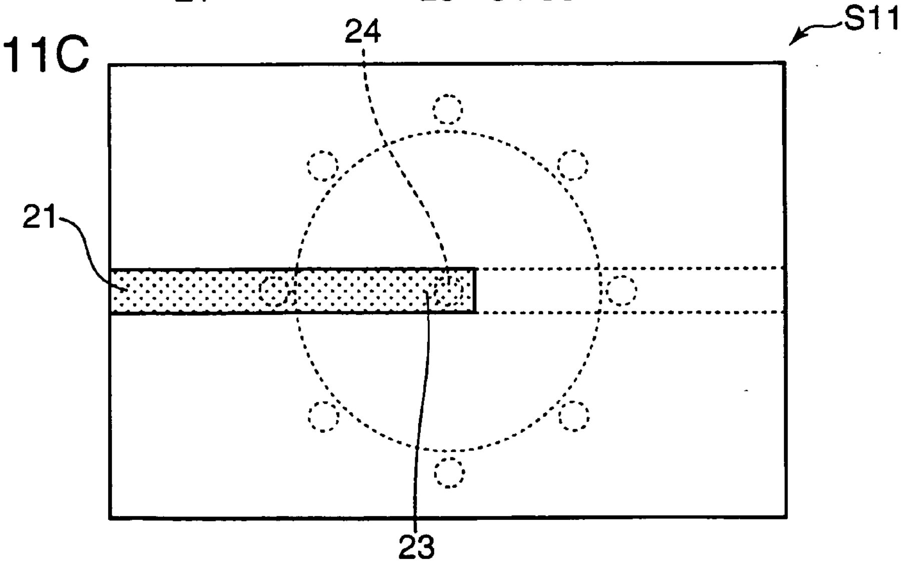
FIG. 11C is a bottom view of the high-frequency signal transmitting device of FIG. 11A.

Referring to FIGS. 11A to 11C showing a high-frequency signal transmitting device S11 according to an eleventh embodiment of the present invention, a high-frequency signal transmitting device S11 has, in its basic construction, the same elements as the high-frequency signal transmitting device S1 according to the first embodiment shown in FIGS. 1A to 1D. Thus, no detailed description is given on the elements having the same functions by identifying them by the same reference numerals, and the following description is centered on differences to the high-frequency signal transmitting device S1 of the first embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S1 of the first embodiment. The high-frequency signal transmitting device S10 of the eleventh embodiment differs from the high-frequency signal transmitting device S1 in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S11 of the eleventh embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S1 of the first embodiment.

In this way, in the high-frequency signal transmitting device S11 of the eleventh embodiment as well, the electromagnetically shielded space can be formed inside the layered substrate 2 by connecting the respective grounding conductors 32 on the upper surfaces of the bottommost and intermediate dielectric layers 1 via the grounding-conductor via conductors 35. As a result, a leak of a high-frequency signal upon passing the signal via conductors 14, 24, 34 can be suppressed to improve a high-frequency transmission characteristic. Thus, a high-frequency signal transmitting device having a good transmission characteristic in a high-frequency band can be obtained.

Figure 12A:
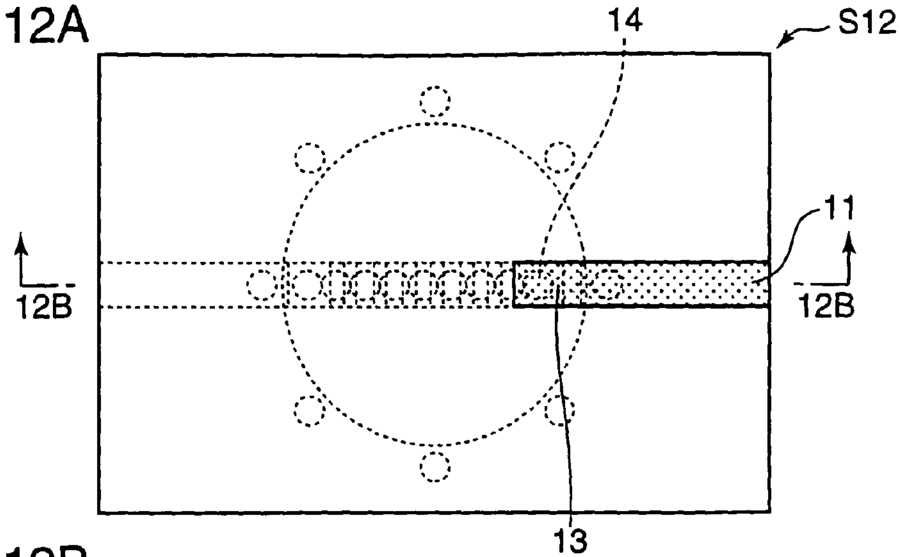
FIG. 12A is a plan view diagrammatically showing a high-frequency signal transmitting device according to a twelfth embodiment of the invention.
Figure 12B:
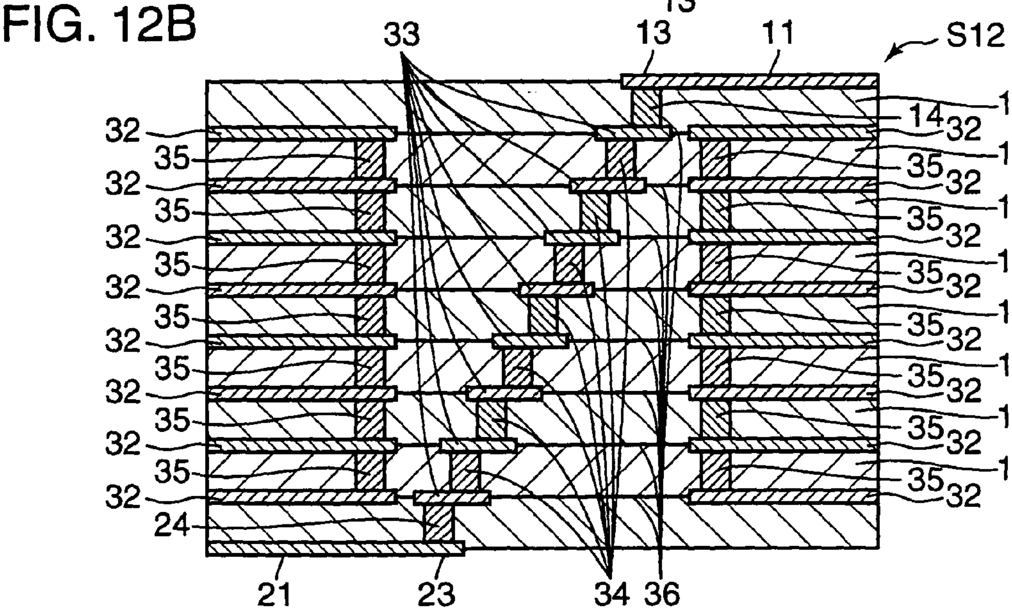
FIG. 12B is a vertical sectional view taken along the line 12B—12B of FIG. 12A.
Figure 12C:
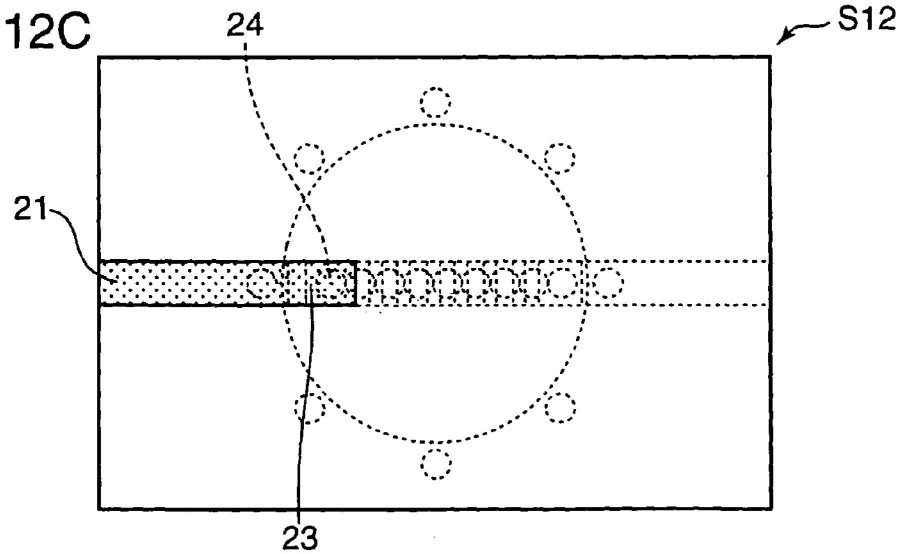
FIG. 12C is a bottom view of the high-frequency signal transmitting device of FIG. 12A.

Referring to FIGS. 12A to 12C showing a high-frequency signal transmitting device S12 according to a twelfth embodiment of the present invention, a high-frequency signal transmitting device S12 has, in its basic construction, the same elements as the high-frequency signal transmitting device S2 according to the second embodiment shown in FIGS. 2A to 2E. Thus, no detailed description is given on the elements having the same functions by identifying them by the same reference numerals, and the following description is centered on differences to the high-frequency signal transmitting device S2 of the second embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S2 of the second embodiment.

The high-frequency signal transmitting device S12 of the twelfth embodiment differs from the high-frequency signal transmitting device S2 of the second embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S12 of the twelfth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S2 of the second embodiment.

In this way, similar to the high-frequency signal transmitting device S2 of the second embodiment, the signal via conductor 14 of the uppermost dielectric layer 1 is provided at a position near the signal wiring conductor 11 and the signal via conductor 24 of the bottommost dielectric layer 1 is provided at a position near the signal wiring conductor 21 in the high-frequency signal transmitting device S12 of the twelfth embodiment. Thus, the lengths of the signal wiring conductors 13, 23 of the uppermost and bottommost dielectric layers 1 are shorter as compared to that of the first embodiment. Therefore, inductances created at the respective signal-wiring connecting conductors 13, 23 can be reduced, with the result that a high-frequency signal transmitting device having a good transmission characteristic in a high-frequency band can be obtained.

Figure 13A:
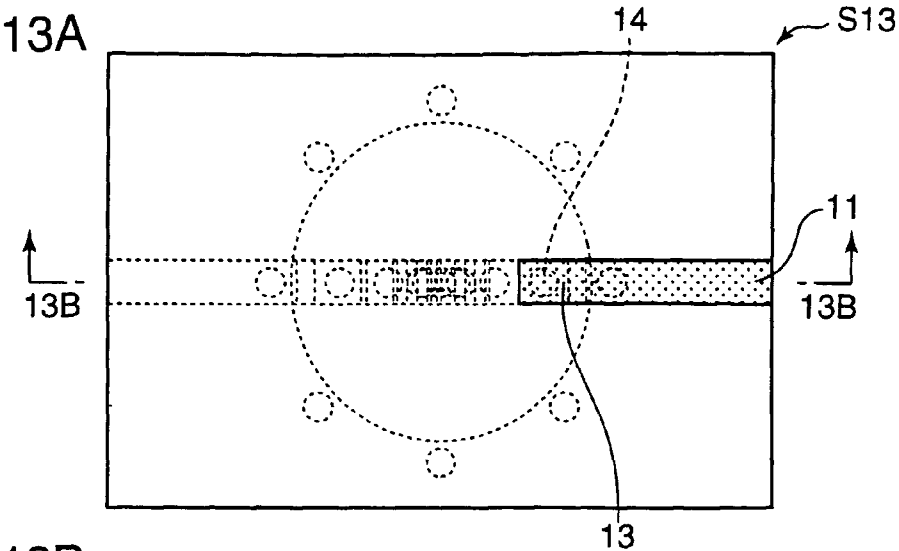
FIG. 13A is a plan view diagrammatically showing a high-frequency signal transmitting device according to a thirteenth embodiment of the invention.
Figure 13B:
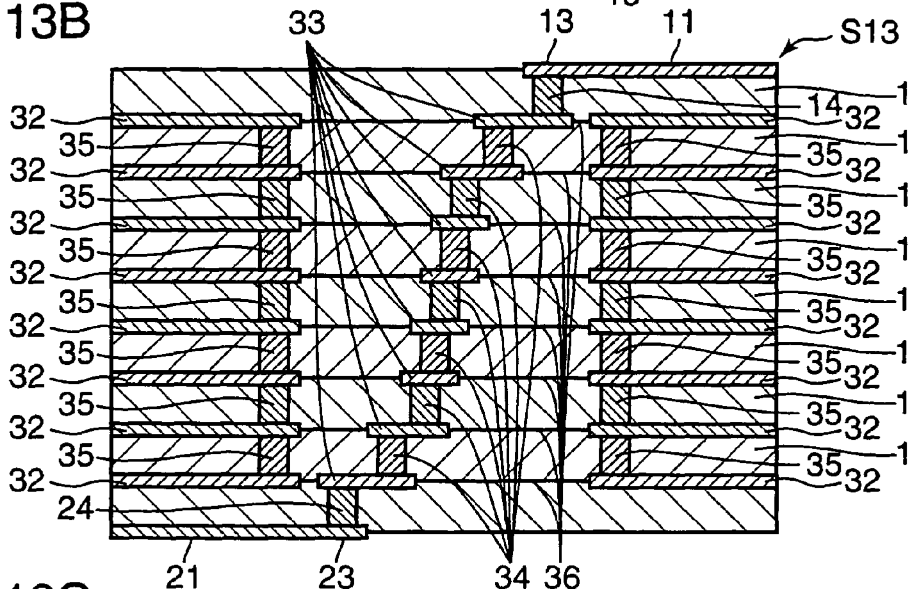
FIG. 13B is a vertical sectional view taken along the line 13B—13B of FIG. 13A.
Figure 13C:
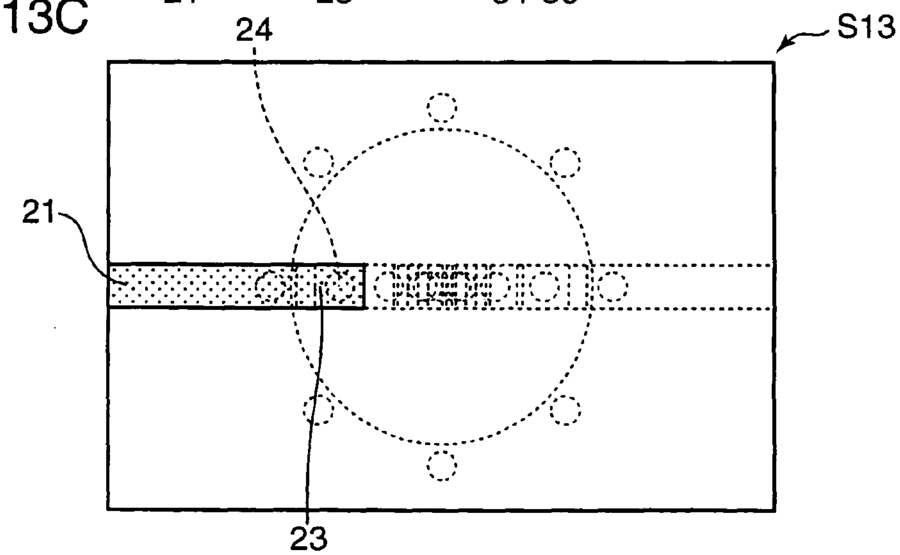
FIG. 13C is a bottom view of the high-frequency signal transmitting device of FIG. 13A.

Referring to FIGS. 13A to 13C showing a high-frequency signal transmitting device S13 according to a thirteenth embodiment of the present invention, a high-frequency signal transmitting device S13 has, in its basic construction, the same elements as the high-frequency signal transmitting device S3 according to the third embodiment shown in FIGS. 3A to 3C. Thus, no detailed description is given on the elements having the same functions by identifying them by the same reference numerals, and the following description is centered on differences to the high-frequency signal transmitting device S3 of the third embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S3 of the third embodiment.

The high-frequency signal transmitting device S13 of the thirteenth embodiment differs from the high-frequency signal transmitting device S3 of the third embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S13 of the thirteenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S3 of the third embodiment.

In this way, similar to the high-frequency signal transmitting device S3 of the third embodiment, the lengths of the signal wiring conductors 13, 23 of the uppermost and bottommost dielectric layers 1 are shorter in the high-frequency signal transmitting device S13 of the thirteenth embodiment as compared to that of the first embodiment. Thus, inductances created at the respective signal-wiring connecting conductors 13, 23 can be reduced. In addition, the signal via conductors 14, 24, 34 of the respective dielectric layers 1 penetrate the electromagnetically shielded space while being inclined in such a step-like manner as to be at a larger angle of inclination at the sides of the uppermost and bottommost dielectric layers 1 and at a smaller angle of inclination at the middle side. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Figure 14A:
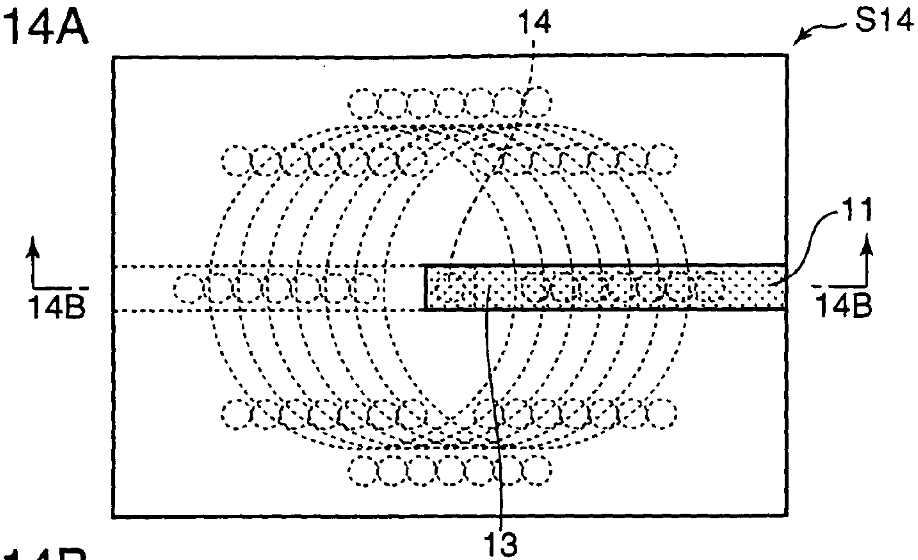
FIG. 14A is a plan view diagrammatically showing a high-frequency signal transmitting device according to a fourteenth embodiment of the invention.
Figure 14B:
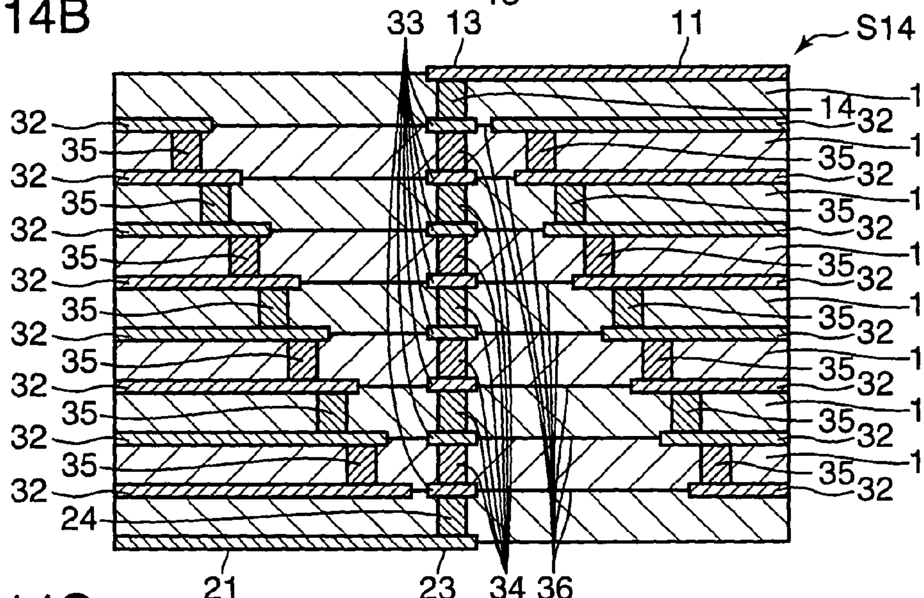
FIG. 14B is a vertical sectional view taken along the line 14B—14B of FIG. 14A.
Figure 14C:
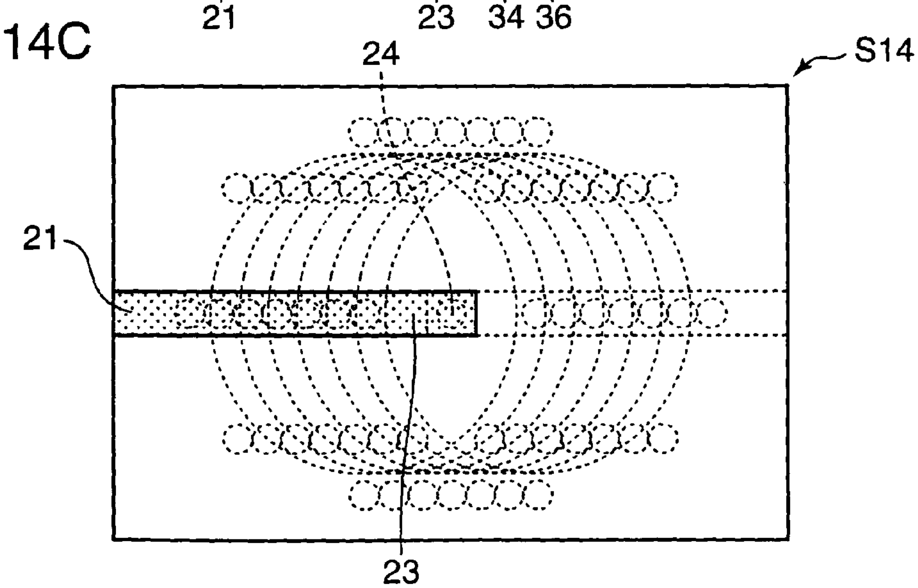
FIG. 14C is a bottom view of the high-frequency signal transmitting device of FIG. 14A.

Referring to FIGS. 14A to 14C showing a high-frequency signal transmitting device S14 according to a fourteenth embodiment of the present invention, a high-frequency signal transmitting device S14 has, in its basic construction, the same elements as the high-frequency signal transmitting device S4 according to the fourth embodiment shown in FIGS. 4A to 4C. Thus, no detailed description is given on the elements having the same functions by identifying them by the same reference numerals, and the following description is centered on differences to the high-frequency signal transmitting device S4 of the fourth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S4 of the fourth embodiment.

The high-frequency signal transmitting device S14 of the fourteenth embodiment differs from the high-frequency signal transmitting device S4 of the fourth embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S14 of the fourteenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S4 of the fourth embodiment.

In this way, similar to the high-frequency signal transmitting device S4 of the fourth embodiment, the lengths of the signal wiring conductors 13, 23 of the uppermost and bottommost dielectric layers 1 are shorter in the high-frequency signal transmitting device S14 of the fourteenth embodiment as compared to that of the first embodiment. Thus, inductances created at the respective signal-wiring connecting conductors 13, 23 can be reduced, and a high-frequency signal transmitting device having a good transmission characteristic in a high-frequency band can be obtained.

Figure 15A:
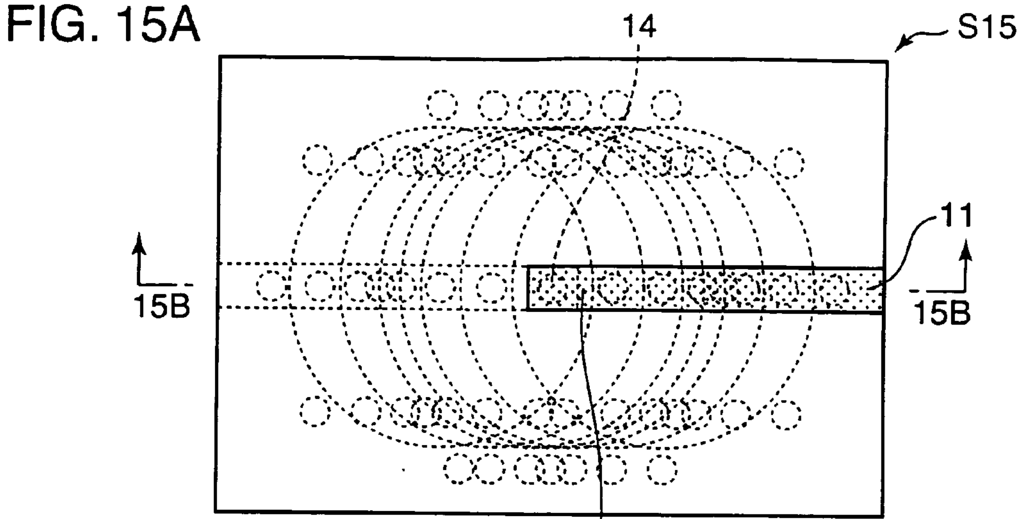
FIG. 15A is a plan view diagrammatically showing a high-frequency signal transmitting device according to a fifteenth embodiment of the invention.
Figure 15B:
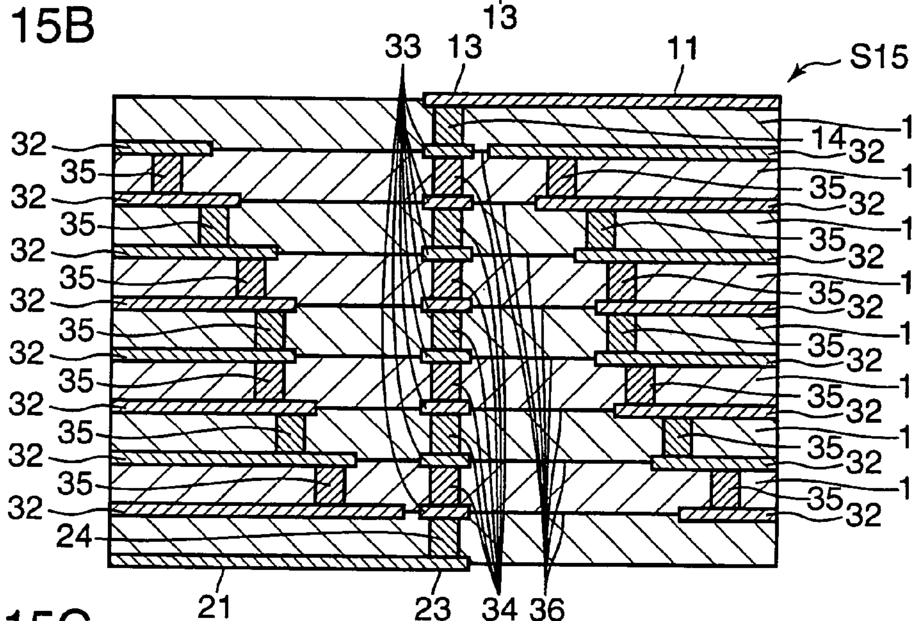
FIG. 15B is a vertical sectional view taken along the line 15B—15B of FIG. 15A.
Figure 15C:
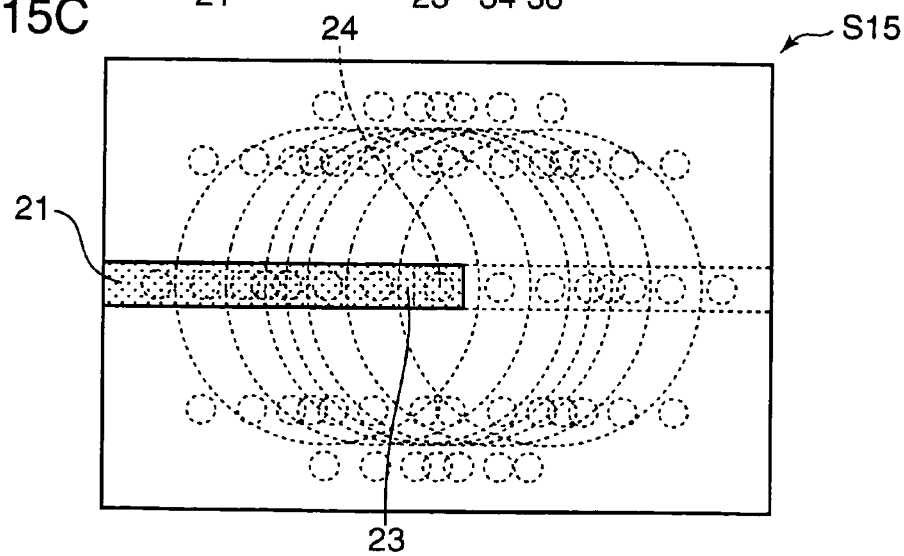
FIG. 15C is a bottom view of the high-frequency signal transmitting device of FIG. 15A.

Referring to FIGS. 15A to 15C showing a high-frequency signal transmitting device S15 according to a fifteenth embodiment of the present invention, a high-frequency signal transmitting device S15 has, in its basic construction, the same elements as the high-frequency signal transmitting device S5 according to the fifth embodiment shown in FIGS. 5A to 5C. Thus, no detailed description is given on the elements having the same functions by identifying them by the same reference numerals, and the following description is centered on differences to the high-frequency signal transmitting device S5 of the fifth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S5 of the fifth embodiment.

The high-frequency signal transmitting device S15 of the fifteenth embodiment differs from the high-frequency signal transmitting device S5 of the fifth embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S15 of the fifteenth embodiment, the signal via conductor 14 of the uppermost dielectric layer 1 is provided within an area facing the grounding-conductor non-forming area 36 on the upper surface of the uppermost intermediate dielectric layer 1 (i.e. within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S5 of the fifth embodiment.

In this way, similar to the high-frequency signal transmitting device S5 of the fifth embodiment, the lengths of the signal wiring conductors 13, 23 of the uppermost and bottommost dielectric layers 1 are shorter in the high-frequency signal transmitting device S15 of the fifteenth embodiment as compared to that of the first embodiment. Thus, inductances created at the respective signal-wiring connecting conductors 13, 23 can be reduced. In addition, since the electromagnetically shielded space is formed while being bent in the oblique direction, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Figure 16A:
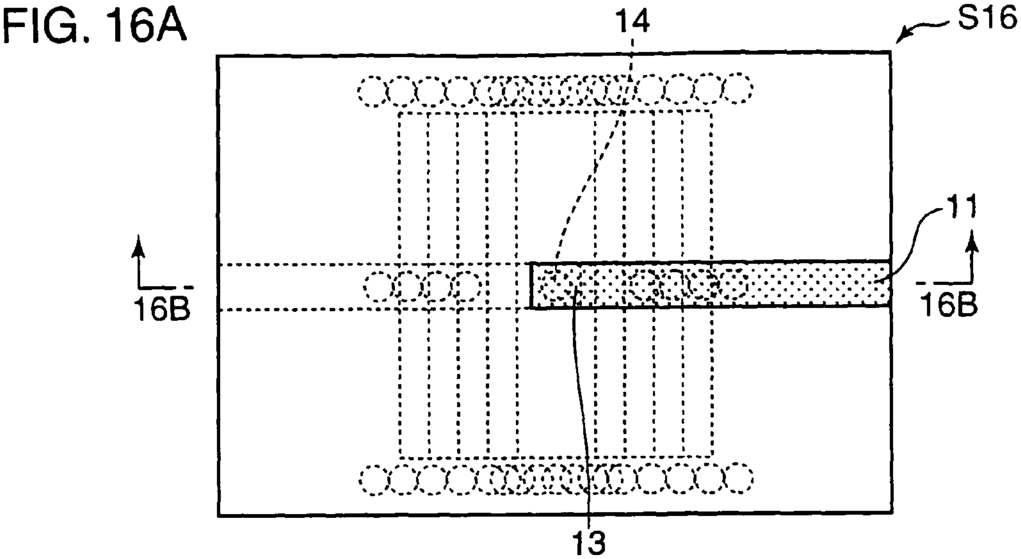
FIG. 16A is a plan view diagrammatically showing a high-frequency signal transmitting device according to a sixteenth embodiment of the invention.
Figure 16B:
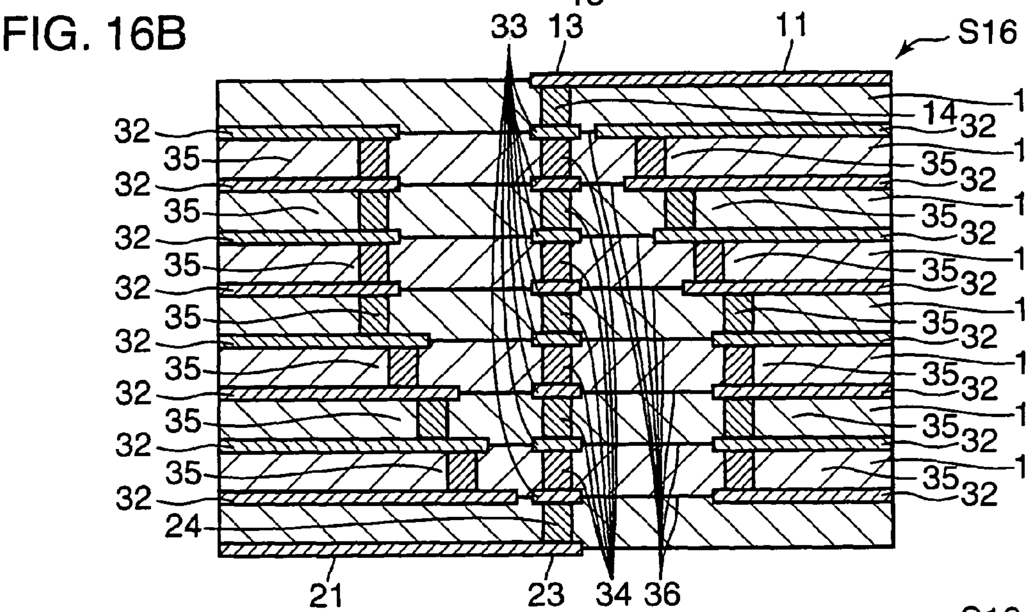
FIG. 16B is a vertical sectional view taken along the line 16B—16B of FIG. 16A.
Figure 16C:
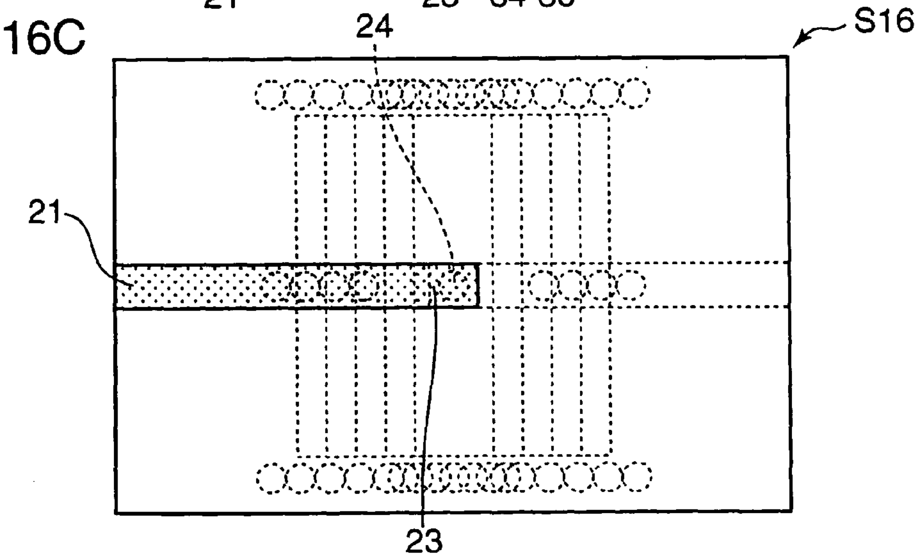
FIG. 16C is a bottom view of the high-frequency signal transmitting device of FIG. 16A.

Referring to FIGS. 16A to 16C showing a high-frequency signal transmitting device S16 according to a sixteenth embodiment of the present invention, a high-frequency signal transmitting device S16 has, in its basic construction, the same elements as the high-frequency signal transmitting device S6 according to the sixth embodiment shown in FIGS. 6A to 6C. Thus, no detailed description is given on the elements having the same functions by identifying them by the same reference numerals, and the following description is centered on differences to the high-frequency signal transmitting device S6 of the sixth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S6 of the sixth embodiment.

The high-frequency signal transmitting device S16 of the sixteenth embodiment differs from the high-frequency signal transmitting device S6 of the sixth embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S16 of the sixteenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S6 of the sixth embodiment.

In this way, similar to the high-frequency signal transmitting device S6 of the sixth embodiment, the signal via conductor 14 of the uppermost dielectric layer 1 is provided at a position near the signal wiring conductor 11 and the signal via conductor 24 of the bottommost dielectric layer 1 is provided at a position near the signal wiring conductor 21 in the high-frequency signal transmitting device S16 of the sixteenth embodiment, with the result that the lengths of the signal wiring conductors 13, 23 of the uppermost and bottommost dielectric layers 1 are shorter as compared to that of the first embodiment. Thus, inductances created at the respective signal-wiring connecting conductors 13, 23 can be reduced, and a high-frequency signal transmitting device having a good transmission characteristic in a high-frequency band can be obtained.

Figure 17A:
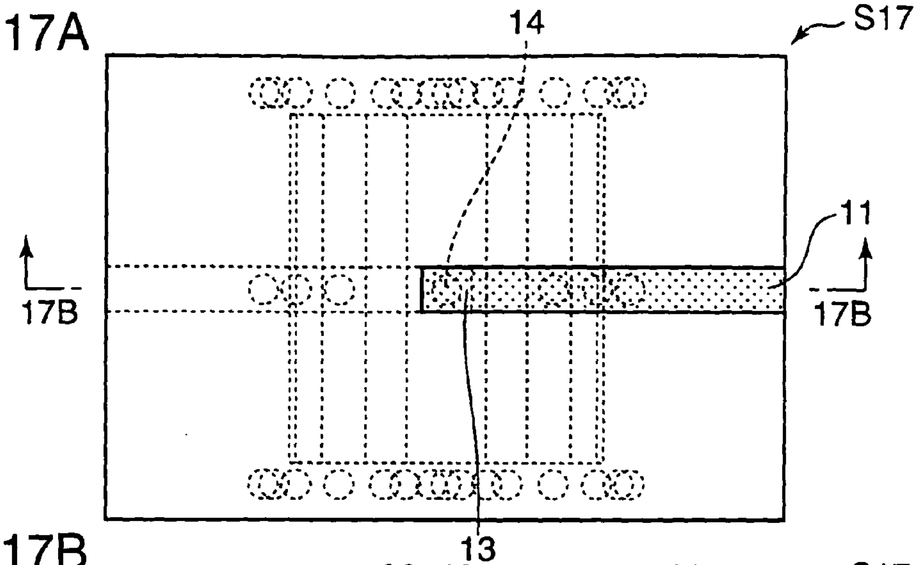
FIG. 17A is a plan view diagrammatically showing a high-frequency signal transmitting device according to a seventeenth embodiment of the invention.
Figure 17B:
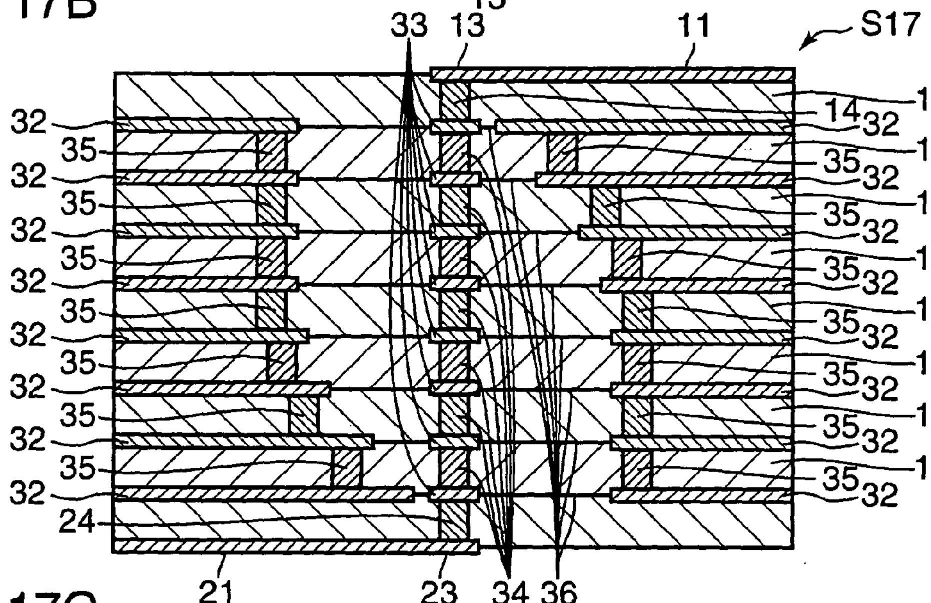
FIG. 17B is a vertical sectional view taken along the line 17B—17B of FIG. 17A.
Figure 17C:
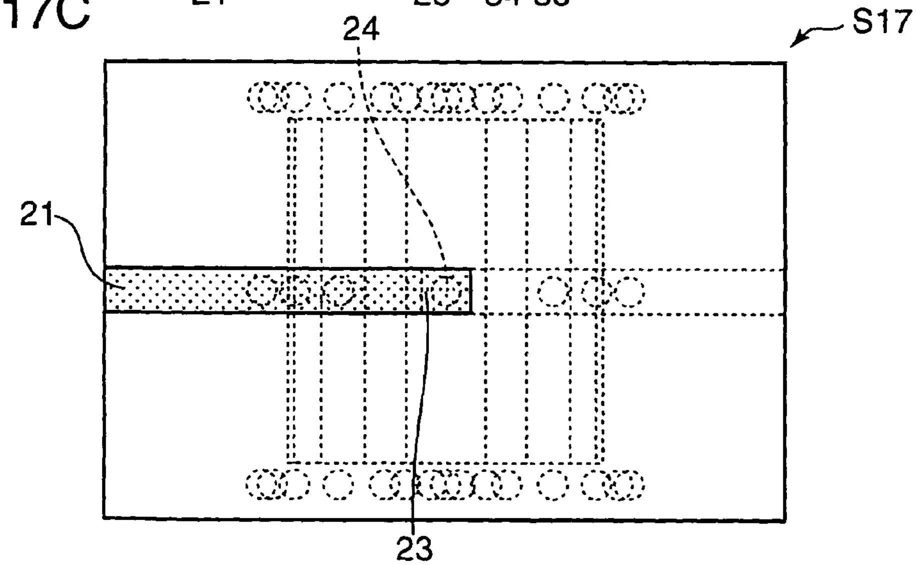
FIG. 17C is a bottom view of the high-frequency signal transmitting device of FIG. 17A.

Referring to FIGS. 17A to 17C showing a high-frequency signal transmitting device S17 according to a seventeenth embodiment of the present invention, a high-frequency signal transmitting device S17 has, in its basic construction, the same elements as the high-frequency signal transmitting device S7 according to the seventh embodiment shown in FIGS. 7A to 7C. Thus, no detailed description is given on the elements having the same functions by identifying them by the same reference numerals, and the following description is centered on differences to the high-frequency signal transmitting device S7 of the seventh embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S7 of the seventh embodiment.

The high-frequency signal transmitting device S17 of the seventeenth embodiment differs from the high-frequency signal transmitting device S7 of the seventh embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S17 of the seventeenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S7 of the seventh embodiment.

In this way, similar to the high-frequency signal transmitting device S7 of the seventh embodiment, changing values of dimensions between one and the other ends of the grounding-conductor non-forming areas 36 of the intermediate dielectric layers 1 are made smaller from the upper layers toward the middle layers and from the lower layers toward the middle layers of the layered substrate 2 in the high-frequency signal transmitting device S17 of the seventeenth embodiment. Thus, discontinuity of impedance in the propagation of a high-frequency signal between the outer side and the inner side can be improved, with the result that a high-frequency signal transmitting device having a good transmission characteristic in a high-frequency band can be obtained.

Figure 18A:
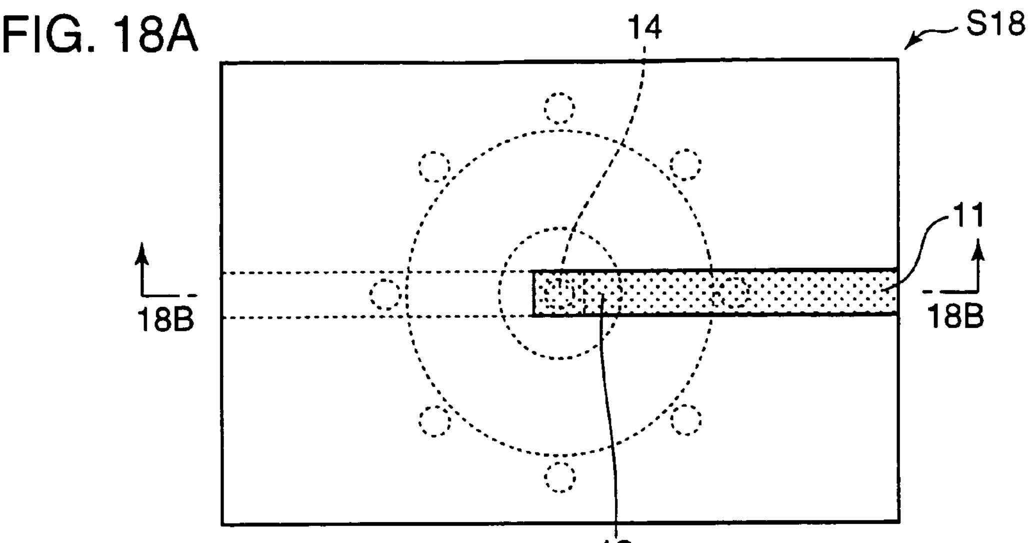
FIG. 18A is a plan view diagrammatically showing a high-frequency signal transmitting device according to an eighteenth embodiment of the invention.
Figure 18B:
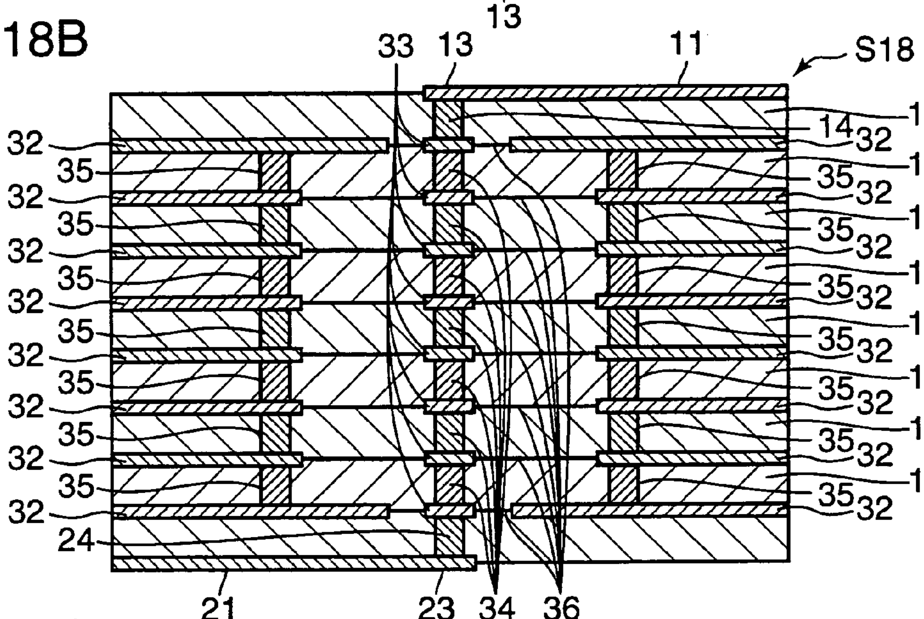
FIG. 18B is a vertical sectional view taken along the line 18B—18B of FIG. 18A.
Figure 18C:
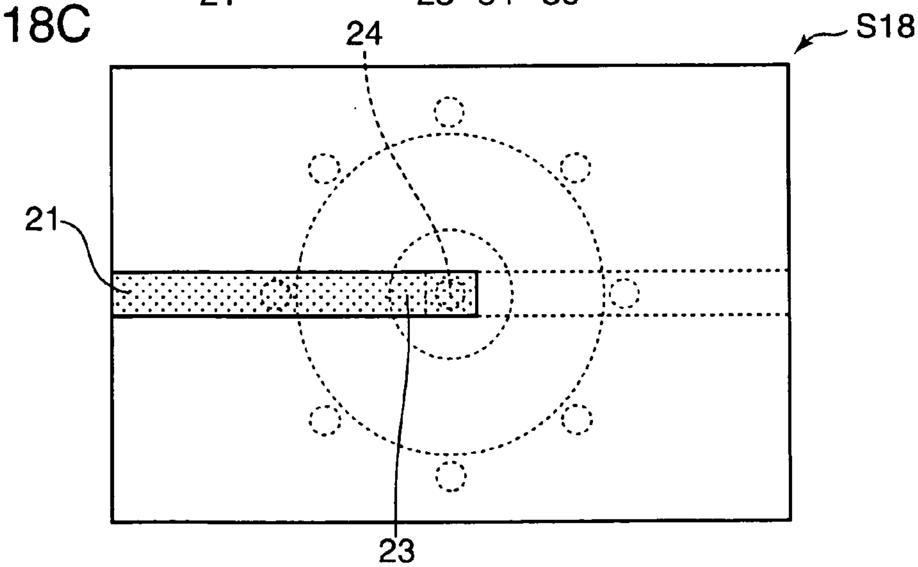
FIG. 18C is a bottom view of the high-frequency signal transmitting device of FIG. 18A.

Referring to FIGS. 18A to 18C showing a high-frequency signal transmitting device S18 according to an eighteenth embodiment of the present invention, a high-frequency signal transmitting device S18 has, in its basic construction, the same elements as the high-frequency signal transmitting device S8 according to the eighth embodiment shown in FIGS. 8A to 8C. Thus, no detailed description is given on the elements having the same functions by identifying them by the same reference numerals, and the following description is centered on differences to the high-frequency signal transmitting device S8 of the eighth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S8 of the eighth embodiment.

The high-frequency signal transmitting device S18 of the eighteenth embodiment differs from the high-frequency signal transmitting device S8 of the eighth embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S18 of the eighteenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S8 of the eighth embodiment.

In this way, similar to the high-frequency signal transmitting device S8 of the eighth embodiment, the grounding-conductor non-forming area 36 on the upper surface of the uppermost intermediate dielectric layer 1 and the grounding-conductor non-forming area 36 on the upper surface of the bottommost dielectric layer 1 are formed to have concentric and smaller areas. Thus, the length of the signal-wiring connecting conductor 13 on the upper surface of the uppermost dielectric layer 1 which is the conductive portion not opposed to the grounding conductor 32 of the dielectric layer 1 located immediately therebelow in the thickness direction and the length of the signal-wiring connecting conductor 23 on the lower surface of the bottommost dielectric layer 1 which is the conductive portion not opposed to the grounding conductor 32 on the upper surface of the bottommost dielectric layer 1 in the thickness direction are shorter as compared to those of the high-frequency signal transmitting device S1 of the first embodiment. Thus, inductances created at the respective signal-wiring connecting conductors 13, 23 can be reduced, with the result that a high-frequency signal transmitting device having a good transmission characteristic in a high-frequency band can be obtained.

Figure 19A:
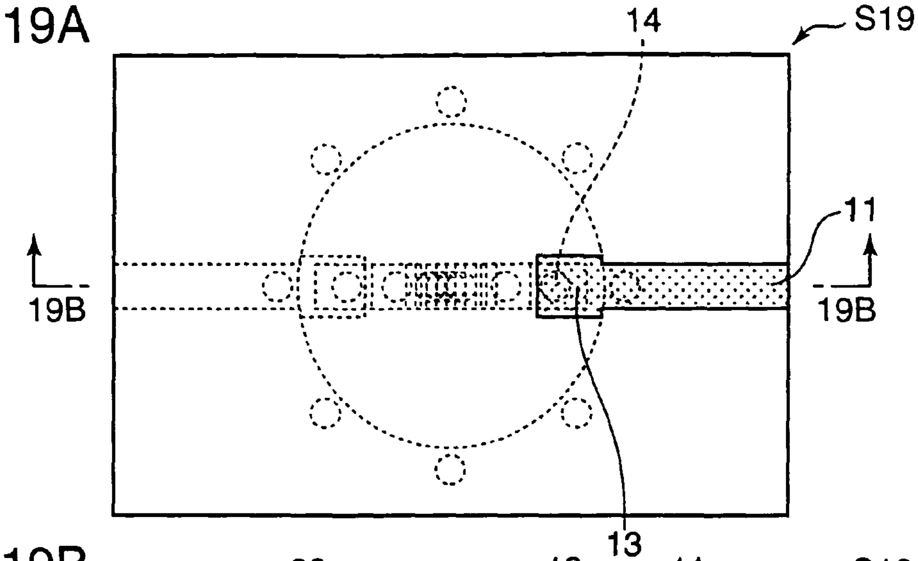
FIG. 19A is a plan view diagrammatically showing a high-frequency signal transmitting device according to a nineteenth embodiment of the invention.
Figure 19B:
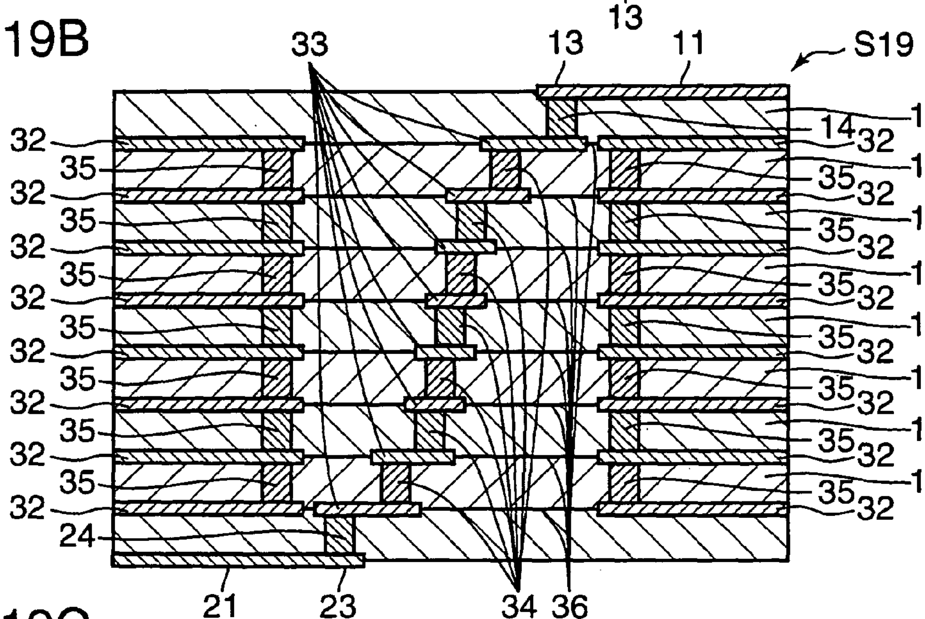
FIG. 19B is a vertical sectional view taken along the line 19B—19B of FIG. 19A.
Figure 19C:
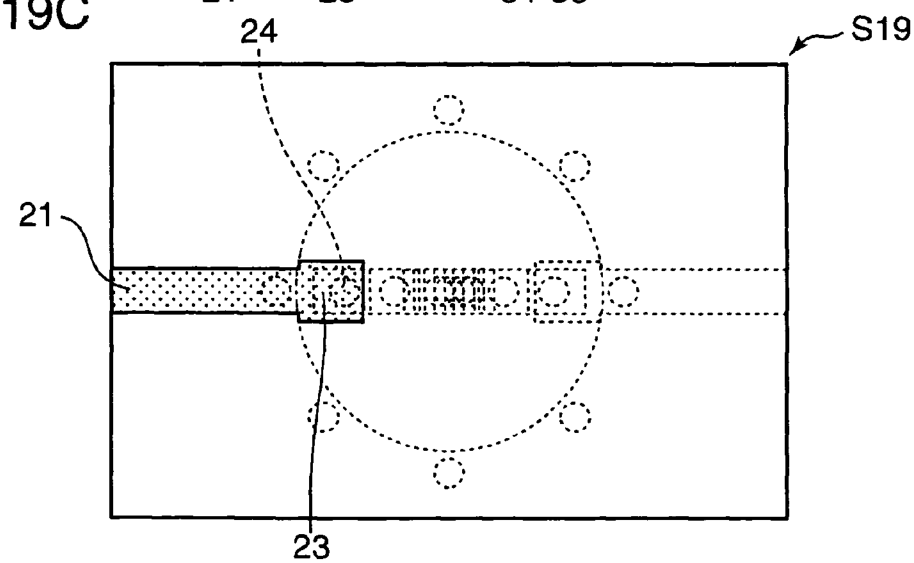
FIG. 19C is a bottom view of the high-frequency signal transmitting device of FIG. 19A.

Referring to FIGS. 19A to 19C showing a high-frequency signal transmitting device S19 according to a nineteenth embodiment of the present invention, a high-frequency signal transmitting device S19 has, in its basic construction, the same elements as the high-frequency signal transmitting device S9 according to the ninth embodiment shown in FIGS. 9A to 9C. Thus, no detailed description is given on the elements having the same functions by identifying them by the same reference numerals, and the following description is centered on differences to the high-frequency signal transmitting device S9 of the ninth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S9 of the ninth embodiment.

The high-frequency signal transmitting device S19 of the nineteenth embodiment differs from the high-frequency signal transmitting device S9 of the ninth embodiment in that only the grounding conductors 32 are provided on the upper surfaces of the bottommost dielectric layer 1 and the intermediate dielectric layers 1 without providing the grounding conductors 12, 22 on the upper surface of the uppermost dielectric layer 1 and on the lower surface of the bottommost dielectric layer 1.

Thus, in the high-frequency signal transmitting device S19 of the nineteenth embodiment, the signal via conductor 14 of the uppermost dielectric layer 1 is provided within an area facing the grounding-conductor non-forming area 36 on the upper surface of the uppermost intermediate dielectric layer 1 (i.e., within the grounding-conductor non-forming area 16 if the grounding conductor 12 were provided), and the signal via conductor 24 of the bottommost dielectric layer 1 is provided within an area facing the grounding-conductor non-forming area 36 on the upper surface of the bottommost dielectric layer 1 (i.e., within the grounding-conductor non-forming area 26 if the grounding conductor 22 were provided).

Since the grounding conductors 12, 22 are not provided, the grounding-conductor via conductors 15, 25 provided in the uppermost and bottommost dielectric layers 1 are unnecessary. The other construction is similar to that of the high-frequency signal transmitting device S9 of the ninth embodiment.

In this way, similar to the high-frequency signal transmitting device S9 of the ninth embodiment, the signal-wiring connecting conductor 13 on the upper surface of the uppermost dielectric layer 1 and the one 23 on the lower surface of the bottommost dielectric layer 1 are formed wider than the signal wiring conductors 11, 21. Thus, inductances created at the respective signal-wiring connecting conductors 13, 23 can be reduced, with the result that a high-frequency signal transmitting device having a good transmission characteristic in a high-frequency band can be obtained.

The construction of forming the signal-wiring connecting conductors 13, 23 wider is also applicable to all the other embodiments including those in which the displacements of the signal via conductors 14, 24, 34 of the respective dielectric layers 1 in the plane direction take substantially the same value, and enables inductances created at the signal-wiring connecting conductors 13, 23 to be reduced and the transmission characteristic in the high-frequency band to be better.

Figure 20A:
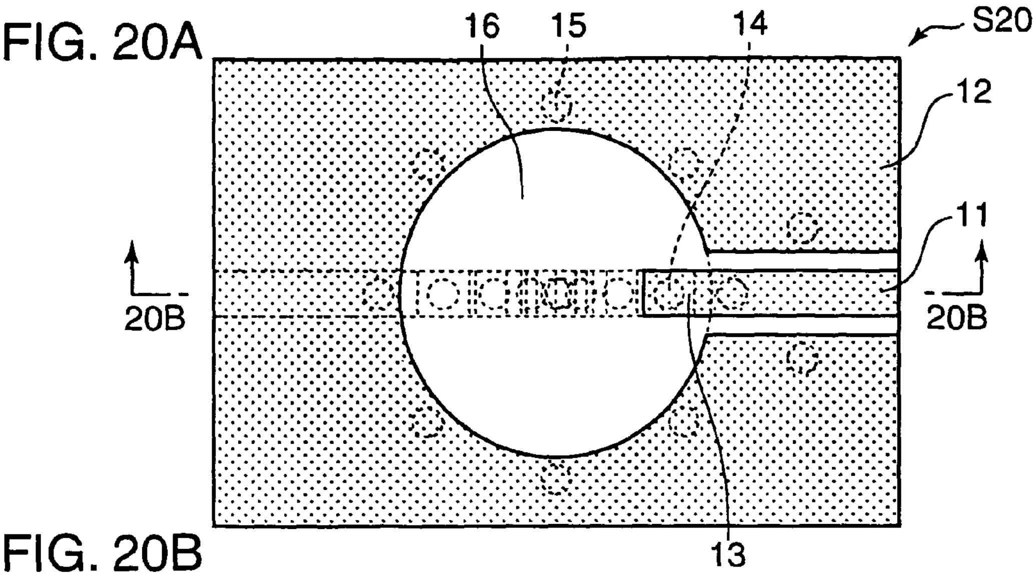
FIG. 20A is a plan view diagrammatically showing a high-frequency signal transmitting device according to a twentieth embodiment of the invention.
Figure 20B:
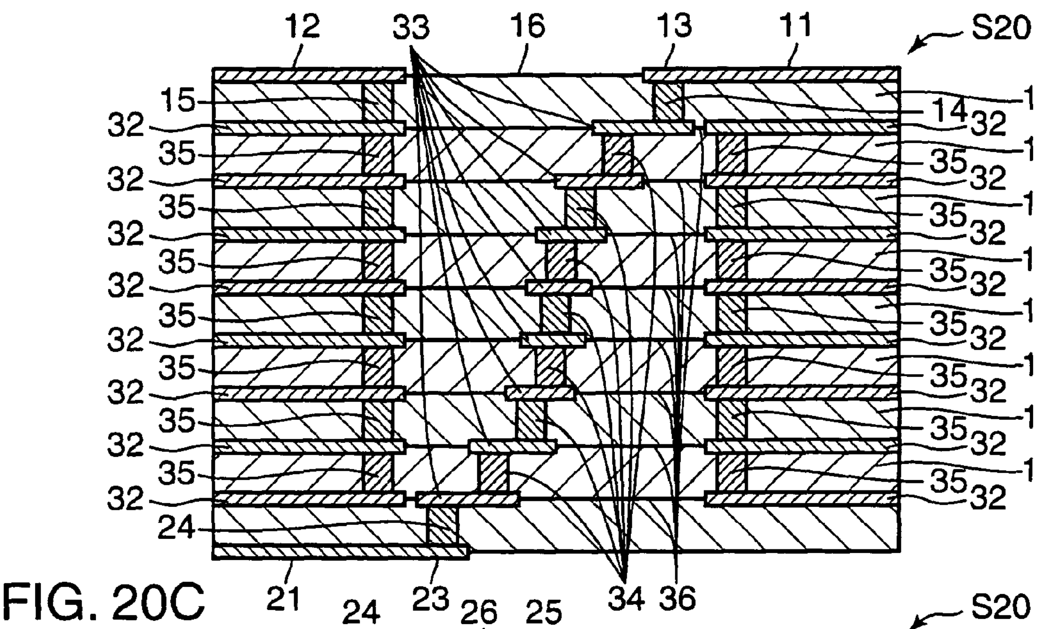
FIG. 20B is a vertical sectional view taken along the line 20B—20B of FIG. 20A.
Figure 20C:
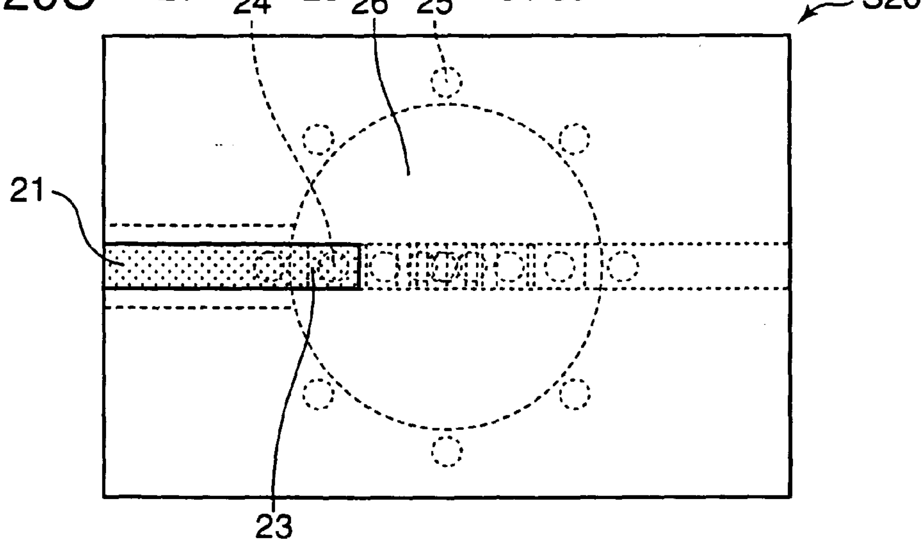
FIG. 20C is a bottom view of the high-frequency signal transmitting device of FIG. 20A.

Referring to FIGS. 20A to 20C showing a high-frequency signal transmitting device S20 according to a twentieth embodiment of the present invention, a high-frequency signal transmitting device S20 has, in its basic construction, the same elements as the high-frequency signal transmitting device S3 according to the third embodiment shown in FIGS. 3A to 3C. Thus, no detailed description is given on the elements having the same functions by identifying them by the same reference numerals, and the following description is centered on differences to the high-frequency signal transmitting device S3 of the third embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S3 of the third embodiment.

The high-frequency signal transmitting device S20 of the twentieth embodiment differs from the high-frequency signal transmitting device S3 of the third embodiment in that only the grounding conductors 12, 32 are provided only on the upper surfaces of the uppermost dielectric layer 1, the bottommost dielectric layer 1 and the intermediate dielectric layers 1 without providing the grounding conductor 22 on the lower surface of the bottommost dielectric layer 1. Thus, the grounding-conductor via conductor 25 provided in the bottommost dielectric layer 1 is unnecessary. The other construction is similar to that of the high-frequency signal transmitting device S3 of the third embodiment.

It should be noted that the grounding conductors 22, 32 may be provided on the lower surface of the bottommost dielectric layer 1 and on the upper surfaces of the intermediate dielectric layers 1 and the bottommost dielectric layer 1 without providing the grounding conductor 12 on the upper surface of the uppermost dielectric layer 1. In such a case, the grounding-conductor via conductor 15 provided in the uppermost dielectric layer 1 is unnecessary although the grounding-conductor via conductor 25 needs to be provided in the bottommost dielectric layer 1.

In this way, similar to the high-frequency signal transmitting device S3 of the third embodiment, inductances created at the respective signal-wiring connecting conductors 13, 23 can be reduced to improve the transmission characteristic in the high-frequency band. In addition, the signal via conductors 14, 24, 34 of the respective dielectric layers 1 penetrate the electromagnetically shielded space while being inclined in such a step-like manner as to be at a larger angle of inclination at the sides of the uppermost and bottommost dielectric layers 1 and at a smaller angle of inclination at the middle side. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Although the displacements of the signal via conductors 14, 24, 34 between the respective dielectric layers differ in the twentieth embodiment, they may take the same value as in the aforementioned twelfth embodiment. Even in such a case, inductances created at the respective signal-wiring connecting conductors 13, 23 are reduced to improve the transmission characteristic in the high-frequency band.

Figure 21A:
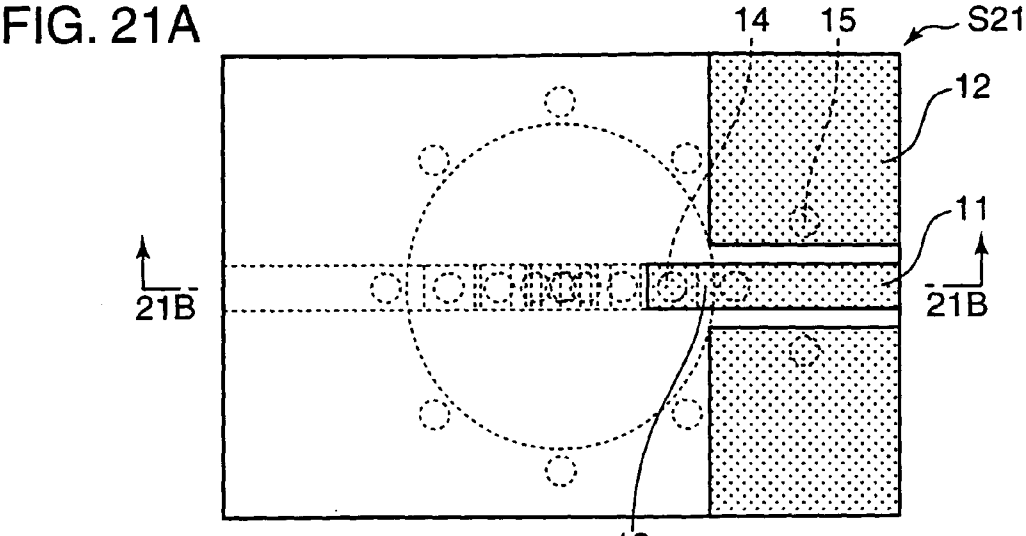
FIG. 21A is a plan view diagrammatically showing a high-frequency signal transmitting device according to a twenty-first embodiment of the invention.
Figure 21B:
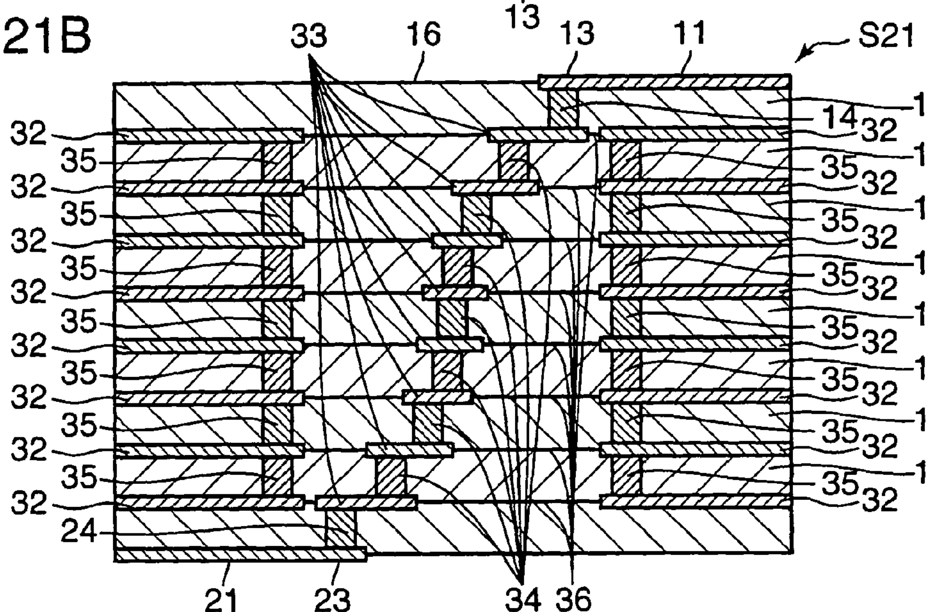
FIG. 21B is a vertical sectional view taken along the line 21B—21B of FIG. 21A.
Figure 21C:
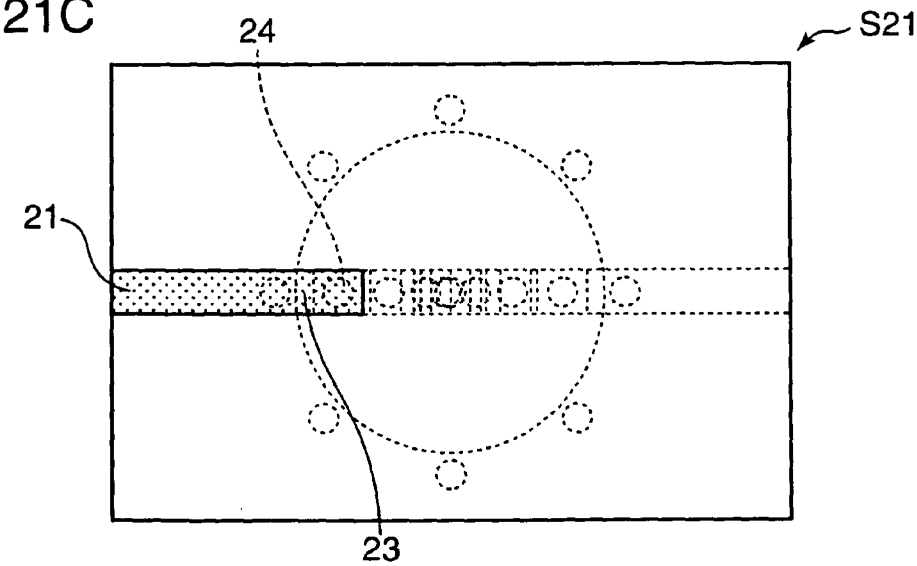
FIG. 21C is a bottom view of the high-frequency signal transmitting device of FIG. 21A.

Referring to FIGS. 21A to 21C showing a high-frequency signal transmitting device S21 according to a twenty-first embodiment of the present invention, a high-frequency signal transmitting device S21 has, in its basic construction, the same elements as the high-frequency signal transmitting device S10 according to the tenth embodiment shown in FIGS. 10A to 10C. Thus, no detailed description is given on the elements having the same functions by identifying them by the same reference numerals, and the following description is centered on differences to the high-frequency signal transmitting device S10 of the tenth embodiment.

As described above, the grounding conductors 12, 22, 32 are provided on the upper surface of the uppermost dielectric layer 1, on the lower and upper surfaces of the bottommost dielectric layer 1 and on the upper surfaces of the respective intermediate dielectric layers 1 in the high-frequency signal transmitting device S10 of the tenth embodiment. However, the grounding conductor 12 on the upper surface of the uppermost dielectric layer 1 is formed only in the area at the opposite sides of the signal wiring conductor 11, and the grounding conductor 22 on the lower surface of the bottommost dielectric layer 1 is formed only in the area at the opposite sides of the signal wiring conductor 21. Further, the displacements of the signal via conductors 14, 24, 34 between the respective dielectric layers are set to be substantially equal.

The high-frequency signal transmitting device S21 of the twenty-first embodiment differs from the high-frequency signal transmitting device S10 of the tenth embodiment in that only the grounding conductors 12, 32 similar to those of the high-frequency signal transmitting device S10 of the tenth embodiment are provided on the upper surfaces of the uppermost dielectric layer 1, the bottommost dielectric layer 1 and the intermediate dielectric layers 1 without providing the grounding conductor 22 on the lower surface of the bottommost dielectric layer 1 and that the displacements of the signal via conductors 14, 24, 34 between the respective dielectric layers are differed such that the angle of inclination is larger at the sides of the uppermost and bottommost dielectric layers 1 while being smaller at the middle side as in the twentieth embodiment.

It should be noted that the grounding conductors 22, 32 similar to those of the high-frequency signal transmitting device S10 of the tenth embodiment may be provided on the lower surface of the bottommost dielectric layer 1 and on the upper surfaces of the intermediate dielectric layers 1 and the bottommost dielectric layer 1 without providing the grounding conductor 12 on the upper surface of the uppermost dielectric layer 1. Further, in the case that a grounding conductor 12 similar to that of the high-frequency signal transmitting device S10 of the tenth embodiment is provided on the upper surface of the uppermost dielectric layer 1, the grounding-conductor via conductor 15 is provided in an area at the opposite sides of the signal wiring conductor 11. In the case that a grounding conductor 22 similar to that of the high-frequency signal transmitting device S10 of the tenth embodiment is provided on the lower surface of the bottommost dielectric layer 1, the grounding-conductor via conductor 25 is provided in an area at the opposite sides of the signal wiring conductor 21.

In this way, similar to the high-frequency signal transmitting device S10 of the tenth embodiment, inductances created at the respective signal-wiring connecting conductors 13, 23 is reduced to improve the transmission characteristic in the high-frequency band in the high-frequency signal transmitting device S21 of the twenty-first embodiment. In addition, since the signal via conductors 14, 24, 34 of the respective dielectric layers 1 penetrate the electromagnetically shielded space while being inclined in such a step-like manner as to be at a larger angle of inclination at the sides of the uppermost and bottommost dielectric layers 1 and at a smaller angle of inclination at the middle side, a direction of propagation can be changed while maintaining a propagation mode stable against a straight-propagating property of electromagnetic waves from the outer side to the inner side or from the inner side to the outer side. This makes reflection difficult to occur, with the result that a high-frequency signal transmitting device having a good compatibility can be obtained.

Although the displacements of the signal via conductors 14, 24, 34 between the respective dielectric layers differ in the twenty-first embodiment, they may take the same value as in the aforementioned twelfth embodiment or the signal via conductors 14, 24, 34 may be vertically arranged along the same axis as in the aforementioned eleventh embodiment. Even in such cases, the transmission characteristic in the high-frequency band can be improved.

In any of the high-frequency signal transmitting devices S11 to S21 of the eleventh and twenty-first embodiments, it is preferable to set the length of the signal-wiring connecting conductor 13 between the signal wiring conductor 11 and the signal via conductor 14 on the upper surface of the uppermost dielectric layer 1 at a value equal to or smaller than the thickness of the uppermost intermediate dielectric layer 1 in the grounding-conductor non-forming area 36 and to set the length of the signal-wiring connecting conductor 23 between the signal wiring conductor 21 and the signal via conductor 24 on the lower surface of the bottommost dielectric layer 1 at a value equal to or smaller than the thickness of the bottommost intermediate dielectric layer 1 in the grounding-conductor non-forming area 36. Such setting makes the lengths of the signal-wiring connecting conductors 13, 23 very short and only a very small amount of inductance is created there, with the result that the transmission characteristic in the high-frequency band can be better.

Figure 22A:
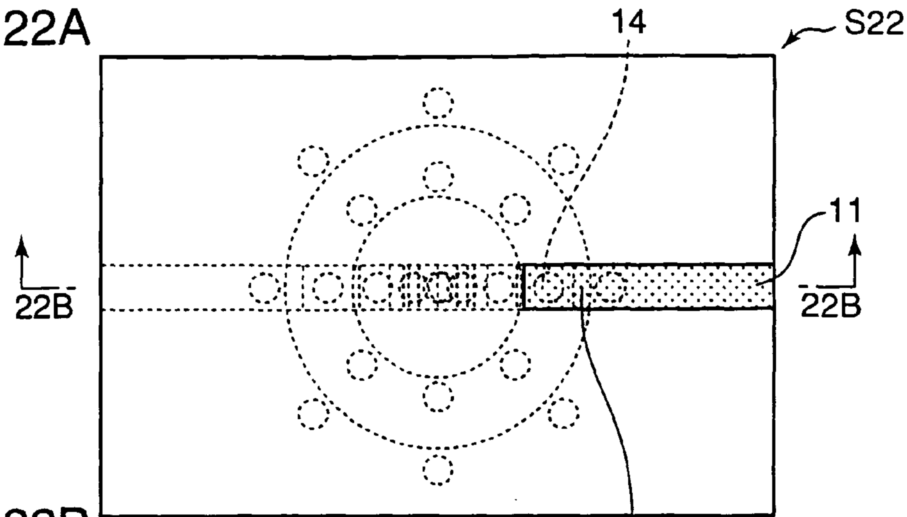
FIG. 22A is a plan view diagrammatically showing a high-frequency signal transmitting device according to a twenty-second embodiment of the invention.
Figure 22B:
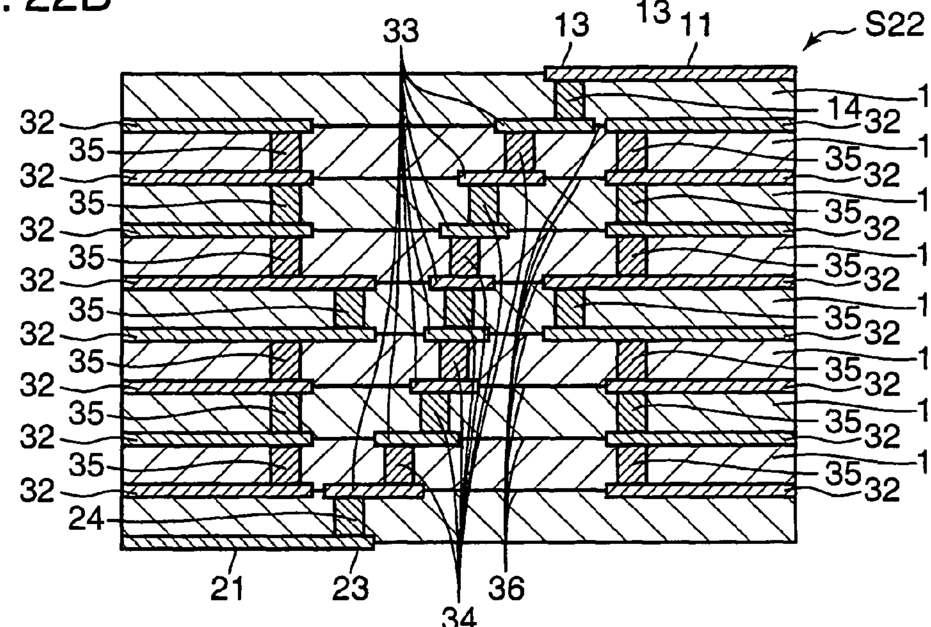
FIG. 22B is a vertical sectional view taken along the line 22B—22B of FIG. 22A.
Figure 22C:
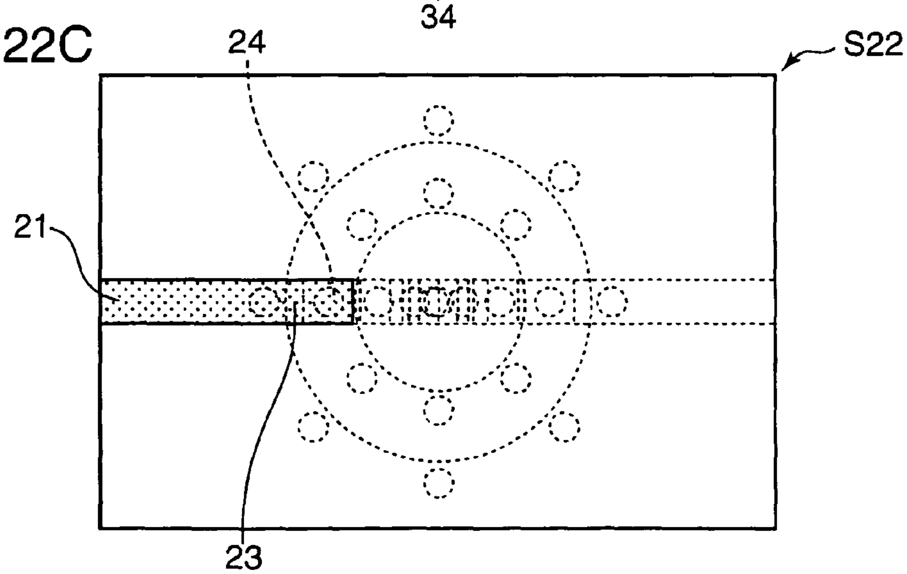
FIG. 22C is a bottom view of the high-frequency signal transmitting device of FIG. 22A.

Referring to FIGS. 22A to 22C showing a high-frequency signal transmitting device S22 according to a twenty-second embodiment of the present invention, a high-frequency signal transmitting device S22 has, in its basic construction, the same elements as the high-frequency signal transmitting device S13 according to the thirteenth embodiment shown in FIGS. 13A to 13C. Thus, no detailed description is given on the elements having the same functions by identifying them by the same reference numerals, and the following description is centered on differences to the high-frequency signal transmitting device S13 of the thirteenth embodiment.

As described above, in high-frequency signal transmitting device S13 of the thirteenth embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a stepped manner as to be at a larger angle of inclination at the sides of the uppermost and bottommost dielectric layers 1 and at a smaller angle of inclination at the middle side.

The high-frequency signal transmitting device S22 of the twenty-second embodiment differs from the high-frequency signal transmitting device S13 of the thirteenth embodiment in that the grounding-conductor non-forming areas 36 surrounded by the grounding conductor 32 on the upper surface of the middle intermediate dielectric layer 1 located vertically in the middle (hereinafter, "middle intermediate dielectric layers") and the grounding conductor 32 on the upper surface of the dielectric layer 1 located right therebelow (i.e., the grounding conductors 32 located on the upper and lower surfaces of the middle intermediate dielectric layer 1) are made smaller toward their centers to have a smaller elliptical area, and the grounding-conductor via conductors 35 connecting these upper and lower grounding conductors 32 are extended toward the center, whereby a resonance controlling layer acting as a cylindrical dielectric resonator and adapted to control a resonance frequency of the electromagnetically shielded space is formed in a vertically middle portion of the layered substrate 2. The other construction is similar to that of the high-frequency signal transmitting device S13 of the thirteenth embodiment.

In this way, similar to the high-frequency signal transmitting device S13 of the thirteenth embodiment, the lengths of the signal wiring conductors 13, 23 of the uppermost and bottommost dielectric layers 1 are shorter as compared to that of the first embodiment. Thus, inductances created at the respective signal-wiring connecting conductors 13, 23 are reduced to improve the transmission characteristic in the high-frequency band. In addition, the resonance controlling layer for controlling the resonance frequency of the electromagnetically shielded space is formed in the vertically middle portion of the layered substrate 2 by reducing the areas of the respective grounding-conductor non-forming areas 36 surrounded by the grounding conductor 32 on the upper surface of the middle dielectric layer 1 and the grounding conductor 32 on the upper surface of the dielectric layer 1 right below it. This promotes the broadening of a usable frequency band of the high-frequency signal transmitting device.

Specifically, in the high-frequency signal transmitting device S13 of the thirteenth embodiment, the electromagnetically shielded space formed by the grounding conductors 32 of the respective dielectric layers 1 acts as a cylindrical dielectric resonator, with the result that the usable frequency band of the high-frequency signal transmitting device is narrowed by the resonance. Contrary to this, a cutoff frequency of a circular waveguide mode (TE11 mode) in the resonance controlling layer is higher than those of circular waveguide modes (TE11 modes) in the other dielectric layers in the high-frequency signal transmitting device S22 of the twenty-second embodiment. Thus, this resonance controlling layer acts as a reactance attenuator to suppress the high-order mode propagation. As a result, the resonance in accordance with the cylindrical dielectric resonance mode is shifted toward a higher frequency side, broadening the usable frequency band.

In the twenty-second embodiment, the displacements of the signal via conductors 14, 24, 34 between the respective dielectric layers are differed such that the angle of inclination is larger at the sides of the uppermost and bottommost dielectric layers while being smaller at the middle side. However, they may take the same value between the respective layers as in the aforementioned twelfth embodiment. Even in such a case, inductances created at the respective signal-wiring connecting conductors 13, 23 are reduced to improve the transmission characteristic in the high-frequency band. In addition, the usable frequency band of the high-frequency signal transmitting device can be further broadened by forming the resonance controlling layer for controlling the resonance frequency of the electromagnetically shielded space.

Figure 23A:
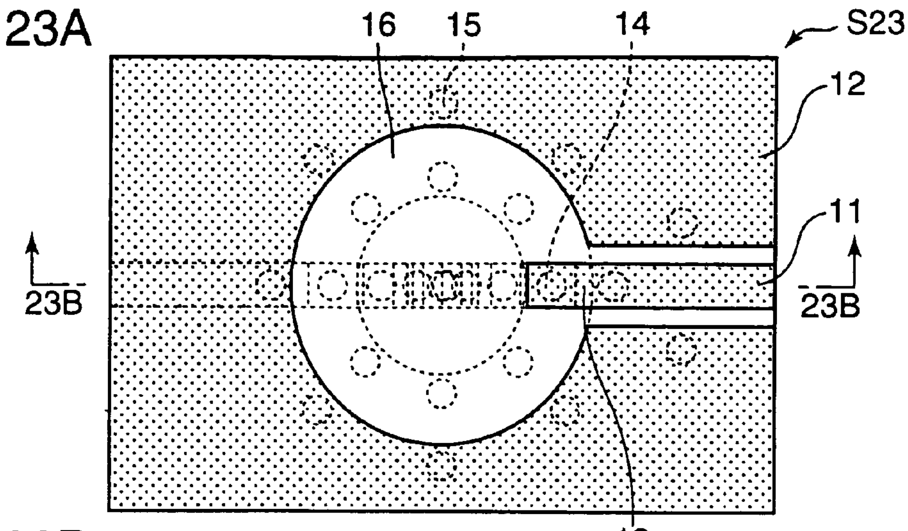
FIG. 23A is a plan view diagrammatically showing a high-frequency signal transmitting device according to a twenty-third embodiment of the invention.
Figure 23B:
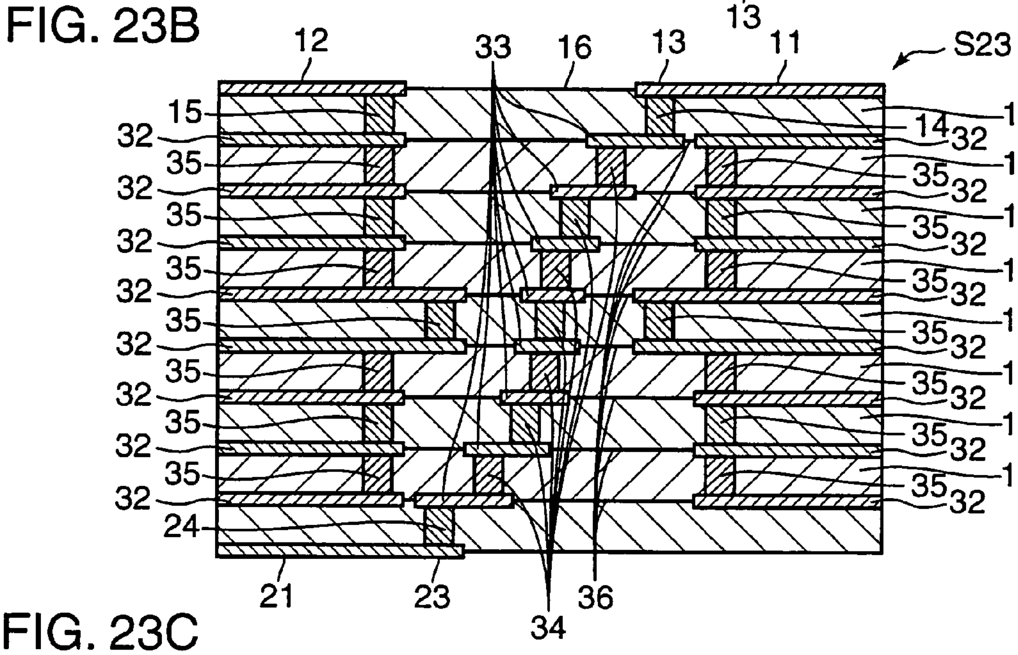
FIG. 23B is a vertical sectional view taken along the line 23B—23B of FIG. 23A.
Figure 23C:
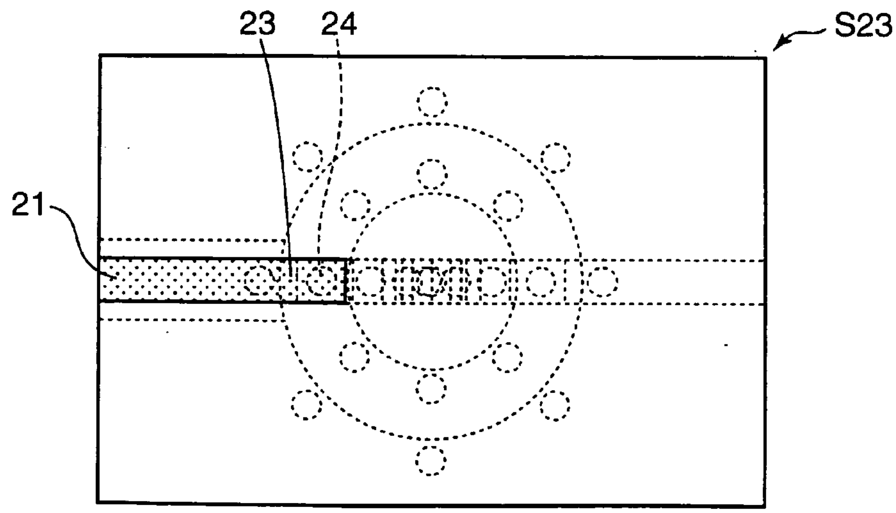
FIG. 23C is a bottom view of the high-frequency signal transmitting device of FIG. 23A.

Referring to FIGS. 23A to 23C showing a high-frequency signal transmitting device S23 according to a twenty-third embodiment of the present invention, a high-frequency signal transmitting device S23 has, in its basic construction, the same elements as the high-frequency signal transmitting device S22 according to the twenty-second embodiment shown in FIGS. 22A to 22C. Thus, no detailed description is given on the elements having the same functions by identifying them by the same reference numerals, and the following description is centered on differences to the high-frequency signal transmitting device S22 of the twenty-second embodiment.

As described above, in the high-frequency signal transmitting device S22 of the twenty-second embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a step-like manner as to be at a larger angle of inclination at the sides of the uppermost and bottommost dielectric layers 1 and at a smaller angle of inclination at the middle side. Further, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it.

The high-frequency signal transmitting device S23 according to the twenty-third embodiment differs from the high-frequency signal transmitting device S22 according to the twenty-second embodiment in that a grounding conductor 12 (similar to the grounding conductor 12 of the high-frequency signal transmitting device S20 shown in FIG. 20) having such a shape as to surround the signal wiring conductor 11 with specified gaps G1, G2 defined to the opposite sides of the signal wiring conductor 11 and a grounding-conductor non-forming area 16 of the same size and located at the same position as the grounding-conductor non-forming areas 36 of the intermediate dielectric layers 1 is provided on the upper surface of the uppermost dielectric layer 1, and a grounding-conductor via conductor 15 (similar to the grounding-conductor via conductor 15 of the high-frequency signal transmitting device S20 shown in FIG. 20) for connecting the grounding conductor 12 and the grounding conductor 32 on the upper surface of the dielectric layer 1 right below the uppermost dielectric layer 1 is provided in the uppermost dielectric layer 1. The other construction is similar to that of the high-frequency signal transmitting device S22 of the twenty-second embodiment.

In this way, similar to the high-frequency signal transmitting device S22 of the twenty-second embodiment, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it in the high-frequency signal transmitting device S23 of the twenty-third embodiment. On the other hand, the grounding conductor 12 not included in the high-frequency signal transmitting device S22 of the twenty-second embodiment is provided on the upper surface of the uppermost dielectric layer 1. Thus, the usable frequency band of the high-frequency signal transmitting device can be more broadened than the high-frequency signal transmitting device S22 of the twenty-second embodiment.

It should be noted that a grounding conductor 22 having such a shape as to surround the signal wiring conductor 21 with specified gaps defined to the opposite sides of the signal wiring conductor 21 and a grounding-conductor non-forming area of the same size and located at the same position as the grounding-conductor non-forming areas 36 of the intermediate dielectric layers 1 may be provided on the lower surface of the bottommost dielectric layer 1 without providing the grounding conductor 12 on the upper surface of the uppermost dielectric layer 1, and a grounding-conductor via conductor 25 for connecting this grounding conductor and the grounding conductor 32 on the upper surface of the bottommost dielectric layer 1 may be provided in the bottommost dielectric layer 1.

Further, in the twenty-third embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band can be further broadened similar to the embodiment in which the above displacements are differed.

Figure 24A:
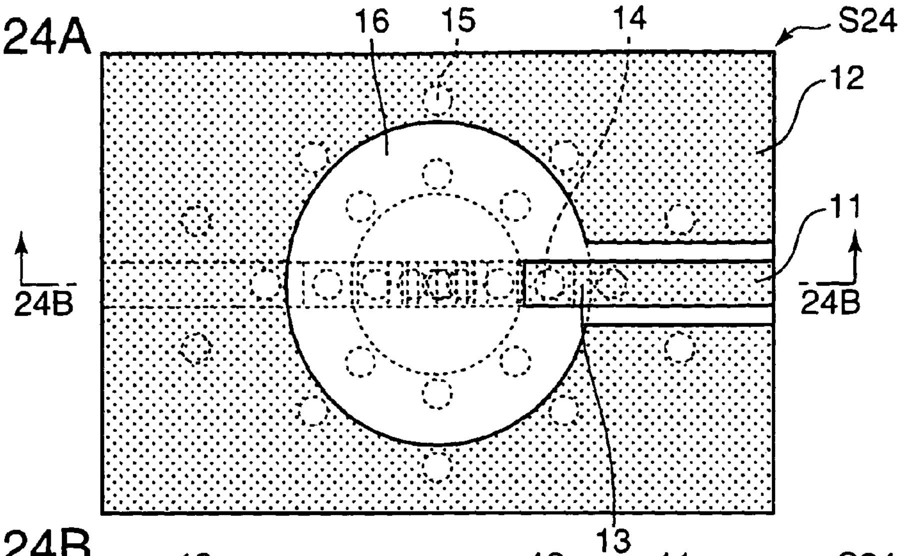
FIG. 24A is a plan view diagrammatically showing a high-frequency signal transmitting device according to a twenty-fourth embodiment of the invention.
Figure 24B:
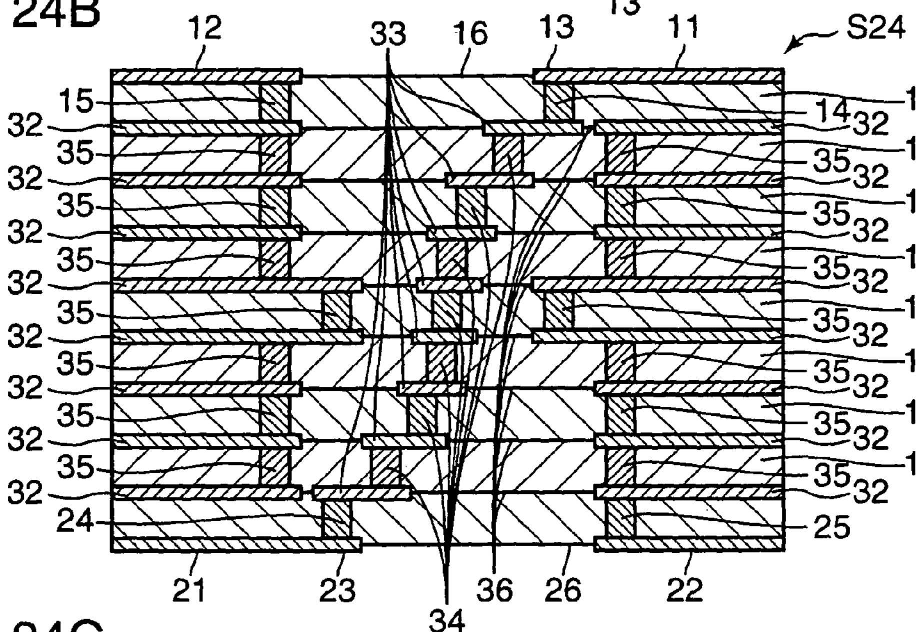
FIG. 24B is a vertical sectional view taken along the line 24B—24B of FIG. 24A.
Figure 24C:
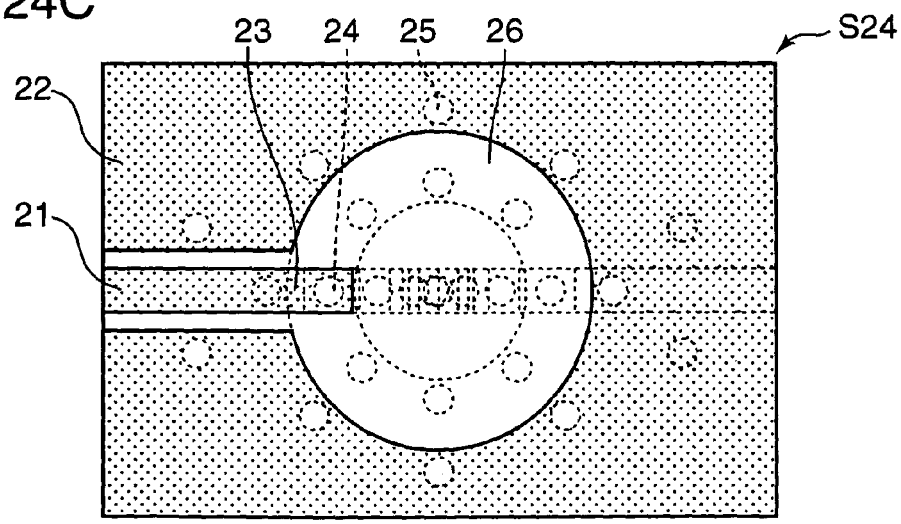
FIG. 24C is a bottom view of the high-frequency signal transmitting device of FIG. 24A.

Referring to FIGS. 24A to 24C showing a high-frequency signal transmitting device S24 according to a twenty-fourth embodiment of the present invention, a high-frequency signal transmitting device S24 has, in its basic construction, the same elements as the high-frequency signal transmitting device S22 according to the twenty-fourth embodiment shown in FIGS. 22A to 22C. Thus, no detailed description is given on the elements having the same functions by identifying them by the same reference numerals, and the following description is centered on differences to the high-frequency signal transmitting device S22 of the twenty-second embodiment.

As described above, in the high-frequency signal transmitting device S22 of the twenty-second embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a step-like manner as to be at a larger angle of inclination at the sides of the uppermost and bottommost dielectric layers 1 and at a smaller angle of inclination at the middle side. Further, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it.

The high-frequency signal transmitting device S24 according to the twenty-fourth embodiment differs from the high-frequency signal transmitting device S22 according to the twenty-second embodiment in the following points. A grounding conductor 12 (similar to the grounding conductor 12 of the high-frequency signal transmitting device S20 shown in FIG. 20) having such a shape as to surround the signal wiring conductor 11 with specified gaps G1, G2 defined to the opposite sides of the signal wiring conductor 11 and a grounding-conductor non-forming area 16 of the same size and located at the same position as the grounding-conductor non-forming areas 36 of the intermediate dielectric layers 1 is provided on the upper surface of the uppermost dielectric layer 1. A grounding-conductor via conductor 15 (similar to the grounding-conductor via conductor 15 of the high-frequency signal transmitting device S20 shown in FIG. 20) for connecting the grounding conductor 12 and the grounding conductor 32 on the upper surface of the dielectric layer 1 right below the uppermost dielectric layer 1 is provided in the uppermost dielectric layer 1. A grounding conductor 22 (similar to the grounding conductor 22 of the high-frequency signal transmitting device S20 shown in FIG. 20) having such a shape as to surround the signal wiring conductor 21 with specified gaps G3, G4 defined to the opposite sides of the signal wiring conductor 21 and a grounding-conductor non-forming area 26 of the same size and located at the same position as the grounding-conductor non-forming areas 16 surrounded by the grounding conductor 12 of the uppermost dielectric layer 1 is provided on the lower surface of the bottommost dielectric layer 1. A grounding-conductor via conductor 25 (similar to the grounding-conductor via conductor 25 of the high-frequency signal transmitting device S20 shown in FIG. 20) for connecting the grounding conductor 22 and the grounding conductor 32 on the upper surface of the bottommost dielectric layer 1 is provided in the bottommost dielectric layer 1. The other construction is similar to that of the high-frequency signal transmitting device S22 of the twenty-second embodiment.

In this way, similar to the high-frequency signal transmitting device S22 of the twenty-second embodiment, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it in the high-frequency signal transmitting device S24 of the twenty-fourth embodiment. On the other hand, the grounding conductors 12, 22 not included in the high-frequency signal transmitting device S22 of the twenty-second embodiment are provided on the upper surface of the uppermost dielectric layer 1 and on the lower surface of the bottommost dielectric layer 1. Thus, the usable frequency band of the high-frequency signal transmitting device can be more broadened than the high-frequency signal transmitting device S22 of the twenty-second embodiment.

Further, in the twenty-fourth embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band can be further broadened similar to the embodiment in which the above displacements are differed.

Figure 25A:
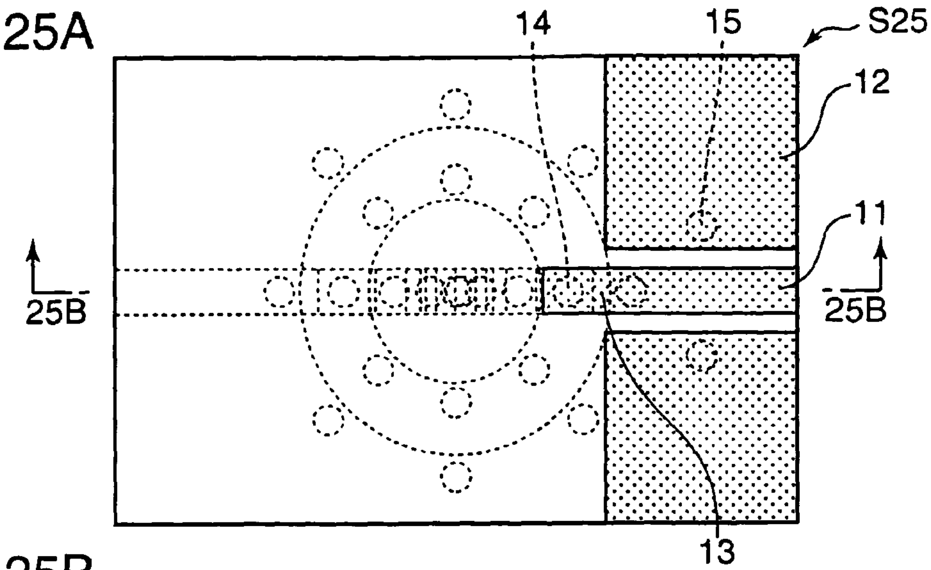
FIG. 25A is a plan view diagrammatically showing a high-frequency signal transmitting device according to a twenty-fifth embodiment of the invention.
Figure 25B:
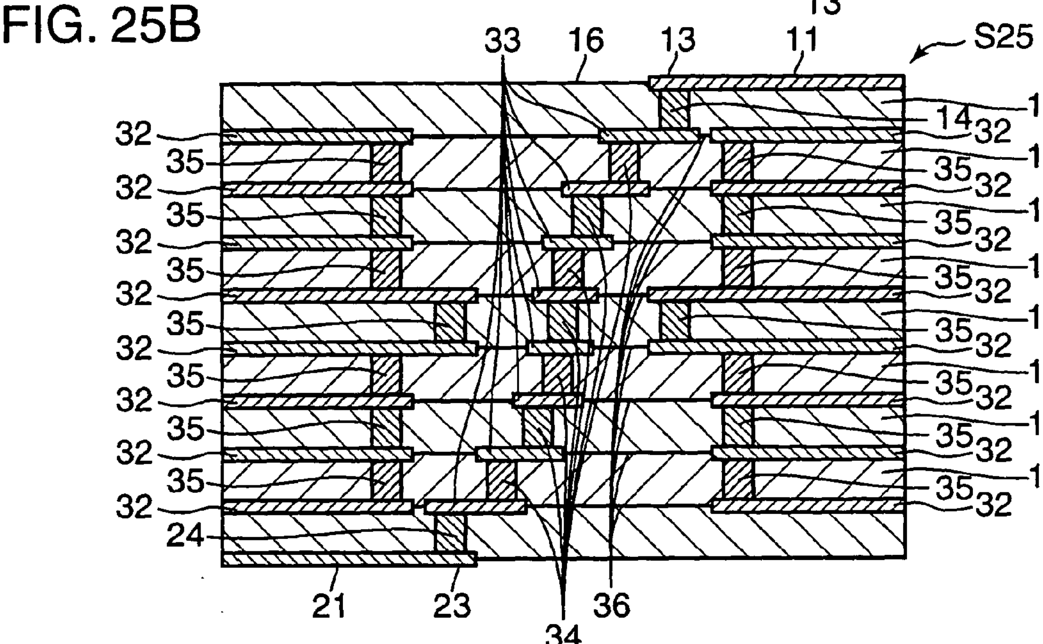
FIG. 25B is a vertical sectional view taken along the line 25B—25B of FIG. 25A.
Figure 25C:
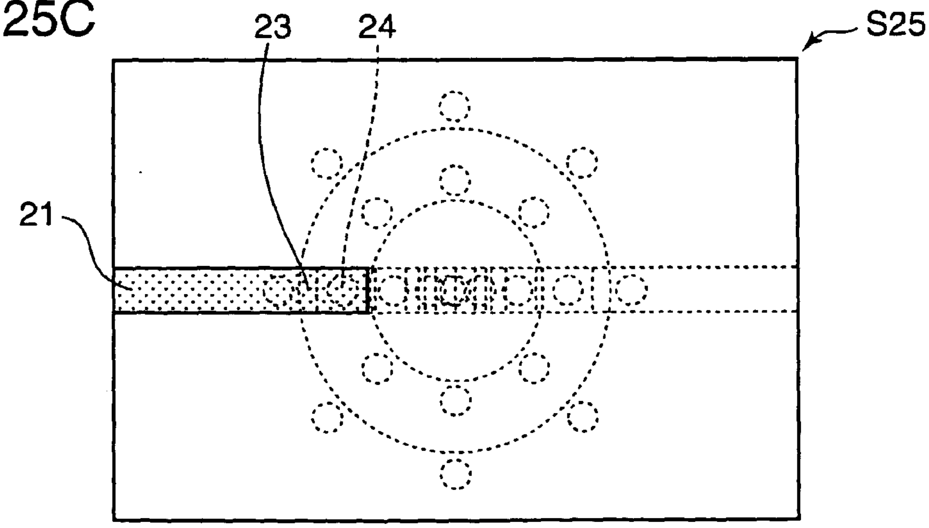
FIG. 25C is a bottom view of the high-frequency signal transmitting device of FIG. 25A.

Referring to FIGS. 25A to 25C showing a high-frequency signal transmitting device S25 according to a twenty-fifth embodiment of the present invention, a high-frequency signal transmitting device S25 has, in its basic construction, the same elements as the high-frequency signal transmitting device S22 according to the twenty-second embodiment shown in FIGS. 22A to 22C. Thus, no detailed description is given on the elements having the same functions by identifying them by the same reference numerals, and the following description is centered on differences to the high-frequency signal transmitting device S22 of the twenty-second embodiment.

As described above, in the high-frequency signal transmitting device S22 of the twenty-second embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a step-like manner as to be at a larger angle of inclination at the sides of the uppermost and bottommost dielectric layers 1 and at a smaller angle of inclination at the middle side. Further, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it.

The high-frequency signal transmitting device S25 according to the twenty-fifth embodiment differs from the high-frequency signal transmitting device S22 according to the twenty-second embodiment in that a grounding conductor 12 having such a shape as to surround the signal wiring conductor 11 with specified gaps G5, G6 defined to the opposite sides of the signal wiring conductor 11 is provided only in an area of the upper surface of the uppermost dielectric layer 1 where the signal wiring conductor 11 is present, and a grounding-conductor via conductor 15 for connecting the grounding conductor 12 and the grounding conductor 32 on the upper surface of the dielectric layer 1 right below the uppermost dielectric layer 1 is provided in the uppermost dielectric layer 1. The other construction is similar to that of the high-frequency signal transmitting device S22 of the twenty-second embodiment.

In this way, similar to the high-frequency signal transmitting device S22 of the twenty-second embodiment, the resonance controlling layer for controlling the resonance frequency of the electromagnetically shielded space is formed in the vertically middle portion of the layered substrate 2 by reducing the dimensions of the grounding-conductor non-forming areas 36 surrounded by the grounding conductor 32 on the upper surface of the middle intermediate dielectric layer 1 and the grounding conductor 32 on the upper surface of the dielectric layer 1 right below it in the high-frequency signal transmitting device S25 of the twenty-fifth embodiment. On the other hand, the grounding conductor 12 not included in the high-frequency signal transmitting device S22 of the twenty-second embodiment is provided on the upper surface of the uppermost dielectric layer 1. Thus, the usable frequency band of the high-frequency signal transmitting device can be more broadened than the high-frequency signal transmitting device S22 of the twenty-second embodiment.

It should be noted that a grounding conductor 22 similar to the grounding conductor 12 on the uppermost dielectric layer 1 may be provided on the lower surface of the bottommost dielectric layer 1 without providing the grounding conductor 12 on the upper surface of the uppermost dielectric layer 1, and a grounding-conductor via conductor 25 for connecting this grounding conductor and the grounding conductor 32 on the upper surface of the bottommost dielectric layer 1 may be provided in the bottommost dielectric layer 1. Alternatively, the uppermost dielectric layer 1 may be provided with the grounding conductor 12 and the grounding-conductor via conductor 15 and the bottommost dielectric layer 1 may be provided with the grounding conductor 22 and the grounding-conductor via conductor 25.

Further, in the twenty-fifth embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band can be further broadened similar to the embodiment in which the above displacements are differed.

In the high-frequency signal transmitting devices S22 to S25 of the twenty-second to twenty-fifth embodiments described above, the signal via conductors 14, 24, 34 of the respective dielectric layers 1 penetrate the electromagnetically shielded space while being inclined in such a step-like manner as to be at a larger angle of inclination at the sides of the uppermost and bottommost dielectric layers 1 and at a smaller angle of inclination at the middle side. However, the signal via conductors 14, 24, 34 of the respective dielectric layers 1 may penetrate the electromagnetically shielded space while being inclined in a step-like manner along a straight line of a specified inclination as shown in FIG. 2.

Further, in the high-frequency signal transmitting devices S22 to S25 of the twenty-second to twenty-fifth embodiments, the cutoff frequency of the waveguide is highest when the waveguide takes a circular shape provided that the waveguides take up an equal area. Thus, the grounding conductors 12, 22, 32 most preferably takes a circular shape in order to broaden the usable frequency band. For example, the cutoff frequency of a high-order mode (TE11 mode) in a so-called coaxial line having a characteristic impedance of 50 Ω and having such a cross section that a grounding conductor takes a circular shape having a diameter of 1.26 mm, a signal conductor having a diameter of 0.10 mm is located in its center, and a dielectric material having a relative dielectric constant of 9.2 is filled between the grounding conductor and the signal conductor is 45.5 GHz.

On the other hand, as a comparison, the cutoff frequency of a high-order mode (TE10 mode) in a transmitting device having a characteristic impedance of 50 Ω and having such a cross section that a grounding conductor takes a square shape having sides of 1.17 mm, a signal conductor having a diameter of 0.10 mm is located in its center, and a dielectric material having a relative dielectric constant of 9.2 is filled between the grounding conductor and the signal conductor is 41.8 GHz. Thus, it can be said that the cutoff frequency is higher if the grounding conductor takes a circular shape.

Further, if the number of the layers provided with the grounding-conductor non-forming area for the resonance control is increased, reactance is attenuated to a larger degree due to an increase in the transmission distance. Thus, a cutoff effect can be expected. However, if the transmission distance becomes too long, characteristic impedance is considerably reduced due to an increased capacity at a frequency up to the cutoff frequency, causing a bad influence of leading to an increased reflection. Therefore, the transmission distance, i.e., the number of the layers provided with the grounding-conductor non-forming area for the resonance control may be suitably determined.

Further, in the case that the grounding conductors 12, 22 are provided on the upper and/lower surfaces of the layered substrate 2, their main purpose is to form a high-frequency transmitting device by being formed at the opposite sides of the signal wiring conductors 11, 21 while being spaced by a specified distance from the signal wiring conductors 11, 21, and a good high-frequency characteristic can be obtained even if the grounding conductors 12, 22 do not surround the signal-wiring connecting conductors 13, 23. However, a better high-frequency transmission characteristic can be obtained by approximating the construction of the grounding conductors 12, 22 to such a construction as to surround the signal-wiring connecting conductors 13, 23.

Figure 26A:
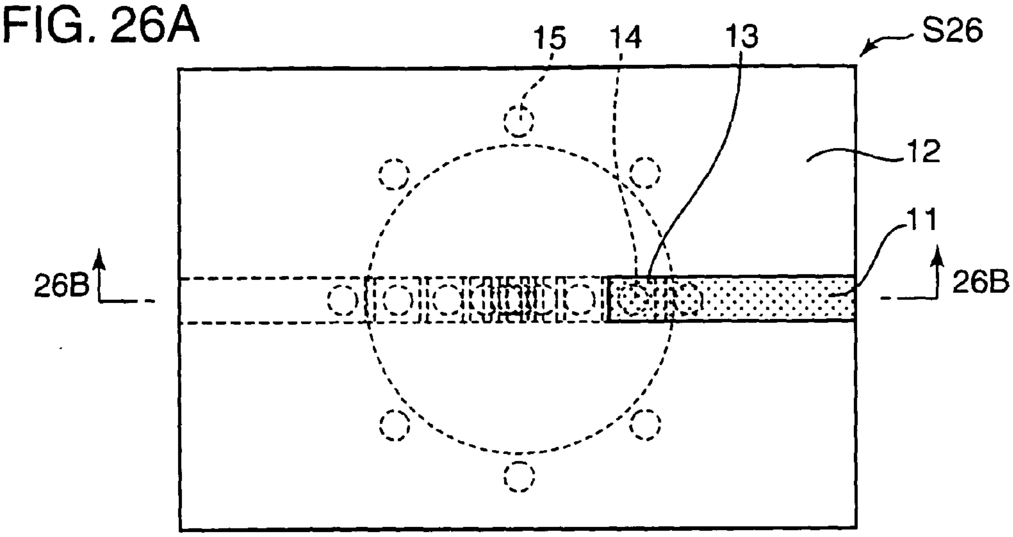
FIG. 26A is a plan view diagrammatically showing a high-frequency signal transmitting device according to a twenty-sixth embodiment of the invention.
Figure 26B:
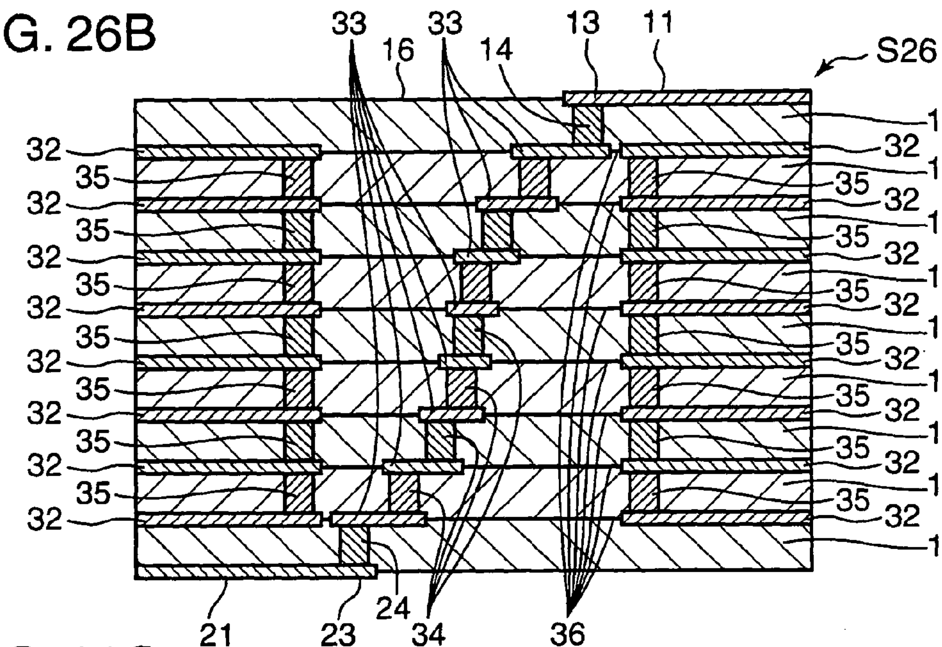
FIG. 26B is a vertical sectional view taken along the line 26B—26B of FIG. 26A.
Figure 26C:
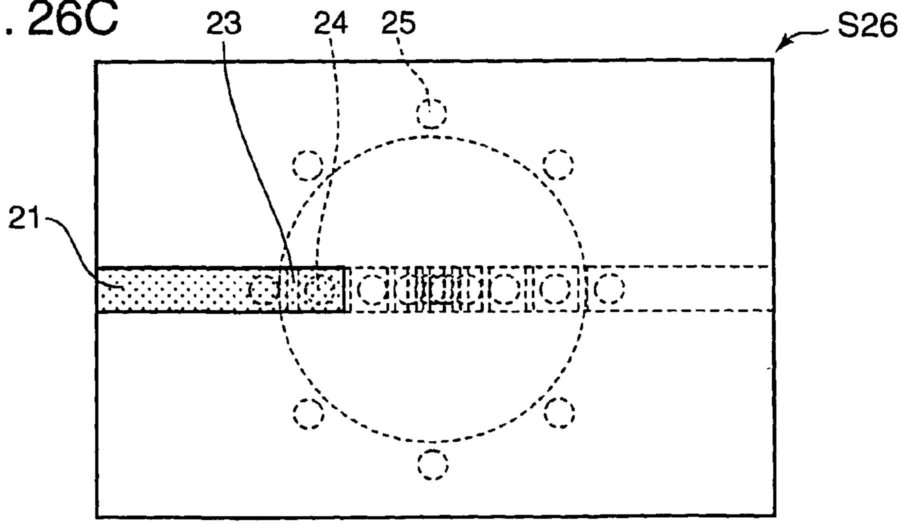
FIG. 26C is a bottom view of the high-frequency signal transmitting device of FIG. 26A.

Referring to FIGS. 26A to 26C showing a high-frequency signal transmitting device S26 according to a twenty-sixth embodiment of the present invention, a high-frequency signal transmitting device S26 has, in its basic construction, the same elements as the high-frequency signal transmitting device S13 according to the thirteenth embodiment shown in FIGS. 13A to 13C. Thus, no detailed description is given on the elements having the same functions by identifying them by the same reference numerals, and the following description is centered on differences to the high-frequency signal transmitting device S13 of the thirteenth embodiment.

As described above, in high-frequency signal transmitting device S13 of the thirteenth embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a stepped manner as to be at a larger angle of inclination at the sides of the uppermost and bottommost dielectric layers 1 and at a smaller angle of inclination at the middle side.

The high-frequency signal transmitting device S26 of the twenty-sixth embodiment differs from the high-frequency signal transmitting device S13 of the thirteenth embodiment in that the middle intermediate dielectric layer 1 from top (fifth dielectric layer 1 in this embodiment) is made of a dielectric material having a smaller permittivity than the other dielectric layers 1, whereby a resonance controlling layer acting as a cylindrical dielectric resonator and adapted to control the resonance frequency of the electromagnetically shielded space is formed in the vertically middle portion of the layered substrate 2. The other construction is similar to that of the high-frequency signal transmitting device S13 of the thirteenth embodiment.

In this way, since the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1, the usable frequency band of the high-frequency signal transmitting device can be broadened.

Specifically, in the high-frequency signal transmitting device S13 of the thirteenth embodiment, the electromagnetically shielded space formed by the grounding conductors 32 of the respective dielectric layers 1 acts as a cylindrical dielectric resonator, with the result that the usable frequency band of the high-frequency signal transmitting device is narrowed by the resonance. Contrary to this, a cutoff frequency of a circular waveguide mode (TE11 mode) in the resonance controlling layer is higher than those of circular waveguide modes (TE11 modes) in the other dielectric layers in the high-frequency signal transmitting device S26 of the twenty-sixth embodiment. Thus, this resonance controlling layer acts as a reactance attenuator to suppress the high-order mode propagation. As a result, the resonance in accordance with the cylindrical dielectric resonance mode is shifted toward a higher frequency side, broadening the usable frequency band.

Further, in the twenty-sixth embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band of the high-frequency signal transmitting device can be further broadened by forming the resonance controlling layer for controlling the resonance frequency of the electromagnetically shielded space.

Figure 27A:
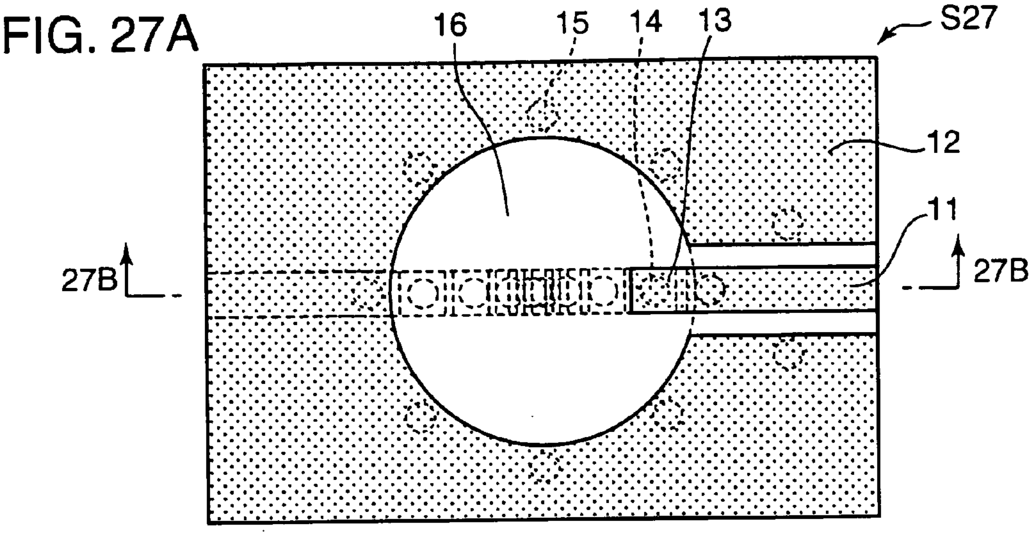
FIG. 27A is a plan view diagrammatically showing a high-frequency signal transmitting device according to a twenty-seventh embodiment of the invention.
Figure 27B:
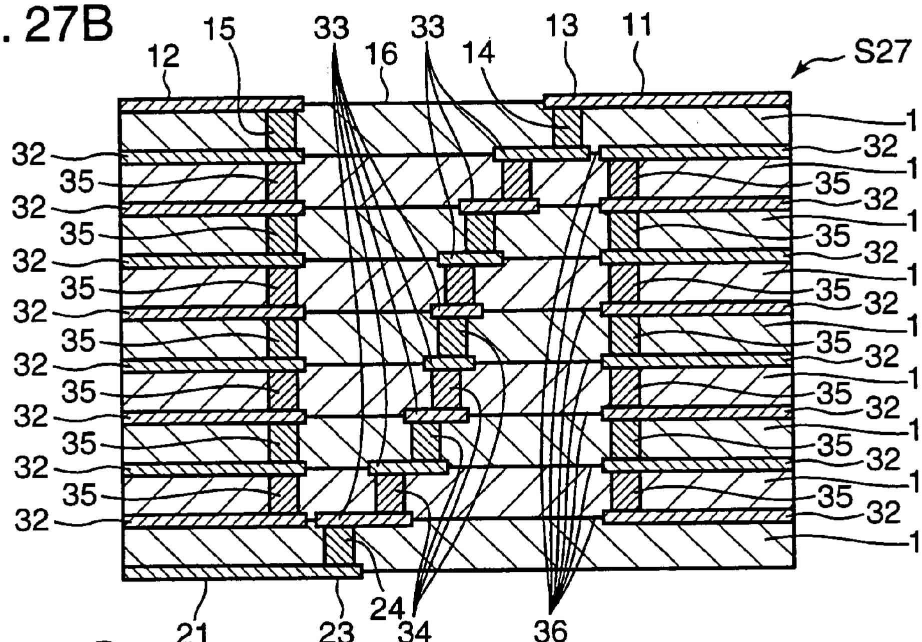
FIG. 27B is a vertical sectional view taken along the line 27B—27B of FIG. 27A.
Figure 27C:
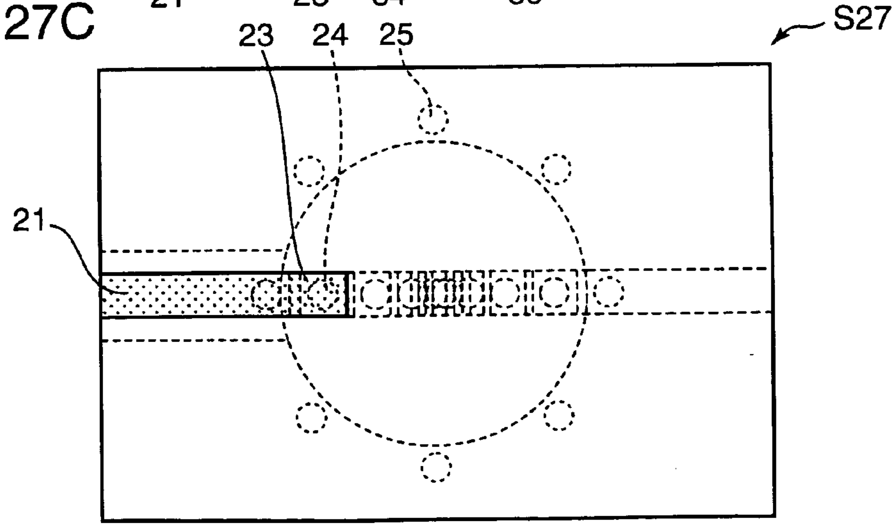
FIG. 27C is a bottom view of the high-frequency signal transmitting device of FIG. 27A.

Referring to FIGS. 27A to 27C showing a high-frequency signal transmitting device S27 according to a twenty-seventh embodiment of the present invention, a high-frequency signal transmitting device S27 has, in its basic construction, the same elements as the high-frequency signal transmitting device S26 according to the twenty-sixth embodiment shown in FIGS. 26A to 26C. Thus, no detailed description is given on the elements having the same functions by identifying them by the same reference numerals, and the following description is centered on differences to the high-frequency signal transmitting device S26 of the twenty-sixth embodiment.

As described above, in high-frequency signal transmitting device S26 of the twenty-sixth embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a stepped manner as to be at a larger angle of inclination at the sides of the uppermost and bottommost dielectric layers 1 and at a smaller angle of inclination at the middle side. Further, the resonance controlling layer acting as a cylindrical dielectric resonator and adapted to control the resonance frequency of the electromagnetically shielded space is formed in the vertically middle portion of the layered substrate 2 by making the middle dielectric layer 1 of the dielectric material having a smaller permittivity than the other dielectric layers 1.

The high-frequency signal transmitting device S27 of the twenty-seventh embodiment differs from the high-frequency signal transmitting device S26 of the twenty-sixth embodiment in that a grounding conductor 12 (similar to the grounding conductor 12 of the high-frequency signal transmitting device S20 shown in FIG. 20) having such a shape as to surround the signal wiring conductor 11 with specified gaps G1, G2 defined to the opposite sides of the signal wiring conductor 11 and a grounding-conductor non-forming area 16 of the same size and located at the same position as the grounding-conductor non-forming areas 36 of the intermediate dielectric layers 1 is provided on the upper surface of the uppermost dielectric layer 1 and a grounding-conductor via conductor 15 (similar to the grounding-conductor via conductor 15 of the high-frequency signal transmitting device S20 shown in FIG. 20) for connecting the grounding conductor 12 and the grounding conductor 32 on the upper surface of the dielectric layer 1 right below the uppermost dielectric layer 1 is provided in the uppermost dielectric layer 1. The other construction is similar to that of the high-frequency signal transmitting device S26 of the twenty-sixth embodiment.

In this way, similar to the high-frequency signal transmitting device S26 of the twenty-sixth embodiment, the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1 in the high-frequency signal transmitting device S27 of the twenty-seventh embodiment. On the other hand, the grounding conductor 12 not included in the high-frequency signal transmitting device S26 of the twenty-sixth embodiment is provided on the upper surface of the uppermost dielectric layer 1. Thus, the usable frequency band of the high-frequency signal transmitting device can be more broadened than the high-frequency signal transmitting device S26 of the twenty-sixth embodiment.

It should be noted that a grounding conductor 22 surrounding the signal wiring conductor 21 with specified gaps defined to the opposite sides of the signal wiring conductor 21 and having such a shape as to surround a grounding-conductor non-forming area of the same size and located at the same position as the grounding-conductor non-forming areas 36 of the intermediate dielectric layers 1 may be provided on the lower surface of the bottommost dielectric layer 1 without providing the grounding conductor 12 on the upper surface of the uppermost dielectric layer 1, and a grounding-conductor via conductor 25 for connecting this grounding conductor and the grounding conductor 32 on the upper surface of the bottommost dielectric layer 1 may be provided in the bottommost dielectric layer 1.

Further, in the twenty-seventh embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band of the high-frequency transmitting device can be further broadened by forming the resonance controlling layer for controlling the resonance frequency of the electromagnetically shielded space.

Figure 28A:
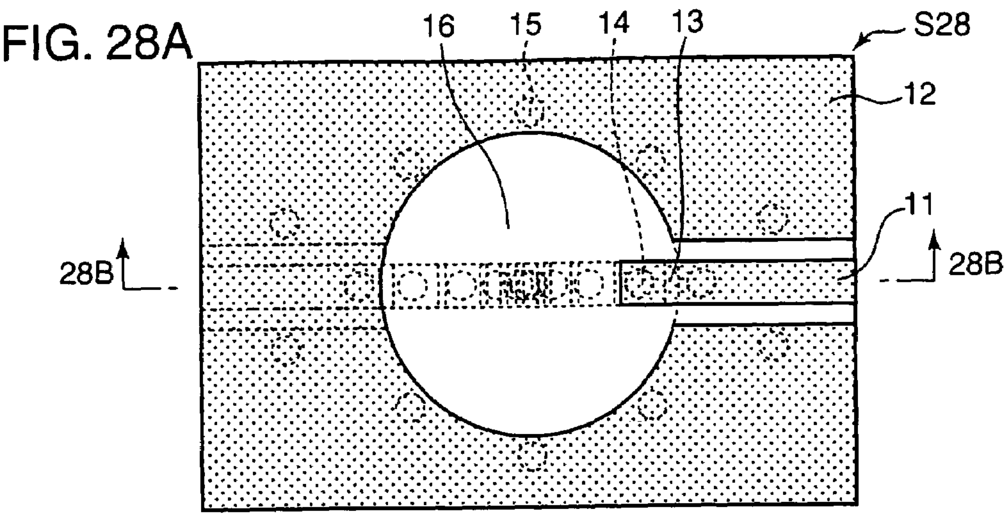
FIG. 28A is a plan view diagrammatically showing a high-frequency signal transmitting device according to a twenty-eighth embodiment of the invention.
Figure 28B:
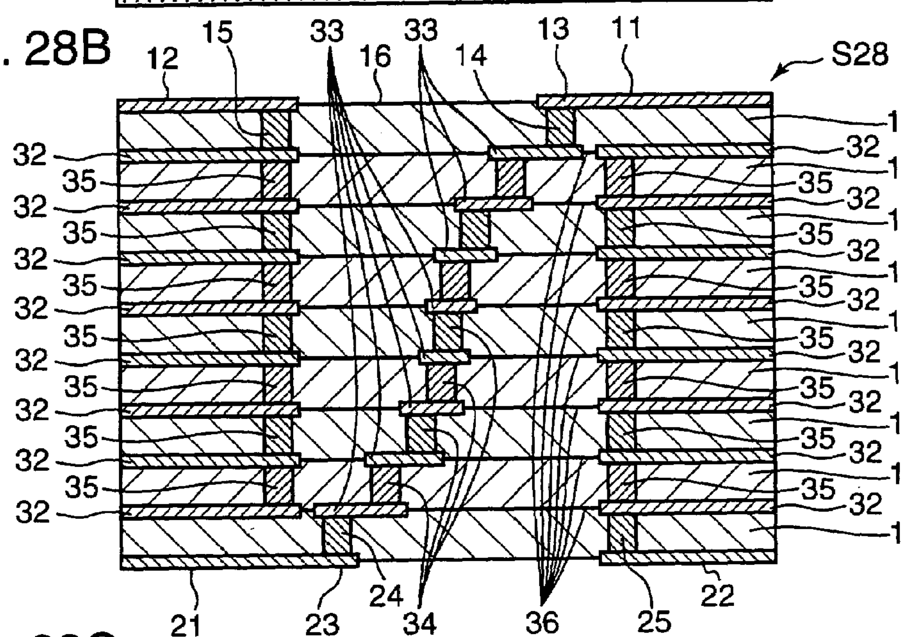
FIG. 28B is a vertical sectional view taken along the line 28B—28B of FIG. 28A.
Figure 28C:
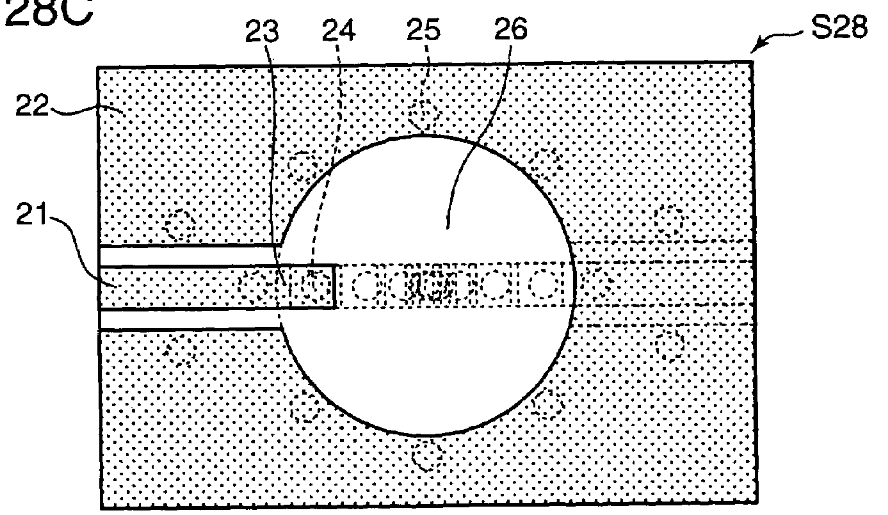
FIG. 28C is a bottom view of the high-frequency signal transmitting device of FIG. 28A.

Referring to FIGS. 28A to 28C showing a high-frequency signal transmitting device S28 according to a twenty-eighth embodiment of the present invention, a high-frequency signal transmitting device S28 has, in its basic construction, the same elements as the high-frequency signal transmitting device S26 according to the twenty-sixth embodiment shown in FIGS. 26A to 26C. Thus, no detailed description is given on the elements having the same functions by identifying them by the same reference numerals, and the following description is centered on differences to the high-frequency signal transmitting device S26 of the twenty-sixth embodiment.

As described above, in high-frequency signal transmitting device S26 of the twenty-sixth embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a stepped manner as to be at a larger angle of inclination at the sides of the uppermost and bottommost dielectric layers 1 and at a smaller angle of inclination at the middle side. Further, the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1.

The high-frequency signal transmitting device S28 of the twenty-eighth embodiment differs from the high-frequency signal transmitting device S26 of the twenty-sixth embodiment in the following points. A grounding conductor 12 (similar to the grounding conductor 12 of the high-frequency signal transmitting device S20 shown in FIG. 20) having such a shape as to surround the signal wiring conductor 11 with specified gaps G1, G2 defined to the opposite sides of the signal wiring conductor 11 and a grounding-conductor non-forming area 16 of the same size and located at the same position as the grounding-conductor non-forming areas 36 of the intermediate dielectric layers 1 is provided on the upper surface of the uppermost dielectric layer 1. A grounding-conductor via conductor 15 (similar to the grounding-conductor via conductor 15 of the high-frequency signal transmitting device S20 shown in FIG. 20) for connecting the grounding conductor 12 and the grounding conductor 32 on the upper surface of the dielectric layer 1 right below the uppermost dielectric layer 1 is provided in the uppermost dielectric layer 1. A grounding conductor 22 (similar to the grounding conductor 22 of the high-frequency signal transmitting device S20 shown in FIG. 20) having such a shape as to surround the signal wiring conductor 21 with specified gaps G3, G4 defined to the opposite sides of the signal wiring conductor 21 and a grounding-conductor non-forming area 26 of the same size and located at the same position as the grounding-conductor non-forming areas 16 surrounded by the grounding conductor 12 of the uppermost dielectric layer 1 is provided on the lower surface of the bottommost dielectric layer 1. A grounding-conductor via conductor 25 (similar to the grounding-conductor via conductor 25 of the high-frequency signal transmitting device S20 shown in FIG. 20) for connecting the grounding conductor 22 and the grounding conductor 32 on the upper surface of the bottommost dielectric layer 1 is provided in the bottommost dielectric layer 1. The other construction is similar to that of the high-frequency signal transmitting device S26 of the twenty-sixth embodiment.

In this way, similar to the high-frequency signal transmitting device S26 of the twenty-sixth embodiment, the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1 in the high-frequency signal transmitting device S28 of the twenty-eighth embodiment. On the other hand, the grounding conductors 12, 22 not included in the high-frequency signal transmitting device S26 of the twenty-sixth embodiment are provided on the upper surface of the uppermost dielectric layer 1 and on the lower surface of the bottommost dielectric layer 1. Thus, the usable frequency band of the high-frequency signal transmitting device can be more broadened than the high-frequency signal transmitting device S26 of the twenty-sixth embodiment.

Further, in the twenty-eighth embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band of the high-frequency signal transmitting device can be further broadened by forming the resonance controlling layer for controlling the resonance frequency of the electromagnetically shielded space.

Figure 29A:
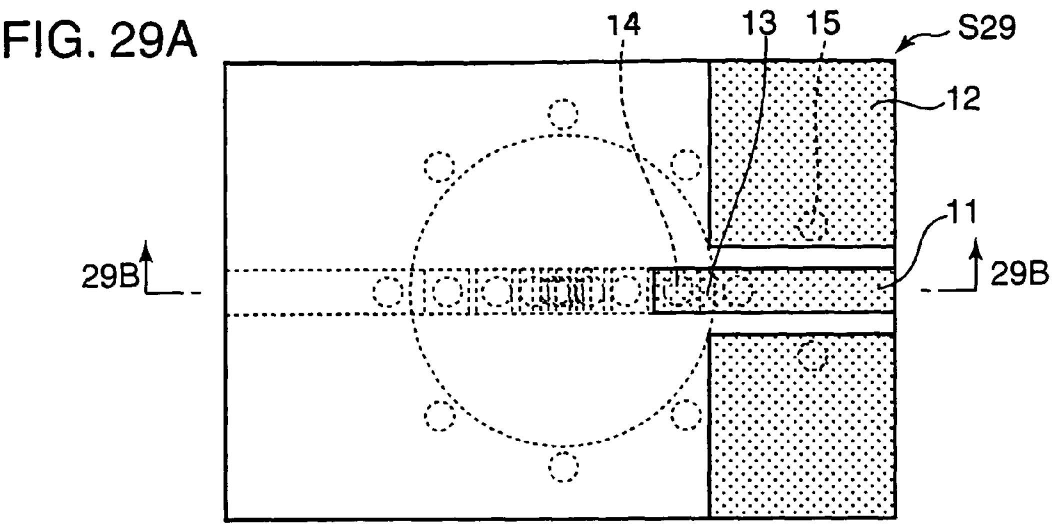
FIG. 29A is a plan view diagrammatically showing a high-frequency signal transmitting device according to a twenty-ninth embodiment of the invention.
Figure 29B:
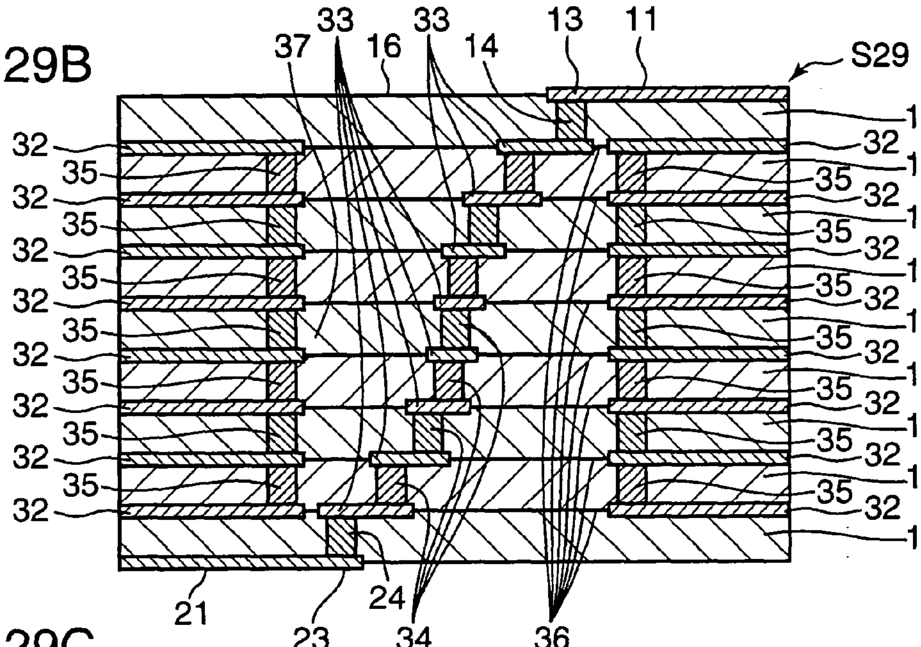
FIG. 29B is a vertical sectional view taken along the line 29B—29B of FIG. 29A.
Figure 29C:
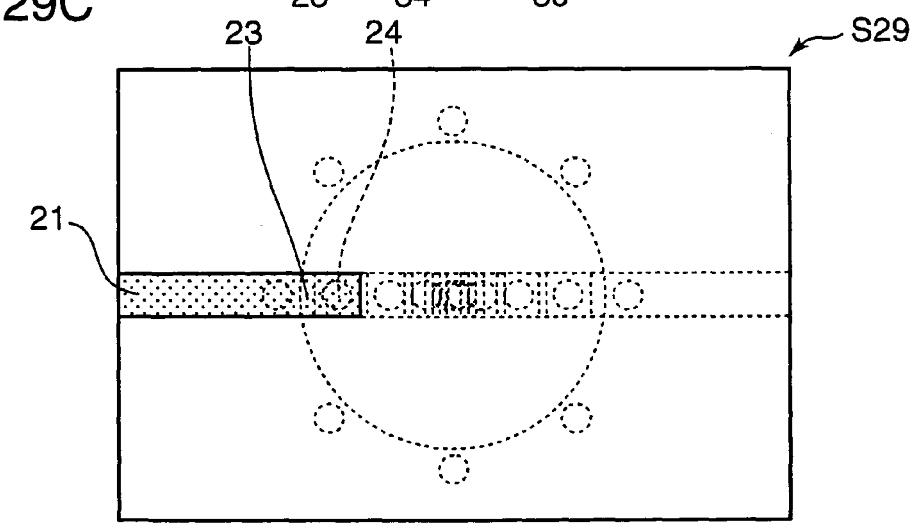
FIG. 29C is a bottom view of the high-frequency signal transmitting device of FIG. 29A.

Referring to FIGS. 29A to 29C showing a high-frequency signal transmitting device S29 according to a twenty-ninth embodiment of the present invention, a high-frequency signal transmitting device S29 has, in its basic construction, the same elements as the high-frequency signal transmitting device S26 according to the twenty-sixth embodiment shown in FIGS. 26A to 26C. Thus, no detailed description is given on the elements having the same functions by identifying them by the same reference numerals, and the following description is centered on differences to the high-frequency signal transmitting device S26 of the twenty-sixth embodiment.

As described above, in high-frequency signal transmitting device S26 of the twenty-sixth embodiment, the signal via conductors 14, 24, 34 of the respective dielectric layers 1 penetrate the electromagnetically shielded space formed to vertically extend between the upper and lower surfaces of the layered substrate 2 by providing the grounding conductors 32 on the upper surfaces of the intermediate dielectric layers 1 and the bottommost dielectric layer 1 such that the respective grounding-conductor non-forming areas 36 are placed one over another along vertical direction, while being inclined in such a stepped manner as to be at a larger angle of inclination at the sides of the uppermost and bottommost dielectric layers 1 and at a smaller angle of inclination at the middle side. Further, the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1.

The high-frequency signal transmitting device S29 according to the twenty-ninth embodiment differs from the high-frequency signal transmitting device S26 according to the twenty-sixth embodiment in that a grounding conductor 12 having such a shape as to surround the signal wiring conductor 11 with specified gaps G5, G6 defined to the opposite sides of the signal wiring conductor 11 is provided only in an area of the upper surface of the uppermost dielectric layer 1 where the signal wiring conductor 11 is present, and a grounding-conductor via conductor 15 for connecting the grounding conductor 12 and the grounding conductor 32 on the upper surface of the dielectric layer 1 right below the uppermost dielectric layer 1 is provided in the uppermost dielectric layer 1. The other construction is similar to that of the high-frequency signal transmitting device S26 of the twenty-sixth embodiment.

In this way, similar to the high-frequency signal transmitting device S26 of the twenty-sixth embodiment, the resonance controlling layer for controlling the resonance frequency of the electromagnetically shielded space is formed in the vertically middle portion of the layered substrate 2 by making the middle dielectric layer 1 of the dielectric material having a smaller permittivity than the other dielectric layers 1 in the high-frequency signal transmitting device S29 of the twenty-ninth embodiment. On the other hand, the grounding conductor 12 not included in the high-frequency signal transmitting device S26 of the twenty-sixth embodiment is provided on the upper surface of the uppermost dielectric layer 1. Thus, the usable frequency band of the high-frequency signal transmitting device can be more broadened than the high-frequency signal transmitting device S26 of the twenty-sixth embodiment.

It should be noted that a grounding conductor 22 similar to the grounding conductor 12 on the uppermost dielectric layer 1 may be provided on the lower surface of the bottommost dielectric layer 1 without providing the grounding conductor 12 on the upper surface of the uppermost dielectric layer 1, and a grounding-conductor via conductor 25 for connecting this grounding conductor and the grounding conductor 32 on the upper surface of the bottommost dielectric layer 1 may be provided in the bottommost dielectric layer 1. Alternatively, the uppermost dielectric layer 1 may be provided with the grounding conductor 12 and the grounding-conductor via conductor 15 and the bottommost dielectric layer 1 may be provided with the grounding conductor 22 and the grounding-conductor via conductor 25.

Further, in the twenty-ninth embodiment, the displacements of the signal via conductors 14, 24, 34 between the respective dielectric layers are differed such that the angle of inclination is larger at the sides of the uppermost and bottommost dielectric layers while being smaller at the middle side. However, they make take the same value between the respective dielectric layers as in the aforementioned twelfth embodiment. Even in such a case, the usable frequency band of the high-frequency signal transmitting device can be further broadened by forming the resonance controlling layer for controlling the resonance frequency of the electromagnetically shielded space.

Further, in the high-frequency signal transmitting devices S26 to S29 of the twenty-sixth to twenty-ninth embodiments described above, there is only one resonance controlling layer having the same thickness as the other layers. However, the same effects can be obtained even if there are a plurality of resonance controlling layers or the thickness of the resonance controlling layer is different from that of the other layers. If the number of the layers provided as the resonance controlling layers is increased, reactance is attenuated to a larger degree due to an increase in the transmission distance. Thus, a cutoff effect can be expected. However, if the transmission distance becomes too long, characteristic impedance is considerably reduced due to an increased capacity at a frequency up to the cutoff frequency, causing a bad influence of leading to an increased reflection. Therefore, the transmission distance, i.e., the number of the layers provided as the resonance controlling layers may be suitably determined.

Further, in any of the high-frequency signal transmitting devices S1 to S29, a ceramic material such as alumina, mullite or aluminum nitride, or a glass ceramic material which is a mixture of a glass and a ceramic may be used as the dielectric material for the dielectric layer 1. Further, a metallic material for a high-frequency wiring conductor such as Cu, MoMn+Ni+Au, W+Ni+Au, Cr+Cu, Cr+Cu+Ni+Au, $Ta_2N$+NiCr+Au, Ti+Pd+Au or NiCr+Pd+Au can be used as a conductive material for the conductive patterns such as the signal wiring conductors and the grounding conductors and for the connecting elements such as signal via conductors. These conductive materials can be applied to the dielectric material by various conductive film forming methods including the thick film printing method, the thin film forming method and the plating. It should be noted that the representation using the mark (+) here means a film construction in which a lower layer is arranged on the left side of the mark (+) while an upper layer is arranged on the left side of the mark (+).

The high-frequency signal transmitting device S1 to S29 can be obtained, for example, by forming a dielectric material into a thin sheet element by the doctor blade method or extrusion method, forming the signal wiring conductors, the grounding conductors, the signal via conductors and the grounding-conductor via conductors by printing a pasted conductive material on the sheet element, and baking a plurality of sheet elements having the conductive material applied thereto and placed one over another.

Figure 30:
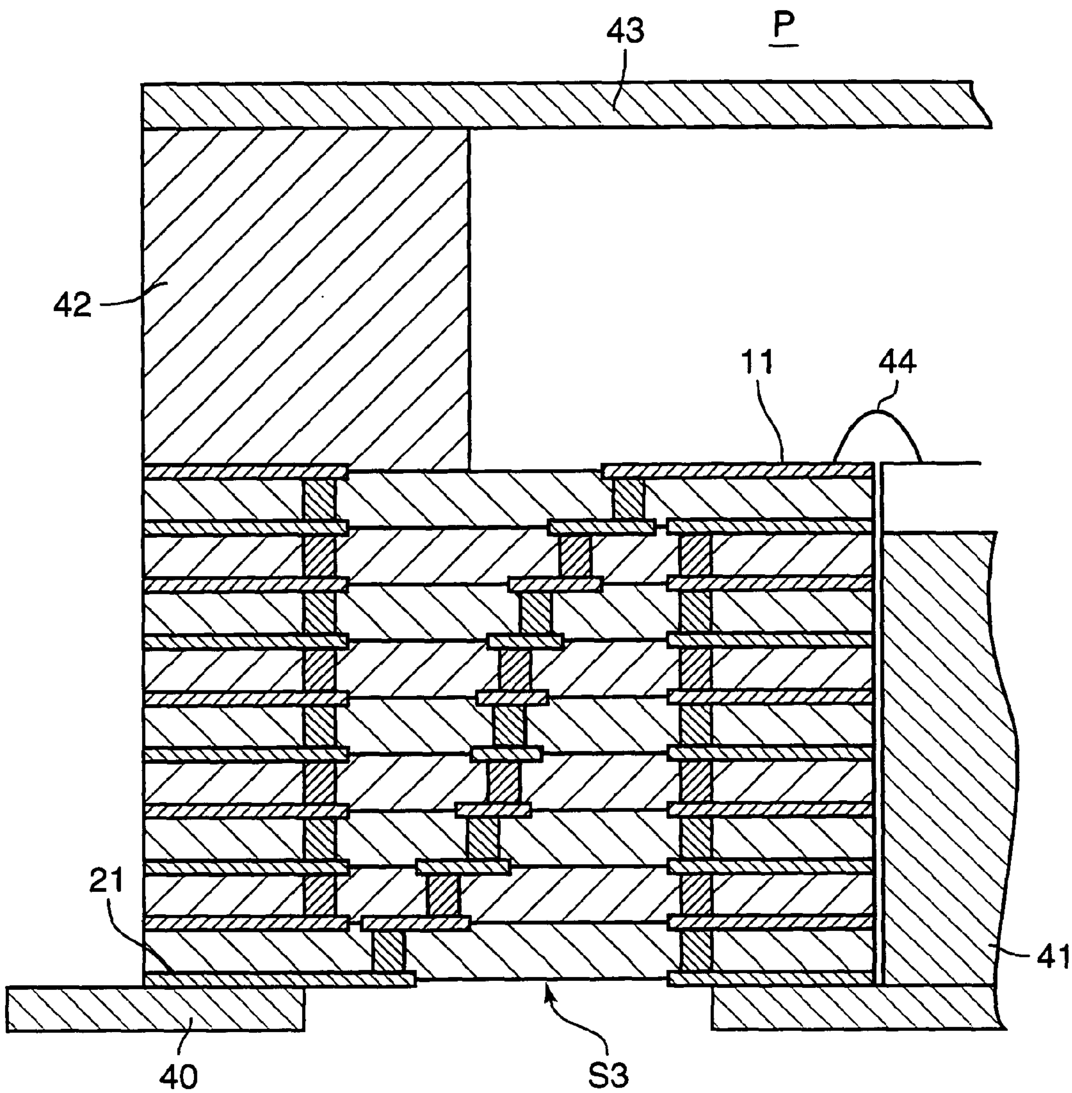
FIG. 30 is a section showing an essential portion of a semiconductor package constructed using a high-frequency signal transmitting device according to an embodiment of the invention.

FIG. 30 shows an essential portion of a semiconductor package formed using the inventive high-frequency signal transmitting device. Specifically, the high-frequency signal transmitting device S3 (any of the high-frequency signal transmitting device S1 to S29 may be used) is placed on a base substrate 40 together with a metallic structure 41, a frame 42 for accommodating a high-frequency semiconductor device is provided on the upper surface of the high-frequency signal transmitting device S1 and a lid 43 is provided on the upper surface of this frame 42. The signal wiring conductor 21 on the lower surface of the high-frequency signal transmitting device S1 is connected with an unillustrated wiring pattern on the base substrate 40, whereas the signal wiring conductor 11 on the upper surface of the high-frequency signal transmitting device S1 is connected with the metallic structure 41 via a wire 44. In this way, a high-frequency semiconductor package P having a good high-frequency transmission characteristic can be obtained.

In such a high-frequency semiconductor package P, if the frame 42 and the lid 43 are metallic, a material made of, e.g., a Fe—Ni alloy such as a Fe—Ni—Co alloy or a Fe—Ni42 alloy; an oxygen-free copper; an aluminum; a stainless steel; a Cu—W alloy; or a Cu—Mo alloy is used. The lid 42 is joined with the frame 42 by a suitable welding means such as a high-melting point brazing metal seam welding using a solder, AuSn brazing metal, AuGe brazing metal or the like, thereby hermetically sealing the frame 42. The wire 44 is joined with the signal wiring conductor 11 and the metallic structure 41 by a high-melting point brazing metal such as an AgCu brazing metal, AuSn brazing metal or AuGe brazing metal.

Next, specific examples of the typical ones of the high-frequency signal transmitting devices S1 to S29 according to the invention are described.

EXAMPLE 1

The high-frequency signal transmitting device S1 having the construction shown in FIGS. 1A to 1D was formed as follows. First, nine alumina dielectric layers 1 having a relative dielectric constant of 8.6 and a thickness of 0.2 mm were placed one over another to form the layered substrate 2. The signal wiring conductor 11 was provided to have a width of 0.16 mm while being spaced apart from the grounding conductor 12 by 0.1 mm, and the signal-wiring connecting conductor 13 was provided to have a width of 0.16 mm. Further, the signal via conductors 14, 24, 34 had a circular cross section having a diameter of 0.1 mm, and the grounding-conductor non-forming areas 16, 26, 36 had a circular cross section having a diameter of 0.84 mm.

The grounding-conductor via conductors 15, 25, 35 had a circular cross section having a diameter of 0.1 mm, and each were arranged at vertices of a right octagon defined on a circle having a diameter of 1.0 mm on the outer periphery of the grounding-conductor non-forming area 16, 26, 36. The connecting conductors for signal 33 had a circular cross section having a diameter of 0.16 mm, and a distance in plan view (distance when viewed from above) between the edge of the signal wiring conductor 11 located at the opposite side from the signal-wiring connecting conductor 13 and the edge of the signal wiring conductor 21 located at the opposite side from the signal-wiring connecting conductor 23 was 2.0 mm. The high-frequency signal transmitting device thus constructed was called a sample T1.

Figure 31:
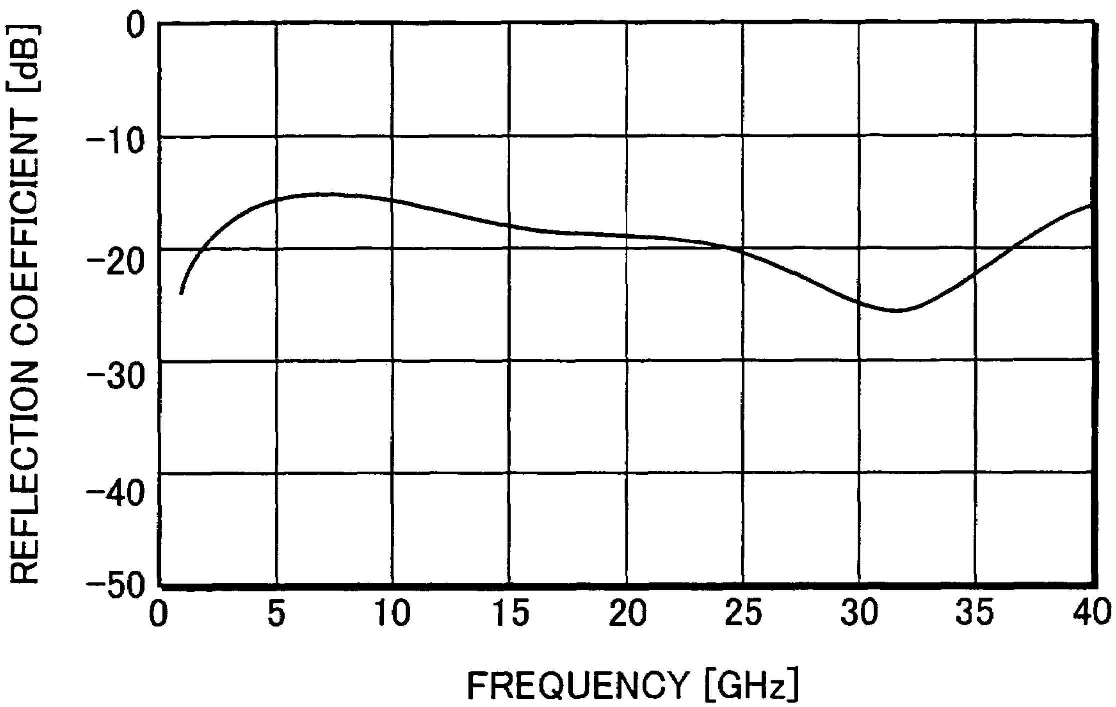
FIG. 31 is a graph showing a high-frequency characteristic of the high-frequency signal transmitting device according to the first embodiment of the invention.

For this sample T1, a high-frequency characteristic between the edges of the signal wiring conductors 11, 21 was measured by an electromagnetic field simulation to obtain a characteristic curve having a frequency characteristic as shown in a graph of FIG. 31. FIG. 31 shows a frequency characteristic of a reflection coefficient (unit: dB) representing a ratio of reflected and returned signals to incident high-frequency signals, wherein horizontal axis represents frequency (unit: GHz) and vertical axis represents reflection coefficient (unit: dB) as an evaluation index of a reflected quantity of the incident signals. As is clear from FIG. 31, the high-frequency transmission characteristic can be understood to be better as a whole as compared to the prior art high-frequency signal transmitting device having the construction of FIGS. 76A and 76B.

EXAMPLE 2

The high-frequency signal transmitting device S2 having the construction shown in FIGS. 2A to 2E was formed as follows. The connecting conductors for signal 33 had a rectangular shape having a width of 0.16 mm; the grounding-conductor non-forming areas 16, 26, 36 had an elliptical shape having a major axis of 1.2 mm and a minor axis of 1.0 mm; and the grounding-conductor via conductors 15, 25, 35 had a circular cross section having a diameter of 0.1 mm and arranged at eight positions on an ellipse away from the outer peripheral of the grounding-conductor non-forming area 16, 26, 36 by 0.08 mm. The signal via conductors 14, 24, 34 were displaced by 0.8 mm between the adjacent ones of the respective layers. A sample T2 was obtained by setting the other construction as in the sample T1.

The high-frequency signal transmitting device S3 having the construction shown in FIGS. 3A to 3C was formed as follows. Displacements of the signal via conductors 14, 24, 34 between the adjacent ones of the nine layers were 0.11 mm, 0.09 mm, 0.07 mm, 0.05 mm, 0.05 mm, 0.07 mm, 0.09 mm, 0.11 mm from top. A sample T3 was obtained by setting the other construction as in the sample T1. Further, the high-frequency signal transmitting device S10 having the construction shown in FIGS. 10A to 10C was formed by forming the grounding conductors 12, 22 only at the opposite sides of the signal wiring conductors 11, 21. A sample T10 was obtained by setting the other construction as in the sample T2.

Figure 32:
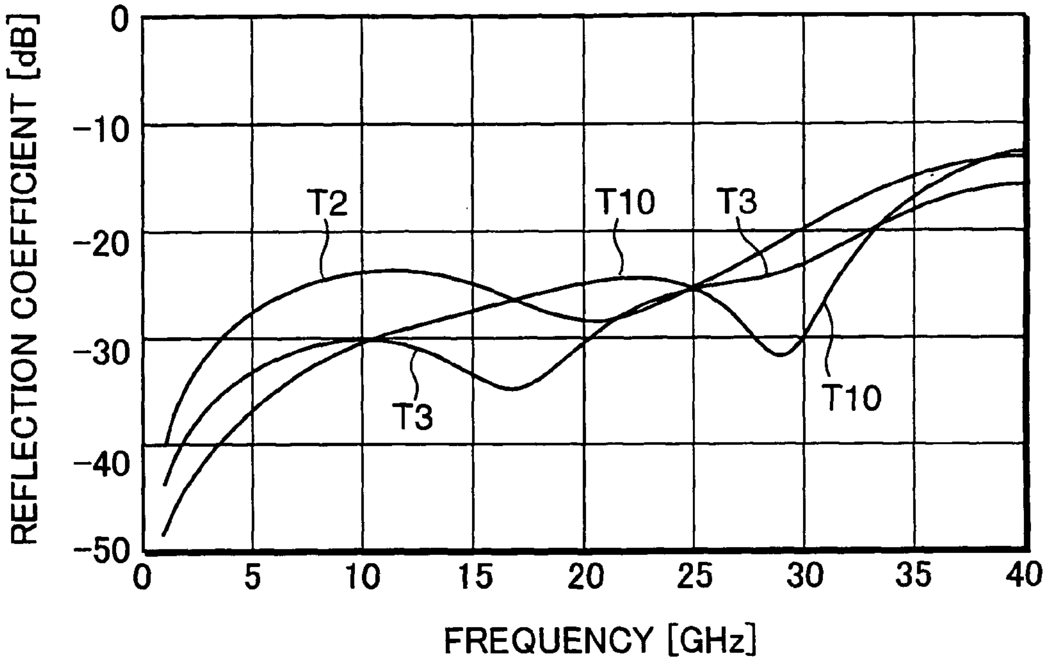
FIG. 32 is a graph showing high-frequency characteristics of the high-frequency signal transmitting devices according to the second, third and tenth embodiments of the invention.

For these samples T2, T3 and T10, a high-frequency characteristic between the edges of the signal wiring conductors 11, 21 was measured by an electromagnetic field simulation to obtain characteristic curves having frequency characteristics as shown in a graph of FIG. 32. As is clear from FIG. 32, the samples T2, T3, T10 which are the high-frequency signal transmitting device according to the present invention can be understood to possess a good electrical characteristic by having less reflection even in a high-frequency band.

EXAMPLE 3

The high-frequency signal transmitting device S4 having the construction shown in FIGS. 4A to 4C was formed by defining the grounding-conductor non-forming areas 36 such that displacements between the adjacent ones of the eight layers was 0.08 mm. A sample T4 was obtained by setting the other construction as in the sample T1.

Further, the high-frequency signal transmitting device S5 having the construction shown in FIGS. 5A to 5C was formed by defining the grounding-conductor non-forming areas 36 such that displacements between the adjacent ones of the eight layers was 0.12 mm, 0.09 mm, 0.06 mm, 0.02 mm, 0.06 mm, 0.09 mm, 0.12 mm from top. A sample T5 was obtained by setting the other construction as in the sample T4.

Figure 33:
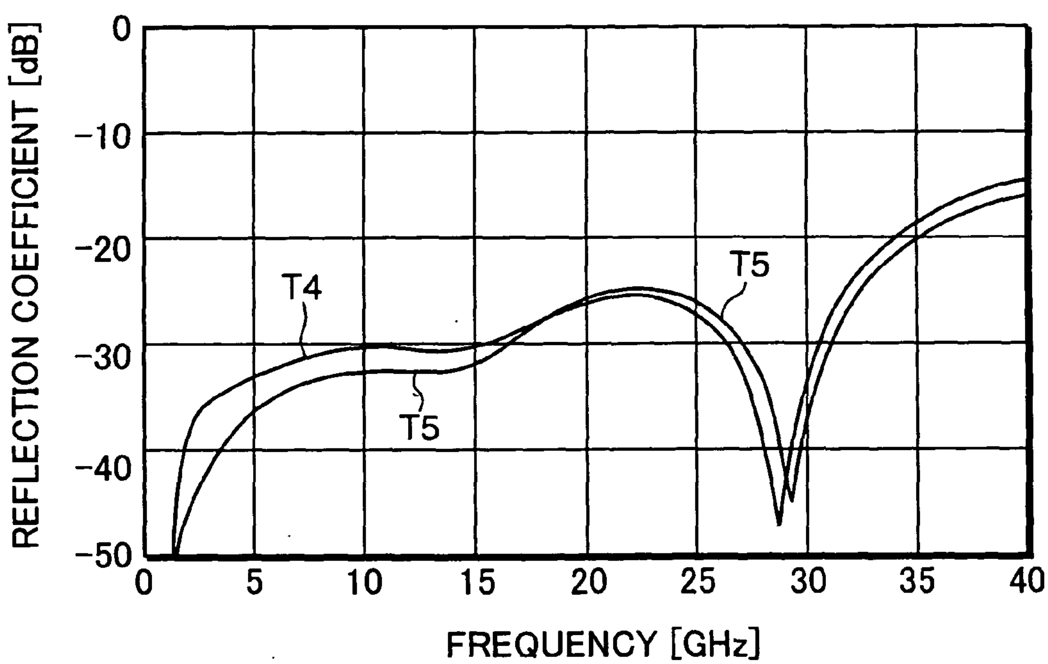
FIG. 33 is a graph showing high-frequency characteristics of the high-frequency signal transmitting devices according to the fourth and fifth embodiments of the invention.

For these samples T4 and T5, a high-frequency characteristic between the edges of the signal wiring conductors 11, 21 was measured by an electromagnetic field simulation to obtain characteristic curves having frequency characteristics as shown in a graph of FIG. 33. As is clear from FIG. 33, the samples T4, T5 which are the high-frequency signal transmitting device according to the present invention can be understood to possess a good electrical characteristic by having less reflection even in a high-frequency band.

EXAMPLE 4

The high-frequency signal transmitting device S6 having the construction shown in FIGS. 6A to 6C was formed by defining the rectangular grounding-conductor non-forming areas 36 such that the longer sides thereof (lengths in a direction perpendicular to the signal wiring conductors 11, 21) were 1.0 mm and the shorter sides thereof (lengths in a direction along the signal wiring conductors 11, 21) were 0.68 mm, 0.76 mm, 0.84 mm, 0.92 mm, 0.92 mm, 0.84 mm, 0.76 mm, 0.68 mm from top. A sample T6 was obtained by setting the other construction as in the sample T4. In other words, the sample T6 was such that the shorter sides of the grounding-conductor non-forming areas 36 were made longer by the same length between the respective dielectric layers 1 from the upper layers toward the middle layers and from the lower layers toward the middle layers.

The high-frequency signal transmitting device S7 having the construction shown in FIGS. 7A to 7C was formed by defining the rectangular grounding-conductor non-forming areas 36 such that the longer sides thereof (lengths in a direction perpendicular to the signal wiring conductors 11, 21) were 1.0 mm and the shorter sides thereof (lengths in a direction along the signal wiring conductors 11, 21) were 0.68 mm, 0.79 mm, 0.88 mm, 0.95 mm, 0.95 mm, 0.88 mm, 0.79 mm, 0.68 mm from top. A sample T7 was obtained by setting the other construction as in the sample T6. In other words, the sample T7 was such that changing values of the lengths of the shorter sides of the grounding-conductor non-forming areas 36 were made smaller from the upper layers toward the middle layers and from the lower layers toward the middle layers.

Figure 34:
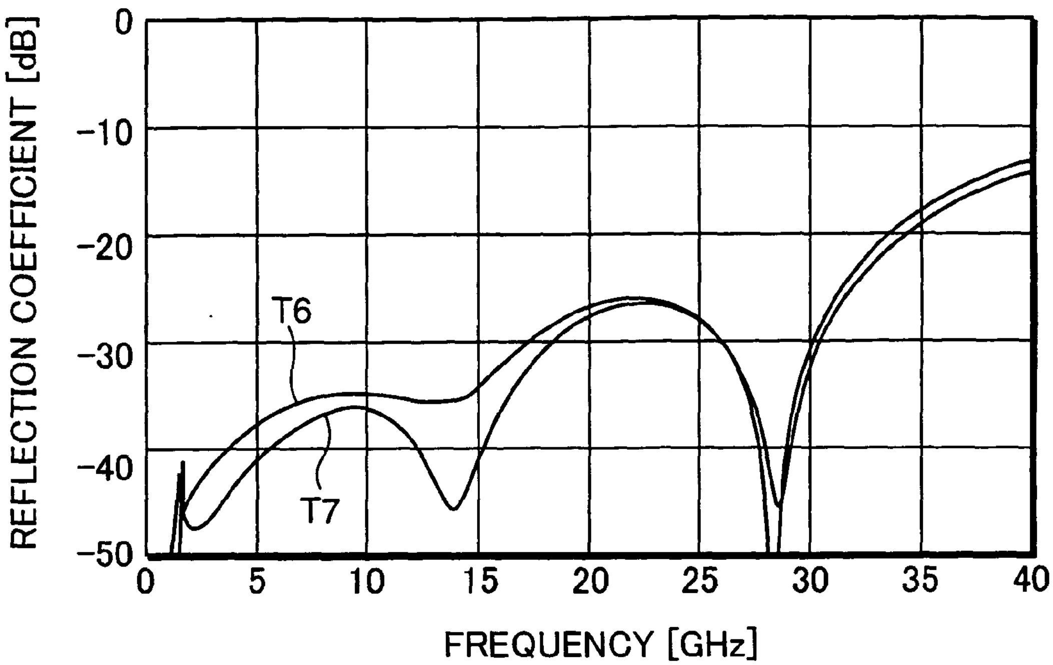
FIG. 34 is a graph showing high-frequency characteristics of the high-frequency signal transmitting devices according to the sixth and seventh embodiments of the invention.

For these samples T6 and T7, a high-frequency characteristic between the edges of the signal wiring conductors 11, 21 was measured by an electromagnetic field simulation to obtain characteristic curves having frequency characteristics as shown in a graph of FIG. 34. As is clear from FIG. 34, the samples T6, T7 which are the high-frequency signal transmitting device according to the present invention can be understood to possess a good electrical characteristic by having less reflection even in a high-frequency band.

EXAMPLE 5

The high-frequency signal transmitting device S8 having the construction shown in FIGS. 8A to 8C was formed by defining the grounding-conductor non-forming area 16 on the upper surface of the uppermost dielectric layer 1, the grounding-conductor non-forming area 36 on the upper surface of the uppermost intermediate dielectric layer 1 and the grounding-conductor non-forming area 26 on the lower surface of the bottommost dielectric layer 1 such that the diameter thereof was 0.46 mm and defining the grounding-conductor non-forming areas 36 of the other dielectric layers 1 such that the diameter thereof was 1.0 mm. A sample T8 was obtained by setting the other construction as in the sample T1.

Figure 35:
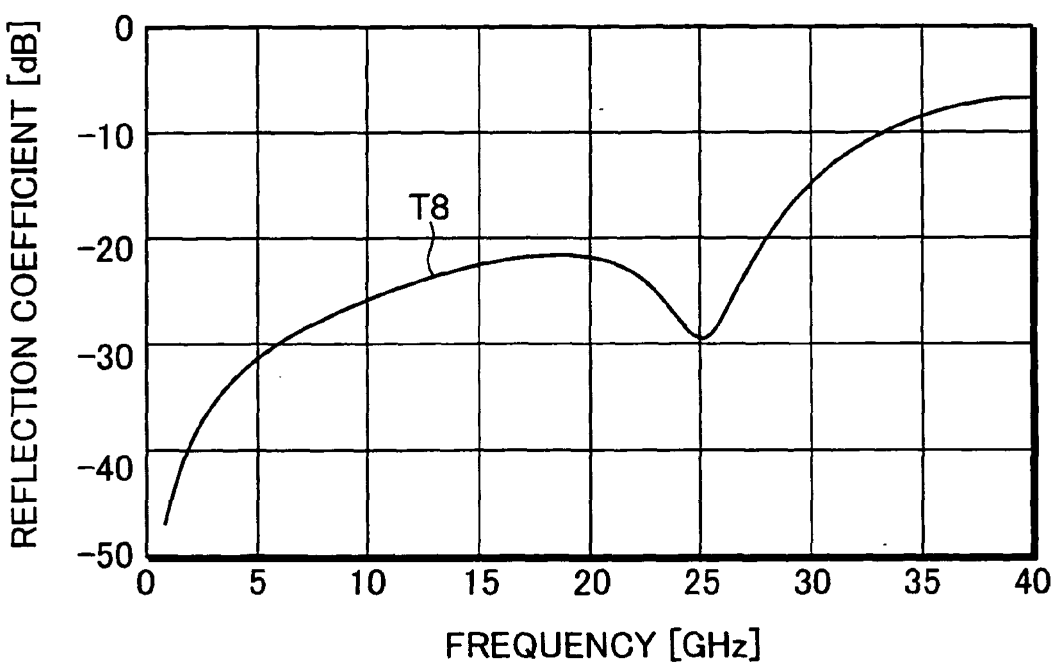
FIG. 35 is a graph showing a high-frequency characteristic of the high-frequency signal transmitting device according to the eighth embodiment of the invention.

For this sample T8, a high-frequency characteristic between the edges of the signal wiring conductors 11, 21 was measured by an electromagnetic field simulation to obtain a characteristic curve having a frequency characteristic as shown in a graph of FIG. 35. As is clear from FIG. 35, the sample T8 which is the high-frequency signal transmitting device according to the present invention can be understood to possess a good electrical characteristic by having less reflection even in a high-frequency band.

EXAMPLE 6

The high-frequency signal transmitting device S9 having the construction shown in FIGS. 9A to 9C was formed by setting the widths of the signal-wiring connecting conductors 13, 23 of the uppermost and bottommost dielectric layers 1 to 0.22 mm. A sample T9 was obtained by setting the other construction as in the sample T3.

Figure 36:
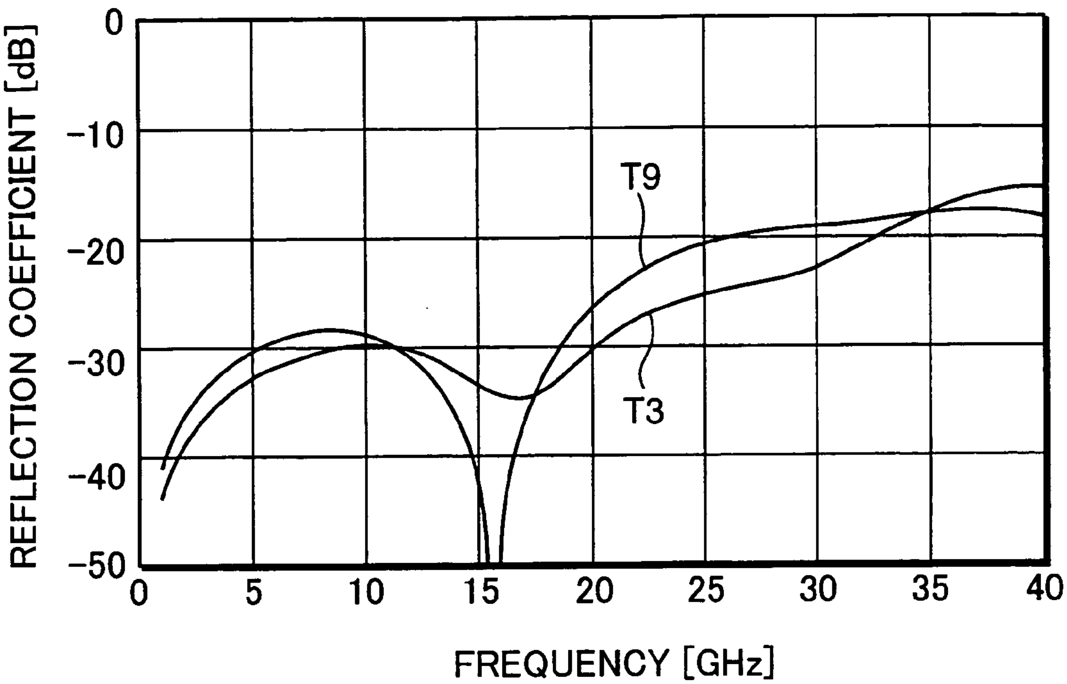
FIG. 36 is a graph showing a high-frequency characteristic of the high-frequency signal transmitting device according to the ninth embodiment of the invention.

For this sample T9, a high-frequency characteristic between the edges of the signal wiring conductors 11, 21 was measured by an electromagnetic field simulation to obtain a characteristic curve having a frequency characteristic as shown in a graph of FIG. 36. As is clear from FIG. 36, the sample T9 which is the high-frequency signal transmitting device according to the present invention can be understood to possess a good electrical characteristic by having less reflection even in a high-frequency band. It should be noted that the characteristic curve of the sample T3 which is the high-frequency signal transmitting device according to the present invention is also shown for comparison in FIG. 36.

EXAMPLE 7

The following samples were prepared as the high-frequency signal transmitting device S2 having the construction shown in FIGS. 2A to 2C in order to compare the characteristics when the lengths of the signal-wiring connecting conductors 13, 23 and the displacements of the signal via conductors 14, 24, 34 between the nine layers were changed. Specifically, a sample T2A was obtained by setting the lengths of the signal-wiring connecting conductors 13, 23 to 0.20 mm and the displacements of the signal via conductors 14, 24, 34 between the nine layers to 0.06 mm and setting the other construction as in the sample T2. Further, a sample T2B was obtained by setting the lengths of the signal-wiring connecting conductors 13, 23 to 0.24 mm and the displacements of the signal via conductors 14, 24, 34 between the nine layers to 0.05 mm and setting the other construction as in the sample T2.

Figure 37:
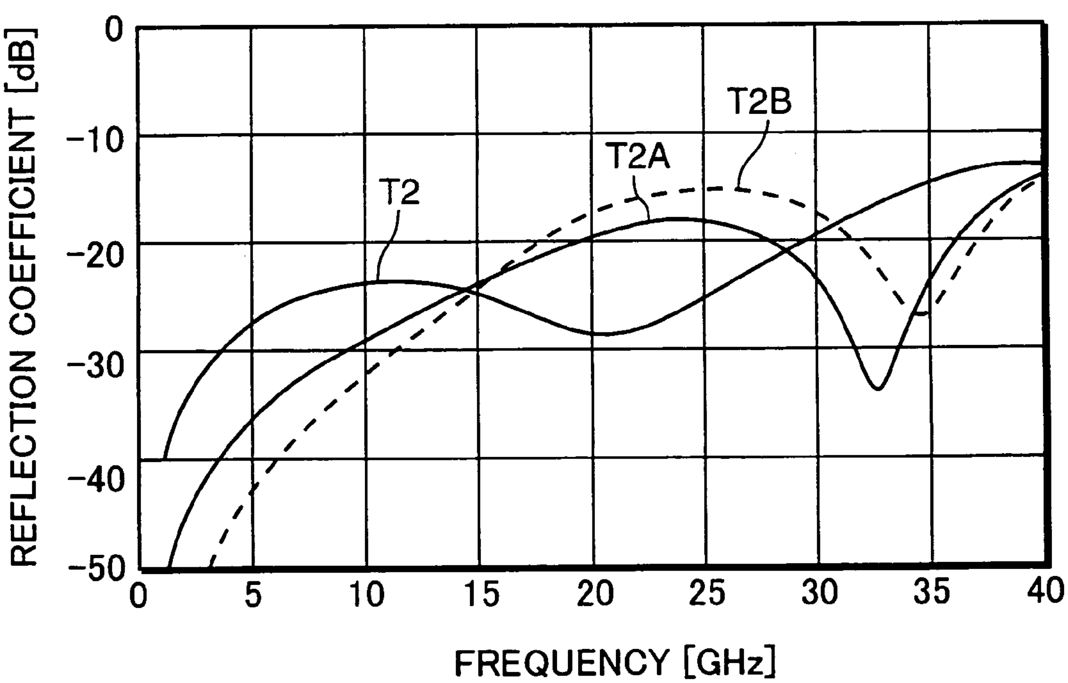
FIG. 37 is a graph showing high-frequency characteristics in the case of differing the lengths and the like of signal-wiring connecting conductors in the high-frequency signal transmitting device according to the second embodiment of the invention.

For these samples T2A and T2B, a high-frequency characteristic between the edges of the signal wiring conductors 11, 21 was measured by an electromagnetic field simulation to obtain characteristic curves having frequency characteristics as shown in a graph of FIG. 37. The characteristic of the aforementioned sample T2 having the construction of the high-frequency signal transmitting device S2 is also shown for comparison in FIG. 37. As is clear from FIG. 37, the samples T2A and T2B can be understood to both have a better high-frequency transmission characteristic than the prior art high-frequency transmitting device having the construction shown in FIGS. 76A and 76B.

However, the comparison of the samples T2A and T2B shows that the sample T2B has a relatively poorer electrical characteristic than the sample T2A. This is thought to come from the fact that the lengths of the signal-wiring connecting conductors 13, 23 between the signal wiring conductors 11, 21 and the signal via conductors 14, 24 exceed the thickness of the uppermost or bottommost dielectric layer 1 in the case of the sample T2B.

Accordingly, inductances created at the signal-wiring connecting conductors 13, 23 can be securely reduced and a good high-frequency transmission characteristic can be securely obtained by setting the lengths of the signal-wiring connecting conductors 13, 23 between the signal wiring conductors 11, 21 and the signal via conductors 14, 24 equal to or smaller than the thickness of the uppermost or bottommost dielectric layer 1.

In other words, contrary to the prior art having a reflection coefficient of about −9 dB in the neighborhood of 25 GHz, the sample T2A has a good characteristic by having a reflection coefficient of about −19 dB. The sample T2B has a reflection coefficient of about −15 dB in the neighborhood of 25 GHz because having more reflection than the sample T2A due to the longer signal-wiring connecting conductors 13, 23. However, as a whole, the sample T2B still has a better characteristic than the prior art.

EXAMPLE 8

The high-frequency signal transmitting device S11 having the construction shown in FIGS. 11A to 11C was formed as follows. Nine alumina dielectric layers 1 having a relative dielectric constant of 9.2 and a thickness of 0.2 mm were placed one over another to form the layered substrate 2. The signal wiring conductors 11, 12 were provided to have a width of 0.21 mm, and the signal-wiring connecting conductors 13, 23 were provided to have a width of 0.21 mm. Further, the signal via conductors 14, 24, 34 had a circular cross section having a diameter of 0.1 mm, and the grounding-conductor non-forming areas had a circular cross section having a diameter of 1.24 mm.

Further, the grounding-conductor via conductors 35 had a circular cross section having a diameter of 0.1 mm and were arranged at vertices of a right octagon defined on a circle having a diameter of 1.4 mm on the outer periphery of the grounding-conductor non-forming area 36. The connecting conductors for signal 33 had a circular cross section having a diameter of 0.16 mm, and a distance in plan view (distance when viewed from above) between the edge of the signal wiring conductor 11 located at the opposite side from the signal-wiring connecting conductor 13 and the edge of the signal wiring conductor 21 located at the opposite side from the signal-wiring connecting conductor 23 was 2.0 mm. The high-frequency signal transmitting device thus constructed was called a sample T11.

Figure 38:
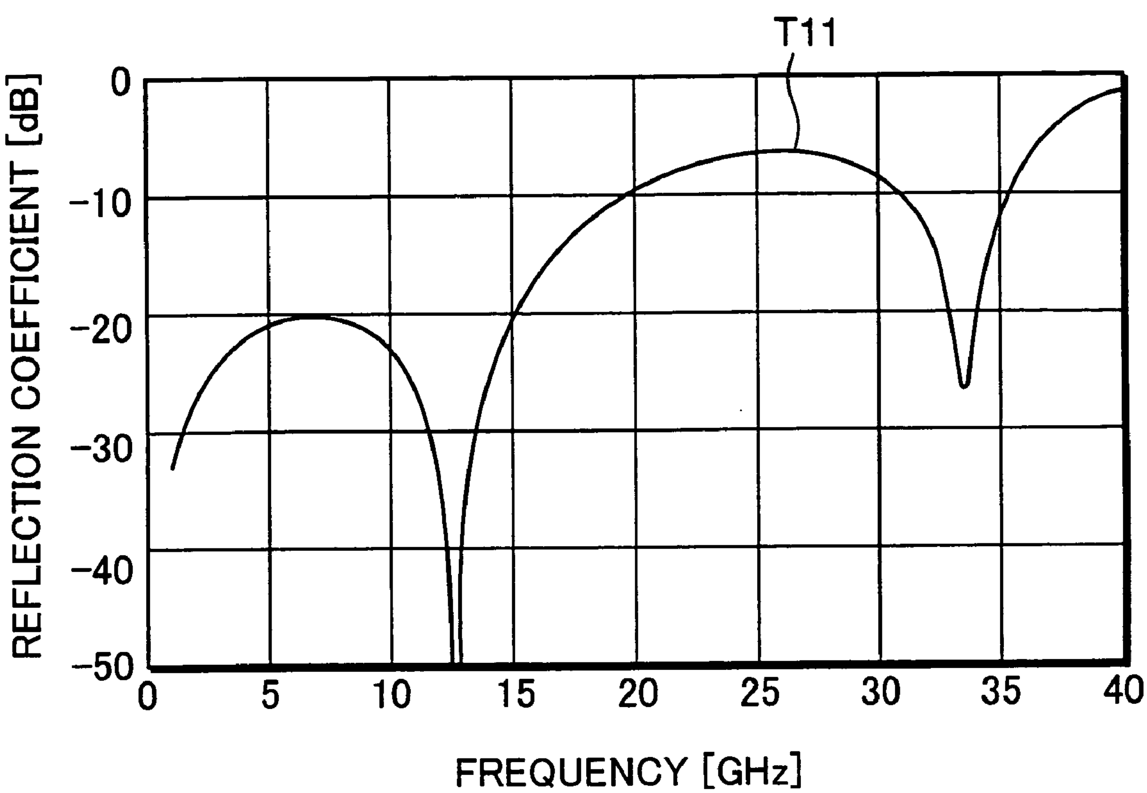
FIG. 38 is a graph showing a high-frequency characteristic of the high-frequency signal transmitting device according to the eleventh embodiment of the invention.

For this sample T11, a high-frequency characteristic between the edges of the signal wiring conductors 11, 21 was measured by an electromagnetic field simulation to obtain a characteristic curve having a frequency characteristic as shown in a graph of FIG. 38. As is clear from FIG. 38, the sample T11 can be understood to have a better high-frequency transmission characteristic as a whole as compared to the prior art high-frequency signal transmitting device having the construction of FIGS. 76A and 76B.

EXAMPLE 9

The high-frequency signal transmitting device S12 having the construction shown in FIGS. 12A to 12C was formed as follows. The signal-wiring connecting conductors 13, 23 were provided to have a width of 0.21 mm and set distances between the signal wiring conductors 11, 21 and the signal via conductors 14, 24 to 0.13 mm. The connecting conductors 33 for signal had a rectangular shape having a width of 0.16 mm, and the grounding-conductor via conductors 15, 25, 35 had a circular cross section having a diameter of 0.1 mm while being arranged at eight positions on a circle spaced apart from the outer periphery of the grounding-conductor non-forming area 36 only by 0.8 mm. The signal via conductors 14, 24, 34 are displaced by 0.11 mm between the adjacent ones of the respective layers. A sample T12 was obtained by setting other construction as in the sample T11. In other words, the sample T12 was such that the displacements of the signal via conductors 13, 24, 34 were set at the same value between the respective dielectric layers.

Further, the high-frequency signal transmitting device S13 having the construction shown in FIGS. 13A to 13C was formed by setting the displacements of the signal via conductors 14, 24, 34 between the adjacent ones of the nine layers to 0.195 mm, 0.115 mm, 0.075 mm, 0.055 mm, 0.055 mm, 0.075 mm, 0.115 mm, 0.195 mm from top. A sample T13 was obtained by setting the other construction as in the sample T12. In other words, the sample T13 was such that the displacements of the signal via conductors 14, 24, 34 were made smaller from the uppermost layer toward the middle intermediate layer while being made larger from the middle intermediate layer toward the bottommost layer.

Figure 39:
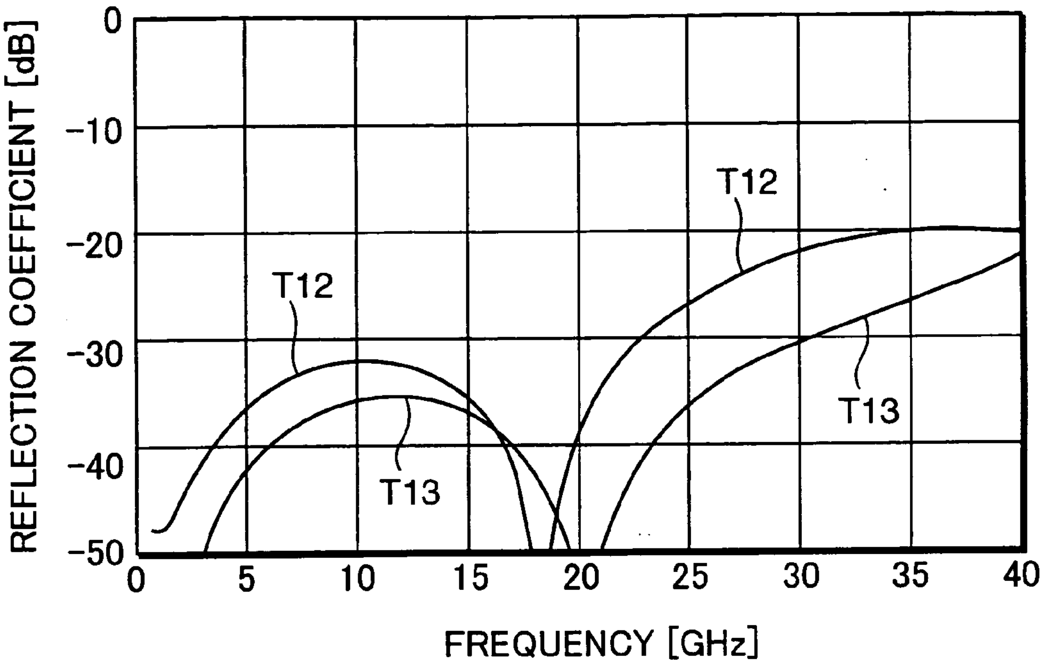
FIG. 39 is a graph showing high-frequency characteristics of the high-frequency signal transmitting devices according to the twelfth and thirteenth embodiments of the invention.

For these samples T12 and T13, a high-frequency characteristic between the edges of the signal wiring conductors 11, 21 was measured by an electromagnetic field simulation to obtain characteristic curves having frequency characteristics as shown in a graph of FIG. 39. As is clear from FIG. 39, the samples T12, T13 which are the high-frequency signal transmitting device according to the present invention can be understood to possess a good electrical characteristic by having less reflection even in a high-frequency band. Particularly, in the sample T13, the relative displacements are smaller as the signal via conductors 14, 24, 34 become closer to the center of the grounding-conductor non-forming areas 36. Thus, discontinuity of impedance is further improved to have a better compatibility, with the result that the sample T13 possesses a better electrical characteristic having even less reflection.

EXAMPLE 10

The high-frequency signal transmitting device S14 having the construction shown in FIGS. 14A to 14C was formed by setting the displacements of the grounding-conductor non-forming areas 36 between the adjacent ones of the eight layers to 0.11 mm. A sample T14 was obtained by setting the other construction as in the sample T11. In other words, the sample T14 was such that the displacements between the eight intermediate layers were set at the same value.

The high-frequency signal transmitting device S15 having the construction shown in FIGS. 15A to 15C was formed by setting the displacements of the grounding-conductor non-forming areas 36 between the adjacent ones of the eight layers to 0.18 mm, 0.14 mm, 0.10 mm, 0.04 mm, 0.10 mm, 0.14 mm, 0.18 mm from top. A sample T15 was obtained by setting the other construction as in the sample T14. In other words, the sample T15 was such that the displacements of the signal via conductors 14, 24, 34 were made smaller from the uppermost layer toward the middle intermediate layer while being made larger from the middle intermediate layer toward the bottommost layer.

Figure 40:
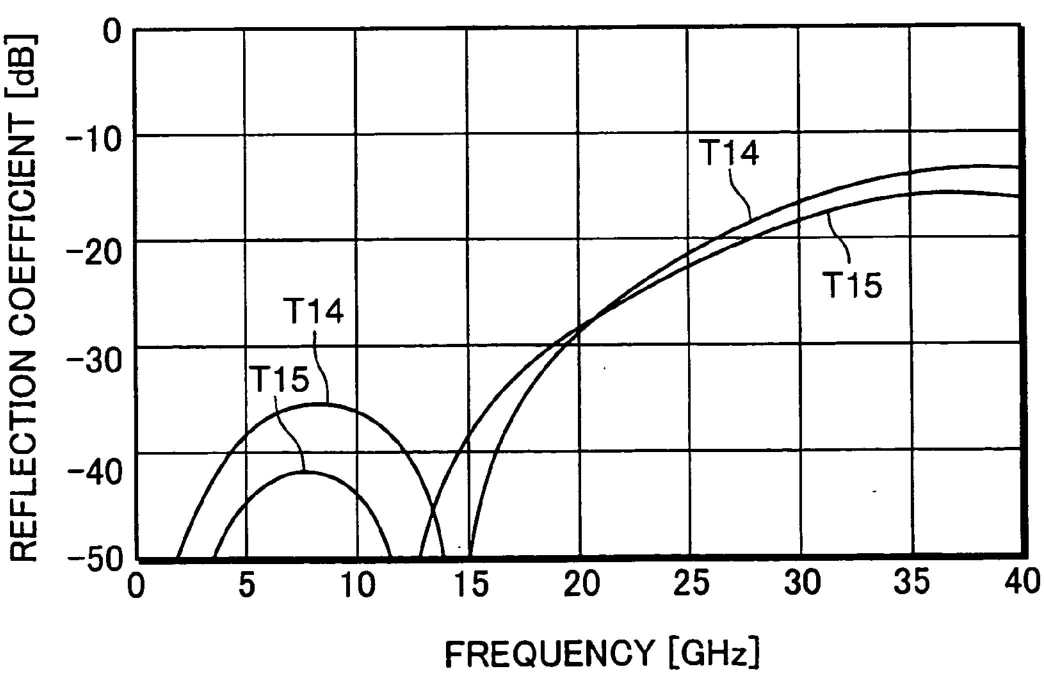
FIG. 40 is a graph showing high-frequency characteristics of the high-frequency signal transmitting devices according to the fourteenth and fifteenth embodiments of the invention.

For these samples T14 and T15, a high-frequency characteristic between the edges of the signal wiring conductors 11, 21 was measured by an electromagnetic field simulation to obtain characteristic curves having frequency characteristics as shown in a graph of FIG. 40. As is clear from FIG. 40, the samples T14, T15 which are the high-frequency signal transmitting device according to the present invention can be understood to possess a good electrical characteristic by having less reflection even in a high-frequency band. Particularly, since the relative displacements of the grounding-conductor non-forming areas 36 are smaller toward the vertical center in the sample T15, discontinuity of impedance is further improved to have a better compatibility, with the result that the sample T15 possesses a better electrical characteristic having even less reflection.

EXAMPLE 11

The high-frequency signal transmitting device S16 having the construction shown in FIGS. 16A to 16C was formed by defining the rectangular grounding-conductor non-forming areas 36 such that the longer sides thereof (lengths in a direction perpendicular to the signal wiring conductors 11, 21) were 1.16 mm and the shorter sides thereof (lengths in a direction along the signal wiring conductors 11, 21) were 0.76 mm, 0.86 mm, 0.96 mm, 1.06 mm, 1.06 mm, 0.96 mm, 0.86 mm, 0.78 mm from top. A sample T16 was obtained by setting the other construction as in the sample T14. In other words, the sample T16 was such that the shorter sides of the grounding-conductor non-forming areas 36 were made longer by the same length between the respective dielectric layers 1 from the upper layers toward the middle layers and from the lower layers toward the middle layers.

Further, the high-frequency signal transmitting device S17 having the construction shown in FIGS. 17A to 17C was formed by defining the rectangular grounding-conductor non-forming areas 36 such that the longer sides thereof (lengths in a direction perpendicular to the signal wiring conductors 11, 21) were 1.16 mm and the shorter sides thereof (lengths in a direction along the signal wiring conductors 11, 21) were 0.76 mm, 0.89 mm, 1.00 mm, 1.09 mm, 1.09 mm, 1.00 mm, 0.89 mm, 0.76 mm from top. A sample T17 was obtained by setting the other construction as in the sample T16. In other words, the sample T17 was such that changing values of the lengths of the shorter sides of the grounding-conductor non-forming areas 36 were made smaller from the upper layers toward the middle layers and from the lower layers toward the middle layers.

Figure 41:
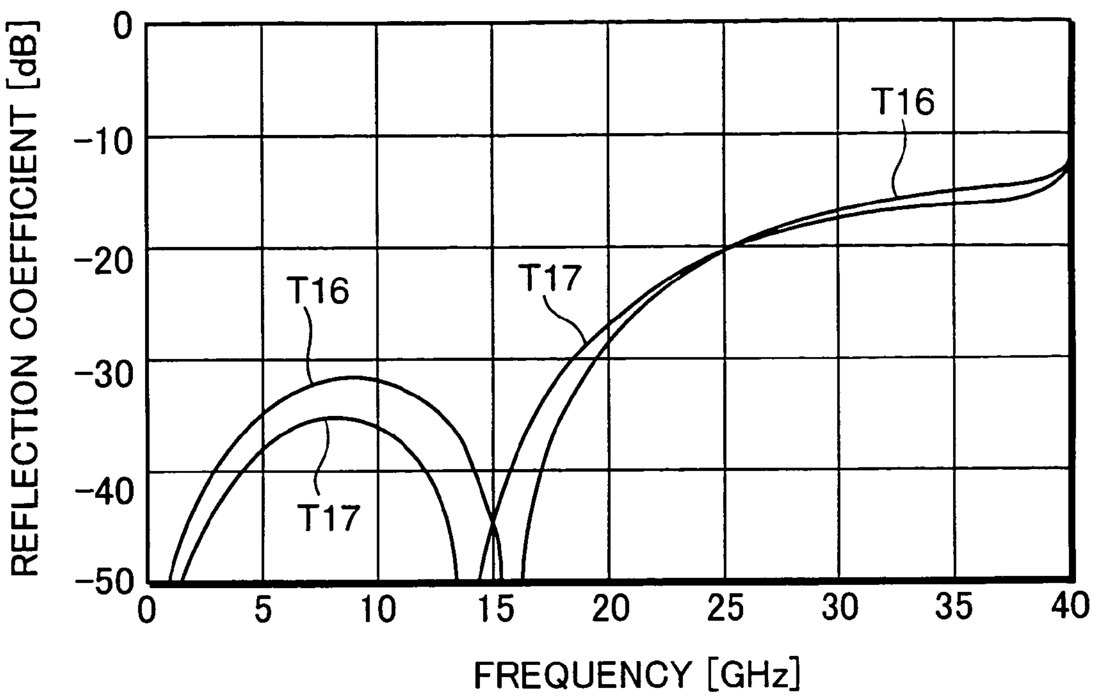
FIG. 41 is a graph showing high-frequency characteristics of the high-frequency signal transmitting device according to the sixteenth and seventeenth embodiments of the invention.

For these samples T16 and T17, a high-frequency characteristic between the edges of the signal wiring conductors 11, 21 was measured by an electromagnetic field simulation to obtain characteristic curves having frequency characteristics as shown in a graph of FIG. 41. As is clear from FIG. 41, the samples T16, T17 which are the high-frequency signal transmitting device according to the present invention can be understood to possess a good electrical characteristic by having less reflection even in a high-frequency band. Particularly, since rates of change in the shape of the grounding-conductor non-forming areas 36 are smaller toward the vertical center in the sample T17, discontinuity of impedance is further improved to have a better compatibility, with the result that the sample T15 possesses a better electrical characteristic having even less reflection.

EXAMPLE 12

The high-frequency signal transmitting device S18 having the construction shown in FIGS. 18A to 18C was formed by defining the grounding-conductor non-forming area 16 on the upper surface of the uppermost dielectric layer 1, the grounding-conductor non-forming area 36 on the upper surface of the uppermost intermediate dielectric layer 1 and the grounding-conductor non-forming area 26 on the lower surface of the bottommost dielectric layer 1 such that the diameter thereof was 0.46 mm and defining the grounding-conductor non-forming areas 36 of the other dielectric layers 1 such that the diameter thereof was 1.24 mm. A sample T18 was obtained by setting the other construction as in the sample T1.

Figure 42:
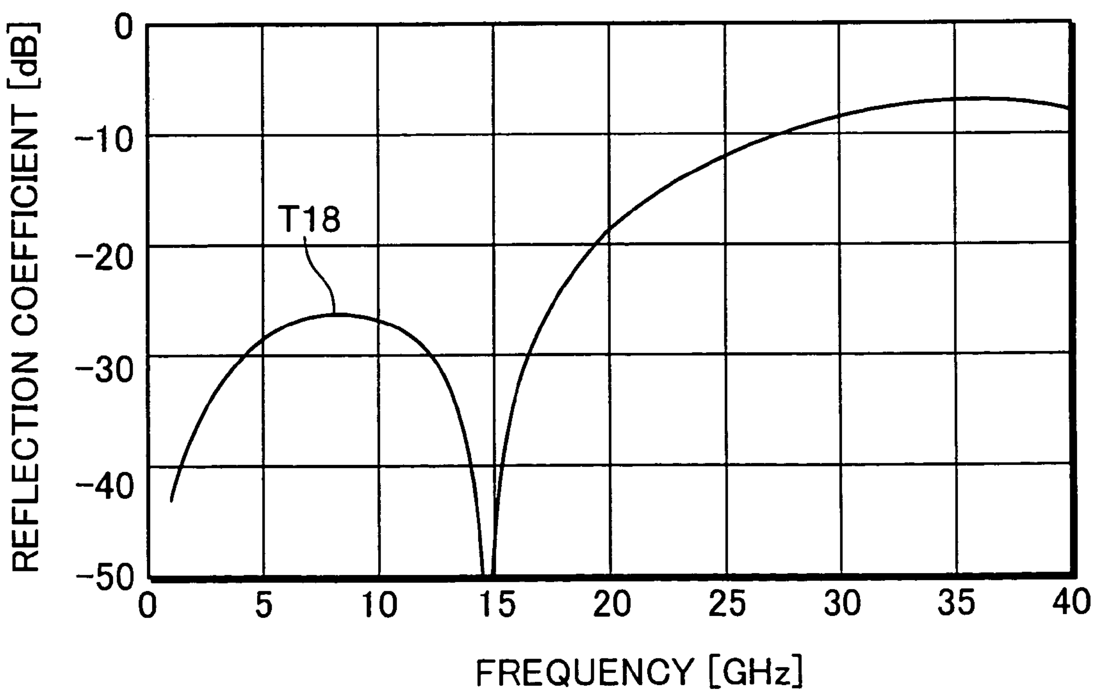
FIG. 42 is a graph showing a high-frequency characteristic of the high-frequency signal transmitting device according to the eighteenth embodiment of the invention.

For this sample T18, a high-frequency characteristic between the edges of the signal wiring conductors 11, 21 was measured by an electromagnetic field simulation to obtain a characteristic curve having a frequency characteristic as shown in a graph of FIG. 42. As is clear from FIG. 42, the sample T18 which is the high-frequency signal transmitting device according to the present invention can be understood to possess a good electrical characteristic by having less reflection even in a high-frequency band.

EXAMPLE 13

The high-frequency signal transmitting device S19 having the construction shown in FIGS. 19A to 19C was formed by setting the widths of the signal-wiring connecting conductors 13, 23 of the uppermost and bottommost dielectric layers 1 to 0.30 mm. A sample T19 was obtained by setting the other construction as in the sample T13.

Figure 43:
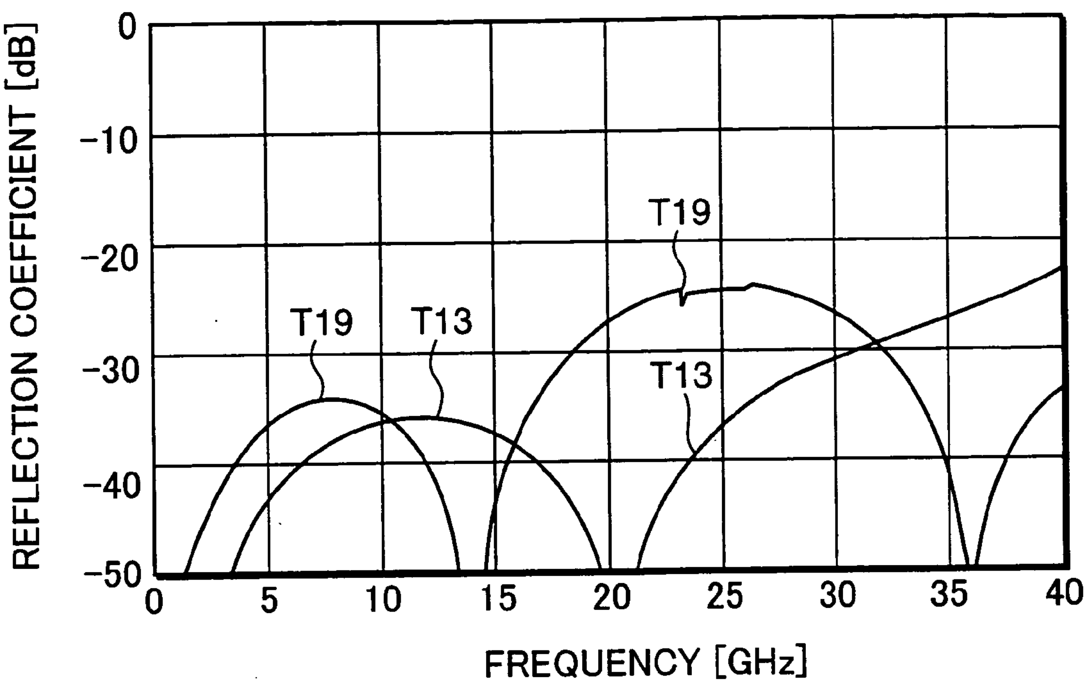
FIG. 43 is a graph showing a high-frequency characteristic of the high-frequency signal transmitting device according to the nineteenth embodiment of the invention.

For this sample T19, a high-frequency characteristic between the edges of the signal wiring conductors 11, 21 was measured by an electromagnetic field simulation to obtain a characteristic curve having a frequency characteristic as shown in a graph of FIG. 43. As is clear from FIG. 43, the sample T19 which is the high-frequency signal transmitting device according to the present invention can be understood to posses a good electric characteristic having less reflection even in a high-frequency band, which results from a good compatibility due to an improved discontinuity of impedance. It should be noted that the characteristic curve of the sample T13 which is the high-frequency signal transmitting device according to the present invention is also shown for comparison in FIG. 43.

EXAMPLE 14

The following samples were prepared as the high-frequency signal transmitting device S12 having the construction shown in FIGS. 12A to 12C in order to compare the characteristics when the lengths of the signal-wiring connecting conductors 13, 23 and the displacements of the signal via conductors 14, 24, 34 between the nine layers were changed. Specifically, a sample T12A was obtained by setting the lengths of the signal-wiring connecting conductors 13, 23 to 0.20 mm and the displacements of the signal via conductors 14, 24, 34 between the nine layers to 0.0925 mm and setting the other construction as in the sample T12. Further, a sample T12B was obtained by setting the lengths of the signal-wiring connecting conductors 13, 23 to 0.29 mm and the displacements of the signal via conductors 14, 24, 34 between the nine layers to 0.07 mm and setting the other construction as in the sample T12.

Figure 44:
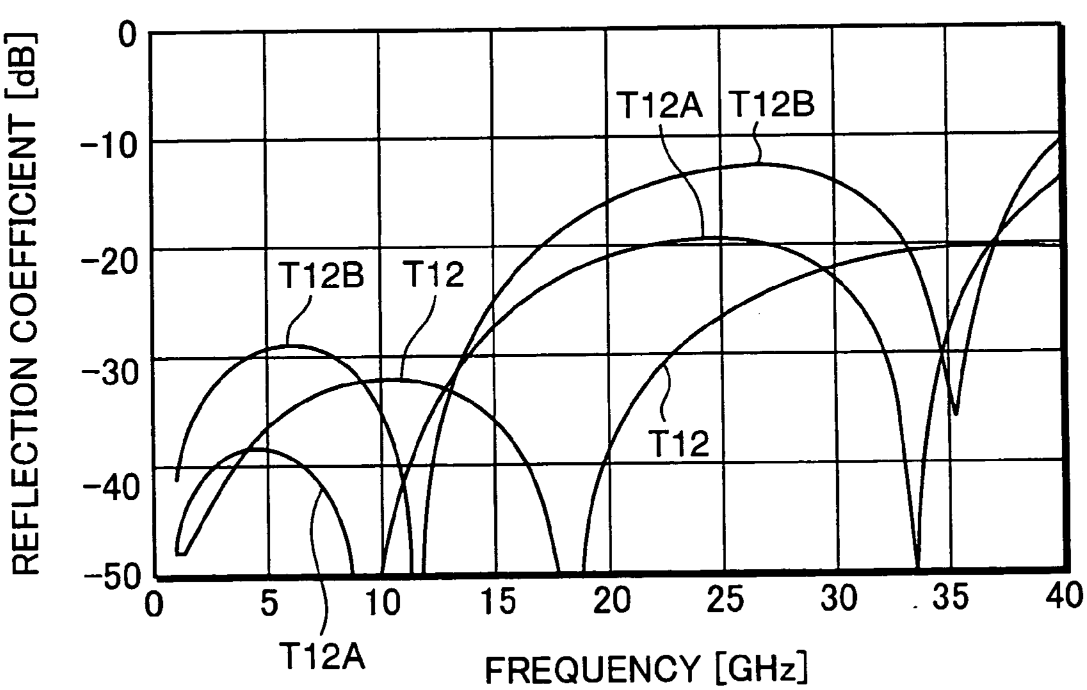
FIG. 44 is a graph showing a high-frequency characteristic of another construction of the high-frequency signal transmitting device according to the twelfth embodiment of the invention.

For these samples T12A and T12B, a high-frequency characteristic between the edges of the signal wiring conductors 11, 21 was measured by an electromagnetic field simulation to obtain characteristic curves having frequency characteristics as shown in a graph of FIG. 44. The characteristic of the aforementioned sample T12 having the construction of the high-frequency signal transmitting device S12 is also shown for comparison in FIG. 44. As is clear from FIG. 44, the samples T12A and T12B can be understood to both have a better high-frequency transmission characteristic as a whole than the prior art high-frequency transmitting device having the construction shown in FIGS. 76A and 76B.

However, the comparison of the samples T12A and T12B shows that the sample T12B has a relatively poorer electrical characteristic than the sample T2A. This is thought to come from the fact that the lengths of the signal-wiring connecting conductors 13, 23 between the signal wiring conductors 11, 21 and the signal via conductors 14, 24 exceed the thickness of the uppermost or bottommost dielectric layer 1 in the case of the sample T2B.

Accordingly, inductances created at the signal-wiring connecting conductors 13, 23 can be securely reduced and a good high-frequency transmission characteristic can be securely obtained by setting the lengths of the signal-wiring connecting conductors 13, 23 between the signal wiring conductors 11, 21 and the signal via conductors 14, 24 equal to or smaller than the thickness of the uppermost or bottommost dielectric layer 1.

EXAMPLE 15

The high-frequency signal transmitting device S20 having the construction shown in FIGS. 20A to 20C was formed by providing the grounding conductor 12 on the upper surface of the uppermost dielectric layer 1 such that the grounding-conductor non-forming area 16 was at the same position and of the same shape as the grounding-conductor non-forming area 36 on the upper surface of the dielectric layer 1 right below the uppermost dielectric layer 1 and was spaced apart from the signal wiring conductor 11 by 0.10 mm, and connecting the grounding conductor 12 and the grounding conductor 32 on the upper surface of the dielectric layer 1 right below it by the grounding-conductor via conductor 15 vertically penetrating the uppermost dielectric layer 1 and having a diameter of 0.1 mm. A sample T20 was obtained by setting the other construction as in the sample T13.

Figure 45:
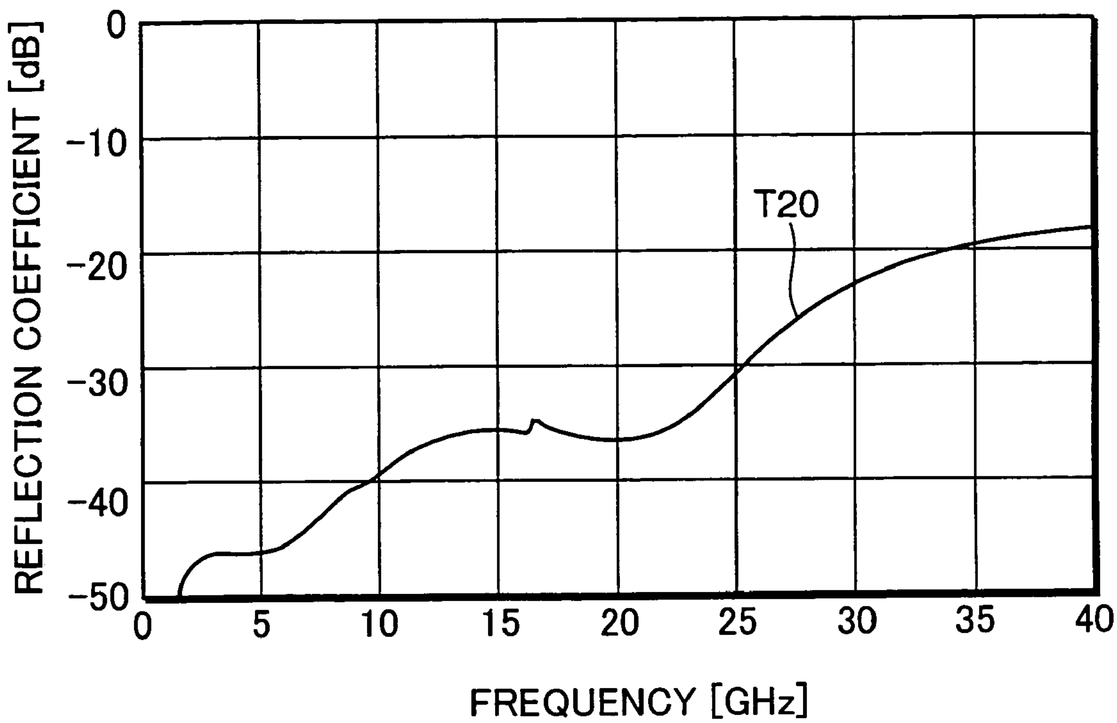
FIG. 45 is a graph showing a high-frequency characteristic of the high-frequency signal transmitting device according to the twentieth embodiment of the invention.

For the sample T20, a high-frequency characteristic between the edges of the signal wiring conductors 11, 21 was measured by an electromagnetic field simulation to obtain a characteristic curve having a frequency characteristic as shown in a graph of FIG. 45. As is clear from FIG. 45, the sample T20 which is the high-frequency signal transmitting device according to the present invention can be understood to possess a good electrical characteristic by having less reflection even in a high-frequency band. If an input/output line is formed as a coplanar line, discontinuity of impedance with an external wiring can be improved in the case that the external wiring is a coplanar line. Thus, the input/output line comes to possess a good high-frequency transmission characteristic.

EXAMPLE 16

The high-frequency signal transmitting device S22 having the construction shown in FIGS. 22A to 22D was formed as follows. Nine alumina dielectric layers 1 having a relative dielectric constant of 9.2 and a thickness of 0.2 mm were placed one over another to form the layered substrate 2. The signal wiring conductors 11, 12 were provided as to have a width of 0.21 mm and the signal-wiring connecting conductors 13, 23 were so provided to have a width of 0.21 mm and space the signal wiring conductors 11, 21 and the signal via conductors 14, 24 by a distance of 0.13 mm. Further, the signal via conductors 14, 24, 34 had a circular cross section having a diameter of 0.1 mm, and the connecting conductors for signal 33 had a rectangular shape having a width of 0.16 mm. The grounding-conductor non-forming area 36 which serves as the resonance controlling layer vertically in the middle had a circular shape having a diameter of 1.04 mm and the other grounding-conductor non-forming areas 36 had a circular cross section having a diameter of 1.24 mm.

The grounding-conductor via conductors 35 had a circular cross section having a diameter of 0.1 mm, and were arranged at eight positions on a circle spaced apart from the outer periphery of the grounding-conductor non-forming area 36 only by 0.08 mm. Displacements of the signal via conductors 14, 24, 34 between the adjacent ones of the nine layers were set to 0.195 mm, 0.115 mm, 0.075 mm, 0.055 mm, 0.055 mm, 0.075 mm, 0.115 mm, 0.195 mm from top, and a distance in plan view (distance when viewed from above) between the edge of the signal wiring conductor 11 located at the opposite side from the signal-wiring connecting conductor 13 and the edge of the signal wiring conductor 21 located at the opposite side from the signal-wiring connecting conductor 23 was 2.0 mm. The high-frequency signal transmitting device thus constructed was called a sample T22.

Further, a sample T22A was obtained as a comparative example having a construction similar to the high-frequency signal transmitting device S13 shown in FIGS. 13A to 13C by forming the grounding-conductor non-forming areas 36 into the same shape in all the layers without providing the grounding-conductor non-forming area 36 as the resonance controlling layer in the sample T22.

Figure 46:
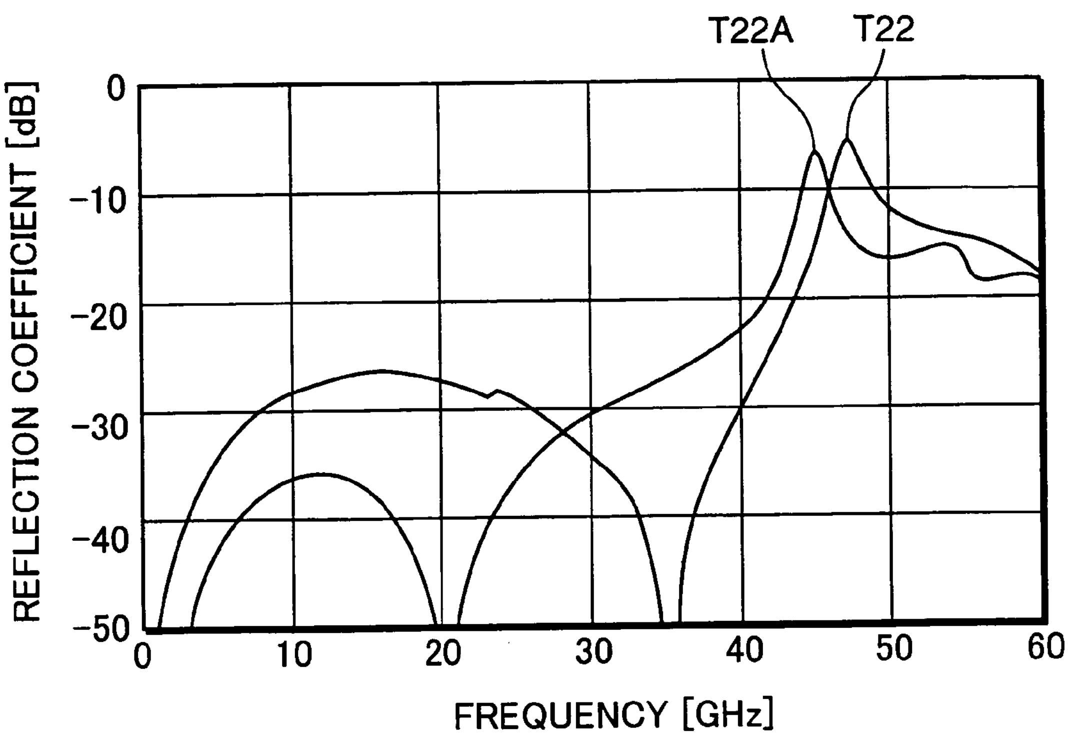
FIG. 46 is a graph showing a high-frequency characteristic of the high-frequency signal transmitting device according to the twenty-second embodiment of the invention.

For these samples T22 and T22A, a high-frequency characteristic between the edges of the signal wiring conductors 11, 21 was measured by an electromagnetic field simulation to obtain characteristic curves having frequency characteristics as shown in a graph of FIG. 46. As is clear from FIG. 46, the resonance frequency of the sample T22A which is the high-frequency signal transmitting device as a comparative example is 45.3 GHz, whereas that of the sample T22 which is the high-frequency signal transmitting device according to the present invention is 47.4 GHz. It can be understood from this that the resonance frequency is shifted toward a higher frequency side to broaden a usable frequency band.

EXAMPLE 17

The high-frequency signal transmitting device S23 having the construction shown in FIGS. 23A to 23C was formed as follows. The signal wiring conductor 11 was formed to have a width of 0.14 mm, and the signal-wiring connecting conductor 13 was formed to have a width of 0.16 mm. The grounding conductor 12 was so formed on the upper surface of the uppermost dielectric layer 1 as to be at the same position and of the same shape as the grounding-conductor non-forming area 36 on the upper surface of the dielectric layer 1 right below the uppermost dielectric layer 1 while being spaced apart from the signal wiring conductor 11 by 0.10 mm. The grounding conductor 12 and the grounding conductor 32 on the upper surface of the dielectric layer 1 right below it was connected by the grounding-conductor via conductor 15 vertically penetrating the uppermost dielectric layer 1 and having a diameter of 0.1 mm. A sample T23 was obtained by setting the other construction as in the sample T22.

Further, a sample T23A was obtained as a comparative example having a construction similar to the high-frequency signal transmitting device S20 shown in FIGS. 20A to 20C by forming the grounding-conductor non-forming areas 36 into the same shape in all the layers without providing the grounding-conductor non-forming area 36 as the resonance controlling layer in the sample T23.

Figure 47:
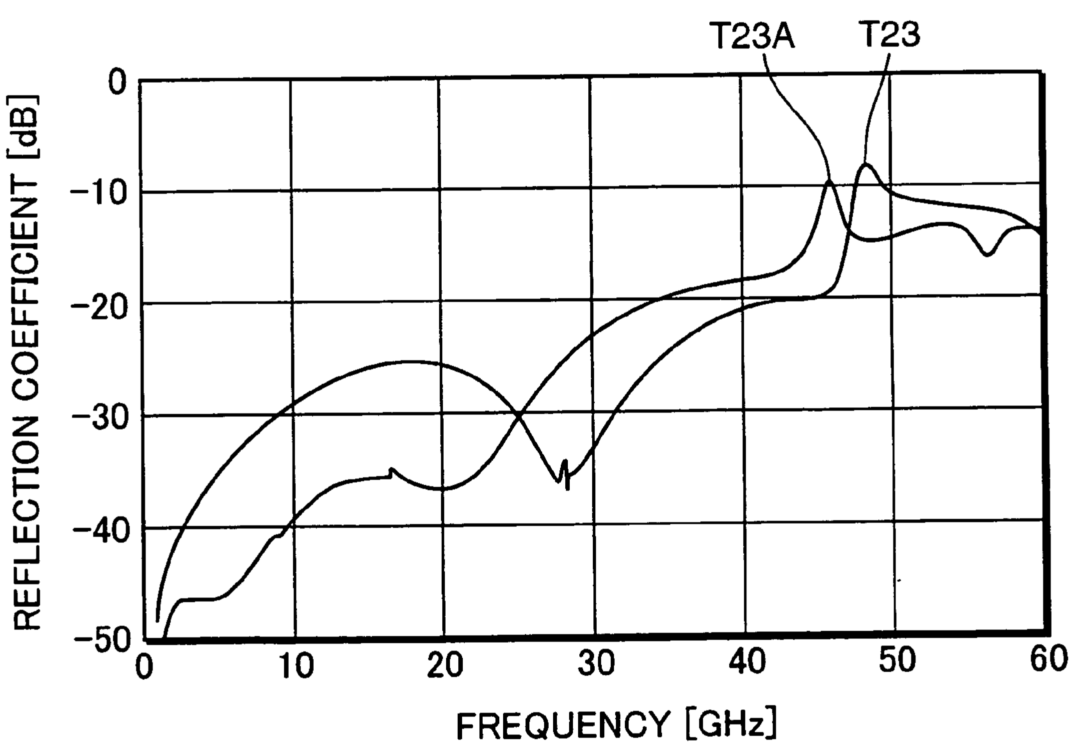
FIG. 47 is a graph showing a high-frequency characteristic of the high-frequency signal transmitting device according to the twenty-third embodiment of the invention.

For these samples T23 and T23A, a high-frequency characteristic between the edges of the signal wiring conductors 11, 21 was measured by an electromagnetic field simulation to obtain characteristic curves having frequency characteristics as shown in a graph of FIG. 47. As is clear from FIG. 47, the resonance frequency of the sample T23A which is the high-frequency signal transmitting device as a comparative example is 45.8 GHz, whereas that of the sample T23 which is the high-frequency signal transmitting device according to the present invention is 48.3 GHz. It can be understood from this that the resonance frequency is shifted toward a higher frequency side to broaden a usable frequency band.

EXAMPLE 18

The high-frequency signal transmitting device S24 having the construction shown in FIGS. 24A to 24C was formed as follows. The signal wiring conductors 11, 21 were formed to have a width of 0.14 mm, and the signal-wiring connecting conductors 13, 23 were formed to have a width of 0.16 mm. The grounding conductors 12, 22 was so formed on the upper surface of the uppermost dielectric layer 1 and on the lower surface of the bottommost dielectric layer 1 as to be at the same position and of the same shape as the grounding-conductor non-forming area 36 on the upper surface of the dielectric layer 1 right below the uppermost dielectric layer 1 and the grounding-conductor non-forming area 36 on the upper surface of the bottommost dielectric layer 1 while being spaced apart from the signal wiring conductors 11, 21 by 0.10 mm. The grounding conductors 12, 22 and the grounding conductors 32 on the upper surfaces of the uppermost intermediate dielectric layer 1 and the bottommost dielectric layer 1 were connected by the grounding-conductor via conductors 15, 25 vertically penetrating the uppermost dielectric layer 1 and the bottommost dielectric layer 1 and having a diameter of 0.1 mm. A sample T24 was obtained by setting the other construction as in the sample T23.

Further, a sample T24A was obtained as the high-frequency signal transmitting device S24 having the construction shown in FIGS. 24A to 24C by forming the grounding-conductor non-forming areas 36 as the resonance controlling layer in the sample T24 to have a circular shape having a diameter of 0.84 mm and setting the other construction as in the sample T24. Furthermore, a sample T24B was obtained as a comparative example by forming the grounding-conductor non-forming areas 36 into the same shape in all the layers without providing the grounding-conductor non-forming area 36 as the resonance controlling layer in the sample T24.

Figure 48:
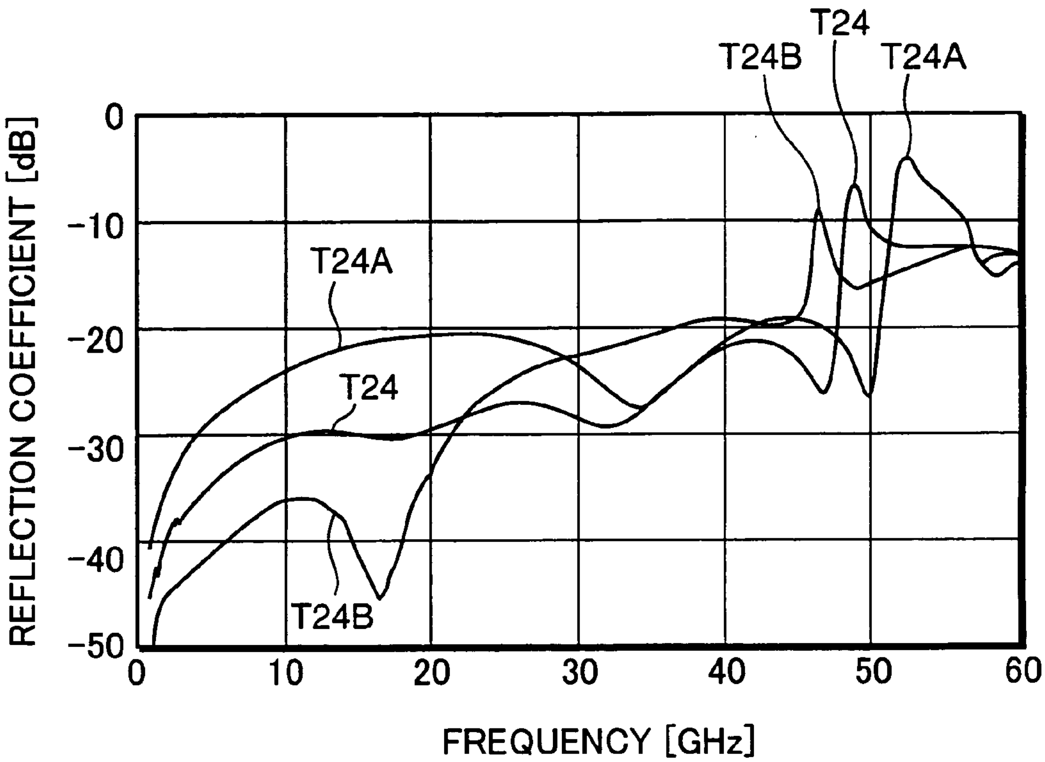
FIG. 48 is a graph showing a high-frequency characteristic of the high-frequency signal transmitting device according to the twenty-fourth embodiment of the invention.

For these samples T24, T24A and T24B, a high-frequency characteristic between the edges of the signal wiring conductors 11, 21 was measured by an electromagnetic field simulation to obtain characteristic curves having frequency characteristics as shown in a graph of FIG. 48. As is clear from FIG. 48, the resonance frequency of the sample T24B which is the high-frequency signal transmitting device as a comparative example is 46.8 GHz, whereas those of the samples T24, T24A which are the high-frequency signal transmitting devices according to the present invention are 49.1 GHz and 52.6 GHz. It can be understood from this that the resonance frequency is shifted toward a higher frequency side to broaden a usable frequency band. Particularly, the usable frequency band is most broaden in the sample T24A having the smallest grounding-conductor non-forming area 36 as the resonance controlling layer.

EXAMPLE 19

The high-frequency signal transmitting device S28 having the construction shown in FIGS. 28A to 28D was formed as follows. One alumina dielectric layer 1 having a relative dielectric constant of 8.5 and a thickness of 0.2 mm and forming the resonance controlling layer vertically in the middle and eight alumina dielectric layers 1 having a relative dielectric constant of 10 and a thickness of 0.2 mm, i.e., a total of nine layers were placed one over another to form the layered substrate 2. The signal wiring conductors 11, 12 were so provided as to have a width of 0.14 mm while being spaced apart from the signal wiring conductors 12, 22 by a distance of 0.1 mm. The signal wiring conductors 13, 23 were formed to have a width of 0.16 mm, and the signal via conductors 14, 24, 34 had a circular cross section having a diameter of 0.1 mm. Further, distances in the signal wiring conductors 13, 23 between the signal wiring conductors 11, 21 and the signal via conductors 14, 24 were set to 0.13 mm, and the grounding-conductor non-forming areas 16, 26, 36 had a circular shape having a diameter of 1.24 mm.

The grounding-conductor via conductors 15, 25, 35 had a circular cross section having a diameter of 0.1 mm, and were arranged at eight positions on a circle spaced apart from the outer periphery of the grounding-conductor non-forming area 16, 26, 36 only by 0.08 mm. The c Displacements of the signal via conductors 14, 24, 34 between the adjacent ones of the nine layers were set to 0.195 mm, 0.115 mm, 0.075 mm, 0.055 mm, 0.055 mm, 0.075 mm, 0.115 mm, 0.195 mm from top, and a distance in plan view (distance when viewed from above) between the edge of the signal wiring conductor 11 located at the opposite side from the signal-wiring connecting conductor 13 and the edge of the signal wiring conductor 21 located at the opposite side from the signal-wiring connecting conductor 23 was 2.0 mm. The high-frequency signal transmitting device thus constructed was called a sample T28.

A sample T28A was obtained as the high-frequency signal transmitting device S28 by setting the relative dielectric constant of the dielectric layer 1 forming the resonance controlling layer to 6 and setting other construction as in the sample T28. Further, a sample T28B was obtained as a comparative example by setting the relative dielectric constants of all the dielectric layers 1 to 10 without providing the resonance controlling layer.

Figure 49:
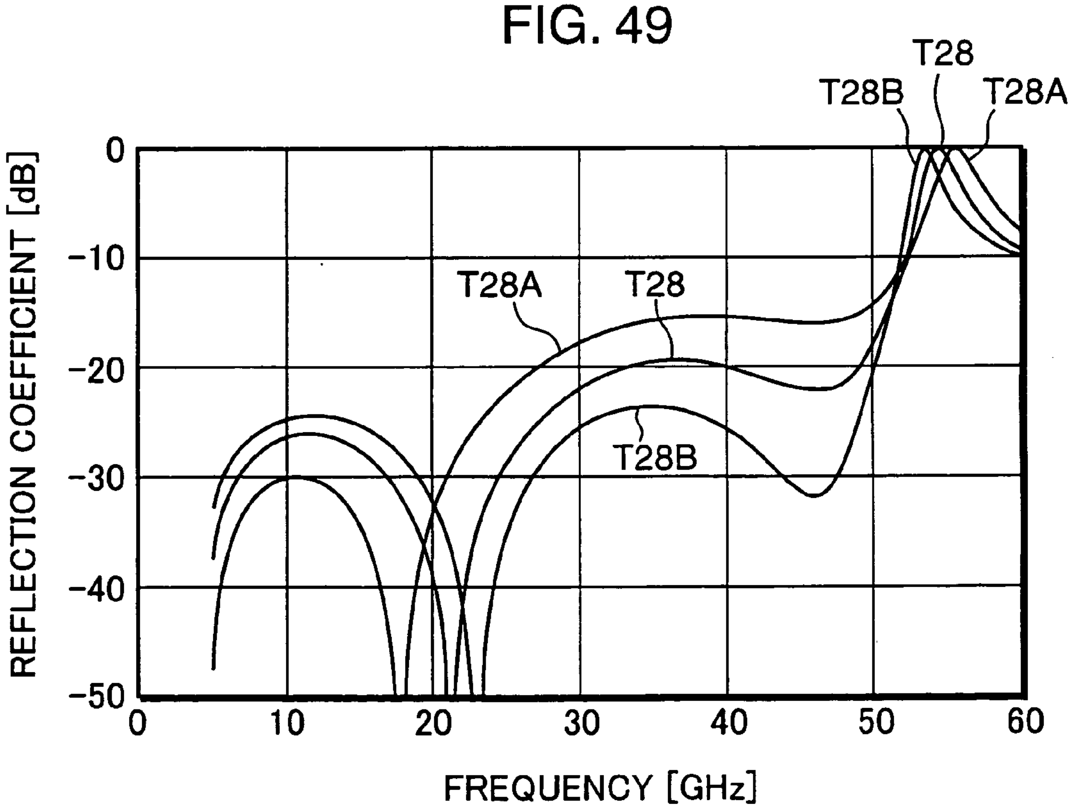
FIG. 49 is a graph showing a high-frequency characteristic of the high-frequency signal transmitting device according to the twenty-eighth embodiment of the invention.

For these samples T28, T28A and T28B, a high-frequency characteristic between the edges of the signal wiring conductors 11, 21 was measured by an electromagnetic field simulation to obtain characteristic curves having frequency characteristics as shown in a graph of FIG. 49. As is clear from FIG. 49, the resonance frequency of the sample T28B which is the high-frequency signal transmitting device as a comparative example is 53.8 GHz, whereas those of the samples T28, T28A which are the high-frequency signal transmitting devices according to the present invention are 54.8 GHz and 56.0 GHz. It can be understood from this that the resonance frequency is shifted toward a higher frequency side to broaden a usable frequency band. Particularly, the usable frequency band is most broaden in the sample T28A whose dielectric layer 1 acting as the resonance controlling layer has the smallest relative dielectric constant.

Next, thirtieth to thirty-second embodiments of the invention relating to a high-frequency signal transmitting device and a high-frequency semiconductor package will be described.

First, these embodiments are summarily described. Specifically, the high-frequency signal transmitting devices (layered structures for high-frequency signal transmission) according to the following embodiments are formed using layered substrates obtained by placing a plurality of dielectric layers one over another, and the respective intermediate dielectric layers of the layered substrate excluding the uppermost and bottommost dielectric layers having a thickness equal to or smaller than ⅛ of the tube wavelength of a highest frequency of a frequency band used have a thickness smaller than half the tube wavelength of the highest frequency used.

Signal wiring conductors extending in opposite directions are formed on the upper and lower surfaces of the layered substrate, one ends of the signal wiring conductors are connected with via conductors for outer-layer signal vertically penetrating the respective layers via signal-wiring connecting conductors and provided on the uppermost and bottommost layers. Outer-surface grounding conductors are formed substantially on the entire upper and lower surfaces of the layered substrate excluding portions of a specified width at the opposite sides of the signal wiring conductors while surrounding the via conductors for outer-layer signal and the signal-wiring connecting conductors. An inner-layer grounding conductor is formed substantially on the entire surface of each inner layer except an inner-layer grounding-conductor non-forming area having a rectangular shape, circular shape, elliptical shape or like shape symmetrical with respect to two axes.

These inner-layer grounding-conductor non-forming areas are so arranged as to be placed one over another along vertical direction. Via conductor connecting conductors for signal for connecting via conductors for inner-layer signal vertically penetrating the corresponding inner dielectric layers are formed within the inner-layer grounding-conductor non-forming areas. A plurality of via conductors for inner-layer grounding vertically penetrating the respective inner layers near the outer peripheries of the inner-layer grounding-conductor non-forming areas and a plurality of via conductors for outer-surface grounding vertically penetrating between the outer-surface grounding conductors and the inner-layer grounding conductors are arranged at an interval shorter than half the tube wavelength of a highest frequency used, thereby connecting the inner-layer grounding conductors with each other and connecting the outer-surface grounding conductors with the inner-layer grounding conductors to form an electromagnetically shielded space within an inner-layer portion. The via conductors for outer-layer signal and the via conductors for inner-layer signal are connected via the via conductor connecting conductors for signal, thereby forming a layered construction for electrically connecting the upper and lower surfaces of the layered substrate.

If the length and width of the signal-wiring connecting conductor of the uppermost layer extending to the via conductor for outer-layer signal without overlapping the inner-layer grounding conductor right below the signal wiring conductor of the uppermost layer are $L_1$, $W_1$; the length and width of the signal-wiring connecting conductor of the bottommost layer extending to the via conductor for outer-layer signal without overlapping the inner-layer grounding conductor right above the signal wiring conductor of the uppermost layer are $L_2$, $W_2$; the relative dielectric constant of the layered substrate is $e_r$; the highest frequency of the used frequency band is $f_{max}$ (unit: GHz) and an applied characteristic impedance is $Z_0$, $L_1$, $W_1$, $L_2$, $W_2$, $e_r$ are so set as to satisfy a conditional expression below depending on the highest frequency $f_{max}$ used:

$$2\pi f_{\max}\left(0.09\ln\left(\frac{2L_1}{W_1(\varepsilon_r+1)}\times\frac{2L_2}{W_2(\varepsilon_r+1)}\right)+0.32\right)\leq\frac{2}{3}Z_0$$

Figure 50A:
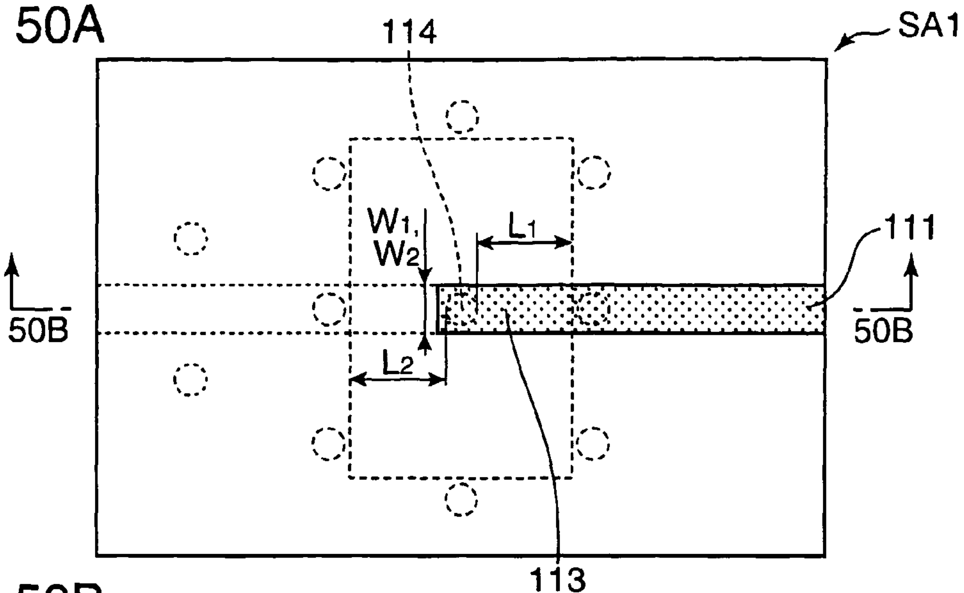
FIG. 50A is a plan view diagrammatically showing a high-frequency signal transmitting device according to a thirtieth embodiment of the invention.
Figure 50B:
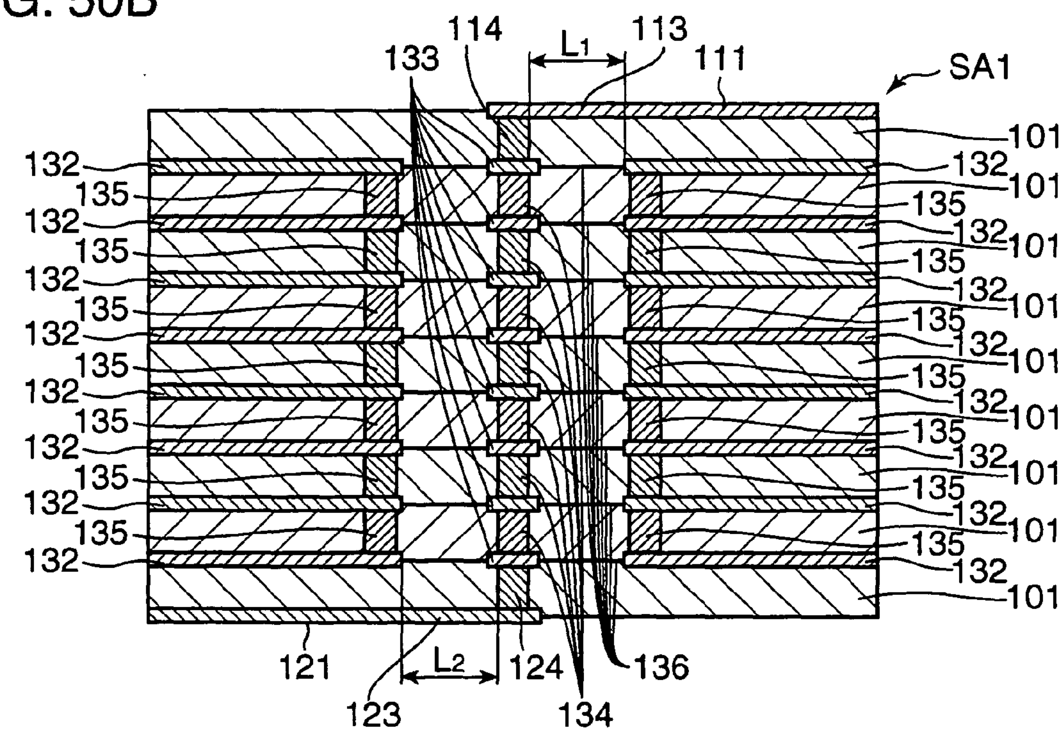
FIG. 50B is a vertical sectional view taken along the line 50B—50B of FIG. 50A.

FIGS. 50A and 50B show a high-frequency signal transmitting device (layered structure for high-frequency signal transmission) SA1 according to one example of a thirtieth embodiment of the invention. Specifically, in FIGS. 50A and 50B, the high-frequency signal transmitting device SA1 of the thirtieth embodiment is formed into a layered substrate by placing a plurality of dielectric layers 101 one over another. Signal wiring conductors 111, 121 are connected with via conductors for outer-layer 114, 124 via signal-wiring connecting conductors 113, 123. Further, via conductors for outer-layer grounding 115, 125 are connected with outer-surface grounding conductors 112, 122.

The outer-surface grounding conductors 112, 122 are formed with rectangular outer-surface grounding-conductor non-forming areas 116, 126. The inner layers are formed with via conductors for outer-layer signal 134 and via conductors connecting conductors for signal 133 to connect the via conductors for outer-layer signal 114, 124. A rectangular inner-layer grounding-conductor non-forming area 136 is formed inside each inner-layer grounding conductor 132, and via conductors for inner-layer grounding 135 are formed near the outer periphery of each inner-layer grounding-conductor non-forming area 136. The outer-surface grounding-conductor non-forming areas 116, 126 and the inner-layer grounding-conductor non-forming areas 136 are arranged one over another, and the via conductors for outer-layer signal 114, 124 are connected via the via conductors 134 for inner-layer signal and the via conductor connecting conductors for signal 133.

Thus, as compared to the prior art in which the signal-wiring connecting conductors act as an inductance to deteriorate a high-frequency signal characteristic since the lengths of the signal-wiring connecting conductors are long and high-frequency signals have to propagate long distances to a ground along the signal-wiring connecting conductors, inductances created at the signal-wiring connecting conductors can be securely reduced by satisfying the above conditional expression. As a result, a good high-frequency transmission characteristic can be obtained. Therefore, the high-frequency signal transmitting device can have a good transmission characteristic up to a highest frequency of a frequency band used.

Concerning the above conditional expression, it was confirmed that a satisfactory coincidence could be attained by a method described below. First, in the high-frequency signal transmitting device shown in FIGS. 50A and 50B, the inductance of one signal-wiring connecting conductor was measured by an electromagnetic field simulation by setting $L=L_1=L_2$, $W=W_1=W_2$ and changing the value of $\epsilon_r$, and the result is shown in FIG. 56.

Figure 56:
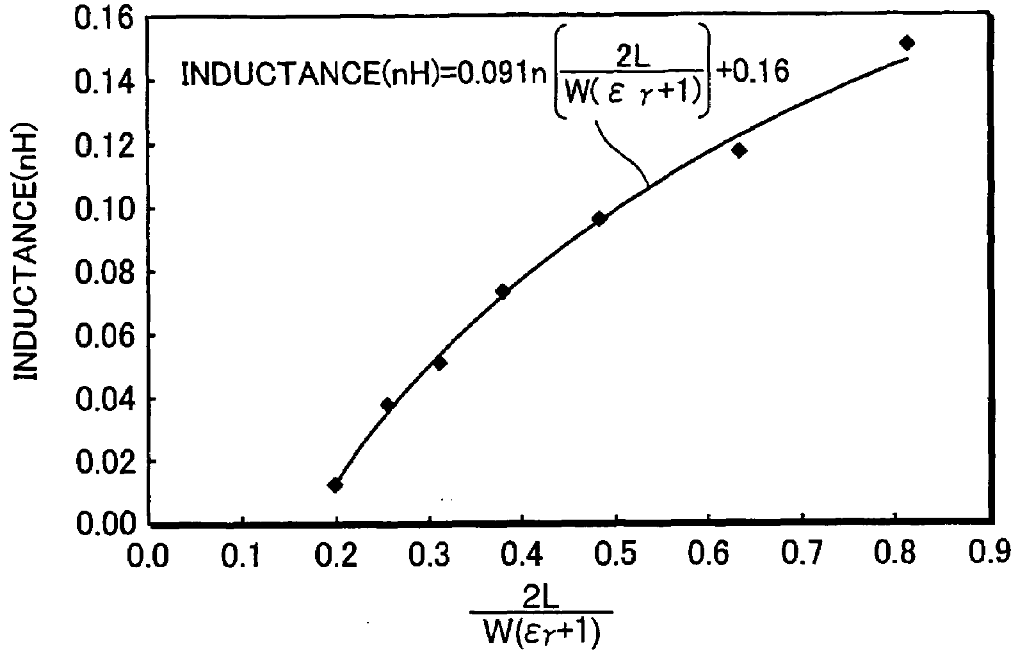

In FIG. 56, rhombic points show relationships of L, W, $\epsilon_r$, and the inductance, and a characteristic curve satisfactorily coinciding with the above conditional expression were obtained. Here, since inductances are present at both signal-wiring connecting conductors on the uppermost and bottommost layers, reactance as the high-frequency signal transmitting device is $\omega$ $(L_u,L_d)$ ($\omega$: angular frequency) if the respective inductances are $L_u$, $L_d$. Thus, in order to maintain a good high-frequency characteristic, $\omega (L_u,L_d) \geqq 2Z_0/3$ ($Z_0$: applied characteristic impedance) may be satisfied.

Figure 51A:
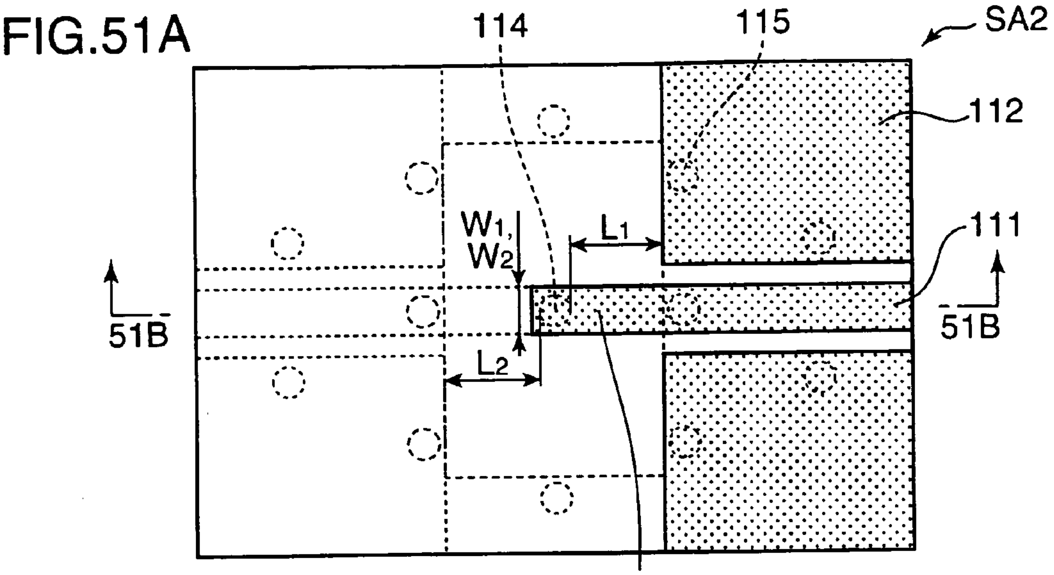
FIG. 51A is a plan view diagrammatically showing a high-frequency signal transmitting device according to a thirty-first embodiment of the invention.
Figure 51B:
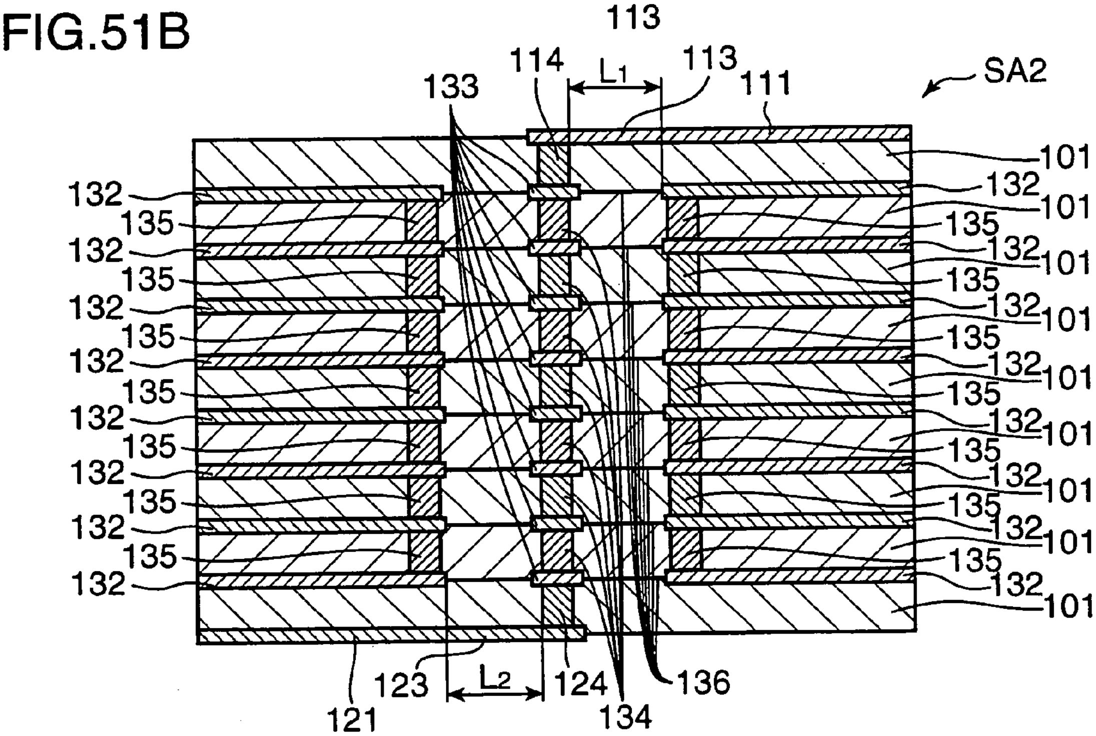
FIG. 51B is a vertical sectional view taken along the line 51B—51B of FIG. 51A.

Referring to FIGS. 51A and 51B showing a high-frequency signal transmitting device SA2 according to a thirty-first embodiment of the invention, the high-frequency signal transmitting device SA2 is formed such that an outer-layer grounding conductor at specified distance to the outer-layer grounding-conductor non-forming area and the signal wiring conductor is formed on the upper surface and/or lower surface of the layered substrate only at a side of the signal wiring conductor in the high-frequency signal transmitting device SA1.

In FIGS. 51A, 51B, the same elements as those shown in FIGS. 50A, 50B are identified by the same reference numerals, and the high-frequency signal transmitting device SA2 includes the dielectric layers 101, the signal wiring conductors 111, 121, the signal-wiring connecting conductors 113, 123, the via conductors for outer-layer signal 114, 124, the inner-layer grounding conductors 132, the via conductor connecting conductors for signal 133, the via conductors for inner-layer signal 134, the via conductors for inner-layer grounding 135 and the inner-layer grounding-conductor non-forming areas 136. Outer-layer grounding conductors 112, 122 at specified distances to the outer-layer grounding-conductor non-forming areas 116, 126 and the signal wiring conductors 111, 121 are formed on the upper and lower surfaces of the layered substrate at the sides of the signal wiring conductors 111, 121.

Thus, if an input/output line is formed as a coplanar line, discontinuity of impedance with an external wiring can be improved in the case that the external wiring is a coplanar line. As a result, the high-frequency signal transmitting device comes to possess a good high-frequency transmission characteristic up to a highest frequency of a frequency band used.

Figure 52A:
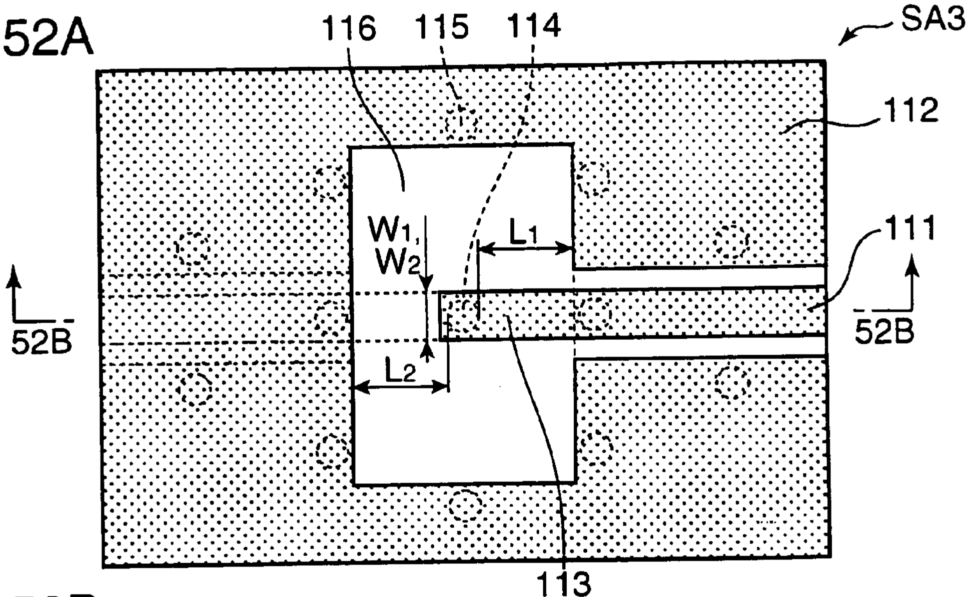
FIG. 52A is a plan view diagrammatically showing a high-frequency signal transmitting device according to a first example of a thirty-second embodiment of the invention.
Figure 52B:
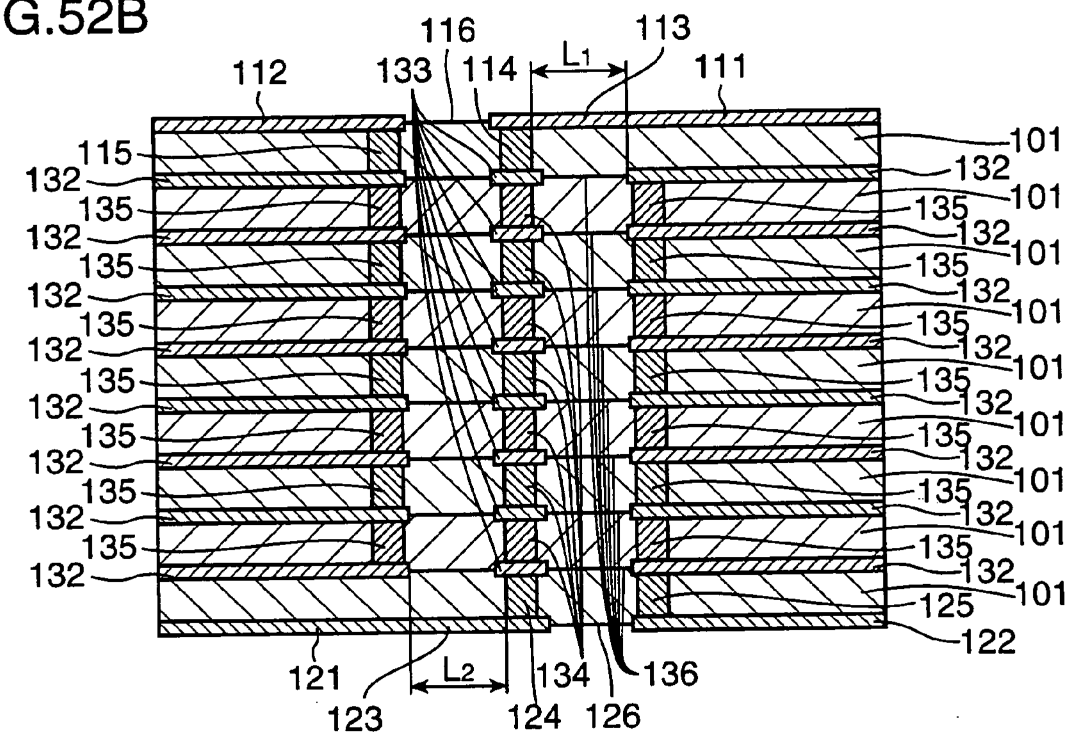
FIG. 52B is a vertical sectional view taken along the line 52B—52B of FIG. 52A.

Referring to FIGS. 52A and 52B showing a high-frequency signal transmitting device SA3 according to a first example of a thirty-second embodiment of the invention, the high-frequency signal transmitting device SA3 is formed such that an outer-layer grounding conductor at specified distance to the outer-layer grounding-conductor non-forming area and the signal wiring conductor is so formed on the upper surface and/or lower surface of the layered substrate as to surround the signal wiring conductor in the high-frequency signal transmitting devices SA1, SA2.

In FIGS. 52A, 52B, the same elements as those shown in FIGS. 50A, 50B are identified by the same reference numerals, and the high-frequency signal transmitting device SA3 includes the dielectric layers 101, the signal wiring conductors 111, 121, the signal-wiring connecting conductors 113, 123, the via conductors for outer-layer signal 114, 124, the inner-layer grounding conductors 132, the via conductor connecting conductors for signal 133, the via conductors for inner-layer signal 134, the via conductors for inner-layer grounding 135 and the inner-layer grounding-conductor non-forming areas 136. Outer-layer grounding conductors 112, 122 at specified distances to the outer-layer grounding-conductor non-forming areas 116, 126 and the signal wiring conductors 111, 121 are so formed on the upper and lower surfaces of the layered substrate as to surround the signal wiring conductors 111, 121.

Thus, if an input/output line is formed as a coplanar line, discontinuity of impedance with an external wiring can be improved in the case that the external wiring is a coplanar line. As a result, the high-frequency signal transmitting device comes to possess a good high-frequency transmission characteristic up to a highest frequency of a frequency band used.

Figure 53A:
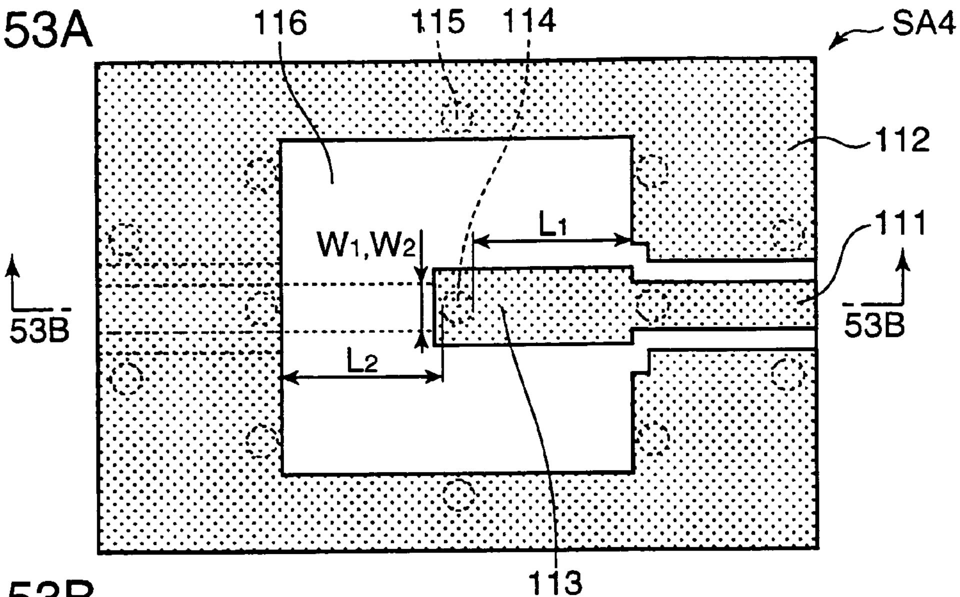
FIG. 53A is a plan view diagrammatically showing a high-frequency signal transmitting device according to a second example of the thirty-second embodiment of the invention.
Figure 53B:
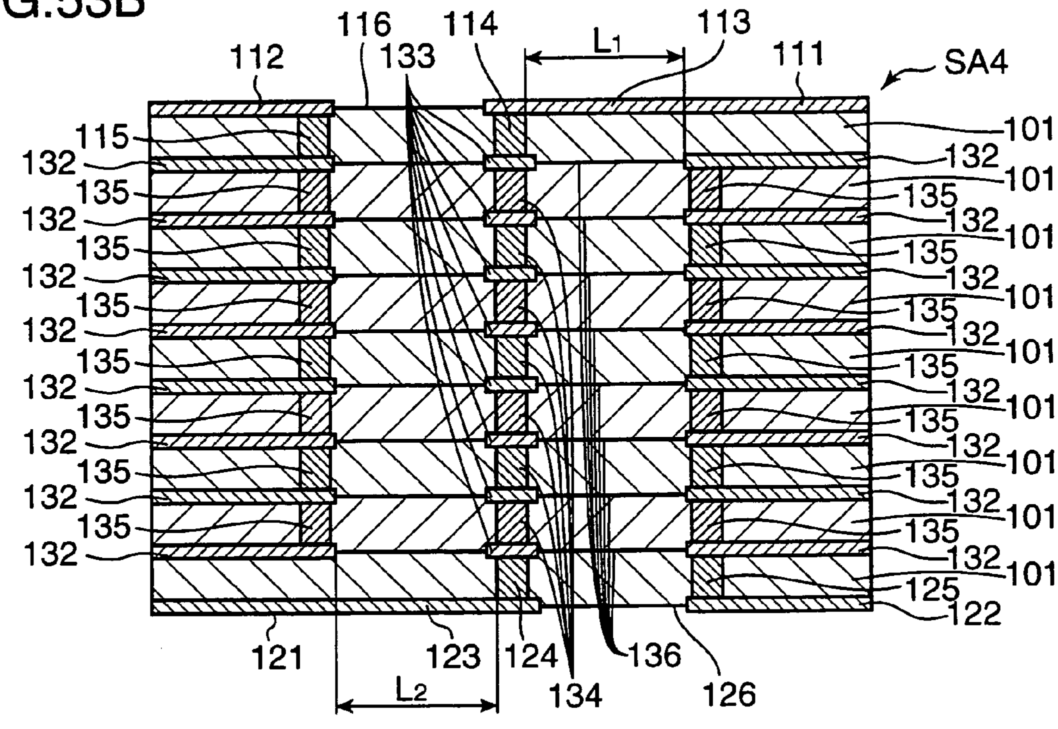
FIG. 53B is a vertical sectional view taken along the line 53B—53B of FIG. 53A.

Referring to FIGS. 53A and 53B showing a high-frequency signal transmitting device SA4 according to a second example of the thirty-second embodiment of the invention, a high-frequency signal transmitting device SA4 differs from the high-frequency signal transmitting device SA3 according to the first example of the thirty-second embodiment only in that the outer-layer grounding-conductor non-forming areas 116, 126 are formed to have a larger area and the signal-wiring connecting conductors 113, 123 are formed to be wider. The other construction is similar to that of the high-frequency signal transmitting device SA3 according to the first example of the thirty-second embodiment.

Figure 54A:
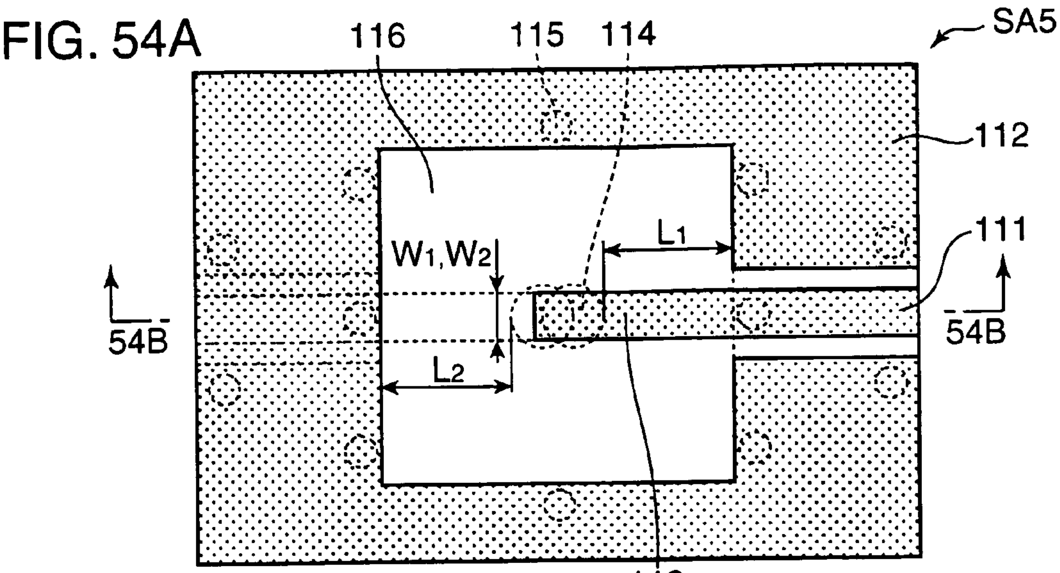
FIG. 54A is a plan view diagrammatically showing a high-frequency signal transmitting device according to a fourth example of the thirty-second embodiment of the invention.
Figure 54B:
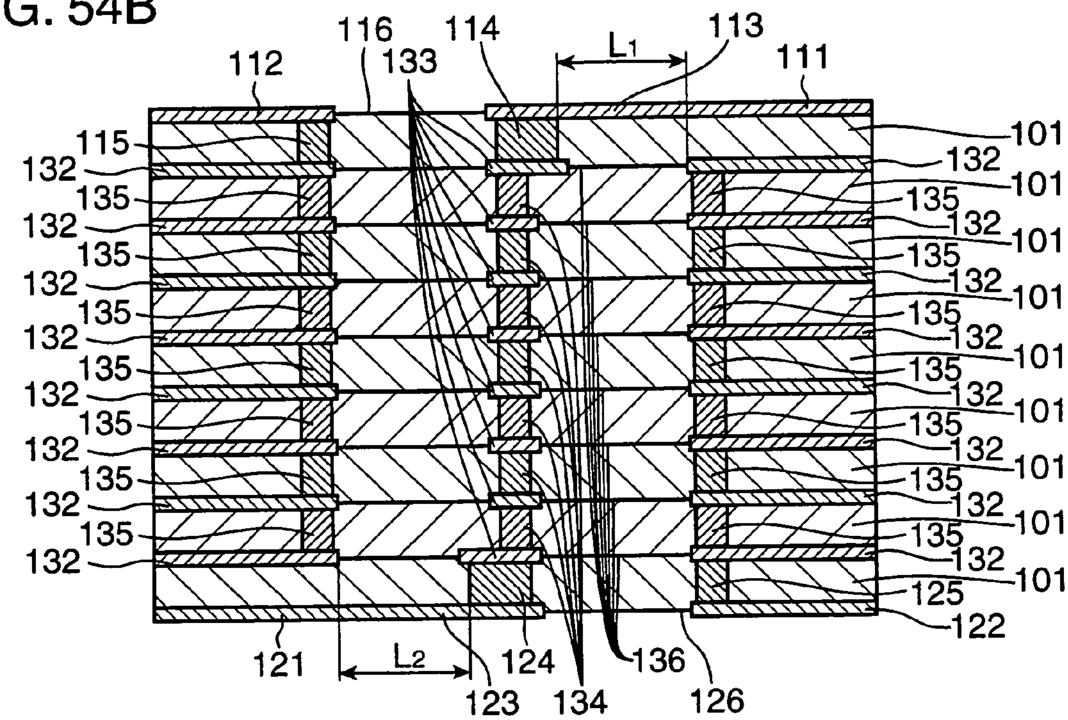

Referring to FIGS. 54A and 54B showing a high-frequency signal transmitting device SA5 according to a third example of the thirty-second embodiment of the invention, a high-frequency signal transmitting device SA5 differs from the high-frequency signal transmitting device SA3 according to the first example of the thirty-second embodiment only in that the outer-layer grounding-conductor non-forming areas 116, 126 are formed to have a larger area and the via conductors for outer-layer signal 114, 124 are formed to have a large diameter. The other construction is similar to that of the high-frequency signal transmitting device SA3 according to the first example of the thirty-second embodiment.

The high-frequency signal transmitting devices SA1 to SA5 are applicable to high-frequency semiconductor packages. Specifically, a frame and a lid are so formed on the upper surface of the layered substrate as to accommodate high-frequency semiconductor device, and an input/output signal-wiring connecting conductor for the signal input and output to and from outside is formed at a side of the signal wiring conductor on the lower surface of the layered substrate opposite from the signal-wiring connecting conductor, whereby a high-frequency semiconductor package having a good high-frequency transmission characteristic can be constructed.

In the inventive high-frequency signal transmitting device and high-frequency semiconductor package as above, ceramic materials such as alumina, mullite and aluminum nitride, so-called glass-ceramic materials are widely used for the dielectric substrate. Metallic materials for high-frequency wiring conductor including elemental metals such as Cu, and alloys such as MoMn+Ni+Au, W+Ni+Au, Cr+Cu, Cr+Cu+Ni+Au, $Ta_2N$+NiCr+Au, Ti+Pd+Au and NiCr+Pd+Au are used for the conductive patterns such as the signal wiring conductors and the grounding conductors. Together with the permittivity and the thickness of the dielectric material, the thicknesses and widths of the conductive patterns are set based on the frequency of high-frequency signals to be transmitted and a characteristic impedance used.

If the frame and the lid are metallic, a material made of, e.g., a Fe—Ni alloy such as a Fe—Ni—Co alloy or a Fe—Ni42 alloy; an oxygen-free copper; an aluminum; a stainless steel; a Cu—W alloy; or a Cu—Mo alloy is used. The metallic structures are joined by a high-melting point brazing metal such as a solder, AuSn brazing metal, AuGe brazing metal, thereby being hermetically sealed. The dielectric substrate and the metallic structure are joined by a high-melting point brazing metal such as an AgCu brazing metal, AuSn brazing metal or AuGe brazing metal to accommodate the semiconductor device, whereby a high-frequency semiconductor package having a good transmission characteristic can be provided.

Next, specific examples of the high-frequency signal transmitting devices SA1 to SA5 according to the thirty-second embodiment are described.

EXAMPLE 1

A specific example of the high-frequency signal transmitting device SA3 according to the first example of the thirty-second embodiment, having the construction shown in FIGS. 52A and 52B was formed as follows. First, a layered substrate was formed by placing six dielectric layers having a relative dielectric constant of 8 and a thickness of 0.6 mm one over another and placing two dielectric layers having a relative dielectric constant of 8 and a thickness of 0.2 mm as uppermost and bottommost layers. The signal wiring conductors 111, 121 were formed to have a width of 0.176 mm while being spaced apart from the outer-surface grounding conductors 112, 122 by 0.1 mm, and the signal-wiring connecting conductors 113, 123 were formed to have a width of 0.15 mm and to set distances between the signal wiring conductors 111, 121 and the via conductors for outer-surface signal 114, 124 to 0.265 mm.

Further, the via conductors for outer-layer signal 114, 124 and the via conductors for inner-layer signal 134 had a circular cross section having a diameter of 0.07 mm, the via conductor connecting conductors for signal 133 had a circular shape having a diameter of 0.13 mm, and the outer-surface grounding-conductor non-forming areas 116, 126 and the inner-layer grounding-conductor non-forming areas 136 had a rectangular shape having longer sides of 1 mm and shorter sides of 0.6 mm. The via conductors for outer-layer grounding 115, 125 and the via conductors for inner-layer grounding 135 had a circular cross section having a diameter of 0.1 mm and were arranged at eight positions where the centers of the via conductors 115, 125, 135 are spaced apart from the outer periphery of the grounding-conductor non-forming areas 116, 126, 136 only by 0.8 mm. The via conductors for outer-layer signal 114, 124 and the via conductors for inner-layer signal 134 in the eight layers were connected straight. The high-frequency signal transmitting device thus constructed was called a sample T30.

Figure 55A:
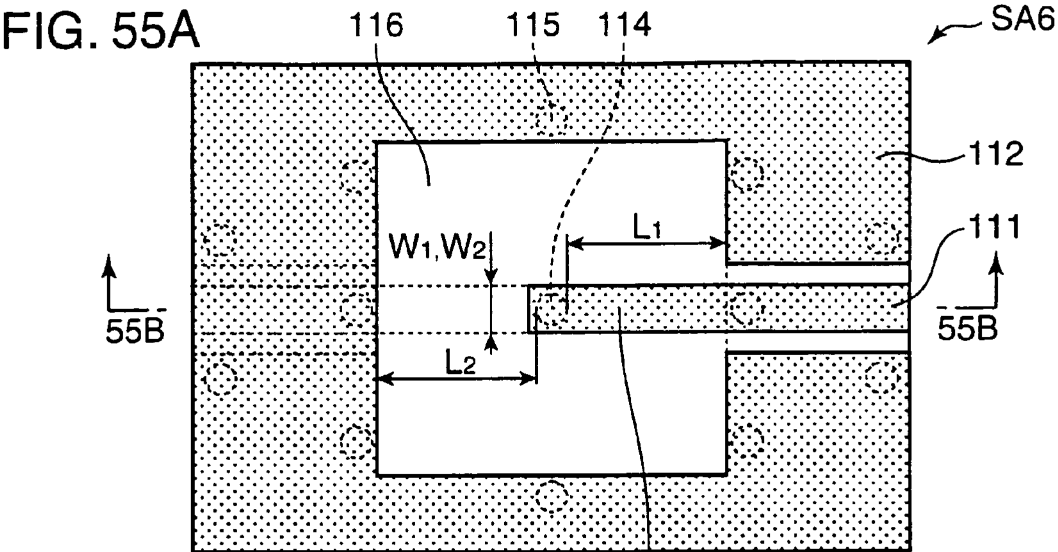
Figure 55B:
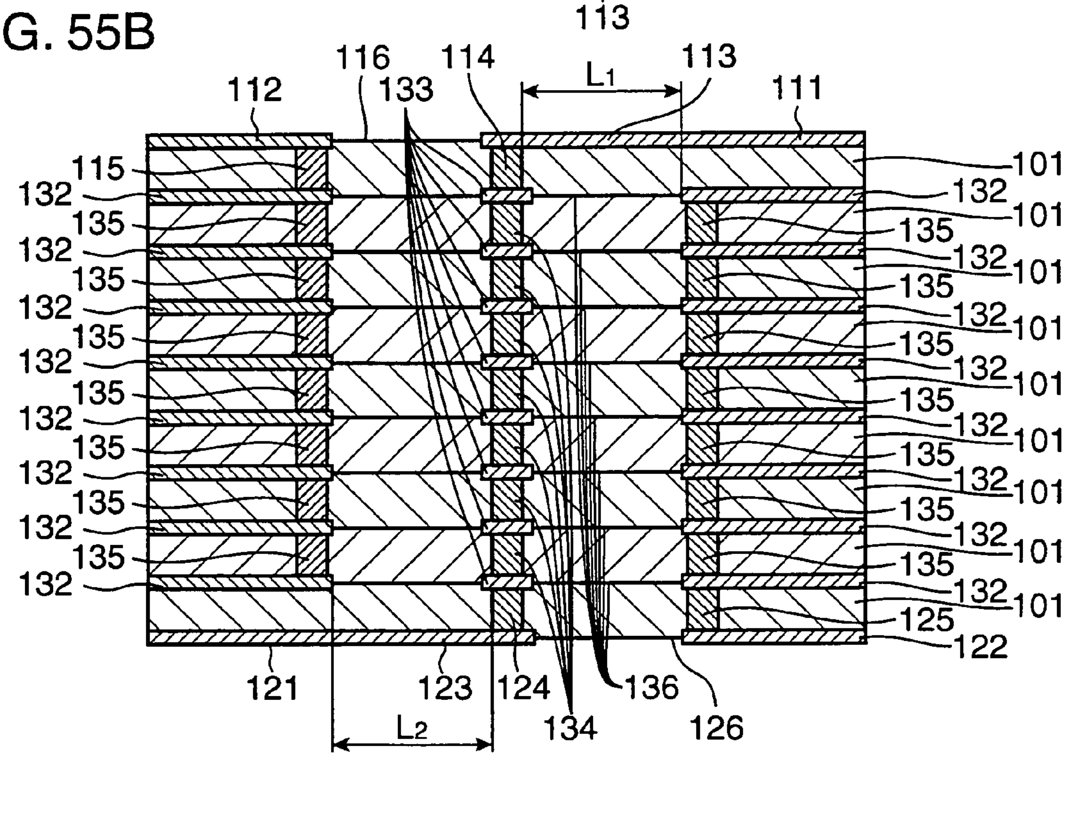

As a comparative example to the high-frequency signal transmitting device SA3 according to the first example of the thirty-second embodiment, a high-frequency signal transmitting device shown in FIGS. 55A and 55B was formed, for example, by enlarging the areas of the outer-layer grounding-conductor non-forming areas 116, 126. Specifically, a layered substrate was formed by placing six dielectric layers having a relative dielectric constant of 8 and a thickness of 0.6 mm one over another and placing two dielectric layers having a relative dielectric constant of 8 and a thickness of 0.2 mm as uppermost and bottommost layers. The signal wiring conductors 111, 121 were formed to have a width of 0.176 mm while being spaced apart from the outer-surface grounding conductors 112, 122 by 0.1 mm, and the signal-wiring connecting conductors 113, 123 were formed to have a width of 0.15 mm and to set distances between the signal wiring conductors 111, 121 and the via conductors for outer-surface signal 114, 124 to 0.449 mm.

Further, the via conductors for outer-layer signal 114, 124 and the via conductors for inner-layer signal 134 had a circular cross section having a diameter of 0.102 mm, the via conductor connecting conductors for signal 133 had a circular shape having a diameter of 0.162 mm, and the outer-surface grounding-conductor non-forming areas 116, 126 and the inner-layer grounding-conductor non-forming areas 136 had a square shape having sides of 1 mm. The via conductors for outer-layer grounding 115, 125 and the via conductors for inner-layer grounding 135 had a circular cross section having a diameter of 0.1 mm and were arranged at eight positions where the centers of the via conductors 115, 125, 135 are spaced apart from the outer periphery of the grounding-conductor non-forming areas 116, 126, 136 only by 0.8 mm. The via conductors for outer-layer signal 114, 124 and the via conductors for inner-layer signal 134 in the eight layers were connected straight. The high-frequency signal transmitting device thus constructed was called a sample T31.

Figure 57:
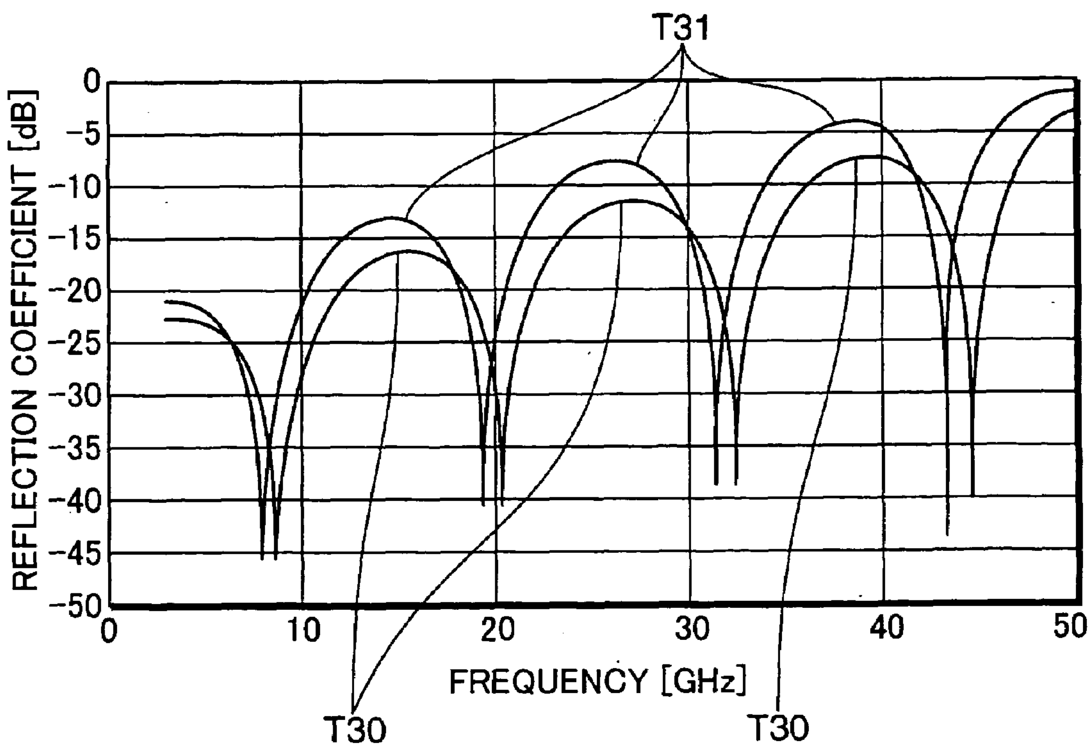

For these samples T30 and T31, a high-frequency characteristic between the edges of the signal wiring conductors 111, 121 was measured by an electromagnetic field simulation to obtain characteristic curves having frequency characteristics as shown in a graph of FIG. 57. From this result, the sample T30 which is the inventive high-frequency signal transmitting device can be understood to possess a better electrical characteristic than the sample T31 by having less reflection even in a high-frequency band. This is also clear from the fact that if the values of the samples T30, T31 are substituted into the above conditional expression to obtain the values of $f_{max}$, $f_{max}$ is 35 GHz for the sample T30 and 21.5 GHz for the sample T31, showing that the sample T30 has a higher applicable frequency.

EXAMPLE 2

A specific example of the high-frequency signal transmitting device SA4 according to the second example of the thirty-second embodiment having the construction shown in FIGS. 53A and 53B was formed as follows. First, a layered substrate was formed by placing six dielectric layers having a relative dielectric constant of 8 and a thickness of 0.6 mm one over another and placing two dielectric layers having a relative dielectric constant of 8 and a thickness of 0.2 mm as uppermost and bottommost layers. The signal wiring conductors 111, 121 were formed to have a width of 0.176 mm while being spaced apart from the outer-surface grounding conductors 112, 122 by 0.1 mm, and the signal-wiring connecting conductors 113, 123 were formed to have a width of 0.25 mm and to set distances between the signal wiring conductors 111, 121 and the via conductors for outer-surface signal 114, 124 to 0.449 mm.

Further, the via conductors for outer-layer signal 114, 124 and the via conductors for inner-layer signal 134 had a circular cross section having a diameter of 0.102 mm, the via conductor connecting conductors for signal 133 had a circular shape having a diameter of 0.162 mm, and the outer-surface grounding-conductor non-forming areas 116, 126 and the inner-layer grounding-conductor non-forming areas 136 had a square shape having sides of 1 mm. The via conductors for outer-layer grounding 115, 125 and the via conductors for inner-layer grounding 135 had a circular cross section having a diameter of 0.1 mm and were arranged at eight positions where the centers of the via conductors 115, 125, 135 are spaced apart from the outer periphery of the grounding-conductor non-forming areas 116, 126, 136 only by 0.8 mm. The via conductors for outer-layer signal 114, 124 and the via conductors for inner-layer signal 134 in the eight layers were connected straight. The high-frequency signal transmitting device thus constructed was called a sample T32.

Figure 58:
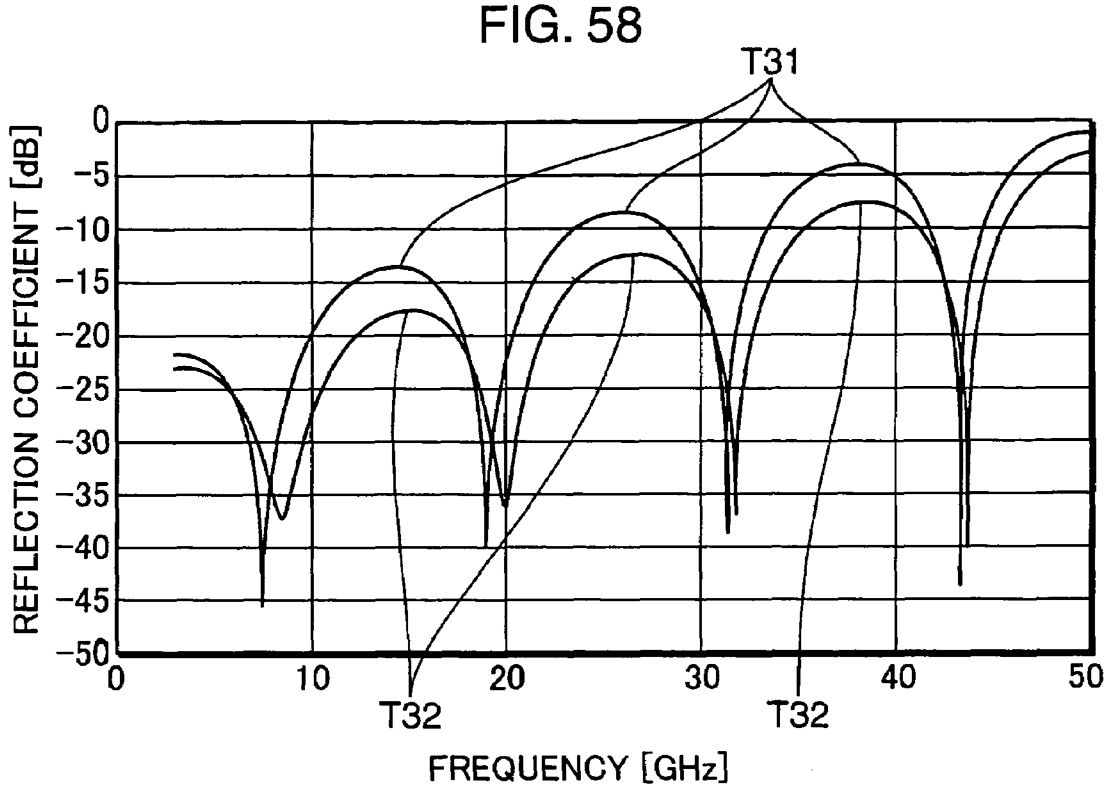

For this sample T32 and the sample T31, a high-frequency characteristic between the edges of the signal wiring conductors 111, 121 was measured by an electromagnetic field simulation to obtain characteristic curves having frequency characteristics as shown in a graph of FIG. 58. From this result, the samples T32 which is the high-frequency signal transmitting device can be understood to possess a better electrical characteristic than the sample T31 by having less reflection even in a high-frequency band. This is also clear from the fact that if the values of the samples T32, T31 are substituted into the above conditional expression to obtain the values of $f_{max}$, $f_{max}$ is 34.3 GHz for the sample T32 and 21.5 GHz for the sample T31, showing that the sample T32 has a higher applicable frequency.

EXAMPLE 3

A specific example of the high-frequency signal transmitting device SA5 according to the third example of the thirty-second embodiment having the construction shown in FIGS. 54A and 54B was formed as follows. First, a layered substrate was formed by placing six dielectric layers having a relative dielectric constant of 8 and a thickness of 0.6 mm one over another and placing two dielectric layers having a relative dielectric constant of 8 and a thickness of 0.2 mm as uppermost and bottommost layers. The signal wiring conductors 111, 121 were formed to have a width of 0.176 mm while being spaced apart from the outer-surface grounding conductors 112, 122 by 0.1 mm, and the signal-wiring connecting conductors 113, 123 were formed to have a width of 0.15 mm. The via conductors for outer-surface signal 114, 124 were formed to have a circular cross section having a diameter of 0.240 mm and arranged at such positions as to set distances between the signal wiring conductors 111, 121 and the via conductors for outer-surface signal 114, 124 to 0.311 mm.

Further, the via conductors for inner-layer signal 134 had a circular cross section having a diameter of 0.102 mm, the via conductor connecting conductors for signal 133 had a circular shape having a diameter of 0.162 mm, and the outer-surface grounding-conductor non-forming areas 116, 126 and the inner-layer grounding-conductor non-forming areas 136 had a square shape having sides of 1 mm. The via conductors for outer-layer grounding 115, 125 and the via conductors for inner-layer grounding 135 had a circular cross section having a diameter of 0.1 mm and were arranged at eight positions where the centers of the via conductors 115, 125, 135 were spaced apart from the outer periphery of the grounding-conductor non-forming areas 116, 126, 136 only by 0.8 mm. The via conductors for outer-layer signal 114, 124 and the via conductors for inner-layer signal 134 in the eight layers were so connected one over another as to overlap. The high-frequency signal transmitting device thus constructed was called a sample T33.

Figure 59:
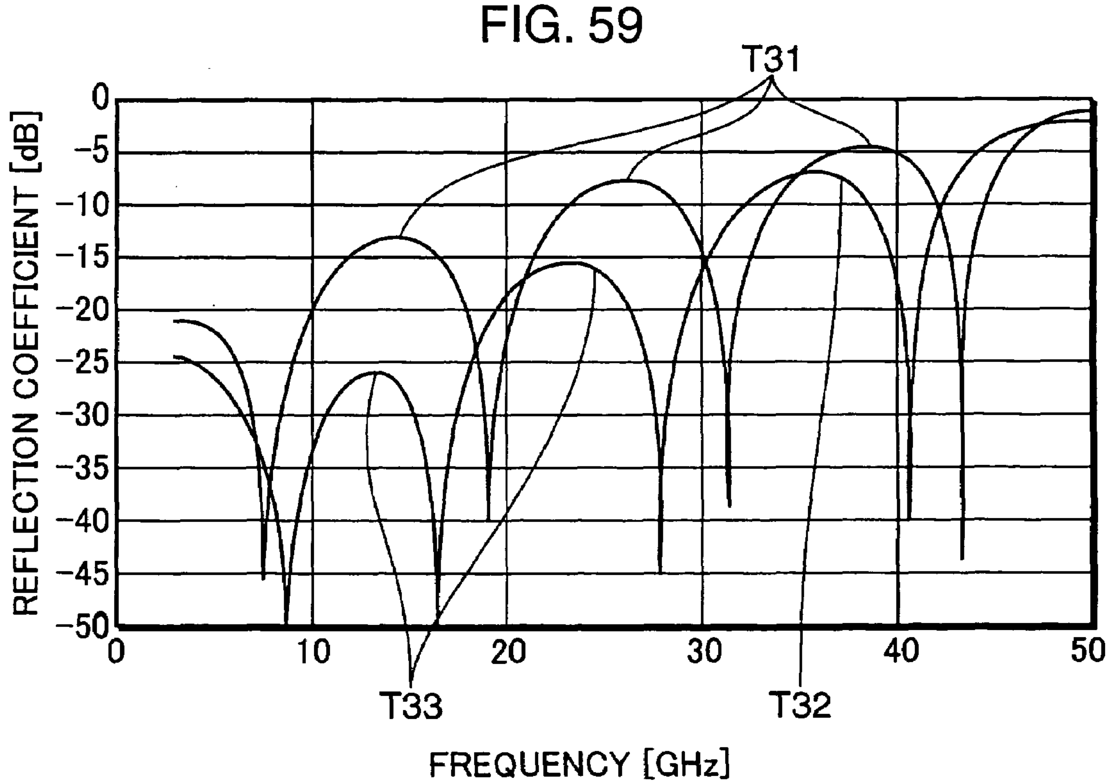

For this samples T33 and the sample T31, a high-frequency characteristic between the edges of the signal wiring conductors 111, 121 was measured by an electromagnetic field simulation to obtain characteristic curves having frequency characteristics as shown in a graph of FIG. 59. From this result, the samples T33 which is the high-frequency signal transmitting device according to the present invention can be understood to possess a better electrical characteristic than the sample T31 by having less reflection even in a high-frequency band. This is also clear from the fact that if the values of the samples T33, T31 are substituted into the above conditional expression to obtain the values of $f_{max}$, $f_{max}$ is 29.4 GHz for the sample T33 and 21.5 GHz for the sample T31, showing that the sample T33 has a higher applicable frequency.

The above examples are merely examples, which the invention is not limited thereto. Various changes and improvements may be made without departing from the scope and spirit of the invention.

Next, thirty-third to thirty-fifth embodiments of the invention relating to a high-frequency circuit part mounting substrate, a semiconductor package used in a high-frequency band such as microwave band and an extremely high frequency band and a mounting construction thereof are described below.

A high-frequency circuit part mounting substrate according to a thirty-third embodiment of the invention is provided with a dielectric substrate formed on the upper surface thereof with a mounting portion where a high-frequency circuit part is to be mounted, a first line conductor formed on the upper surface of the dielectric substrate at an outer side of the mounting portion for transmitting a high-frequency signal, a second line conductor formed on the lower surface of the dielectric substrate, extending toward an outer peripheral end of the dielectric substrate in parallel with the first line conductor and adapted to transmit the high-frequency signal, and via conductors formed in the dielectric substrate for electrically connecting the inner ends of the first and second line conductors; a metal terminal thinner than a metal bottom plate provided on the lower surface of the dielectric substrate is connected with the second line conductor; and one end of the metal terminal is located below the via conductors or at a more outer side of the dielectric substrate than this position below the via conductors while the other end thereof is caused to extend to the outside of the dielectric substrate.

A high-frequency semiconductor package according to the thirty-third embodiment is such that a high-frequency circuit part is mounted on the above first high-frequency circuit part mounting substrate. Specifically, a frame and a lid are, for example, provided on the upper surface of the high-frequency circuit part mounting substrate to accommodate the high-frequency semiconductor part.

A mounting construction for the first high-frequency circuit part mounting substrate or first high-frequency semiconductor package is such that an externally drawn line conductor formed on an external circuit board and the metal terminal are so electrically connected via a connecting conductor that the end of the metal terminal projects more toward the via conductors than the end of the externally drawn line conductor.

Figure 60:
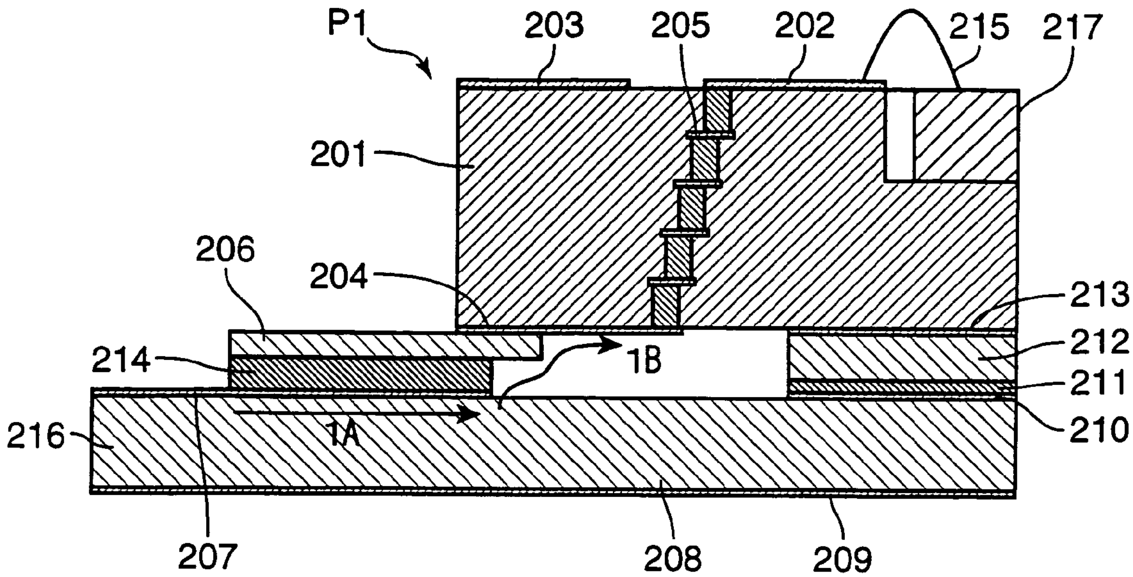

Specifically, FIG. 60 shows an essential portion of a high-frequency semiconductor package P1 constructed by mounting a high-frequency circuit part on a high-frequency circuit part mounting substrate. The high-frequency semiconductor package P1 is provided with a dielectric substrate 201 having a high-frequency semiconductor device 217 mounted in an accommodating portion, a first line conductor 202 formed on the upper surface of the dielectric substrate 201 at a side of the accommodating portion for the high-frequency semiconductor device 217, a first coplanar grounding conductor 203 formed on the upper surface of the dielectric substrate 201 to surround the first line conductor 202, a second line conductor 204 formed on the lower surface of the dielectric substrate 201 to extend toward an outer peripheral end, a second coplanar grounding conductor 213 formed on the lower surface of the dielectric substrate 201 to surround the second line conductor 204, via conductors 205 for electrically connecting the opposing ends of the first and second line conductors 202, 204, and an unillustrated grounding-conductor via conductor for electrically connecting the first and second coplanar grounding conductors 203, 213.

A metal terminal 206 is provided on the lower surface of the dielectric substrate 201. This metal terminal 206 is thinner than a metal bottom plate 212 mounted on the lower surface of the dielectric substrate 201, and is so mounted as to face the second line conductor 204 in parallel with one end (inner end) thereof located right below the via conductors 205 or at a more outer side than a position right below the via conductors 205 and with the other end (outer end) thereof caused to project out from the dielectric substrate 201.

Unillustrated frame and lid are provided on the upper surface of the dielectric substrate 201 to cover the high-frequency semiconductor device 217 mounted into the accommodating portion, thereby constructing the high-frequency semiconductor package P1. Further, the high-frequency semiconductor device 217 and the first line conductor 202 are connected by an electrically conductive connecting member 215 such as a bonding wire. A circuit board 216 is formed by providing an externally drawn line conductor 207 on the upper surface of a dielectric base 208.

The externally drawn line conductor 207 and the metal terminal 206 are electrically connected via a connecting conductor 214 such as a solder such that the inner end of the metal terminal 206 projects more toward the via conductors 205 than an end of the externally drawn line conductor 207 toward the via conductors 205, whereby the high-frequency semiconductor package P1 is mounted on the circuit board 216. In this embodiment, a lower-surface grounding conductor 209 and an upper-surface grounding conductor 210 are formed on the lower and upper surfaces of the dielectric base 208, respectively, and the metal bottom plate 212 and the upper-surface grounding conductor 210 are electrically connected via a second connecting conductor 211.

On the other hand, conventionally, a metal terminal having the same thickness as a metal bottom plate mounted on a high-frequency semiconductor package has been electrically connected with an externally drawn line conductor via a connecting conductor such as a solder with an end of the externally drawn line conductor toward via conductors and an end of the metal terminal toward the via conductors aligned. Thus, there has been a problem: a high-frequency signal leaks into a dielectric base upon transmitting a high-frequency signal from the externally drawn line conductor to a second line conductor via the metal terminal while changing its propagating direction by 90°, resulting in a deteriorated transmission characteristic of the high-frequency signal.

Contrary to this, the metal terminal thinner than the metal bottom plate mounted on the high-frequency semiconductor package is electrically connected with the externally drawn line conductor via the connecting conductor such that the end of the metal terminal projects more toward the via conductors than the corresponding end of the externally drawn line conductor, whereby a high-frequency signal is smoothly transmitted from the externally drawn line conductor to the second line conductor via the metal terminal since a propagating direction thereof to the second line conductor is changed by an angle smaller than 90° instead of being changed by 90°. As a result, a leak of the high-frequency signal into the dielectric substrate is reduced, realizing a mounting construction for the high-frequency circuit part mounting substrate which construction has an improved transmission characteristic.

Further, a high-frequency circuit part mounting substrate according to a thirty-fourth embodiment of the invention is provided with a dielectric substrate formed on the upper surface thereof with a mounting portion where the high-frequency circuit part is to be mounted, a first line conductor formed on the upper surface of the dielectric substrate and extending from the proximity of the mounting portion to an outer side of the dielectric substrate for transmitting a high-frequency signal; a second line conductor formed on the lower surface of the dielectric substrate, extending toward an outer peripheral end of the dielectric substrate in parallel with the first line conductor and adapted to transmit the high-frequency signal, and via conductors formed in the dielectric substrate for electrically connecting the inner ends of the first and second line conductors; and a metal terminal having a thickness substantially equal to that of a bottom plate provided on the lower surface of the dielectric substrate is mounted to face the second line conductor in parallel with one end of thereof located below the via conductors or at a more outer side of the dielectric substrate than this position below the via conductors and with the other end thereof caused to extend to the outside of the dielectric substrate.

A high-frequency semiconductor package according to the thirty-fourth embodiment is such that a frame and a lid are provided on the upper surface of the second high-frequency circuit part mounting substrate to accommodate a high-frequency semiconductor part.

A mounting construction for the second high-frequency circuit part mounting substrate or second high-frequency semiconductor package is such that an externally drawn line conductor of a circuit board having this externally drawn line conductor formed on the upper surface of a dielectric base and the metal terminal of the high-frequency circuit part mounting substrate or the high-frequency semiconductor package are so electrically connected that the end of the metal terminal projects more toward the via conductors than the end of the externally drawn line conductor.

Specifically, FIG. 61 shows an essential portion of a high-frequency semiconductor package P2 constructed by mounting a high-frequency circuit part on a high-frequency circuit part mounting substrate. The high-frequency semiconductor package P2 is provided with a dielectric substrate 218 having a high-frequency semiconductor device 234 mounted in an accommodating portion, a first line conductor 222 formed on the upper surface of the dielectric substrate 218 at a side of the accommodating portion for the high-frequency semiconductor device 234, a first coplanar grounding conductor 219 formed on the upper surface of the dielectric substrate 218 to surround the first line conductor 222, a second line conductor 220 formed on the lower surface of the dielectric substrate 218 to extend toward an outer peripheral end, a second coplanar grounding conductor 230 formed on the lower surface of the dielectric substrate 218 to surround the second line conductor 220, via conductors 221 for electrically connecting the opposing ends of the first and second line conductors 222, 220, and an unillustrated grounding-conductor via conductor for electrically connecting the first and second coplanar grounding conductors 219, 230.

A metal terminal 223 is provided on the lower surface of the dielectric substrate 218. This metal terminal 223 has a thickness substantially equal to that of a metal bottom plate 229 mounted on the lower surface of the dielectric substrate 218, and is so mounted as to face the second line conductor 220 in parallel with one end (inner end) thereof located right below the via conductors 221 or at a more outer side than a position right below the via conductors 221 and with the other end (outer end) thereof caused to project out from the dielectric substrate 218.

Unillustrated frame and lid are provided on the upper surface of the dielectric substrate 218 to cover the high-frequency semiconductor device 234 mounted into the accommodating portion, thereby constructing the high-frequency semiconductor package P2. Further, the high-frequency semiconductor device 234 and the first line conductor 222 are connected by an electrically conductive connecting member 233 such as a bonding wire. A circuit board 232 is formed by providing an externally drawn line conductor 224 on the upper surface of a dielectric base 225.

The externally drawn line conductor 224 and the metal terminal 223 are electrically connected via a connecting conductor 231 such as a solder such that the inner end of the metal terminal 223 projects more toward the via conductors 221 than an end of the externally drawn line conductor 224 toward the via conductors 221, whereby the high-frequency semiconductor package P2 is mounted on the circuit board 232. In this embodiment, a lower-surface grounding conductor 226 and an upper-surface grounding conductor 227 are formed on the lower and upper surfaces of the dielectric base 225, respectively, and the metal bottom plate 229 and the upper-surface grounding conductor 227 are electrically connected via a second connecting conductor 228.

On the other hand, conventionally, a metal terminal having the same thickness as a metal bottom plate mounted on a high-frequency semiconductor package has been electrically connected with an externally drawn line conductor via a connecting conductor such as a solder with an end of the externally drawn line conductor toward via conductors and an end of the metal terminal toward the via conductors aligned. Thus, there has been a problem: a high-frequency signal leaks into a dielectric base upon transmitting the high-frequency signal from the externally drawn line conductor to the second line conductor via the metal terminal while changing its propagating direction by 90°, resulting in a deteriorated transmission characteristic of the high-frequency signal.

Contrary to this, the metal terminal having a thickness substantially equal to that of the metal bottom plate mounted on the high-frequency semiconductor package is electrically connected with the externally drawn line conductor via the connecting conductor such that the end of the metal terminal projects more toward the via conductors than the corresponding end of the externally drawn line conductor, whereby a high-frequency signal can be smoothly transmitted from the externally drawn line conductor to the second line conductor via the metal terminal since a propagating direction thereof to the second line conductor is changed by an angle smaller than 90° instead of being changed by 90°. As a result, a leak of the high-frequency signal into the dielectric substrate is reduced, realizing a mounting construction for the high-frequency circuit part mounting substrate which construction has an improved transmission characteristic.

Further, a high-frequency circuit part mounting substrate according to a thirty-fifth embodiment of the invention is provided with a dielectric substrate formed on the upper surface thereof with a mounting portion where the high-frequency circuit part is to be mounted, a first line conductor formed on the upper surface of the dielectric substrate and extending from the proximity of the mounting portion to an outer side for transmitting a high-frequency signal, a second line conductor formed on the lower surface of the dielectric substrate, extending toward an outer peripheral end of the dielectric substrate in parallel with the first line conductor and adapted to transmit the high-frequency signal, and via conductors formed in the dielectric substrate for electrically connecting the inner ends of the first and second line conductors; a metal terminal formed at one end thereof with a stepped or slanted portion thinner than a metal bottom plate provided on the lower surface of the dielectric substrate is connected with the second line conductor; and one end of the metal terminal is located below the via conductors or at a more outer side of the dielectric substrate than this position below the via conductors while the other end thereof is caused to extend to the outside of the dielectric substrate.

A high-frequency semiconductor package according to the thirty-fifth embodiment is such that a frame and a lid are provided on the upper surface of the third high-frequency circuit part mounting substrate to accommodate a high-frequency semiconductor part.

A mounting construction for the third high-frequency circuit part mounting substrate or third high-frequency semiconductor package is such that an externally drawn line conductor of a circuit board having this externally drawn line conductor formed on the upper surface of a dielectric base and the metal terminal of the high-frequency circuit part mounting substrate or the high-frequency semiconductor package are so electrically connected that the end of the metal terminal projects more toward the via conductors than the end of the externally drawn line conductor.

Specifically, FIG. 62 shows an essential portion of a high-frequency semiconductor package P3 constructed by mounting a high-frequency circuit part on a high-frequency circuit part mounting substrate. The high-frequency semiconductor package P3 is provided with a dielectric substrate 235 having a high-frequency semiconductor device 251 mounted in an accommodating portion, a first line conductor 239 formed on the upper surface of the dielectric substrate 235 at a side of the accommodating portion for the high-frequency semiconductor device 251, a first coplanar grounding conductor 236 formed on the upper surface of the dielectric substrate 235 to surround the first line conductor 239, a second line conductor 237 formed on the lower surface of the dielectric substrate 235 to extend toward an outer peripheral end, a second coplanar grounding conductor 248 formed on the lower surface of the dielectric substrate 235 to surround the second line conductor 237, via conductors 238 for electrically connecting the opposing ends of the first and second line conductors 239, 237, and an unillustrated grounding-conductor via conductor for electrically connecting the first and second coplanar grounding conductors 236, 248.

A metal terminal 241 is provided on the lower surface of the dielectric substrate 235. This metal terminal 241 has a thickness substantially equal to that of a metal bottom plate 247 mounted on the lower surface of the dielectric substrate 235, and is formed with such a stepped portion at an end thereof toward the via conductors 238 that a substantially upper half at the side of the dielectric substrate 235 projects toward the via conductors 238. The metal terminal 241 is mounted to face the second line conductor 237 in parallel with one end (inner end) thereof located right below the via conductors 238 or at a more outer side than a position right below the via conductors 238 and with the other end (outer end) thereof caused to project out from the dielectric substrate 235.

Unillustrated frame and lid are provided on the upper surface of the dielectric substrate 235 to cover the high-frequency semiconductor device 251 mounted into the accommodating portion, thereby constructing the high-frequency semiconductor package P3. Further, the high-frequency semiconductor device 251 and the first line conductor 239 are connected by an electrically conductive connecting member 240 such as a bonding wire. A circuit board 250 is formed by providing an externally drawn line conductor 242 on the upper surface of a dielectric base 243.

The externally drawn line conductor 242 and the metal terminal 241 are electrically connected via a connecting conductor 249 such as a solder such that the inner end of the metal terminal 241 projects more toward the via conductors 238 than an end of the externally drawn line conductor 242 toward the via conductors 238, whereby the high-frequency semiconductor package P3 is mounted on the circuit board 250. In this embodiment, a lower-surface grounding conductor 244 and an upper-surface grounding conductor 245 are formed on the lower and upper surfaces of the dielectric base 243, respectively, and the metal bottom plate 247 and the upper-surface grounding conductor 245 are electrically connected via a second connecting conductor 246.

On the other hand, conventionally, a metal terminal having the same thickness as a metal bottom plate mounted on a high-frequency semiconductor package has been electrically connected with an externally drawn line conductor via a connecting conductor such as a solder with an end of the externally drawn line conductor toward via conductors and an end of the metal terminal toward the via conductors aligned. Thus, there has been a problem: a high-frequency signal leaks into a dielectric base upon transmitting the high-frequency signal from the externally drawn line conductor to the second line conductor via the metal terminal while changing its propagating direction by 90°, resulting in a deteriorated transmission characteristic of the high-frequency signal.

Contrary to this, the metal terminal having a thickness substantially equal to that of the metal bottom plate mounted on the high-frequency semiconductor package is electrically connected with the externally drawn line conductor via the connecting conductor such that the end of the metal terminal projects more toward the via conductors than the corresponding end of the externally drawn line conductor, whereby a high-frequency signal can be smoothly transmitted from the externally drawn line conductor to the second line conductor via the metal terminal since a propagating direction thereof to the second line conductor is changed by an angle smaller than 90° instead of being changed by 90°. As a result, a leak of the high-frequency signal into the dielectric substrate is reduced, realizing a mounting construction for the high-frequency circuit part mounting substrate which construction has an improved transmission characteristic.

Next, specific examples of the high-frequency circuit part mounting substrate, the high-frequency semiconductor package and the mounting construction thereof according to the thirty-third to thirty-fifth embodiments are described.

EXAMPLE 1

First, the high-frequency semiconductor package P1 having the construction shown in FIG. 60 was constructed as follows. Nine dielectric layers having a relative dielectric constant of 8.5 and a thickness of 0.2 mm were placed one over another to form the dielectric substrate 201. The first line conductor 202 was formed to have a width of 0.14 mm while being spaced apart from the first coplanar grounding conductor 203 by 0.1 mm, the via conductors 205 had a circular cross section having a diameter of 0.1 mm, and via conductor connecting conductors had a rectangular shape having a width of 0.16 mm. The via conductor connecting conductors were provided between the respective layers to connecting the via conductors 205 of the respective layers.

Further, the via conductor 205 in the bottommost layer was provided at a distance of 0.95 mm from the outer peripheral edge of the dielectric substrate 201, the second line conductor 204 was formed to have a width of 0.25 mm and a length of 1.03 mm from the outer peripheral edge of the dielectric substrate 201 toward the via conductor 205, and the metal bottom plate 212 having a thickness of 0.3 mm was mounted on the lower surface of the dielectric substrate 201. The metal terminal 206 having a width of 0.15 mm and a thickness of 0.15 mm was so mounted as to be connected with the dielectric substrate 201 over a length of 0.5 mm and extend from the end of the dielectric substrate 201 over a length of 1.0 mm. In this way, the high-frequency semiconductor package P1 was obtained.

This high-frequency semiconductor package P1 was electrically connected with the dielectric base 208 via the connecting conductor 214 such as a solder such that an end of the metal terminal 206 projects more toward the via conductors 205 by 0.3 mm than the corresponding end of the externally drawn line conductor 207 having a width of 0.27 mm and formed on the upper surface of the dielectric base 208 having a thickness of 0.2 mm. In this way, a sample T35 as a mounting construction of the high-frequency semiconductor package P1 was obtained.

Further, the high-frequency semiconductor package P2 having the construction shown in FIG. 61 was constructed by setting the thickness of the metal terminal 223 equal to that of the metal bottom plate 229, i.e., to 0.3 mm and setting the other construction as in the high-frequency semiconductor package P1. In this way, a sample T36 as a mounting construction of the high-frequency semiconductor package P2 was obtained.

Further, the high-frequency semiconductor package P3 having the construction shown in FIG. 62 was constructed by setting the thickness of the metal terminal 241 equal to that of the metal bottom plate 247, i.e., to 0.3 mm, forming an end portion of the metal terminal 241 toward the via conductors 238 into a stepped shape at a height of 0.15 mm from the lower surface of the metal terminal 241 over a length of 0.3 mm from the end toward the via conductors 238, and setting the other construction as in the high-frequency semiconductor package P1. In this way, a sample T37 as a mounting construction of the high-frequency semiconductor package P3 was obtained.

Figure 63:
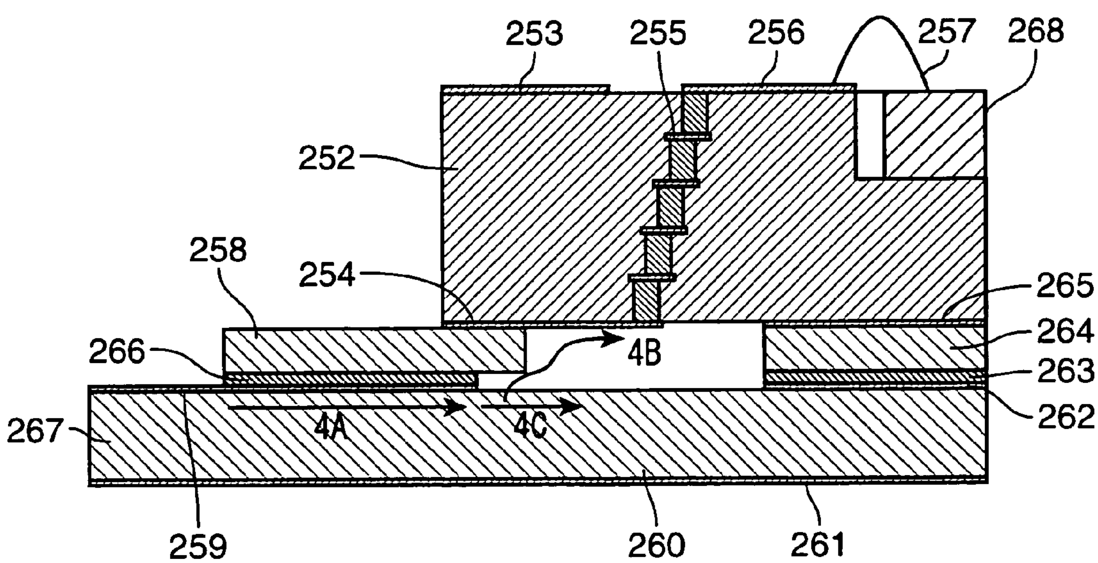

As a comparative example, a sample having a construction shown in FIG. 63 was obtained. Specifically, nine dielectric layers having a relative dielectric constant of 8.5 and a thickness of 0.2 mm were placed one over another to form a dielectric substrate 252. A first line conductor 256 was formed to have a width of 0.14 mm while being spaced apart from a first coplanar grounding conductor 253 by 0.1 mm, and via conductors 255 had a circular cross section having a diameter of 0.1 mm. Via conductor connecting conductors had a rectangular shape having a width of 0.16 mm, and the via conductors 255 of the respective layers were connected via the via conductor connecting conductors.

Further, the via conductor 255 in the bottommost layer was provided at a distance of 0.95 mm from the outer peripheral edge of the dielectric substrate 252, a second line conductor 254 was formed to have a width of 0.25 mm and a length of 1.03 mm from the outer peripheral edge of the dielectric substrate 251 toward the via conductor 255, and a metal bottom plate 264 having a thickness of 0.3 mm was mounted on the lower surface of the dielectric substrate 252. A metal terminal 258 having a width of 0.15 mm and a thickness of 0.3 mm was so mounted as to be connected with the dielectric substrate 252 over a length of 0.5 mm and extend out from the end of the dielectric substrate 252 over a length of 1.0 mm. In this way, the high-frequency semiconductor package was obtained.

This high-frequency semiconductor package was electrically connected with a circuit board 267 via a connecting conductor 266 such as a solder with an end of the metal terminal 256 toward the via conductors 255 and the corresponding end of an externally drawn line conductor 259 having a width of 0.27 mm and formed on the upper surface of a dielectric base 260 having a thickness of 0.2 mm aligned. In this way, a sample T37 as a mounting construction of the high-frequency semiconductor package was obtained.

Figure 64:
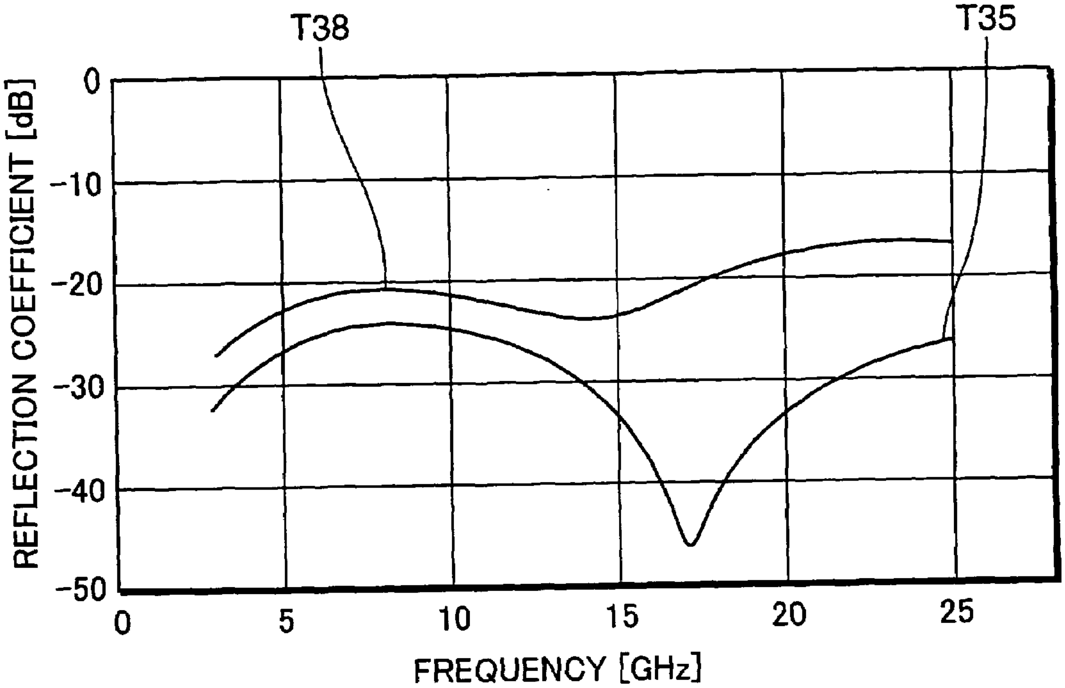

For the samples T35 to T37 of the embodiment and the sample T38, a transmission characteristic of a high-frequency signal between the externally drawn line conductor and the first line conductor was measured by an electromagnetic field simulation to obtain characteristic curves having frequency characteristics as shown in graphs of FIGS. 64 to 66. These characteristic curves are similar to those shown thus far.

From these results, the samples T35 to T37 which are the inventive high-frequency circuit part mounting substrate, high-frequency semiconductor package and the mounting construction thereof were confirmed to have an action of smoothly changing the direction of the high-frequency signal having been propagating in the externally drawn line conductor when the high-frequency signal propagates from the externally drawn line conductor to the second line conductor via the metal terminal as compared to the sample T38, thereby realizing a high-frequency circuit part mounting substrate, a high-frequency semiconductor package and a mounting construction thereof which have all an improved transmission characteristic.

These examples are merely shown as an example, which the present invention is not limited thereto. Various changes and improvements may be made without departing from the scope and spirit of the invention.

Next, thirty-sixth to thirty-eighth embodiments of the invention relating to a high-frequency signal transmitting device and a high-frequency semiconductor package using such a transmitting device are described below.

FIGS. 67A and 67B and FIGS. 68A, 68B, 68C and 68D show a high-frequency signal transmitting device and a semiconductor package using such a transmitting device according to a thirty-sixth embodiment of the invention. The high-frequency signal transmitting device according to this embodiment is such that signal wiring conductors are so formed on the upper and lower surfaces of a layered substrate obtained by placing a plurality of dielectric layers one over another as to extend in opposite directions from opposite ends, and each layer of the dielectric substrate is formed with a grounding-conductor non-forming area and a grounding conductor. In the grounding-conductor non-forming areas, signal via conductors vertically penetrating the respective layers of the dielectric substrate and via conductor connecting conductors for signal for connecting the signal via conductors with each other are formed. The signal wiring conductors are connected by these signal via conductors and via conductor connecting conductors for signal.

Further, grounding-conductor via conductors vertically penetrating the corresponding layer of the layered substrate are formed on the outer periphery of each grounding-conductor non-forming area to connect the grounding conductors, whereby the uppermost and the bottommost layers of the layered substrate are connected. A signal wiring extending portion extending from the signal wiring conductor of the bottommost layer of the layered substrate toward an end of the layered substrate is provided and a metal lead drawn out from the end of the layered substrate is mounted on the signal wiring extending portion from above.

A metal base formed with a hollow portion so as to surround the metal lead and the grounding-conductor non-forming area of the bottommost layer of the layered substrate is mounted on the grounding conductor of the bottommost layer of the layered substrate, and at least one of the inner layers of the layered substrate above the metal lead is provided with an above-the-lead layer grounding-conductor non-forming area, and at least one pair of vertical wall grounding conductors for connecting the grounding conductors from the bottommost to the upper layers of the layered substrate are provided at the opposite sides of the metal lead.

Specifically, in FIGS. 67A and 67B and FIGS. 68A, 68B, 68C and 68D, a layered substrate is formed by placing a plurality of dielectric layers 301 one over another, and signal wiring conductors 302 are connected with signal via conductors 321. The inner layers are formed with the signal via conductors 321 and via conductor connecting conductors for signal 322 for connecting the signal via conductors 321. Circular grounding-conductor non-forming areas 332 are formed inside grounding conductors 303 such that these formed in the middle layer and/or the layers near it are smaller than those formed in the other layers, and via conductors for inner-layer grounding 331 are formed near the outer peripheries of the grounding-conductor non-forming areas 332.

The grounding-conductor non-forming areas 332 are arranged one over another along vertical direction. The signal via conductors 321 and the via conductor connecting conductors for signal 322 are successively shifted to smoothly connect the signal wiring conductors 302 on the upper and lower surfaces of the layered substrate. The signal wiring conductor 302 on the bottommost layer is connected with a signal wiring extending portion 323 extending to an end of the layered substrate, and a metal lead 324 drawn out from the layered substrate is mounted on the signal wiring extending portion 323.

Further, a metal base 333 formed with a hollow portion so as to surround the metal lead 324 and the grounding-conductor non-forming area 332 of the bottommost layer of the layered substrate is mounted on the grounding conductor 303 of the bottommost layer of the layered substrate, at least one of the inner layers of the layered substrate above the metal lead 324 is provided with an above-the-lead layer grounding-conductor non-forming area 335, and a pair of vertical wall grounding conductors 336 for connecting the grounding conductors 303 from the bottommost layer to the upper layers at one end of the layered substrate are provided at the opposite sides of the metal lead 324.

In the prior art, an electromagnetically shielded space formed near an end of a layered substrate acts as a dielectric resonator, with the result that a high-frequency characteristic is deteriorated by the resonance. In addition, discontinuity of impedance near the metal lead considerably occurs in a high-frequency band, leading to an increased reflection to further deteriorate the high-frequency characteristic. As compared to the prior art, the electromagnetically shielded space can be made smaller and the resonance frequency can be shifted to a higher frequency side to broaden a usable frequency band by providing at least one pair of vertical wall grounding conductors 336 at the opposite sides of the metal lead 324 in this construction. Further, by arranging the grounding conductors 303 near the metal lead 324, impedance matching in a high-frequency band can be carried out. As a result, a high-frequency signal transmitting device having a good high-frequency characteristic can be obtained.

A high-frequency signal transmitting device according to a first modification of the thirty-sixth embodiment is such that spacing between the vertical wall grounding conductors 336 is set smaller than a value obtained by dividing half the free space wavelength of a highest frequency of a high-frequency signal used by a square root of a relative dielectric constant of dielectric layers forming a layered substrate in the high-frequency signal transmitting device of the thirty-sixth embodiment.

In the prior art, an electromagnetically shielded space formed near an end of a layered substrate acts as a dielectric resonator, with the result that a high-frequency characteristic is deteriorated by the resonance. In addition, discontinuity of impedance near the metal lead considerably occurs in a high-frequency band, leading to an increased reflection to further deteriorate the high-frequency characteristic. As compared to the prior art, the electromagnetically shielded space can be made smaller and the resonance frequency can be securely shifted to a higher frequency side to broaden a usable frequency band by providing at least one pair of vertical wall grounding conductors 336 at the opposite sides of the metal lead 324 in this construction. Further, by arranging the grounding conductors 303 near the metal lead 324, impedance matching in a high-frequency band can be carried out. As a result, a high-frequency signal transmitting device having a good high-frequency characteristic can be obtained.

A high-frequency signal transmitting device according to a second modification of the thirty-sixth embodiment is such that grounding conductor projecting portions 337 are provided to extend from the vertical wall grounding conductors 336 toward each other in the previous high-frequency signal transmitting devices of this embodiment.

In the prior art, an electromagnetically shielded space formed near an end of a layered substrate acts as a dielectric resonator, with the result that a high-frequency characteristic is deteriorated by the resonance. In addition, discontinuity of impedance near the metal lead considerably occurs in a high-frequency band, leading to an increased reflection to further deteriorate the high-frequency characteristic. As compared to the prior art, the electromagnetically shielded space can be made smaller and the resonance frequency can be securely shifted to a higher frequency side to broaden a usable frequency band by providing at least one pair of vertical wall grounding conductors 336 at the opposite sides of the metal lead 324 in this construction. Further, by arranging the grounding conductors 303 near the metal lead 324 and providing the grounding conductor projecting portions 337 extending from the vertical wall grounding conductors 336, impedance matching in a high-frequency band can be more securely carried out. As a result, a high-frequency signal transmitting device having a good high-frequency characteristic can be obtained.

A high-frequency signal transmitting device according to a third modification of this embodiment is described with reference to FIGS. 70A and 70B and FIGS. 71A, 71B, 71C and 71D. This high-frequency signal transmitting device of the third modification is formed as follows. A plurality of dielectric layers 301 are placed one over another to form a layered substrate, signal wiring conductors 302 are connected with signal via conductors 321. The inner layers are formed with the signal via conductors 321 and signal via conductor connecting conductors 322 for connecting the signal via conductors 321. Circular grounding-conductor non-forming areas 332*c* are formed inside grounding conductors 303 formed on the inner layers such that those formed in the middle layer and/or the layers near it are smaller than those formed in the other layers, and via conductors for inner-layer grounding 331 are formed near the outer peripheries of the grounding-conductor non-forming areas 332*c*.

A grounding-conductor non-forming area 332*a* of the bottommost layer is formed in an area around the signal via conductor 321 of the bottommost layer excluding a signal wiring extending portion 323 located within two parallel lines normal to the longitudinal direction of the signal wiring extending portion 323 and in an area around the signal wiring extending portion 323. A grounding-conductor non-forming area 332*b* of the uppermost layer is formed in an area around the signal via conductor 321 of the uppermost layer excluding the signal wiring conductor 302 located within two parallel lines normal to the longitudinal direction of the signal wiring conductor 302.

The grounding-conductor non-forming areas 332*c* are arranged one over another along vertical direction, and the signal via conductors 321 and the signal via conductor connecting conductors 322 are successively shifted to smoothly connect the signal wiring conductors 302 on the upper and lower surface of the layered substrate. The signal wiring conductor 302 of the bottommost layer is connected with the signal wiring extending portion 323 extending to an end of the layered substrate, and a metal lead 324 drawn out from the layered substrate is mounted on the signal wiring extending portion 323.

Further, a metal base 333 is mounted on the inner side of a grounding conductor 323*a* of the bottommost layer of the layered substrate, at least one of the inner layers of the layered substrate above the metal lead 324 is provided with an above-the-lead layer grounding-conductor non-forming area 335, and a pair of vertical wall grounding conductors 336 for connecting the grounding conductors 303 from the bottommost layer to the upper layers at one end of the layered substrate are provided at the opposite sides of the metal lead 324.

In the prior art, an electromagnetically shielded space formed near an end of a layered substrate acts as a dielectric resonator, with the result that a high-frequency characteristic is deteriorated by the resonance. In addition, discontinuity of impedance near the metal lead considerably occurs in a high-frequency band, leading to an increased reflection to further deteriorate the high-frequency characteristic. As compared to the prior art, the electromagnetically shielded space can be made smaller and the resonance frequency can be shifted to a higher frequency side to broaden a usable frequency band by providing at least one pair of vertical wall grounding conductors 336 at the opposite sides of the metal lead 324 in the above construction as well. Further, by arranging the grounding conductors 303 near the metal lead 324, impedance matching in a high-frequency band can be carried out. As a result, a high-frequency signal transmitting device having a good high-frequency characteristic can be obtained.

Similar to the high-frequency signal transmitting device of this embodiment, the constructions of the first and second modifications may be applied to the high-frequency signal transmitting device of the third modification, thereby obtaining fourth and fifth modifications. Such fourth and fifth modifications have the same effects as the high-frequency signal transmitting devices of the first and second modifications.

A high-frequency semiconductor package according to a sixth modification of the invention is constructed to accommodate a high-frequency semiconductor device by providing a frame and a lid on the upper surface of the layered substrate forming the high-frequency signal transmitting device of this embodiment and the first to fifth modifications.

Specifically, in FIG. 68C, a frame 311 made of a dielectric material is provided on the upper surface of the layered substrate made of a plurality of dielectric layers 301, and a seal ring 334 is provided on the upper surface of the frame 311. In this way, the frame and the lid can be provided on the upper surface of the layered substrate forming the high-frequency signal transmitting device of this embodiment, first or second modifications, thereby realizing a high-frequency semiconductor package having such a construction as to accommodate a high-frequency semiconductor device and having a good high-frequency transmission characteristic.

In such a high-frequency semiconductor package, ceramic materials such as alumina, mullite and aluminum nitride, so-called glass-ceramic materials are widely used for the dielectric substrate. The conductive patterns such as the signal wiring conductors and the grounding conductors are formed by the thick film printing method, various thin film forming method or plating using metallic materials for high-frequency wiring conductor including elemental metals such as Cu, and alloys such as MoMn+Ni+Au, W+Ni+Au, Cr+Cu, Cr+Cu+Ni+Au, $Ta_2N$+NiCr+Au, Ti+Pd+Au and NiCr+Pd+Au.

Together with the permittivity and the thickness of the dielectric material, the thicknesses and widths of the conductive patterns are set based on the frequency of high-frequency signals to be transmitted and a characteristic impedance used. If the frame and the lid are metallic, a material made of, e.g., a Fe—Ni alloy such as a Fe—Ni—Co alloy or a Fe—Ni42 alloy; an oxygen-free copper; an aluminum; a stainless steel; a Cu—W alloy; or a Cu—Mo alloy is used. The metallic structures are joined, for example, by a high-melting point brazing metal seam welding using a solder, AuSn brazing metal, AuGe brazing metal or the like, thereby being hermetically sealed. Further, the dielectric substrate and the metallic structure are joined by a high-melting point brazing metal such as an AgCu brazing metal, AuSn brazing metal or AuGe brazing metal. In this way, a semiconductor device can be accommodated, whereby a high-frequency semiconductor package having a good transmission characteristic can be provided.

Next, specific examples of the high-frequency signal transmitting device according to the thirty-sixth embodiment.

EXAMPLE 1

The high-frequency signal transmitting device having the construction shown in FIGS. 67A and 67B and FIGS. 68A, 68B, 68C and 68D was formed as follows. Nine dielectric layers 301 having a relative dielectric constant of 8.5 and a thickness of 0.2 mm were placed one over another to form the dielectric substrate. The signal wiring conductors 302 were formed to have a width of 0.125 mm while being spaced apart from the grounding conductors 303 by 0.138 mm. The signal via conductors 321 had a circular shape having a diameter of 0.1 mm and the via conductor connecting conductors for signal had a rectangular shape having a width of 0.16 mm.

The inner-layer grounding-conductor non-forming areas 332 had a circular shape of a diameter of 0.84 mm in the fifth and sixth layers near the middle while having a circular shape of a diameter of 1.08 mm in the other layers. The grounding-conductor via conductors 331 had a circular shape having a diameter of 0.1 mm and were arranged at eight positions on a circle where the centers thereof were spaced apart from the outer periphery of the grounding-conductor non-forming areas 332 only by 0.8 mm. Displacements of the signal via conductors 321 between adjacent ones of the nine layers were 0.168 mm, 0.092 mm, 0.072 mm, 0.028 mm, 0.028 mm, 0.072 mm, 0.092 mm, 0.168 mm from top. The signal wiring extending portion 323 having a width of 0.25 mm extended from the signal wiring conductor 321 on the bottommost layer, and the metal lead 324 having a width of 0.15 mm and a thickness of 0.3 mm was so mounted on the signal wiring extending portion 323 as to be connected with the signal wiring extending portion 323 over a length of 0.5 mm and extended out from the end of the substrate over a length of 1.0 mm. The metal base 333 having a thickness of 0.3 mm and formed with the hollow portion having a width of 1.3 mm was mounted.

Further, the above-the-lead layer grounding-conductor non-forming areas 335 having a width of 1.14 mm were so defined in three layers above the metal lead 324 to extend to the end of the layered substrate, and a pair of vertical wall grounding conductors 336 having a width of 0.3 mm and a depth of 0.15 mm are provided at the end of the layered substrate to connect the layers of the layered substrate from the bottommost to the uppermost ones while being spaced apart from each other by 1.2 mm. In this way, a sample T40 as the high-frequency signal transmitting device having the construction shown in FIGS. 67A and 67B and FIGS. 68A, 68B, 68C and 68D was obtained.

Similarly, samples T41, T42, T43 having the same construction as the sample T40 except that the spacing between the vertical wall grounding conductors 336 was 1.0 mm, 0.8 mm, 0.6 mm respectively, were obtained as other examples of the high-frequency signal transmitting devices having the construction shown in FIGS. 67A and 67B and FIGS. 68A, 68B, 68C and 68D.

For these samples T40 to T43, a microstrip line (not shown) having a width of 0.27 mm and mounted on an external substrate (not shown) having a relative dielectric constant of 3.4 and a thickness of 0.20 mm was mounted on the metal lead 324, and a high-frequency characteristic between the microstrip line on the external substrate and the signal wiring conductor on the uppermost layer of the layered substrate was measured by an electromagnetic field simulation to obtain characteristic curves having frequency characteristics as shown in a graph of FIG. 72. These characteristic curves are similar to those shown thus far.

From this result, it can be understood that the electromagnetically shielded space can be made smaller and the resonance frequency was shifted to a higher frequency side to broaden a usable frequency band by providing the vertical wall grounding conductors 336 in the samples T40 to T43 which are the inventive high-frequency signal transmitting devices. Further, by arranging the grounding conductors near the metal lead 324, impedance matching in a high-frequency band can be carried out. As a result, a high-frequency signal transmitting device having a good high-frequency characteristic can be obtained.

In the case that these high-frequency signal transmitting devices are used in a frequency band up to 50 GHz, it can be understood that reflection is more securely suppressed and the high-frequency signal transmitting devices have an even better high-frequency characteristic for the samples T41 to T43 in which the spacing between the vertical wall grounding conductors 336 is smaller than 1.03 mm which is a value obtained by dividing half the free space wavelength of a highest frequency of a high-frequency signal used by a square root of the relative dielectric constant of the dielectric layers forming the layered substrate.

It should be noted that the depth of the vertical wall grounding conductors 336 may be suitably set within such a range as not to increase the discontinuity of impedance. Specifically, for a sample T44 obtained by setting the depths of the vertical wall grounding conductors 336 to 0.01 mm and setting the other construction as in the sample T43, an electric characteristic was measured by a similar electromagnetic field simulation to obtain a characteristic curve of a frequency characteristic as shown in a graph of FIG. 73. In FIG. 73, the frequency characteristic of the sample T43 is also shown for a comparison.

From this result, it was confirmed that the substantially same performance was displayed even if the depth of the vertical wall grounding conductors 336 is smaller.

EXAMPLE 2

A sample T45 as the high-frequency signal transmitting device having the construction shown in FIGS. 67A and 67B and FIGS. 68A, 68B, 68C and 68D was obtained by causing the grounding conductor projecting portions 337 on the bottommost layer to project from the vertical wall grounding conductors 336 by 0.055 mm and causing those on the layer right above the bottommost layer to project from the vertical wall grounding conductors 336 by 0.050 mm and setting the other construction as in the sample T43 of Example 1.

For this sample T45, an electric characteristic was calculated by an electromagnetic field simulation as in Example 1 to obtain a characteristic curve having a frequency characteristic as shown in a graph of FIG. 74. In FIG. 74, the frequency characteristic of the sample T43 is also shown for a comparison.

From this result, it can be understood that reflection is more suppressed in the sample T45 provided with the grounding conductor projecting portions 337 than in the sample T43 not provided with the grounding conductor projecting portions 337 and the high-frequency signal transmitting device has an even better high-frequency characteristic.

EXAMPLE 3

The high-frequency signal transmitting device having the construction shown in FIGS. 70A and 70B, FIGS. 71A, 71B, 71C and 71D was obtained as follows. The grounding-conductor non-forming area 332*a* of the bottommost layer was formed in an area around the signal via conductor 321 of the bottommost layer excluding the signal wiring extending portion 323 located within two parallel lines normal to the longitudinal direction of the signal wiring extending portion 323 and in an area around the signal wiring extending portion 323 while defining a similar spacing to the signal wiring extending portion 323 as in Example 1. The grounding-conductor non-forming area 332*b* of the uppermost layer was formed in an area around the signal via conductor 321 of the uppermost layer excluding the signal wiring conductor 302 located within two parallel lines normal to the signal wiring conductor 302. The metal base 333 having a thickness of 0.3 mm was mounted on the inner side of the grounding conductor 303*a* of the bottommost layer. A sample T46 as the this high-frequency signal transmitting device having the construction shown in FIGS. 70A and 70B and FIGS. 71A, 71B, 71C and 71D was obtained by setting the other construction as in Example 1.

For this sample T46, a high-frequency characteristic was calculated by an electromagnetic field simulation in the same manner as in Example 1 to obtain a characteristic curve having a frequency characteristic as shown in a graph of FIG. 75.

From this result, it can be understood that the electromagnetically shielded space can be made smaller and the resonance frequency was shifted to a higher frequency side to broaden a usable frequency band by providing the vertical wall grounding conductors 336 in the sample T46 which is the inventive high-frequency signal transmitting device as in Example 1. Further, by arranging the grounding conductors near the metal lead 324, impedance matching in a high-frequency band can be carried out. As a result, a high-frequency signal transmitting device having a good high-frequency characteristic can be obtained.

The above examples are merely examples of the invention, which is not limited thereto. Various changes and improvements may be made without departing from the scope and spirit of this invention. For instance, the vertical wall grounding conductors 336 have a rectangular cross section in the embodiments of the invention, but may take a semicircular or an oblong cross section or may be formed with a recess having a thin conductor formed on its surface, thereby having a U-shaped cross section. Further, the vertical wall grounding conductors may not be arranged along the vertical wall. For example, in the case that it is difficult in designing to provide them along the vertical wall, if they are arranged at least within the above-the-lead layer grounding-conductor non-forming area, the same effects can be obtained. Further, the above-the-lead layer grounding-conductor non-forming area may take another shape instead of taking a rectangular shape.

As described above, an inventive high-frequency signal transmitting device comprises signal wiring conductors provided between one end and an inner side on an upper surface of an uppermost dielectric layer and between the other end opposite from the one end and the inner side on a lower surface of a bottommost dielectric layer; grounding conductors provided on upper surfaces of respective intermediate dielectric layers and the upper surface of the bottommost dielectric layer to surround grounding-conductor non-forming areas of a specified shape defined in the respective dielectric layers; signal via conductor vertically penetrating the uppermost dielectric layer and provided within an area facing the grounding-conductor non-forming area on the upper surface of the uppermost intermediate layer; a signal via conductor vertically penetrating the bottommost dielectric layer and provided within an area facing the grounding-conductor non-forming area on the upper surface of the bottommost layer; signal via conductors vertically penetrating the respective intermediate dielectric layers and provided within the grounding-conductor non-forming areas of the respective intermediate dielectric layers; signal-wiring connecting conductors provided on the upper surface of the uppermost dielectric layer and the lower surface of the bottommost dielectric layer for connecting the signal wiring conductors and the signal via conductors of the uppermost and bottommost dielectric layers; via conductor connecting conductors provided on the upper surfaces of the respective intermediate dielectric layers and the bottommost dielectric layer for connecting the signal via conductors of the respective dielectric layers with those of the dielectric layers located right above; and grounding-conductor via conductors for connecting the respective grounding conductors at a plurality of positions around the grounding-conductor non-forming areas of the respective dielectric layers.

In this case, the grounding-conductor non-forming areas of the respective intermediate dielectric layers may be concentrically defined along vertical direction and the signal via conductors of the respective dielectric layers may be so vertically provided along the same axis as to extend through the centers of the grounding-conductor non-forming areas of the respective intermediate dielectric layers.

With this construction, the electromagnetically shielded space is formed inside the layered substrate by connecting the respective grounding conductors by the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency signal transmitting device having a good transmission characteristic in a high-frequency band can be obtained.

Further, in the inventive high-frequency signal transmitting devices, the grounding-conductor non-forming areas of the respective intermediate dielectric layers may be concentrically defined along vertical direction; the signal via conductor of the uppermost dielectric layer may be provided at the position near the signal wiring conductor within the area facing the grounding-conductor non-forming area on the upper surface of the uppermost intermediate dielectric layer; the signal via conductor of the bottommost dielectric layer may be provided at the position near the signal wiring conductor within the area facing the grounding-conductor non-forming area on the upper surface of the bottommost dielectric layer; and the signal via conductors of the respective intermediate dielectric layers may be displaced by specified distances between the signal via conductors of the uppermost and bottommost dielectric layers.

In this case, the displacements may be set at the same value between the respective dielectric layers or may be set at smaller values from the uppermost layer toward the middle intermediate dielectric layer while being set at larger values from the middle intermediate dielectric layer toward the bottommost layer.

With this construction, since the signal via conductors of the uppermost and bottommost dielectric layers are provided at the positions near the signal wiring conductors, the lengths of the signal-wiring connecting conductors of the uppermost and bottommost dielectric layers become shorter and inductances created at the respective signal-conductor connecting conductors can be reduced. As a result, a high-frequency signal transmitting device having a good transmission characteristic in a high-frequency band can be obtained.

In the case that the displacements are set at smaller values from the uppermost dielectric layer toward the middle intermediate dielectric layer while being set at larger values from the middle intermediate dielectric layer toward the bottommost dielectric layer, the signal via conductors of the respective dielectric layers penetrates the electromagnetically shielded space while being inclined in such a step-like manner as to be at a larger angle of inclination at the sides of the uppermost and bottommost dielectric layers while being at a smaller angle of inclination at the middle side. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming area on the upper surface of the uppermost intermediate dielectric layer may be provided at the position near the other end which is a position distanced from the signal wiring conductor on the upper surface of the uppermost dielectric layer; the grounding-conductor non-forming area on the upper surface of the bottommost dielectric layer may be provided at the position near the one end which is a position distanced from the signal wiring conductor on the lower surface of the bottommost dielectric layer; the grounding-conductor non-forming areas on the upper surfaces of the remaining other intermediate dielectric layers may be displaced by the specified distances between the position near the other end and the position near the one end; and the signal via conductors of the respective dielectric layers may vertically penetrate the grounding-conductor non-forming areas of the respective intermediate dielectric layers along the same axis.

In this case, the displacements may be set at the same value between the respective dielectric layers or may be set at smaller values from the uppermost intermediate layer toward the middle intermediate dielectric layer while being set at larger values from the middle intermediate dielectric layer toward the bottommost intermediate layer.

With this construction, the signal via conductors of the uppermost and bottommost dielectric layers are arranged at the positions near the corresponding signal wiring conductors to shorten the lengths of the respective signal-wiring connecting conductors, with the result that inductances created at the respective signal-wiring connecting conductors can be reduced and a high-frequency signal transmitting device having a good transmission characteristic in a high-frequency band can be obtained.

In the case that the displacements are set at smaller values from the uppermost intermediate dielectric layer toward the middle intermediate dielectric layer while being set at larger values from the middle intermediate dielectric layer toward the bottommost intermediate dielectric layer, the electromagnetically shielded space is formed by the grounding conductors while being bent in the oblique direction. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming area on the upper surface of the uppermost intermediate dielectric layer may be provided at the position near the other end which is a position distanced from the signal wiring conductor on the upper surface of the uppermost dielectric layer; the grounding-conductor non-forming area on the upper surface of the bottommost dielectric layer may be provided at the position near the one end which is a position distanced from the signal wiring conductor on the lower surface of the bottommost dielectric layer; the grounding-conductor non-forming areas on the upper surfaces of the remaining other intermediate dielectric layers may have the ends thereof near the one end successively shifted by the specified distances toward the one end from the upper layers toward the middle layers with the ends thereof toward the other end fixed while having the ends thereof toward the other end successively shifted by the specified distances toward the other end from the lower layers toward the middle layers with the ends thereof toward the one end fixed; and the signal via conductors of the respective dielectric layers may vertically penetrate the grounding-conductor non-forming areas of the respective intermediate dielectric layers along the same axis.

In this case, the displacements may be set at the same value between the respective dielectric layers or may be set at smaller values from the upper dielectric layers toward the middle dielectric layers and from the lowers dielectric layer toward the middle layers.

With this construction, the signal via conductors of the uppermost and bottommost dielectric layers are present at the positions near the corresponding signal-wiring connecting conductors, with the result that the respective signal-wiring connecting conductors of the uppermost and bottommost dielectric layers are shortened. Thus, inductances created at the respective signal-wiring connecting conductors can be reduced and a high-frequency signal transmitting device having a good transmission characteristic in a high-frequency band can be obtained.

In the case that the displacements are set to be shorter from the upper dielectric layers toward the middle dielectric layers and from the lower dielectric layers toward the middle dielectric layers, the changing values of the dimensions between the one and the other ends of the grounding-conductor non-forming areas of the intermediate dielectric layers become smaller from the upper layers toward the middle layers and from the lower layers toward the middle layers of the layered substrate. Thus, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming areas of the respective intermediate dielectric layers may be concentrically defined along vertical direction; the grounding-conductor non-forming areas on the upper surfaces of the uppermost intermediate dielectric layer and the bottommost dielectric layer may be set to have a smaller area than the grounding-conductor non-forming areas on the upper surfaces of the other dielectric layers; and the signal via conductors of the uppermost, bottommost and intermediate dielectric layers are so vertically provided along the same axis as to penetrate the centers of the grounding-conductor non-forming areas of the respective intermediate dielectric layers.

With this construction, the signal-wiring connecting conductor on the upper surface of the uppermost dielectric layer which is the conductor portion not opposed to the grounding conductor on the upper surface of the dielectric layer right therebelow in thickness direction and the signal-wiring connecting conductor on the lower surface of the bottommost dielectric layer which is the conductor portion not opposed to the grounding conductor on the upper surface of the bottommost dielectric layer in thickness direction have shorter lengths. Thus, inductances created at the respective signal-wiring connecting conductors can be reduced and a high-frequency signal transmitting device having a good transmission characteristic in a high-frequency band can be obtained.

The inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area defined in the area facing the grounding conductor non-grounding area on the upper surface of the uppermost intermediate dielectric layer, and the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of this dielectric layer.

The inventive high-frequency signal transmitting devices may further comprise the grounding conductor provided on the lower surface of the bottommost dielectric layer and surrounding the signal wiring conductor of this dielectric layer with the specified gaps defined to the opposite sides of the signal wiring conductor and the grounding-conductor non-forming area defined in the area facing the grounding conductor non-grounding area on the upper surface of the bottommost dielectric layer, and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of this dielectric layer.

In any of these cases, the signal via conductors of the respective dielectric layers may be so provided as to vertically penetrate the centers of the grounding-conductor non-forming areas of the respective intermediate dielectric layers or may be provided in oblique direction while being displaced by the specified distances between the signal via conductors of the uppermost and bottommost dielectric layers.

By this construction as well, the electromagnetically shielded space is formed inside the layered substrate by connecting the respective grounding conductors by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency signal transmitting device having a good transmission characteristic in a high-frequency band can be obtained.

Further, in the case that the signal via conductors are displaced by the specified distances between the signal via conductors of the uppermost and bottommost dielectric layers, the signal via conductors of the uppermost and bottommost dielectric layers are brought closer to the corresponding signal wiring conductors to shorten the lengths of the signal-wiring connecting conductors. Thus, inductances created at the respective signal-wiring connecting conductors can be reduced and a high-frequency signal transmitting device having a good transmission characteristic in a high-frequency band can be obtained.

The inventive high-frequency signal transmitting devices may further comprise the grounding conductor provided on the upper surface of the uppermost dielectric layer in the area at the opposite sides of the signal wiring conductor and surrounding the signal wiring conductor of this dielectric layer with the specified gaps defined to the opposite sides of the signal wiring conductor, and the grounding-conductor via conductors vertically penetrating the uppermost dielectric layer and connecting this grounding conductor with the grounding conductor on the upper surface of the uppermost intermediate dielectric layer at the opposite sides of the signal wiring conductor.

The inventive high-frequency signal transmitting devices may further comprise the grounding conductor provided on the lower surface of the bottommost dielectric layer in the area at the opposite sides of the signal wiring conductor and surrounding the signal wiring conductor of this dielectric layer with the specified gaps defined to the opposite sides of the signal wiring conductor, and the grounding-conductor via conductors vertically penetrating the bottommost dielectric layer and connecting this grounding conductor with the grounding conductor on the upper surface of the bottommost dielectric layer at the opposite sides of the signal wiring conductor.

In these cases, the signal via conductors of the respective dielectric layers may be so provided as to vertically penetrate the centers of the grounding-conductor non-forming areas of the respective intermediate dielectric layers or may be provided in oblique direction while being displaced by the specified distances between the signal via conductors of the uppermost and bottommost dielectric layers.

In any of these cases, the electromagnetically shielded space is formed inside the layered substrate by connecting the respective grounding conductors by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency signal transmitting device having a good transmission characteristic in a high-frequency band can be obtained.

Further, in the case that the signal via conductors are displaced by the specified amount between the signal via conductors of the uppermost and bottommost dielectric layers, the signal via conductors of the uppermost and bottommost dielectric layers are brought closer to the corresponding signal wiring conductors to shorten the lengths of the signal-wiring connecting conductors. Thus, inductances created at the respective signal-wiring connecting conductors can be reduced and a high-frequency signal transmitting device having a good transmission characteristic in a high-frequency band can be obtained.

The inventive high-frequency signal transmitting devices may further comprise the grounding conductor provided on the upper surface of the uppermost dielectric layer in the area at the opposite sides of the signal wiring conductor and surrounding the signal wiring conductor of this dielectric layer with the specified gaps defined to the opposite sides of the signal wiring conductor; the grounding-conductor via conductors vertically penetrating the uppermost dielectric layer and connecting this grounding conductor with the grounding conductor on the upper surface of the uppermost intermediate dielectric layer at the opposite sides of the signal wiring conductor; the grounding conductor provided on the lower surface of the bottommost dielectric layer in the area at the opposite sides of the signal wiring conductor and surrounding the signal wiring conductor of this dielectric layer with the specified gaps defined to the opposite sides of the signal wiring conductor; and the grounding-conductor via conductors vertically penetrating the bottommost dielectric layer and connecting this grounding conductor with the grounding conductor on the upper surface of the bottommost dielectric layer at the opposite sides of the signal wiring conductor.

In this case, the signal via conductors of the respective dielectric layers may be so provided as to vertically penetrate the centers of the grounding-conductor non-forming areas of the respective dielectric layers or may be provided in oblique direction while being displaced by the specified distances between the signal via conductors of the uppermost and bottommost dielectric layers.

By this construction as well, the electromagnetically shielded space is formed inside the layered substrate by connecting the respective grounding conductors by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency signal transmitting device having a good transmission characteristic in a high-frequency band can be obtained.

Further, in the case that the signal via conductors are displaced by the specified distances between the signal via conductors of the uppermost and bottommost dielectric layers, the signal via conductors of the uppermost and bottommost dielectric layers are brought closer to the corresponding signal wiring conductors to shorten the lengths of the signal-wiring connecting conductors. Thus, inductances created at the respective signal-wiring connecting conductors can be reduced and a high-frequency signal transmitting device having a good transmission characteristic in a high-frequency band can be obtained.

In the inventive high-frequency signal transmitting devices, if the grounding conductor is provided neither on the upper surface of the uppermost dielectric layer nor on the lower surface of the bottommost dielectric layer, the length of the signal-wiring connecting conductor between the signal wiring conductor and the signal via conductor on the upper surface of the uppermost dielectric layer may be set at a value equal to or smaller than the thickness of the uppermost intermediate dielectric layer in its grounding-conductor non-forming area, and the length of the signal-wiring connecting conductor between the signal wiring conductor and the signal via conductor on the lower surface of the bottommost dielectric layer may be set at a value equal to or smaller than the thickness of the bottommost intermediate dielectric layer in its grounding-conductor non-forming area.

With this construction, the signal-wiring connecting conductors can be made to have a very short length and only a very small amount of inductance is created there, with the result that the transmission characteristic in the high-frequency band can be better.

The inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area of the specified shape; the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of this dielectric layer; the grounding conductor provided on the lower surface of the bottommost dielectric layer and surrounding the signal wiring conductor of this dielectric layer with the specified gaps defined to the opposite sides of the signal wiring conductor and the grounding-conductor non-forming area of the specified shape; and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of this dielectric layer.

In this case, the grounding-conductor non-forming areas of the uppermost dielectric layer, the bottommost dielectric layer and the respective intermediate dielectric layers may be concentrically defined along vertical direction, and the signal via conductors of the respective dielectric layers may be so vertically provided along the same axis as to penetrate the centers of the grounding-conductor non-forming areas of the respective dielectric layers.

With this construction, the electromagnetically shielded space is formed inside the layered substrate by connecting the respective grounding conductors including those of the uppermost and bottommost dielectric layers by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency signal transmitting device having a good transmission characteristic in a high-frequency band can be obtained.

Further, in the inventive high-frequency signal transmitting devices, the grounding-conductor non-forming areas of the uppermost dielectric layer, the bottommost dielectric layer and the respective intermediate dielectric layers may be concentrically defined along vertical direction; the signal via conductor of the uppermost dielectric layer is provided at the position near the signal wiring conductor in the grounding-conductor non-forming area on the upper surface of this dielectric layer; the signal via conductor of the bottommost dielectric layer is provided at the position near the signal wiring conductor in the grounding-conductor non-forming area on the lower surface of this dielectric layer; and the signal via conductors of the respective intermediate dielectric layers are displaced by the specified distances between the signal via conductors of the uppermost and bottommost dielectric layers.

In this case, the displacements may be set at the same value between the respective dielectric layers or may be set at smaller values from the uppermost dielectric layer toward the middle intermediate dielectric layer while being set at larger values from the middle intermediate dielectric layer toward the bottommost dielectric layer.

With this construction, the signal via conductors of the uppermost and bottommost dielectric layers are arranged at the positions near the corresponding signal wiring conductors to shorten the lengths of the respective signal-wiring connecting conductors of the uppermost and bottommost dielectric layers, with the result that inductances created at the respective signal-wiring connecting conductors can be reduced and a high-frequency signal transmitting device having a good transmission characteristic in a high-frequency band can be obtained.

In the case that the displacements are set at smaller values from the uppermost dielectric layer toward the middle intermediate dielectric layer while being set at larger values from the middle intermediate dielectric layer toward the bottommost dielectric layer, the signal via conductors of the respective dielectric layers penetrate the electromagnetically shielded space while being inclined in such a step-like manner as to be at a larger angle of inclination at the sides of the uppermost and bottommost dielectric layers while being at a smaller angle at the middle side. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming areas on the upper surfaces of the uppermost dielectric layer and the uppermost intermediate dielectric layer may be provided at the same position near the other end distanced from the signal wiring conductor on the upper surface of the uppermost dielectric layer; the grounding-conductor non-forming areas on the upper and lower surfaces of the bottommost dielectric layer may be provided at the same position near the one end distanced from the signal wiring conductor on the lower surface of the bottommost dielectric layer; the grounding-conductor non-forming areas on the upper surfaces of the remaining intermediate dielectric layers may be provided while being displaced by the specified distances between the position near the other end and the position near the one end; and the signal via conductors of the respective dielectric layers may vertically penetrate the grounding-conductor non-forming areas of the respective dielectric layers along the same axis.

In this case, the displacements may be set at the same value between the respective dielectric layers or may be set at smaller values from the uppermost intermediate dielectric layer toward the middle intermediate dielectric layer while being set at larger values from the middle intermediate dielectric layer toward the bottommost dielectric layer.

With this construction, the signal via conductors of the uppermost and bottommost dielectric layers are arranged at the positions near the corresponding signal wiring conductors to shorten the lengths of the respective signal-wiring connecting conductors, with the result that inductances created at the respective signal-wiring connecting conductors can be reduced and a high-frequency signal transmitting device having a good transmission characteristic in a high-frequency band can be obtained.

In the case that the displacements are set at smaller values from the uppermost intermediate dielectric layer toward the middle intermediate dielectric layer while being set at larger values from the middle intermediate dielectric layer toward the bottommost intermediate dielectric layer, the electromagnetically shielded space formed by the grounding conductors is bent in oblique direction. Thus, a direction of propagation can be changed while maintaining a propagation mode stable against a straight-propagating property of electromagnetic waves from the outer side to the inner side or from the inner side to the outer side. Therefore, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming areas on the upper surfaces of the uppermost dielectric layer and the uppermost intermediate dielectric layer may be provided at the same position near the other end distanced from the signal wiring conductor on the upper surface of the uppermost dielectric layer; the grounding-conductor non-forming areas on the upper and lower surfaces of the bottommost dielectric layer may be provided at the same position near the one end distanced from the signal wiring conductor on the lower surface of the bottommost dielectric layer; the grounding-conductor non-forming areas on the upper surfaces of the remaining intermediate dielectric layers may have the positions thereof near the one end successively displaced by the specified distances toward the one end from the upper dielectric layers toward the middle dielectric layers with the positions near the other end fixed while having the positions thereof near the other end successively displaced by the specified distances toward the other end from the lower dielectric layers toward the middle dielectric layers with the positions toward the one end fixed; and the signal via conductors of the respective dielectric layers may vertically penetrate the grounding-conductor non-forming areas of the respective intermediate dielectric layers along the same axis.

In this case, the displacements may be set at the same value between the respective dielectric layers or may be set at smaller values from the upper dielectric layers toward the middle dielectric layers and from the lower dielectric layers toward the middle dielectric layers.

With this construction, the signal via conductors of the uppermost and bottommost dielectric layers are arranged at the positions near the corresponding signal wiring conductors to shorten the lengths of the respective signal-wiring connecting conductors of the uppermost and bottommost dielectric layers. As a result, inductances created at the respective signal-wiring connecting conductors can be reduced and a high-frequency signal transmitting device having a good transmission characteristic in a high-frequency band can be obtained.

In the case that the displacements are set at smaller values from the upper dielectric layers toward the middle dielectric layers and from the lower dielectric layers toward the middle dielectric layers, the changing values of the dimensions between the one end and the other end of the grounding-conductor non-forming areas of the intermediate dielectric layers become smaller from the upper dielectric layers toward the middle dielectric layers and from the lower dielectric layers toward the middle dielectric layers. Thus, discontinuity of impedance in the propagation of a high-frequency signal between the outer side and the inner side can be improved, with the result that a high-frequency signal transmitting device having a good transmission characteristic in a high-frequency band can be obtained.

Further, in the inventive high-frequency signal transmitting devices, the grounding-conductor non-forming areas on the upper surface of the uppermost dielectric layer, on the lower surface of the bottommost dielectric layer and on the upper surfaces of the bottommost dielectric layer and the respective intermediate dielectric layers may be concentrically defined along vertical direction; the grounding-conductor non-forming areas on the upper surface of the uppermost dielectric layer, on the lower surface of the bottommost dielectric layer and on the upper surfaces of the uppermost intermediate dielectric layer and the bottommost dielectric layer may be set to have a smaller area than the grounding-conductor non-forming areas on the upper surfaces of the remaining intermediate dielectric layers; and the signal via conductors of the uppermost, bottommost and intermediate dielectric layers may be so vertically provided along the same axis as to penetrate the centers of the grounding-conductor non-forming area of the respective dielectric layers.

With this construction, since the grounding-conductor non-forming area on the upper surface of the uppermost dielectric layer, on the lower surface of the bottommost dielectric layer and on the upper surfaces of the uppermost intermediate dielectric layer and the bottommost dielectric layer are concentric and have a smaller area, the length of the signal-wiring connecting conductor on the upper surface of the uppermost dielectric layer which is the conductive portion not opposed to the grounding conductor on the upper surface of the uppermost intermediate dielectric layer in thickness direction and the length of signal-wiring connecting conductor on the lower surface of the bottommost dielectric layer which is the conductive portion not opposed to the grounding conductor on the upper surface of the bottommost dielectric layer in thickness direction are shortened to reduce inductances created at the respective signal-wiring connecting conductors. As a result, a high-frequency signal transmitting device having a good transmission characteristic in a high-frequency band can be obtained.

Further, in the inventive high-frequency signal transmitting devices, the signal-wiring connecting conductors provided on the upper surface of the uppermost dielectric layer and on the lower surface of the bottommost dielectric layer may be formed wider than the signal wiring conductors provided on the upper surface of the uppermost dielectric layer and on the lower surface of the bottommost dielectric layer.

With this construction, inductances created at the respective signal-wiring connecting conductors can be reduced since the signal-wiring connecting conductors are formed wider than the signal wiring conductors. As a result, a high-frequency signal transmitting device having a good transmission characteristic in a high-frequency band can be obtained.

Further, in the inventive high-frequency signal transmitting devices, the length of the signal-wiring connecting conductor between the signal wiring conductor and the signal via conductor on the upper surface of the uppermost dielectric layer may be set at a value equal to or smaller than the thickness of the uppermost dielectric layer in the grounding-conductor non-forming area on the upper surface of this dielectric layer, and the length of the signal-wiring connecting conductor between the signal wiring conductor and the signal via conductor on the lower surface of the bottommost dielectric layer may be set at a value equal to or smaller than the thickness of the bottommost dielectric layer in the grounding-conductor non-forming area on the upper surface of this dielectric layer.

With this construction, the signal-wiring connecting conductors on the upper surface of the uppermost dielectric layer and on the lower surface of the bottommost dielectric layer are made to have a very short length and only a very small amount of inductance is created there, with the result that the transmission characteristic in the high-frequency band can be better.

Further, in the inventive high-frequency signal transmitting devices, the grounding-conductor non-forming area on the upper surface of the middle intermediate dielectric layer and the one on the upper surface of the dielectric layer right below this dielectric layer may be made to have a smaller area than the grounding-conductor non-forming areas on the upper surface of the other dielectric layers.

In this case, the signal via conductors of the respective intermediate dielectric layers may be displaced by the specified distances between the signal via conductors of the uppermost and bottommost dielectric layers. These displacements may be set at the same value between the respective dielectric layers or may be set at smaller values from the uppermost dielectric layer toward the middle intermediate dielectric layer while being set at larger values from the middle intermediate dielectric layer toward the bottommost dielectric layer.

With this construction, the resonance controlling layer for controlling the resonance frequency of the electromagnetically shielded space is formed in the middle portion of the intermediate dielectric layers. Since the cutoff frequency of the circular waveguide mode (TE11 mode) in this resonance controlling layer is higher than those of the circular waveguide modes (TE11 modes) in the other dielectric layers, this resonance controlling layer acts as a reactance attenuator to suppress the high-order mode propagation. As a result, the resonance in accordance with the cylindrical dielectric resonance mode is shifted toward a higher frequency side, broadening the usable frequency band.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the uppermost intermediate dielectric layer, and the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of the uppermost dielectric layer.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor provided on the lower surface of the bottommost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the bottommost dielectric layer, and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of the bottommost dielectric layer.

With this construction, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided on the upper surface of the uppermost dielectric layer or on the lower surface of the bottommost dielectric layer.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the uppermost intermediate dielectric layer; the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of the uppermost dielectric layer; the grounding conductor provided on the lower surface of the bottommost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the bottommost dielectric layer; and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of the bottommost dielectric layer.

With this construction, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided on the upper surface of the uppermost dielectric layer and on the lower surface of the bottommost dielectric layer.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor surrounding the corresponding signal wiring conductor in the area at the opposite sides of the signal wiring conductor on the upper surface of the uppermost dielectric layer with the specified gaps defined to the opposite sides of this signal wiring conductor, and the grounding-conductor via conductors vertically penetrating the uppermost dielectric layer and connecting this grounding conductor with the grounding conductor on the upper surface of the uppermost intermediate dielectric layer at the opposite sides of the signal wiring conductor.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor surrounding the corresponding signal wiring conductor in the area at the opposite sides of the signal wiring conductor on the lower surface of the bottommost dielectric layer with the specified gaps defined to the opposite sides of this signal wiring conductor, and the grounding-conductor via conductors vertically penetrating the bottommost dielectric layer and connecting this grounding conductor with the grounding conductor on the upper surface of the bottommost dielectric layer at the opposite sides of the signal wiring conductor.

With these constructions, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided at the opposite sides of the signal wiring conductor on the upper surface of the uppermost dielectric layer or on the lower surface of the bottommost dielectric layer.

Further, in the case of forming the resonance controlling layer by reducing the dimensions of the grounding-conductor non-forming area in the middle portion of the intermediate dielectric layers, the inventive high-frequency signal transmitting devices may further comprise the grounding conductor surrounding the corresponding signal wiring conductor in the area at the opposite sides of the signal wiring conductor on the upper surface of the uppermost dielectric layer with the specified gaps defined to the opposite sides of this signal wiring conductor; the grounding-conductor via conductors vertically penetrating the uppermost dielectric layer and connecting this grounding conductor with the grounding conductor on the upper surface of the uppermost intermediate dielectric layer at the opposite sides of the signal wiring conductor; the grounding conductor surrounding the corresponding signal wiring conductor in the area at the opposite sides of the signal wiring conductor on the lower surface of the bottommost dielectric layer with the specified gaps defined to the opposite sides of this signal wiring conductor; and the grounding-conductor via conductors vertically penetrating the bottommost dielectric layer and connecting this grounding conductor with the grounding conductor on the upper surface of the bottommost dielectric layer at the opposite sides of the signal wiring conductor.

With this construction, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductors are provided at the opposite sides of the signal wiring conductor on the upper surface of the uppermost dielectric layer and on the lower surface of the bottommost dielectric layer.

Further, in the inventive high-frequency signal transmitting devices, the middle intermediate dielectric layer may be made of a dielectric material having a smaller permittivity than the other dielectric layers. In this case, the signal via conductors of the respective intermediate dielectric layers may be displaced by the specified distances between the signal via conductors of the uppermost and bottommost dielectric layers. These displacements may be set at the same value between the respective dielectric layers or may be set at smaller values from the uppermost dielectric layer toward the middle intermediate dielectric layer while being set at larger values from the middle intermediate dielectric layer toward the bottommost dielectric layer.

With this construction, the resonance controlling layer for controlling the resonance frequency of the electromagnetically shielded space is formed in the middle portion of the intermediate dielectric layers. Since the cutoff frequency of the circular waveguide mode (TE11 mode) in this resonance controlling layer is higher than those of the circular waveguide modes (TE11 modes) in the other dielectric layers, this resonance controlling layer acts as a reactance attenuator to suppress the high-order mode propagation. As a result, the resonance in accordance with the cylindrical dielectric resonance mode is shifted toward a higher frequency side, broadening the usable frequency band.

Further, in the case of forming the resonance controlling layer by making the middle intermediate dielectric layer of a dielectric material having a smaller permittivity, the inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the uppermost intermediate dielectric layer, and the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of the uppermost dielectric layer.

Further, in the case of forming the resonance controlling layer by making the middle intermediate dielectric layer of a dielectric material having a smaller permittivity, the inventive high-frequency signal transmitting devices may further comprise the grounding conductor provided on the lower surface of the bottommost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the bottommost dielectric layer, and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of the bottommost dielectric layer.

With these constructions, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided on the upper surface of the uppermost dielectric layer or on the lower surface of the bottommost dielectric layer.

Further, in the case of forming the resonance controlling layer by making the middle intermediate dielectric layer of a dielectric material having a smaller permittivity, the inventive high-frequency signal transmitting devices may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the uppermost intermediate dielectric layer; the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of the uppermost dielectric layer; the grounding conductor provided on the lower surface of the bottommost dielectric layer and surrounding the signal wiring conductor of this dielectric layer with the specified gaps defined to the opposite sides of the signal wiring conductor and the grounding-conductor non-forming area defined in the area facing the grounding-conductor non-forming area on the upper surface of the bottommost dielectric layer; and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of the bottommost dielectric layer.

With this construction, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided on the upper surface of the uppermost dielectric layer and on the lower surface of the bottommost dielectric layer.

Further, in the case of forming the resonance controlling layer by making the middle intermediate dielectric layer of a dielectric material having a smaller permittivity, the inventive high-frequency signal transmitting devices may further comprise the grounding conductor surrounding the corresponding signal wiring conductor in the area at the opposite sides of the signal wiring conductor on the upper surface of the uppermost dielectric layer with the specified gaps defined to the opposite sides of this signal wiring conductor, and the grounding-conductor via conductors vertically penetrating the uppermost dielectric layer and connecting this grounding conductor with the grounding conductor on the upper surface of the uppermost intermediate dielectric layer at the opposite sides of the signal wiring conductor.

Further, in the case of forming the resonance controlling layer by making the middle intermediate dielectric layer of a dielectric material having a smaller permittivity, the inventive high-frequency signal transmitting devices may further comprise the grounding conductor surrounding the corresponding signal wiring conductor in the area at the opposite sides of the signal wiring conductor on the lower surface of the bottommost dielectric layer with the specified gaps defined to the opposite sides of this signal wiring conductor, and the grounding-conductor via conductors vertically penetrating the bottommost dielectric layer and connecting this grounding conductor with the grounding conductor on the upper surface of the bottommost dielectric layer at the opposite sides of the signal wiring conductor.

With these constructions, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductor is provided at the opposite sides of the signal wiring conductor on the upper surface of the uppermost dielectric layer or on the lower surface of the bottommost dielectric layer.

Further, in the case of forming the resonance controlling layer by making the middle intermediate dielectric layer of a dielectric material having a smaller permittivity, the inventive high-frequency signal transmitting devices may further comprise the grounding conductor surrounding the corresponding signal wiring conductor in the area at the opposite sides of the signal wiring conductor on the upper surface of the uppermost dielectric layer with the specified gaps defined to the opposite sides of this signal wiring conductor; the grounding-conductor via conductors vertically penetrating the uppermost dielectric layer and connecting this grounding conductor with the grounding conductor on the upper surface of the uppermost intermediate dielectric layer at the opposite sides of the signal wiring conductor; the grounding conductor surrounding the corresponding signal wiring conductor in the area at the opposite sides of the signal wiring conductor on the lower surface of the bottommost dielectric layer with the specified gaps defined to the opposite sides of this signal wiring conductor; and the grounding-conductor via conductors vertically penetrating the bottommost dielectric layer and connecting this grounding conductor with the grounding conductor on the upper surface of the bottommost dielectric layer at the opposite sides of the signal wiring conductor.

With this construction, since the cutoff frequency of the circular waveguide mode in this resonance controlling layer is higher than those of the circular waveguide modes in the other dielectric layers, this resonance controlling layer acts as a reactance attenuator to suppress the high-order mode propagation. As a result, the resonance in accordance with the cylindrical dielectric resonance mode is shifted toward a higher frequency side. In addition, the usable frequency band is further broadened since the grounding conductors are provided at the opposite sides of the signal wiring conductor on the upper surface of the uppermost dielectric layer and on the lower surface of the bottommost dielectric layer.

Further, the high-frequency signal transmitting device may be further provided with a frame on the upper surface of the layered substrate for accommodating a semiconductor device; and a lid on the upper surface of the frame accommodating the semiconductor device to make an inventive high-frequency semiconductor package.

With this construction, the electromagnetically shielded space is formed inside the layered substrate by connecting the grounding conductors of the respective dielectric layers forming the layered substrate by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency semiconductor package having a good transmission characteristic in a high-frequency band can be obtained.

The inventive high-frequency semiconductor package may further comprise the grounding conductor provided on the upper surface of the uppermost dielectric layer and surrounding the signal wiring conductor of this dielectric layer with the specified gaps defined to the opposite sides of the signal wiring conductor and the grounding-conductor non-forming area of the specified shape; the grounding-conductor via conductors vertically penetrating the uppermost dielectric layer and connecting this grounding conductor with the grounding conductor on the upper surface of the uppermost intermediate dielectric layer at a plurality of positions around the grounding-conductor non-forming area of this dielectric layer; the grounding conductor provided on the lower surface of the bottommost dielectric layer and surrounding the signal wiring conductor of this dielectric layer with the specified gaps defined to the opposite sides of the signal wiring conductor and the grounding-conductor non-forming area of the specified shape; and the grounding-conductor via conductors vertically penetrating the bottommost dielectric layer and connecting this grounding conductor with the grounding conductor on the upper surface of the bottommost dielectric layer at a plurality of positions around the grounding-conductor non-forming area of this dielectric layer.

With this construction, the electromagnetically shielded space is formed inside the layered substrate by connecting the grounding conductors of the respective dielectric layers including those on the upper surface of the uppermost dielectric layer and on the lower surface of the bottommost dielectric layer by means of the grounding-conductor via conductors provided in the respective dielectric layers. Thus, a leak of a high-frequency signal is suppressed upon passing the signal via conductors penetrating the electromagnetically shielded space to improve the high-frequency transmission characteristic, with the result that a high-frequency semiconductor package a good transmission characteristic in a high-frequency band can be obtained.

This application is based on patent application Nos. 2001-365134, 2002-20774, 2002-92545, 2002-188466, 2002-188467, 2002-251966, 2002-251967, 2002-284635, 2002-284636, and 2002-346579 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A high-frequency signal transmitting device, comprising:

a layered substrate including an uppermost dielectric layer, a bottommost dielectric layer, and a plurality of intermediate dielectric layers located between the uppermost and bottommost dielectric layers;

signal wiring conductors provided between one end and an inner side on the upper surface of the uppermost dielectric layer and between the other end opposite from the one end and the inner side on the lower surface of the bottommost dielectric layer;

grounding conductors provided on the upper surfaces of the respective intermediate dielectric layers and the bottommost dielectric layer and surrounding grounding-conductor non-forming areas of a specified shape provided on the respective dielectric layers;

a signal via conductor vertically penetrating the uppermost dielectric layer and provided within an area facing the grounding-conductor non-forming area on the upper surface of the uppermost intermediate dielectric layer;

a signal via conductor vertically penetrating the bottommost dielectric layer and provided within an area facing the grounding-conductor non-forming area on the upper surface of the bottommost dielectric layer;

signal via conductors vertically penetrating the respective intermediate dielectric layers and provided within the grounding-conductor non-forming areas of the respective dielectric layers;

signal-wiring connecting conductors provided on the upper surface of the uppermost dielectric layer and on the lower surface of the bottommost dielectric layer and connecting the signal wiring conductors of the uppermost and bottommost dielectric layers with the signal via conductors;

via conductor connecting conductors provided on the upper surfaces of the respective intermediate dielectric layers and the bottommost dielectric layer and connecting the signal via conductors of the respective dielectric layers with those of the dielectric layers right there-above; and grounding-conductor via conductors vertically penetrating the respective intermediate dielectric layers and connecting the respective grounding conductors at a plurality of positions around the grounding-conductor non-forming areas of the respective dielectric layers.

2. A high-frequency signal transmitting device according to claim 1, wherein the grounding-conductor non-forming areas of the respective intermediate dielectric layers are concentrically defined along vertical direction, and the signal via conductors of the respective dielectric layers are so vertically provided along the same axis as to penetrate the centers of the grounding-conductor non-forming areas of the respective intermediate dielectric layers.

3. A high-frequency signal transmitting device according to claim 2, further comprising:

a grounding conductor provided on the upper surface of the uppermost dielectric layer and surrounding the signal wiring conductor of the uppermost dielectric layer with specified gaps defined to the opposite sides of the signal wiring conductor and a grounding-conductor non-forming area defined in the area facing the grounding-conductor non-forming area on the upper surface of the uppermost intermediate dielectric layer, and grounding-conductor via conductors vertically penetrating the uppermost dielectric layer and connecting the grounding conductor of the uppermost dielectric layer with the grounding-conductor non-forming area on the upper surface of the uppermost intermediate dielectric layer at a plurality of positions around the grounding-conductor non-forming area of the uppermost dielectric layer.

4. A high-frequency signal transmitting device according to claim 1, wherein:

the grounding-conductor non-forming areas of the respective intermediate dielectric layers are concentrically defined along vertical direction;

the signal via conductor of the uppermost dielectric layer is provided at a position near the signal wiring conductor within the area facing the grounding-conductor non-forming area on the upper surface of the uppermost intermediate dielectric layer;

the signal via conductor of the bottommost dielectric layer is provided at a position near the signal wiring conductor within the area facing the grounding-conductor non-forming area on the upper surface of the bottommost dielectric layer; and the signal via conductors of the respective intermediate dielectric layers are provided while being displaced by specified distances between the signal via conductors of the uppermost and bottommost dielectric layers.

5. A high-frequency signal transmitting device according to claim 4, wherein the grounding-conductor non-forming areas on the upper surfaces of the middle intermediate dielectric layer and the dielectric layer right therebelow are set to have a smaller area than the grounding-conductor non-forming areas on the upper surfaces of the other dielectric layers.

6. A high-frequency signal transmitting device according to claim 1, wherein:

the grounding-conductor non-forming area on the upper surface of the uppermost intermediate dielectric layer is provided at a position near the other end distanced from the signal wiring conductor on the upper surface of the uppermost dielectric layer;

the grounding-conductor non-forming area on the upper surface of the bottommost dielectric layer is provided at a position near the one end distanced from the signal wiring conductor on the lower surface of the bottommost dielectric layer;

the grounding-conductor non-forming areas on the upper surfaces of the remaining intermediate dielectric layers are displaced by specified distances between the position near the other end and the position near the one end; and the signal via conductors of the respective dielectric layers are so vertically provided along the same axis as to penetrate the grounding-conductor non-forming areas of the respective intermediate dielectric layers.

7. A high-frequency signal transmitting device according to claim 1, wherein:

the grounding-conductor non-forming area on the upper surface of the uppermost intermediate dielectric layer is provided at a position near the other end distanced from the signal wiring conductor on the upper surface of the uppermost dielectric layer;

the grounding-conductor non-forming area on the upper surface of the bottommost dielectric layer is provided at a position near the one end distanced from the signal wiring conductor on the lower surface of the bottommost dielectric layer;

the grounding-conductor non-forming areas on the upper surface of the remaining intermediate dielectric layers have the positions thereof near the one end successively displaced by specified distances toward the one end from the upper dielectric layers toward the middle dielectric layers with the positions thereof near the other end fixed while having the positions thereof near the other end successively displaced by specified distances toward the other end from the lower dielectric layers toward the middle dielectric layers with the positions thereof near the one end fixed; and the signal via conductors of the respective dielectric layers are so vertically provided along the same axis as to penetrate the grounding-conductor non-forming areas of the respective intermediate dielectric layers.

8. A high-frequency signal transmitting device according to claim 1, wherein:

the grounding-conductor non-forming areas of the respective intermediate dielectric layers are concentrically defined along vertical direction;

the grounding-conductor non-forming areas on the upper surfaces of the uppermost intermediate dielectric layer and the bottommost dielectric layer are set to have a smaller area than the grounding-conductor non-forming areas on the upper surface of the other dielectric layers; and the signal via conductors of the uppermost, bottommost and intermediate dielectric layers are so vertically provided along the same axis as to penetrate the centers of the grounding-conductor non-forming areas of the respective intermediate dielectric layers.

9. A high-frequency signal transmitting device according to claim 1, wherein the length of the signal-wiring connecting conductor on the upper surface of the uppermost dielectric layer between the signal wiring conductor and the signal via conductor is set at a value equal to or smaller than the thickness of the uppermost intermediate dielectric layer in the grounding-conductor non-forming area on the upper surface thereof, and the length of the signal-wiring connecting conductor on the lower surface of the bottommost dielectric layer between the signal wiring conductor and the signal via conductor is set at a value equal to or smaller than the thickness of the bottommost intermediate dielectric layer in the grounding-conductor non-forming area on the upper surface thereof.

10. A high-frequency signal transmitting device according to claim 1, further comprising:

a grounding conductor provided on the upper surface of the uppermost dielectric layer and surrounding the signal wiring conductor of the uppermost dielectric layer with specified gaps defined to the opposite sides of the signal wiring conductor and a grounding-conductor non-forming area of a specified shape;

a grounding-conductor via conductor vertically penetrating the uppermost dielectric layer and connecting the grounding conductor of the uppermost dielectric layer with the grounding-conductor non-forming area on the upper surface of the uppermost intermediate dielectric layer at a plurality of positions around the grounding-conductor non-forming area of the uppermost dielectric layer;

a grounding conductor provided on the lower surface of the bottommost dielectric layer and surrounding the signal wiring conductor of the bottommost dielectric layer with specified gaps defined to the opposite sides of the signal wiring conductor and a grounding-conductor non-forming area of a specified shape; and a grounding-conductor via conductor vertically penetrating the bottommost dielectric layer and connecting the grounding conductor on the lower surface of the bottommost dielectric layer with the grounding-conductor non-forming area on the upper surface of the bottommost dielectric layer at a plurality of positions around the grounding-conductor non-forming area of the bottommost dielectric layer.

11. A high-frequency signal transmitting device according to claim 10, wherein the grounding-conductor non-forming areas of the uppermost dielectric layer, the bottommost dielectric layer and the respective intermediate dielectric layers are concentrically defined along vertical direction, and the signal via conductors of the respective dielectric layers are so vertically provided along the same axis as to penetrate the centers of the grounding-conductor non-forming areas of the respective intermediate dielectric layers.

12. A high-frequency signal transmitting device according to claim 10, wherein:

the grounding-conductor non-forming areas of the uppermost dielectric layer, the bottommost dielectric layer and the respective intermediate dielectric layers are concentrically defined along vertical direction;

the signal via conductor of the uppermost dielectric layer is provided at a position near the signal wiring conductor within the grounding-conductor non-forming area on the upper surface of the uppermost dielectric layer;

the signal via conductor of the bottommost dielectric layer is provided at a position near the signal wiring conductor within the grounding-conductor non-forming area on the lower surface of the bottommost dielectric layer; and the signal via conductors of the respective intermediate dielectric layers are provided while being displaced by specified distances between the signal via conductors of the uppermost and bottommost dielectric layers.

13. A high-frequency signal transmitting device according to claim 10, wherein:

the grounding-conductor non-forming areas on the upper surfaces of the uppermost dielectric layer and the uppermost intermediate dielectric layer are provided at the same position near the other end distanced from the signal wiring conductor on the upper surface of the uppermost dielectric layer;

the grounding-conductor non-forming areas on the upper and lower surfaces of the bottommost dielectric layer are provided at the same position near the one end distanced from the signal wiring conductor on the lower surface of the bottommost dielectric layer;

the grounding-conductor non-forming areas on the upper surfaces of the remaining intermediate dielectric layers are displaced by specified distances between the position near the other end and the position near the one end; and the signal via conductors of the respective dielectric layers are so vertically provided along the same axis as to penetrate the grounding-conductor non-forming areas of the respective dielectric layers.

14. A high-frequency signal transmitting device according to claim 10, wherein:

the grounding-conductor non-forming areas on the upper surfaces of the uppermost dielectric layer and the uppermost intermediate dielectric layer are provided at the same position near the other end distanced from the signal wiring conductor on the upper surface of the uppermost dielectric layer;

the grounding-conductor non-forming areas on the upper and lower surfaces of the bottommost dielectric layer are provided at the same position near the one end distanced from the signal wiring conductor on the lower surface of the bottommost dielectric layer;

the grounding-conductor non-forming areas on the upper surface of the remaining intermediate dielectric layers have the positions thereof near the one end successively displaced by specified distances toward the one end from the upper dielectric layers toward the middle dielectric layers with the positions thereof near the other end fixed while having the positions thereof near the other end successively displaced by specified distances toward the other end from the lower dielectric layers toward the middle dielectric layers with the positions thereof near the one end fixed; and the signal via conductors of the respective dielectric layers are so vertically provided along the same axis as to penetrate the grounding-conductor non-forming areas of the respective intermediate dielectric layers.

15. A high-frequency signal transmitting device according to claim 10, wherein:

the grounding-conductor non-forming areas on the upper surface of the uppermost dielectric layer, on the lower surface of the bottommost dielectric layer and on the upper surfaces of the respective intermediate dielectric layers are concentrically defined along vertical direction;

the grounding-conductor non-forming areas on the upper surfaces of the uppermost intermediate dielectric layer, on the lower surface of the bottommost dielectric layer, on the upper surfaces of the uppermost intermediate dielectric layer and the bottommost dielectric layer are set to have a smaller area than the grounding-conductor non-forming areas on the upper surface of the other dielectric layers; and the signal via conductors of the uppermost dielectric layer, the bottommost dielectric layer and the respective intermediate dielectric layers are so vertically provided along the same axis as to penetrate the centers of the grounding-conductor non-forming areas of the respective intermediate dielectric layers.

16. A high-frequency signal transmitting device according to claim 10, wherein the length of the signal-wiring connecting conductor on the upper surface of the uppermost dielectric layer between the signal wiring conductor and the signal via conductor is set at a value equal to or smaller than the thickness of the uppermost intermediate dielectric layer in the grounding-conductor non-forming area on the upper surface thereof, and the length of the signal-wiring connecting conductor on the lower surface of the bottommost dielectric layer between the signal wiring conductor and the signal via conductor is set at a value equal to or smaller than the thickness of the bottommost dielectric layer in the grounding-conductor non-forming area on the upper surface thereof.

17. A high-frequency signal transmitting device according to claim 1, further comprising:

a frame provided on the upper surface of the layered substrate for accommodating a semiconductor device; and a lid provided on the upper surface of the frame accommodating the semiconductor device.

18. A high-frequency signal transmitting device according to claim 17, further comprising:

a grounding conductor provided on the upper surface of the uppermost dielectric layer and surrounding the signal wiring conductor of the uppermost dielectric layer with specified gaps defined to the opposite sides of the signal wiring conductor and a grounding-conductor non-forming area of a specified shape;

a grounding-conductor via conductor vertically penetrating the uppermost dielectric layer and connecting the grounding conductor of the uppermost dielectric layer with the grounding-conductor non-forming area on the upper surface of the uppermost intermediate dielectric layer at a plurality of positions around the grounding-conductor non-forming area of the uppermost dielectric layer;

a grounding conductor provided on the lower surface of the bottommost dielectric layer and surrounding the signal wiring conductor of the bottommost dielectric layer with specified gaps defined to the opposite sides of the signal wiring conductor and a grounding-conductor non-forming area of a specified shape; and a grounding-conductor via conductor vertically penetrating the bottommost dielectric layer and connecting the grounding conductor on the lower surface of the bottommost dielectric layer with the grounding-conductor non-forming area on the upper surface of the bottommost dielectric layer at a plurality of positions around the grounding-conductor non-forming area of the bottommost dielectric layer.

* * * * *